US011769777B2

(12) United States Patent
Miyamoto et al.

(10) Patent No.: US 11,769,777 B2
(45) Date of Patent: Sep. 26, 2023

(54) CIRCUIT BOARD, SEMICONDUCTOR DEVICE, AND ELECTRONIC APPARATUS

(71) Applicant: SONY SEMICONDUCTOR SOLUTIONS CORPORATION, Kanagawa (JP)

(72) Inventors: Takashi Miyamoto, Kanagawa (JP); Yoshiyuki Akiyama, Kanagawa (JP); Junichi Tsunoda, Kanagawa (JP); Shuuichi Kojima, Kanagawa (JP); Akira Arahata, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 430 days.

(21) Appl. No.: 16/981,494

(22) PCT Filed: Mar. 8, 2019

(86) PCT No.: PCT/JP2019/009243
§ 371 (c)(1),
(2) Date: Sep. 16, 2020

(87) PCT Pub. No.: WO2019/181548
PCT Pub. Date: Sep. 26, 2019

(65) Prior Publication Data

US 2021/0036041 A1 Feb. 4, 2021

(30) Foreign Application Priority Data

Mar. 23, 2018 (JP) ................................ 2018-056247

(51) Int. Cl.
*H01L 27/146* (2006.01)
*H01L 23/498* (2006.01)

(52) U.S. Cl.
CPC .................. *H01L 27/14623* (2013.01); *H01L 23/49838* (2013.01); *H01L 27/14634* (2013.01); *H01L 27/14636* (2013.01)

(58) Field of Classification Search
CPC ......... H01L 27/14623; H01L 23/49838; H01L 27/14634; H01L 27/14636;

(Continued)

(56) References Cited

U.S. PATENT DOCUMENTS 5,446,243 A 8/1995 Crowder et al.
5,929,375 A 7/1999 Glovatsky et al.

(Continued)

FOREIGN PATENT DOCUMENTS

JP H06-053351 2/1994
JP 2001-308540 11/2001

(Continued)

OTHER PUBLICATIONS

International Search Report and Written Opinion prepared by the Japanese Patent Office dated May 22, 2019, for International Application No. PCT/JP2019/009243.

*Primary Examiner* — Robert G Bachner
(74) *Attorney, Agent, or Firm* — Sheridan Ross PC

(57) ABSTRACT

The present technology relates to a circuit board, a semiconductor device, and an electronic apparatus that reduce the generation of noise signals. A circuit board includes: a first conductor layer that has a first conductor portion including a conductor having a planar or mesh-like first basic pattern repeatedly disposed in the same plane; and a second conductor layer that has a second conductor portion including a conductor having a planar or mesh-like second basic pattern repeatedly disposed in the same plane, and a third conductor portion including a conductor having a planar, linear, or mesh-shaped third basic pattern repeatedly disposed in the (Continued)

same plane. The repeating cycles of the first and second basic patterns are substantially the same cycles, and the third basic pattern is different than the second basic pattern. The present technology can be applied to a circuit board of a semiconductor device and the like, for example.

20 Claims, 125 Drawing Sheets

(58) Field of Classification Search
CPC ..... H01L 27/14603; H01L 2224/16145; H01L 2224/48227; H01L 2224/73257; H01L 2924/15311; H01L 2924/181; H01L 27/146; H04N 25/60; H04N 25/70; H05K 1/02; H05K 1/0216
See application file for complete search history.

(56) References Cited

U.S. PATENT DOCUMENTS

| | | | |
|---|---|---|---|
| 2017/0133425 | A1 | 5/2017 | Shigenami et al. |
| 2017/0199412 | A1 | 7/2017 | Suto et al. |
| 2017/0308192 | A1 | 10/2017 | Ogura |
| 2018/0131646 | A1 | 5/2018 | Miyamoto et al. |
| 2019/0053406 | A1 | 2/2019 | Tezuka |

FOREIGN PATENT DOCUMENTS

| | | |
|---|---|---|
| JP | 2003-051543 | 2/2003 |
| JP | 2014-057426 | 3/2014 |
| JP | 2016-218834 | 12/2016 |
| JP | 2017-033279 | 2/2017 |
| WO | WO 2013/115075 | 8/2013 |
| WO | WO 2015/198913 | 12/2015 |
| WO | WO 2016/181874 | 11/2016 |
| WO | WO 2017/149845 | 9/2017 |

TENTH EXAMPLE CONFIGURATION

SIXTEENTH EXAMPLE CONFIGURATION

CIRCUIT BOARD, SEMICONDUCTOR DEVICE, AND ELECTRONIC APPARATUS

CROSS REFERENCE TO RELATED APPLICATIONS

This application is a national stage application under 35 U.S.C. 371 and claims the benefit of PCT Application No. PCT/JP2019/009243 having an international filing date of 8 Mar. 2019, which designated the United States, which PCT application claimed the benefit of Japanese Patent Application No. 2018-056247 filed 23 Mar. 2018, the entire disclosures of each of which are incorporated herein by reference.

TECHNICAL FIELD

The present technology relates to a circuit board, a semiconductor device, and an electronic apparatus, and more particularly, to a circuit board, a semiconductor device, and an electronic apparatus that are capable of reducing generation of noise in signals more effectively.

BACKGROUND ART

In a solid-state imaging device represented by a complementary metal oxide semiconductor (CMOS) image sensor, noise might occur in pixel signals generated by the respective pixels due to as internal configuration of the solid-state imaging device.

For example, some active elements such as transistors and diodes existing in the solid-state imaging device cause minute hot carrier light emission. In a case where this hot carrier light emission leaks into the photoelectric conversion portions formed in the pixels, noise is generated in the pixel signals.

As a method for reducing noise to be caused by hot carrier light emission caused by active elements, there is a known technique by which wiring lines formed between the active elements and the photoelectric conversion portion are made to have a light blocking structure (see Patent Document 1, for example).

Further, noise (inductive noise) might occur in pixel signals due to an induced electromotive force generated by a magnetic field derived from the internal configuration of a solid-state imaging device, for example. Specifically, a conductor loop is formed on the pixel array, and the conductive loop is formed with a control line for transmitting a control signal for selecting the pixel from which a pixel signal is to be read when a pixel signal is to be read from a certain pixel, and a signal line through which the pixel signal read from the selected pixel is transmitted.

Further, if a wire line exists in the vicinity of the conductor loop formed with the control line and the signal line, a magnetic flux passing through the conductor loop is generated by a change in the current flowing in the wiring line, which might cause an induced electromotive force in the conductor loop and generate inductive noise in a pixel signal. Hereinafter, a conductor loop in which a magnetic flux is generated by a change in the current flowing in a nearby wiring line, and an induced electromotive force is generated as a result will be referred to as a victim conductor loop.

As a method for reducing inductive noise in an electronic apparatus, there is a method for canceling out a generated magnetic flux by including a two-layered mesh wiring line as the wiring line that is the cause of a magnetic flux in a conventional electronic apparatus (see Patent Document 2, for example).

CITATION LIST

Patent Documents

Patent Document 1: WO 2013/115075

Patent Document 2: Japanese Patent Application Laid-Open No. 2014-57426

SUMMARY OF THE INVENTION

Problems to be Solved by the Invention

However, according to the invention disclosed in Patent Document 2 mentioned above, inductive noise can be reduced, but Patent Document 2 does not teach blocking the hot carrier light emission.

The present technology has been developed in view of such circumstances, and is to enable a more effective reduction of generation of noise in signals.

Solutions to Problems

A circuit board according to a first aspect of the present technology is a circuit board that includes: a first conductor layer that has at least a first conductor portion including a conductor of a shape in which a planar or mesh-like first basic pattern is repeatedly disposed in the same plane; and a second conductor layer that has at least a second conductor portion including a conductor of a shape in which a planar or mesh-like second basic pattern is repeatedly disposed in the same plane, and a third conductor portion including a conductor of a shape in which a planar, linear, or mesh-shaped third basic pattern is repeatedly disposed in the same plane. In the circuit board, the repeating cycle of the first basic pattern and the repeating cycle of the second basic pattern are substantially the same cycles, and the third basic pattern has a different shape from the second basic pattern.

A semiconductor device according to a second aspect of the present technology is a semiconductor device that includes a circuit board, the circuit board including: a first conductor layer that has at least a first conductor portion including a conductor of a shape in which a planar or mesh-like first basic pattern is repeatedly disposed in the same plane; and a second conductor layer that has at least a second conductor portion including a conductor of a shape in which a planar or mesh-like second basic pattern is repeatedly disposed in the same plane, and a third conductor portion including a conductor of a shape in which a planar, linear, or mesh-shaped third basic pattern is repeatedly disposed in the same plane. In the circuit board, the repeating cycle of the first basic pattern and the repeating cycle of the second basic pattern are substantially the same cycles, and the third basic pattern has a different shape from the second basic pattern.

An electronic apparatus according to a third aspect of the present technology is an electronic apparatus that includes a semiconductor device including a circuit board, the circuit board including: a first conductor layer that has at least a first conductor portion including a conductor of a shape in which a planar or mesh-like first basic pattern is repeatedly disposed in the same plane; and a second conductor layer that has at least a second conductor portion including a conductor of a shape in which a planar or mesh-like second basic pattern is repeatedly disposed in the same plane, and a third conductor portion including a conductor of a shape in which a planar, linear, or mesh-shaped third basic pattern is repeatedly disposed in the same plane. In the circuit board, the repeating cycle of the first basic pattern and the repeating cycle of the second basic pattern are substantially the same cycles, and the third basic pattern has a different shape from the second basic pattern.

In the first through third aspects of the present technology, a first conductor layer that has at least a first conductor portion including a conductor of a shape in which a planar or mesh-like first basic pattern is repeatedly disposed in the same plane, and a second conductor layer that has at least a second conductor portion including a conductor of a shape in which a planar or mesh-like second basic pattern is repeatedly disposed in the same plane, and a third conductor portion including a conductor of a shape in which a planar, linear, or mesh-shaped third basic pattern is repeatedly disposed in the same plane are provided. The repeating cycle of the first basic pattern and the repeating cycle of the second basic pattern are substantially the same cycles, and the third basic pattern has a different shape from the second basic pattern.

The circuit board, the semiconductor device, and the electronic apparatus may be independent devices, or may be modules to be incorporated into other apparatuses.

Effects of the Invention

According to the first through third aspects of the present technology, it is possible to reduce generation of noise in signals.

Note that effects of the present technology are not limited to the effects described herein, and may include any of the effects described in the present disclosure.

BRIEF DESCRIPTION OF DRAWINGS

FIG. 120 is a block diagram showing an example configuration of an imaging apparatus.

FIG. 121 is a block diagram schematically showing an example configuration of an in-vivo information acquisition system.

FIG. 122 is a diagram schematically showing an example configuration of an endoscopic surgery system.

FIG. 123 is a block diagram showing an example of the functional configurations of a camera head and a CCU.

FIG. 124 is a block diagram schematically showing an example configuration of a vehicle control system.

FIG. 125 is an explanatory diagram showing an example of installation positions of external information detectors and imaging units.

MODES FOR CARRYING OUT THE INVENTION

Figure 1:
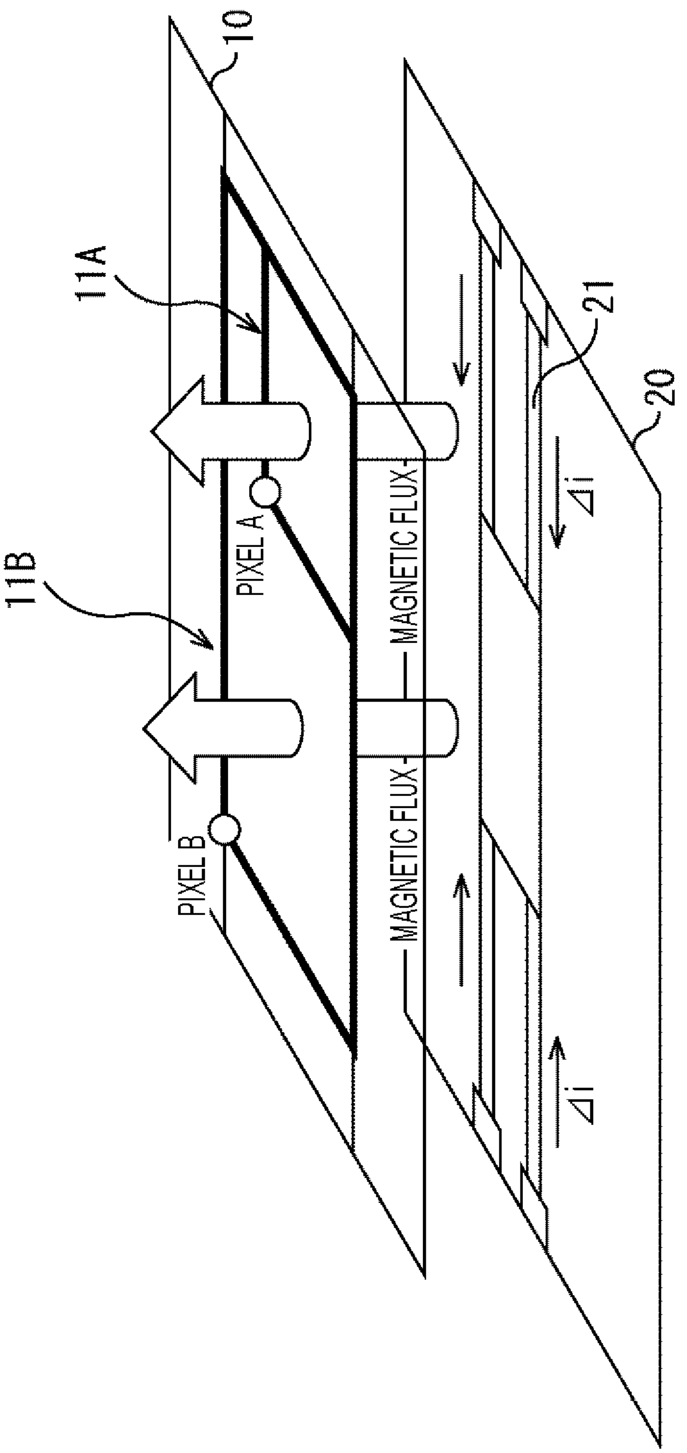
FIG. 1 is a diagram for explaining changes in induced electromotive force due to changes in a conductor loop.

The following is a detailed description of the best modes for carrying out the present technology (these modes will be hereinafter referred to as embodiments), with reference to the drawings. Note that explanation will be made in the following order.

1. Victim conductor loop and magnetic flux
2. Example configuration of a solid-state imaging device (a semiconductor device) according to an embodiment of the present technology
3. Light blocking structure against hot carrier light emission
4. Example configurations of conductor layers A and B constituting a light blocking structure 151
5. Example layouts of electrodes in the semiconductor substrate in which the conductor layers A and B are formed
6. Modifications of example configurations of the conductor layers A and B
7. Modifications of mesh conductors
8. Various effects
9. Example configurations in which extension portions differ
10. Example configurations of connections with pads
11. Example positions of conductive shields
12. Example applications
13. Example configuration of an imaging apparatus
14. Example application to an in-vivo information acquisition system
15. Example application to an endoscopic surgery system
16. Example applications to mobile structures <1. Victim Conductor Loop and Magnetic Flux>

For example, in a case where a circuit having a victim conductor loop formed therein exists in the vicinity of a power-supply wiring line in a solid-state imaging device (a semiconductor device) such as a CMOS image sensor, when there is a change in the magnetic flux passing in the loop plane of the victim conductor loop, the induced electromotive force generated in the victim conductor loop might change, causing noise in a pixel signal. Note that the victim conductor loop may be formed so as to include a conductor in at least a portion thereof. Further, the entire victim conductor loop may be formed with a conductor.

Here, the victim conductor loop (a first conductor loop) is a conductor loop on the side that is affected by a change in the intensity of magnetic field generated in the vicinity. On the other hand, a conductor loop that exists in the vicinity of the victim conductor loop, causes a change in the intensity of magnetic field with a change in the flowing current, and is on the side that affects the victim conductor loop is called the aggressor conductor loop (a second conductor loop).

FIG. 1 is a diagram for explaining changes in induced electromotive force due to changes in a victim conductor loop. For example, a solid-state imaging device such as a CMOS image sensor shown in FIG. 1 is formed by stacking a pixel substrate 10 and a logic substrate 20 in this order from the top. In the solid-state imaging device shown in FIG. 1, at least part of a victim conductor loop 11 (11A or 11B) is formed in the pixel region of the pixel substrate 10, and a power-supply wiring line 21 for supplying a (digital) power source is formed in the vicinity of the victim conductor loop 11 on the logic substrate 20 stacked on the pixel substrate 10.

In the loop plane of the victim conductor loop 11 on the pixel substrate 10, the magnetic flux generated by the power-supply wiring line 21 then passes, to generate an induced electromotive force in the victim conductor loop 11.

Note that the induced electromotive force Vemf generated in the victim conductor loop 11 can be calculated according to the equations (1) and (2) shown below. Note that Φ represents the magnetic flux, H represents the intensity of magnetic field, μ represents the magnetic permeability, and S represents the area of the victim conductor loop 11.

[Mathematical Formula 1]

$$\Phi = \int_S \mu H \cdot dS \tag{1}$$

[Mathematial Formula 2]

$$V_{emf} = -\frac{d\Phi}{dt} \tag{2}$$

The loop path of the victim conductor loop 11 formed in the pixel region of the pixel substrate 10 changes depending on the position of the pixel selected as the read target pixel from which a pixel signal is to be read. In the example case illustrated in FIG. 1, the loop path of the victim conductor loop 11A that is formed when a pixel A is selected differs from the loop path of the victim conductor loop 11B that is formed when a pixel B at a different position from the pixel A is selected. In other words, the effective shape of a conductor loop changes depending on the position of the selected pixel.

When the loop path of the victim conductor loop 11 changes in this manner, the magnetic flux passing through the loop plane of the victim conductor loop changes, which might cause a great change in the induced electromotive force generated in the victim conductor loop. Due to the change in the induced electromotive force, noise (inductive noise) might also be generated in the pixel signal read from the pixel. Because of this inductive noise, striped image noise might also appear in a captured image. That is, the quality of a captured image is degraded some cases.

In view of the above, the present disclosure suggests a technique for reducing generation of inductive noise due to an induced electromotive force in a victim conductor loop.

<2. Example Configuration of a Solid-State Imaging Device (a Semiconductor Device) According to an Embodiment of the Present Technology>

Figure 2:
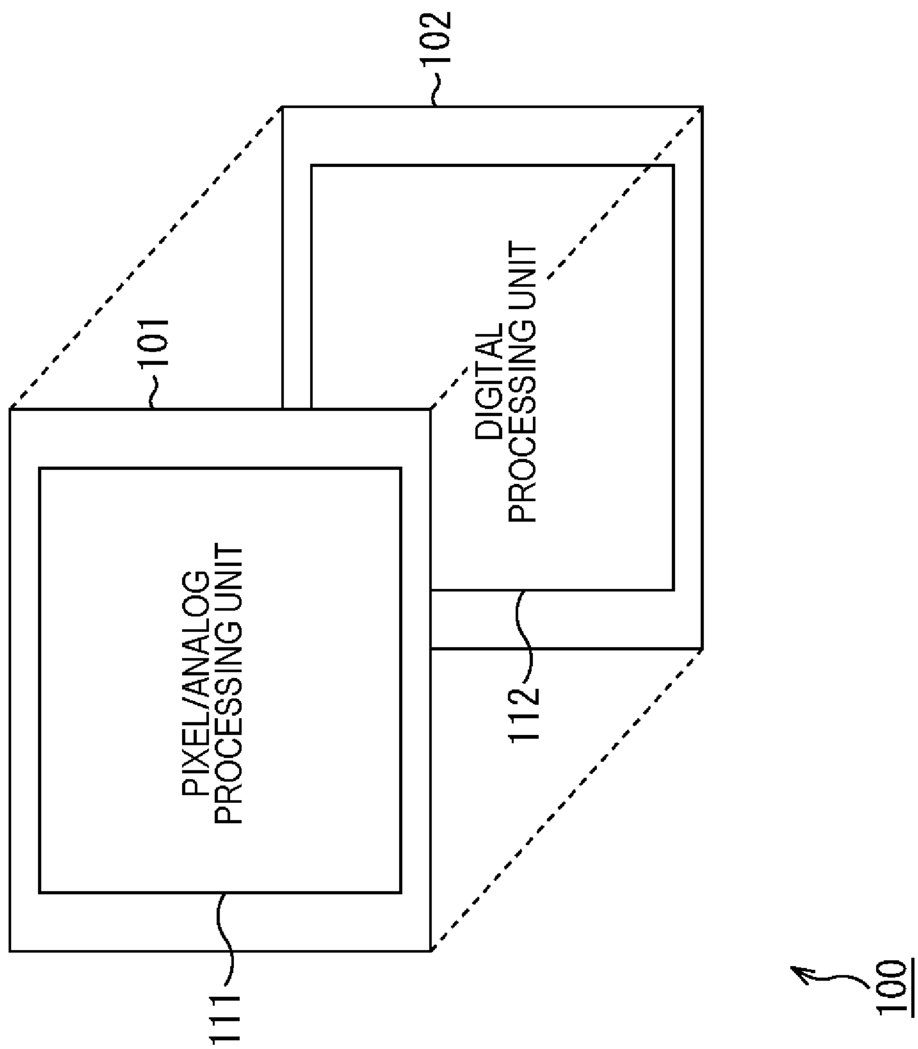
FIG. 2 is a block diagram showing an example configuration of a solid-state imaging device to which the present technology is applied.

FIG. 2 is a block diagram showing a typical example configuration of a solid-state imaging device according to an embodiment of the present technology.

A solid-state imaging device 100 shown in FIG. 2 is a device that photoelectrically converts light from an object and outputs the light as image data. For example, the solid-state imaging device 100 is designed as a back-illuminated CMOS image sensor using CMOS, or the like.

As shown in FIG. 2, the solid-state imaging device 100 is formed by stacking a first semiconductor substrate 101 and a second semiconductor substrate 102.

In the first semiconductor substrate 101, a pixel/analog processing unit 111 including pixels, analog circuits, and the like is formed. In the second semiconductor substrate 102, a digital processing unit 112 including digital circuits and the like is formed.

The first semiconductor substrate 101 and the second semiconductor substrate 102 are overlapped with each other while being insulated from each other. That is, the components of the pixel/analog processing unit 111 are basically insulated from the components of the second semiconductor substrate 102. Although not shown in the drawing, (the relevant ones of) the components formed in the pixel/analog processing unit 111 and (the relevant ones of) the components formed in the digital processing unit 112 are electrically connected to each other, as necessary, by conductor vias (VIAs), through silicon vias (TSVs), homogenous metal bonding such as Cu—Cu bonding, Au—Au bonding, or Al—Al bonding, dissimilar metal bonding such as Cu—Au bonding, Cu—Al bonding, or Au—Al bonding, bonding wires, or the like, for example.

Note that the solid-state imaging device 100 including the two stacked substrates has been described as an example, with reference to FIG. 2. However, the number of stacked substrates constituting the solid-state imaging device 100 may be any appropriate number. For example, a single layer, or three or more layers may constitute the solid-state imaging device 100. In the description below, a case where the solid-state imaging device 100 is formed with two substrates as in the example illustrated in FIG. 2 will be described.

Figure 3:
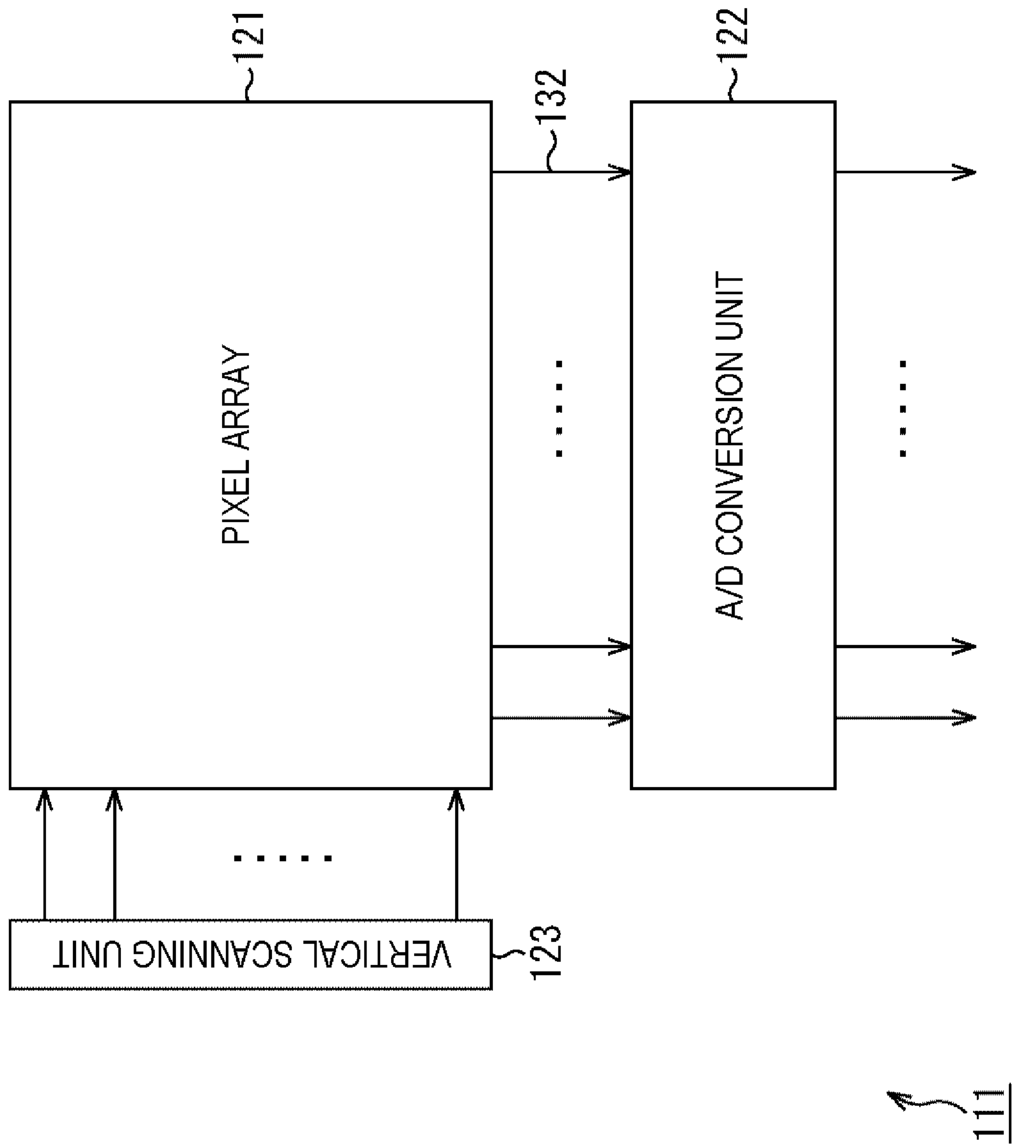
FIG. 3 is a block diagram showing an example of the principal components of a pixel/analog processing unit.

FIG. 3 is a block diagram showing an example of the principal components formed in the pixel/analog processing unit 111.

As shown in FIG. 3, a pixel array 121, an A/D conversion unit 122, a vertical scanning unit 123, and the like are formed in the pixel/analog processing unit 111.

In the pixel array 121, a plurality of pixels 131 (FIG. 4) each including a photoelectric conversion element such as a photodiode is arranged vertically and horizontally.

The A/D conversion unit 122 performs A/D conversion on an analog signal or the like read from each pixel 131 of the pixel array 121, and outputs the resultant digital pixel signal.

The vertical scanning unit 123 controls operation of the transistors (a transfer transistor 142 and the like in FIG. 5) of each pixel 131 of the pixel array 121. That is, the electric charge stored in each pixel 131 of the pixel array 121 is read under the control of the vertical scanning unit 123, and is supplied as a pixel signal to the A/D conversion unit 122 via a signal line 132 (FIG. 4) for each column of the unit pixel. The pixel signal is then subjected to A/D conversion.

The A/D conversion unit 122 supplies the A/D conversion result (a digital pixel signal) to a logic circuit (not shown) formed in the digital processing unit 112 for each column of the pixels 131.

Figure 4:
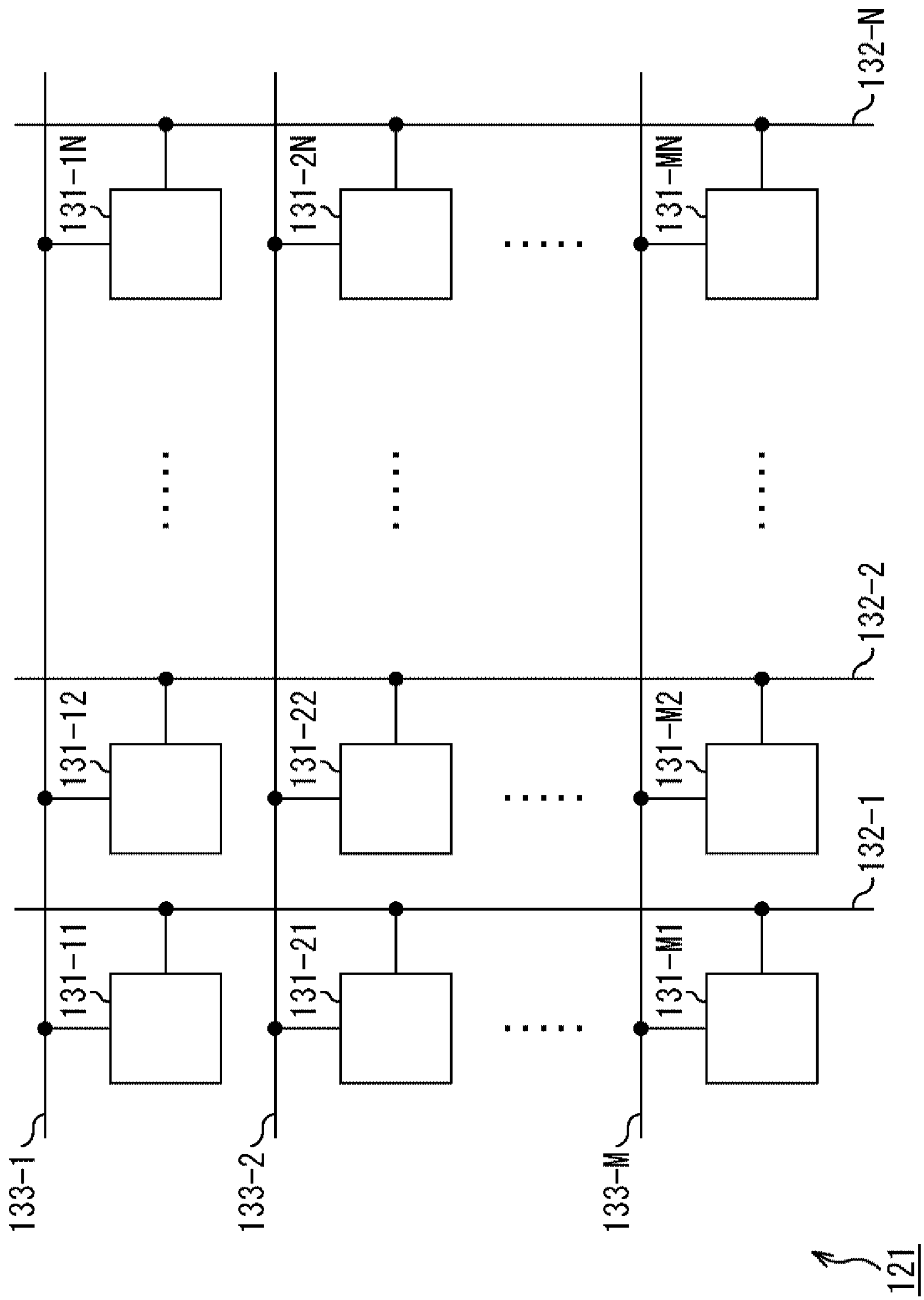
FIG. 4 is a diagram showing a specific example configuration of a pixel array.

FIG. 4 is a diagram showing a specific example configuration of the pixel array 121. Pixels 131-11 through 131-MN are formed in the pixel array 121 (M and N being any appropriate natural numbers). In other words, M rows and N columns of pixels 131 are arranged in a matrix (an array) in the pixel array 121. In the description below, the pixels 131-11 through 131-MN will be referred to as the pixels 131, unless there is the need to distinguish the pixels 131 from one another.

In the pixel array 121, signal lines 132-1 through 132-N and control lines 133-1 through 133-M are formed. Hereinafter, in a case where there is no need to distinguish the signal lines 132-1 through 132-N from one another, the signal lines 132-1 through 132-N will be referred to as the signal lines 132. In a case where there is no need to distinguish the control lines 133-1 through 133-M from one another, the control lines 133-1 through 133-M will be referred to as the control lines 133.

The signal lines 132 corresponding to the respective columns are connected to the pixel 131 column by column. Further, the control lines 133 corresponding to the respective rows are connected to the pixels 131 row by row. A control signal from the vertical scanning unit 123 is transmitted to the pixels 131 via the control lines 133.

From the pixels 131, analog pixel signals are output to the A/D conversion unit 122 via the signal lines 132.

Figure 5:
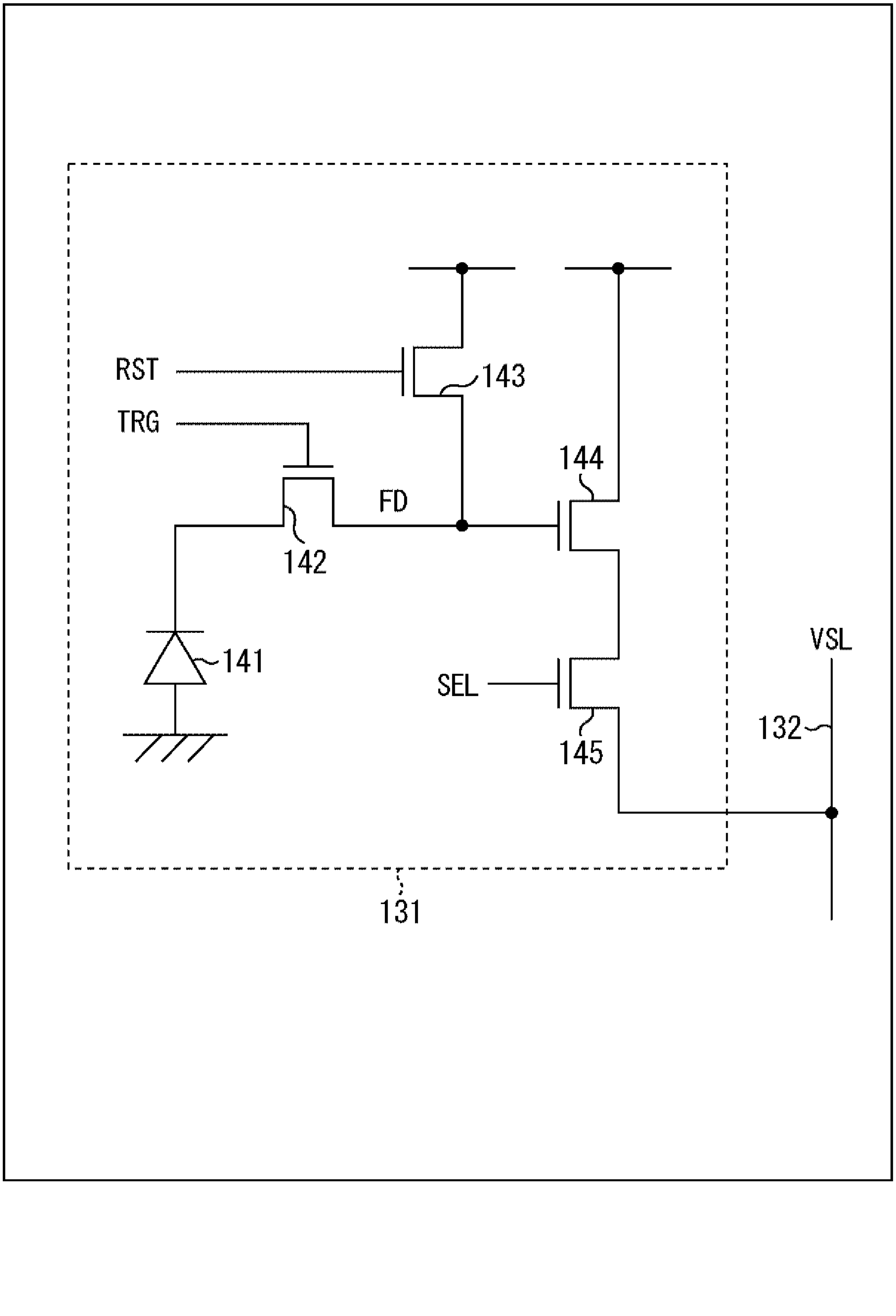
FIG. 5 is a circuit diagram showing an example configuration of a pixel.

Next, FIG. 5 is a circuit diagram showing an example configuration of a pixel 131. The pixel 131 includes a photodiode 141 as a photoelectric conversion element, a transfer transistor 142, a reset transistor 143, an amplification transistor 144, and a select transistor 145.

The photodiode 141 photoelectrically converts received light into photocharge (photoelectrons) of the charge quantity corresponding to the quantity of the received light, and stores the photocharge. The anode electrode of the photodiode 141 is connected to GND, and the cathode electrode is connected to a floating diffusion (FD) via the transfer transistor 142. It is of course possible to adopt a method by which the cathode electrode of the photodiode 141 is connected to the power supply, the anode electrode is connected to the floating diffusion via the transfer transistor 142, and the photocharges are read as photoholes.

The transfer transistor 142 controls reading of photocharges from the photodiode 141. The transfer transistor 142 has its drain electrode connected to the floating diffusion, and its source electrode connected to the cathode electrode of the photodiode 141. Further, a transfer control line for transmitting a transfer control signal TRG supplied from the vertical scanning unit 123 (FIG. 3) is connected to the gate electrode of the transfer transistor 142. When the transfer control signal TRG (which is the gate potential of the transfer transistor 142) in an off-state, transfer of the photocharges from the photodiode 141 is not performed (the photocharges are stored in the photodiode 141). When the transfer control signal TRG (which is the gate potential of the transfer transistor 142) is in an on-state, the photocharges stored in the photodiode 141 are transferred to the floating diffusion.

The reset transistor 143 resets the potential of the floating diffusion. The reset transistor 143 has its drain electrode connected to the power-supply potential, and its source electrode connected to the floating diffusion. Further, a reset control line for transmitting a reset control signal RST supplied from the vertical scanning unit 123 is connected to the gate electrode of the reset transistor 143. When the reset control signal RST (which is the gate potential of the reset transistor 143) is in an off-state, the floating diffusion is cut off from the power-supply potential. When the reset control signal RST (which is the gate potential of the reset transistor 143) is in an on-state, the electric charges of the floating diffusion are released to the power-supply potential, and the floating diffusion is reset.

The amplification transistor 144 outputs an electrical signal (an analog signal) corresponding to the voltage of the floating diffusion (or applies a current). The amplification transistor 144 has its gate electrode connected to the floating diffusion, its drain electrode connected to the (source-follower) power-supply voltage, and its source electrode connected to the drain electrode of the select transistor 145. For example, the amplification transistor 144 outputs a reset signal (a reset level) as an electrical signal corresponding to the voltage of the floating diffusion reset by the reset transistor 143, as a pixel signal to the select transistor 145. Alternatively, the amplification transistor 144 outputs a light accumulation signal (a signal level) as an electrical signal corresponding to the voltage of the floating diffusion to which photocharges have been transferred by the transfer transistor 142, as a pixel signal to the select transistor 145.

The select transistor 145 controls outputting of an electrical signal supplied from the amplification transistor 144 to the signal line (VSL) 132 (or the A/D conversion unit 122). The select transistor 145 has its drain electrode connected to the source electrode of the amplification transistor 141, and its source electrode connected to the signal line 132. Further, a select control line for transmitting a select control signal SEL supplied from the vertical scanning unit 123 is connected to the gate electrode of the select transistor 145. When the select control signal SEL (which is the gate potential of the select transistor 145) is in an off-state, the amplification transistor 144 and the signal line 132 are electrically cut off from each other. Therefore, in this state, the pixel 131 outputs neither a reset signal nor a light accumulation signal as a pixel signal. When the select control signal SEL (which is the gate potential of the select transistor 145) is in an on-state, the pixel 131 is in a selected state. That is, the amplification transistor 144 and the signal line 132 are electrically connected, and a reset signal or a light accumulation signal as a pixel signal output from the amplification transistor 144 is supplied to the A/D conversion unit 122 via the signal line 132. In other words, a reset signal or a light accumulation signal as a pixel signal is read from the pixel 131.

Note that a pixel 131 may have any appropriate configuration, and does not necessarily have the example configuration shown in FIG. 5.

In the pixel/analog processing unit 111 designed as described above, when a pixel 131 is selected as a target from which an analog signal as a pixel signal is to be read, the control line 133 for controlling the various transistors described above, the signal line 132, a power-supply wiring line (an analog power-supply wiring line or a digital power-supply wiring line), and the like constitute various victim conductor loops (conductors in a loop-like (ring-like) form). As a magnetic flux generated from the nearby wiring line and the like passes in the loop plane of the victim conductor loop, an induced electromotive force is generated.

The victim conductor loop is only required to include at least part of one wiring line of the control line 133 or the signal line 132. Alternatively, a victim conductor loop including part of the control line 133, and a victim conductor loop including part of the signal line 132 may exist as victim conductor loops independent of each other. Further, part or all of the victim conductor loop may be included in the second semiconductor substrate 102. Further, the victim conductor loop may have a variable loop path or a fixed loop path.

The wiring directions of the control line 133 and the signal line 132 constituting the victim conductor loop are preferably substantially orthogonal to each other, but may be substantially parallel to each other.

Note that a conductor loop existing in the vicinity of another conductor loop can be a victim conductor loop. For example, even if a change is caused in the intensity of magnetic field by a change in the current flowing in a nearby aggressor loop, even a conductor loop that is not affected can be a victim conductor loop.

In a victim conductor loop, when a radio-frequency signal flows in the wiring lines (an aggressor conductor loop) existing in the vicinity of the victim conductor loop, and the intensity of magnetic field around the aggressor conductor loop changes, an induced electromotive force is generated in the victim conductor loop by the influence, and noise is generated in the victim conductor loop in some cases. Particularly, in a case where wiring lines in which currents flow in the same directions as one another exist at a high density in the vicinity of the victim conductor loop, the change in the intensity of magnetic field becomes greater, and the induced electromotive force (which is noise) generated in the victim conductor loop also becomes greater.

Therefore, in the present disclosure, the direction of the magnetic flux generated from the loop plane of an aggressor conductor loop is adjusted so that the magnetic field does not pass through the aggressor conductor loop.

<3. Light Blocking Structure Against Hot Carrier Light Emission>

Figure 6:
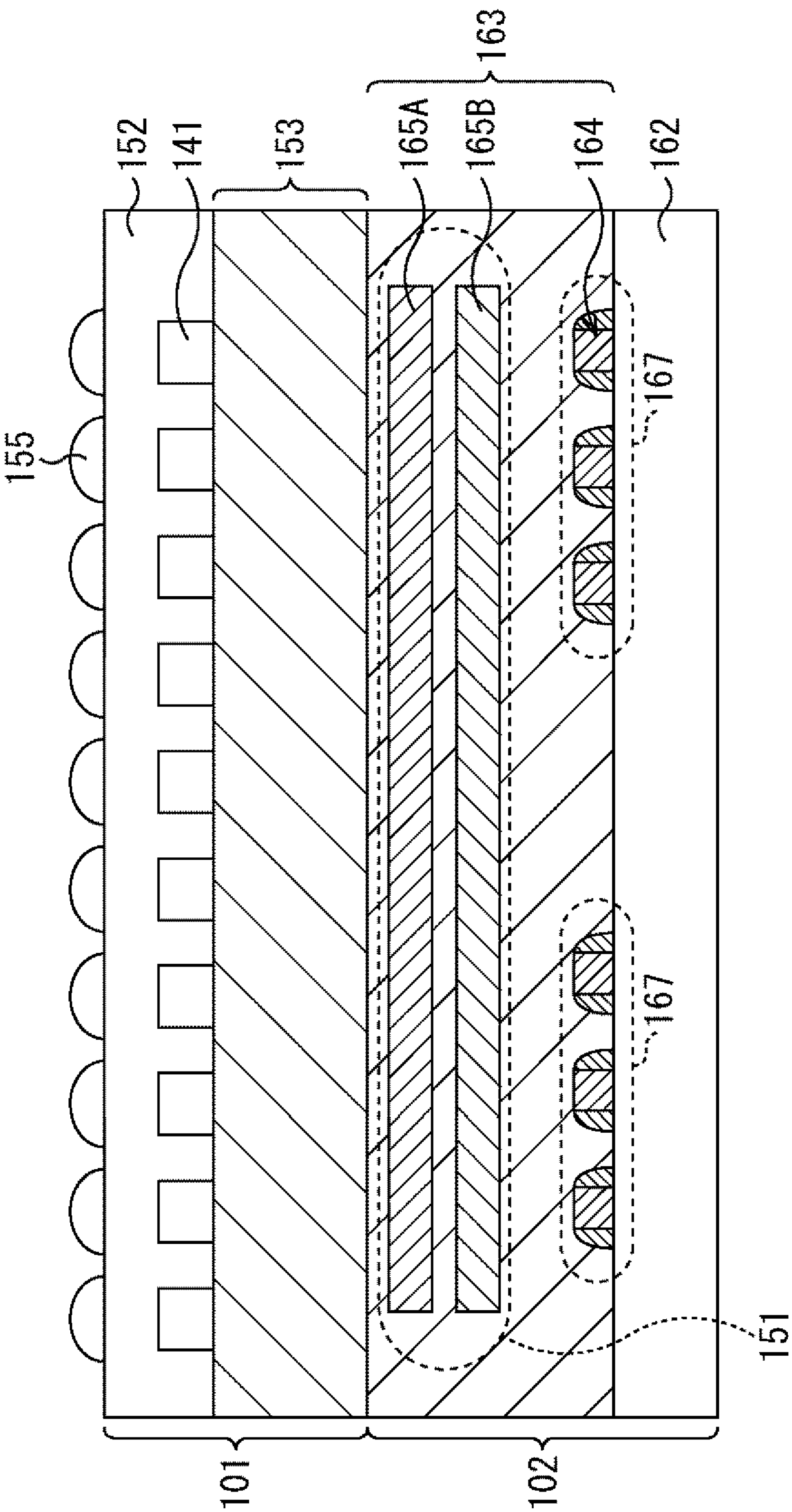
FIG. 6 is a block diagram showing an example cross-section structure of the solid-state imaging device.

FIG. 6 is a diagram showing an example cross-section structure of the solid-state imaging device 100.

As described above, the solid-state imaging device 100 is formed by stacking the first semiconductor substrate 101 and the second semiconductor substrate 102.

In the first semiconductor substrate 101, a pixel array in which a plurality of pixel units each including a photodiode 141 serving as a photoelectric conversion portion and a plurality of pixel transistors (the transfer transistor 142 through the select transistor 145 shown in FIG. 5) is two-dimensionally arranged is formed, for example.

Each photodiode 141 is designed to have an n-type semiconductor region and a p-type semiconductor region on the substrate surface side (the lower side in the drawing) in a well region formed in a semiconductor base 152, for example. A plurality of pixel transistors (the transfer transistor 142 through the select transistor 145 shown in FIG. 5) is formed on the semiconductor base 152.

On the front surface side of the semiconductor base 152, a multilayer wiring layer 153 in which a plurality of layers of wiring lines is disposed via an interlayer insulating film is formed. The wiring lines are formed with copper wiring lines, for example. In the pixel transistors, the vertical scanning unit 123, and the like, the wiring lines of different wiring layers are connected to one another at required locations by connection conductors penetrating the wiring layers. On the back surface (the surface on the upper side in the drawing) of the semiconductor base 152, an antireflection film, a light blocking film that blocks light from entering a predetermined region, and optical members 155 such as color filters and microlenses provided at the positions corresponding to the respective photodiodes 141 are formed, for example.

Meanwhile, a logic circuit as the digital processing unit 112 (FIG. 2) is formed in the second semiconductor substrate 102. The logic circuit includes a plurality of MOS transistors 164 formed in a p-type semiconductor well region of a semiconductor base 162, for example.

Further, a multilayer wiring layer 163 including a plurality of wiring layers in which wiring lines are disposed via an interlayer insulating film is formed on the semiconductor base 162. In FIG. 6, two wiring layers (wiring layers 165A and 165B) of the plurality of wiring layers constituting the multilayer wiring layer 163 are shown.

In the solid-state imaging device 100, the wiring layer 165A and the wiring layer 165B constitute a light blocking structure 151.

Here, in the second semiconductor substrate 102, the region in which active elements such as the MOS transistors 164 are formed is set as an active element group 167. In the second semiconductor substrate 102, a circuit for realizing one function by combining a plurality of active elements such as nMOS transistors and pMOS transistors is formed, for example. Further, the region in which the active element group 167 is formed is a circuit block (corresponding to circuit blocks 202 through 204 shown in FIG. 7). Note that, in addition to the MOS transistors 164, there exist diodes and the like as active elements formed in the second semiconductor substrate 102.

Further, in the multilayer wiring layer 163 of the second semiconductor substrate 102, the light blocking structure 151 including the wiring layer 165A and the wiring layer 165B exists between the active element group 167 and the photodiodes 141, so that hot carrier light emission generated from the active element group 167 is prevented from leaking into the photodiodes 141 (this will be described later in detail).

Hereinafter, between the wiring layer 165A and the wiring layer 165B constituting the light blocking structure 151, the wiring layer 165A closer to the first semiconductor substrate 101 in which the photodiodes 141 and the like are formed will be referred to as the conductor layer A (the first conductor layer). Also, the wiring layer 165B closer to the active element group 167 will be referred to as the conductor layer B (the second conductor layer).

However, the wiring layer 165A closer to the first semiconductor substrate 101 in which the photodiodes 141 and the like are formed may be the conductor layer B, and the wiring layer 165B closer to the active element group 167 may be the conductor layer A. Further, an insulating layer, a semiconductor layer, another conductor layer, or the like may be disposed between the conductor layers A and B. An insulating layer, a semiconductor layer, another conductor layer, or the like may also be disposed at a position other than between the conductor layers A and B.

The conductor layer A and the conductor layer B are preferably conductor layers in which current flows most easily in the circuit board, the semiconductor substrates, or the electronic apparatus, but are not necessarily such conductor layers.

One of the conductor layers A and B is preferably the conductor layer in which current flows most easily in the circuit board, the semiconductor substrates, or the electronic apparatus, and the other one is preferably the conductor layer in which current flows second most easily in the circuit board, the semiconductor substrates, or the electronic apparatus. However, the conductor layers A and B are not necessarily such conductor layers.

One of the conductor layers A and B is preferably not the conductor layer most difficult for current to flow therein in the circuit board, the semiconductor substrates, or the electronic apparatus, but the conductor layers A and B are not necessarily such conductor layers. Both the conductor layers A and B are preferably not the conductor layers most difficult for current to flow therein in the circuit board, the semiconductor substrates, or the electronic apparatus, but the conductor layers A and B are not necessarily such conductor layers.

For example, one of the conductor layers A and B may be the conductor layer in which current flows most easily in the first semiconductor substrate 101, and the other one may be the conductor layer in which current flows second most easily in the first semiconductor substrate 101.

For example, one of the conductor layers A and B may be the conductor layer in which current flows most easily in the second semiconductor substrate 102, and the other one may be the conductor layer in which current flows second most easily in the second semiconductor substrate 102.

For example, one of the conductor layers A and B may be the conductor layer in which current flows most easily in the first semiconductor substrate 101, and the other one may be the conductor layer in which current flows most easily in the second semiconductor substrate 102.

For example, one of the conductor layers A and B may be the conductor layer in which current flows most easily in the first semiconductor substrate 101, and the other one may be the conductor layer in which current flows second most easily in the second semiconductor substrate 102.

For example, one of the conductor layers A and B may be the conductor layer in which current flows second most easily in the first semiconductor substrate 101, and the other one may be the conductor layer in which current flows most easily in the second semiconductor substrate 102.

For example, one of the conductor layers A and B may be the conductor layer in which current flows second most easily in the first semiconductor substrate 101, and the other one may be the conductor layer in which current flows second most easily in the second semiconductor substrate 102.

For example, one of the conductor layers A and B does not have to be the conductor layer most difficult for current to flow therein in first semiconductor substrate 101 or the second semiconductor substrate 102.

For example, both the conductor layer A and the conductor layer B do not have to be the conductor layers most difficult for current to flow therein in the first semiconductor substrate 101 or the second semiconductor substrate 102.

Note that the above "most" can be replaced with "third most", "fourth most", or "Nth most" (N being a positive integer), and "second most" can be replaced with "third most", "fourth most", or "Nth most" (N being a positive integer).

Note that a conductor layer in which current easily flows in the circuit board, the semiconductor substrates, or the electronic apparatus as described above may be regarded as a conductor layer in which current easily flows in the circuit board, a conductor layer in which current easily flows in the semiconductor substrates, or a conductor layer in which current easily flows in the electronic apparatus. Also, a conductor layer difficult for current to flow therein in the circuit board, the semiconductor substrates, or the electronic apparatus as described above may be regarded as a conductor layer difficult for current to flow therein in the circuit board, a conductor layer difficult for current to flow therein in the semiconductor substrates, or a conductor layer difficult for current to flow therein in the electronic apparatus. Alternatively, a conductor layer in which current flows easily can be replaced with a conductor layer having a low sheet resistance, and a conductor layer in which current does not easily flows can be replaced with a conductor layer having a high sheet resistance.

Note that the principal material of the conductor used as the conductor layers A and B is a metal such as copper, aluminum, tungsten, chromium, nickel, tantalum, molybdenum, titanium, gold, silver, or iron, or a mixture, a compound, or an alloy containing at least one of these metals. A semiconductor such as silicon, germanium, a compound semiconductor, or an organic semiconductor may also be included. Further, an insulator such as cotton, paper, polyethylene, polyvinyl chloride, natural rubber, polyester, epoxy resin, melamine resin, phenol resin, polyurethane, synthetic resin, mica, asbestos, glass fiber, or porcelain may also be included.

The conductor layers A and B constituting the light blocking structure 151 can become an aggressor conductor loops when current is applied thereto.

Next, the region (the light-blocking target region) to be protected from light by the light blocking structure 151 is described.

Figure 7:
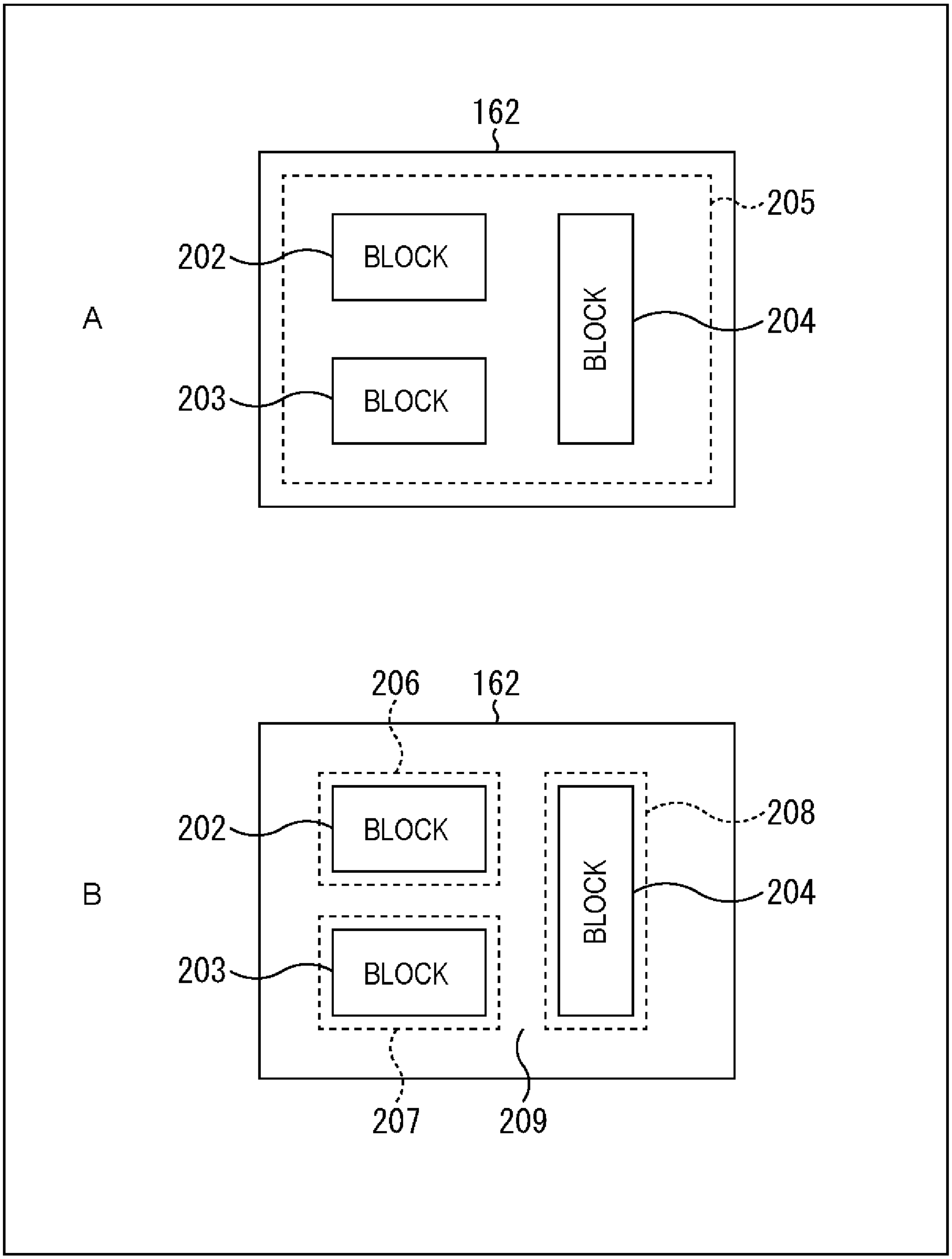
FIG. 7 is a schematic configuration diagram showing an example planar layout of circuit blocks formed with regions in which an active element group is formed.

FIG. 7 is a schematic configuration diagram showing an example planar layout of circuit blocks formed with regions in which the active element group 167 is formed in the semiconductor base 162.

A of FIG. 7 is an example case where a plurality of circuit blocks 202 through 204 is collectively set as the light-blocking target region to be protected by the light blocking structure 151, and a region 205 including all the circuit blocks 202, 203, and 204 is the light blocking target region.

B of FIG. 7 is an example case where the plurality of circuit blocks 202 through 204 is individually set as the light-blocking target regions to be protected by the light blocking structure 151, and regions 206, 207, and 208 including the circuit blocks 202, 203, and 204, respectively, are the individual light-blocking target regions, while the region 209 other than the regions 206 through 208 is the non-light-blocking target region.

In the example case shown in B of FIG. 7, it is possible to avoid restrictions on the freedom of layout of the conductor layers A and B constituting the light blocking structure 151. However, the layout of the conductor layers A and B becomes complicated, and therefore, a great amount of labor is required to design the layout of the conductor layers A and B.

To easily design the layout of the conductor layers A and B constituting the light blocking structure 151, it is preferable to adopt the example shown in A of FIG. 7, and collectively set a plurality of circuit blocks as the light-blocking target region.

In view of this, the present disclosure suggests a structure of the conductor layers A and B whose layout can be easily designed while restrictions on the freedom of layout of the conductor layers A and B are avoided.

Note that, in the light-blocking target region in this embodiment, a buffer region for forming light-blocking target region around the circuit blocks is provided in addition to the circuit blocks representing the region of the active element group 167 serving as the light source of hot carrier light emission. As the buffer region is provided around the circuit blocks, it is possible to prevent hot carrier light emitted obliquely from the circuit blocks from leaking into the photodiodes 141.

Figure 8:
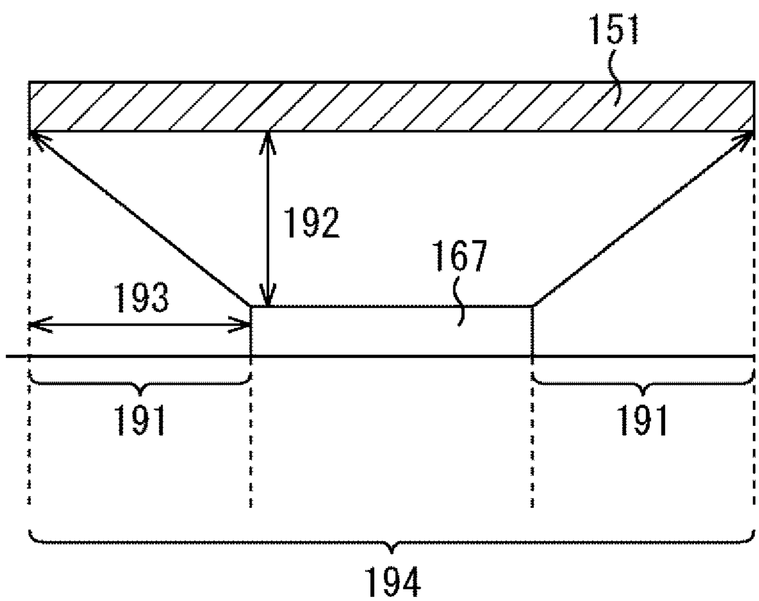
FIG. 8 is a diagram showing an example of the positional relationship between the light-blocking target region protected by a light blocking structure, and the active element group region and a buffer region.

FIG. 8 is a diagram showing an example of the positional relationship between the light-blocking target region protected by the light blocking structure 151, and the active element group region and the buffer region.

In the example shown in FIG. 8, the region in which the active element group 167 is formed and a buffer region 191 around the active element group 167 constitute a light-blocking target region 194, and the light blocking structure 151 is formed so as to face the light-blocking target region 194.

Here, the distance from the active element group 167 to the light blocking structure 151 is set as an interlayer distance 192. Also, the distance from an edge portion of the active element group 167 to an edge portion of the light blocking structure 151 with a wiring line is set as a buffer region width 193.

The light blocking structure 151 is formed so that the buffer region width 193 is greater than the interlayer distance 192. This enables blocking of the oblique component of hot carrier light generated as a point light source.

Note that an appropriate value of the buffer region width 193 changes depending on the interlayer distance 192 between the light blocking structure 151 and the active element group 167. For example, in a case where the interlayer distance 192 is long, it is necessary to set a large buffer region 191 so that the oblique component of hot carrier light emission from the active element group 167 can be adequately blocked. In a case where the interlayer distance 192 is short, on the other hand, hot carrier light emission from the active element group 167 can be adequately blocked without a large buffer region 191. Therefore, if the light blocking structure 151 is formed with wiring layers close to the active element group 167 among the plurality of wiring layers constituting the multilayer wiring layer 163, the degree of freedom in the layout of the conductor layers A and B can be increased. However, it is often difficult to form the light blocking structure 151 using the wiring layers close to the active element group 167, because of the layout constraint on the wiring layers close to the active element group 167, for example. According to the present technology, a high degree of freedom in layout can be achieved even in a case where the light blocking structure 151 is formed with wiring layers far from the active element group 167.

<4. Example Configurations of the Conductor Layers A And B Constituting the Light Blocking Structure 151>

In the description below, example configurations of the conductor layer A (the wiring layer 165A) and the conductor layer B (the wiring layer 165B) constituting the light blocking structure 151, which can be an aggressor conductor loop in the solid-state imaging device 100 according to the present technology, will be described. Before that, a comparative example to be compared with the example configurations will be described.

First Comparative Example

Figure 9:
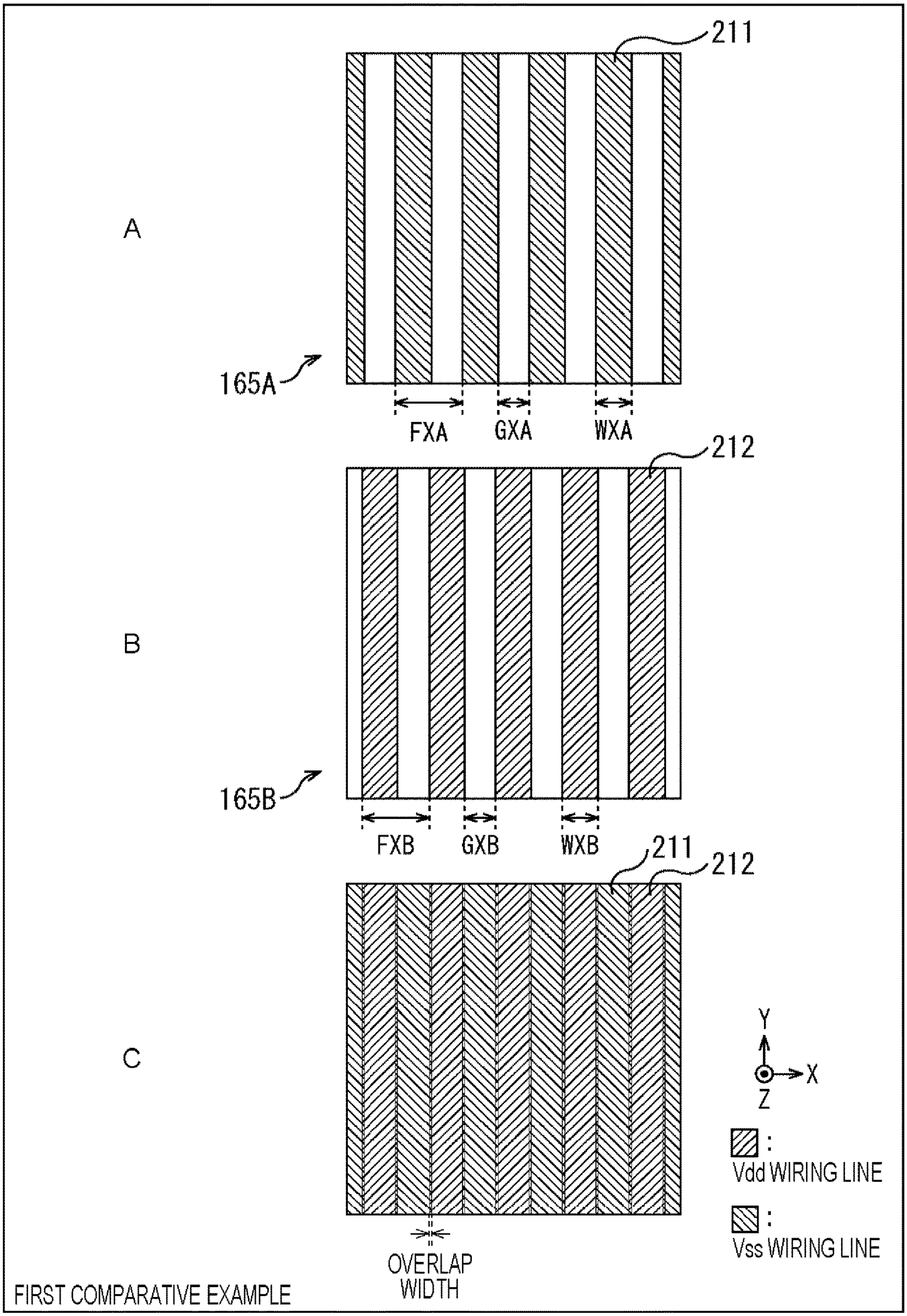
FIG. 9 is a diagram showing a first comparative example of conductor layers A and B.

FIG. 9 is a plan view showing a first comparative example of the conductor layers A and B constituting the light blocking structure 151, for comparison with the plurality of example configurations described later. Note that A of FIG. 9 shows the conductor layer A, and B of FIG. 9 shows the conductor layer B. In the coordinate system in FIG. 9, the horizontal direction is the X-axis, the vertical direction is the Y-axis, and the direction perpendicular to the X-Y plane is the Z-axis.

In the conductor layer A in the first comparative example, linear conductors 211 that are long in the Y direction are cyclically arranged in the X direction with a conductor cycle FXA. Note that the conductor cycle FXA=the conductor width WXA in the X direction+the gap width GXA in the X direction. Each linear conductor 211 is a wiring line (a Vss wiring line) connected to GND or a negative power supply, for example.

In the conductor layer B in the first comparative example, linear conductors 212 that are long in the Y direction are cyclically arranged in the X direction with a conductor cycle FXB. Note that the conductor cycle FXB=the conductor width WXB in the X direction+the gap width GXB in the X direction. Each linear conductor 212 is a wiring line (a Vdd wiring line) connected to a positive power supply, for example. Here, the conductor cycle FXB=the conductor cycle FXA.

Note that the connection destinations of the conductor layers A and B may be switched so that each linear conductor 211 is a Vdd wiring line while each linear conductor 212 is a Vss wiring line.

C of FIG. 9 shows a state in which the conductor layers A and B shown in A and B of FIG. 9 are viewed from the side of the photodiodes 141 (the back surface side). In the first comparative example, in a case where the linear conductors 211 constituting the conductor layer A and the linear conductors 212 constituting the conductor layer B are arranged in an overlapping manner as shown in C of FIG. 9, the linear conductors 211 and 212 are formed so that overlapping portions at which the conductor portions overlap are formed. Thus, hot carrier light emission from the active element group 167 can be adequately blocked. Note that the width of each overlapping portion is also referred to as the overlap width.

Figure 10:
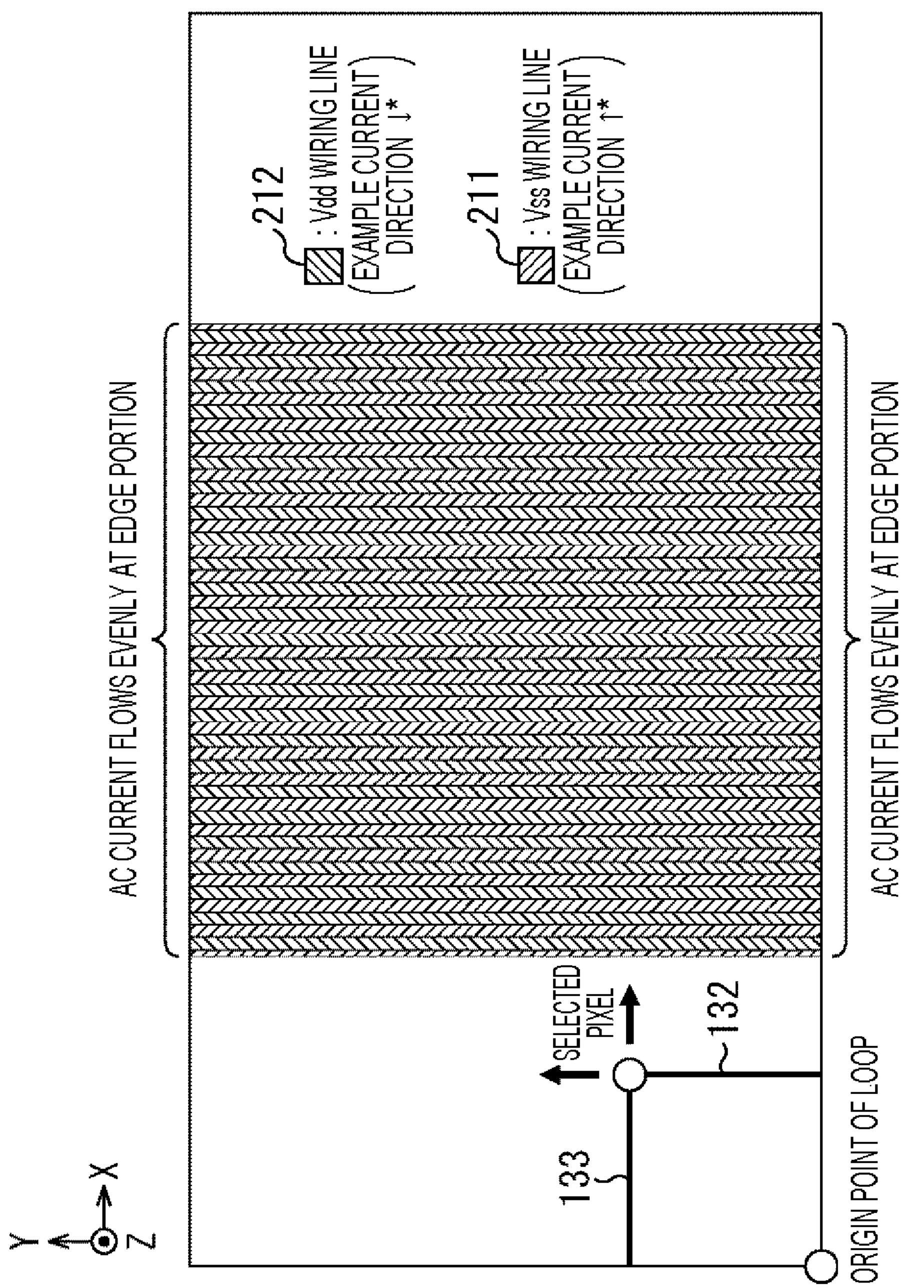
FIG. 10 is a diagram showing the conditions for the current flowing in the first comparative example.

FIG. 10 is a diagram showing the conditions for the current flowing in the first comparative example (FIG. 9).

It is assumed that an AC current flows evenly at the edge portions of the linear conductors 211 constituting the conductor layer A and the linear conductors 212 constituting the conductor layer B. However, the current, direction changes with time. When current flows in the linear conductors 212 as Vdd wiring lines from the top side toward the bottom side of the drawing, for example, current flows the linear conductors 211 as Vss wiring lines from the bottom side toward the top side of the drawing.

In a case where current flows as shown in FIG. 10 in the first comparative example, a magnetic flux almost in the Z direction is likely to be generated between the linear conductors 211 as Vss wiring lines and the linear conductors 212 as Vdd wiring lines by a conductor loop that includes the adjacent linear conductors 211 and 212, and has a loop plane almost parallel to the X-Y plane in the plan view in FIG. 10.

On the other hand, in the pixel array 121 of the first semiconductor substrate 101 stacked on the second semiconductor substrate 102 in which the light blocking structure 151 formed with the conductor layers A and B is formed, a victim conductor loop formed with a signal line 132 and a control line 133 is formed in the X-Y plane as shown in FIG. 10. In the victim conductor loop formed in the X-Y plane, induced electromotive force is easily generated by the magnetic flux in the Z direction. The greater a change in the induced electromotive force, the poorer an image output from the solid-state imaging device 100 (or the greater the inductive noise).

Further, depending on the configuration of the aggressor conductor loop, the induced electromotive force is proportional to the size of the victim conductor loop. Therefore, when the selected pixel is moved in the pixel array 121, and the effective size of the victim conductor loop formed with a signal line 132 and a control line 133 is changed accordingly, the change in the induced electromotive force becomes conspicuous.

In the case of the first comparative example, the direction of the magnetic flux (substantially in the Z direction) generated from the loop plane of the aggressor conductor loop of the light blocking structure 151 formed with the conductor layers A and B is substantially the same as the direction of a magnetic flux (in the Z direction) that is likely to cause an induced electromotive force in the victim conductor loop. Therefore, degradation of an image output from the solid-state imaging device 100 (generation of inductive noise) is predicted.

Figure 11:
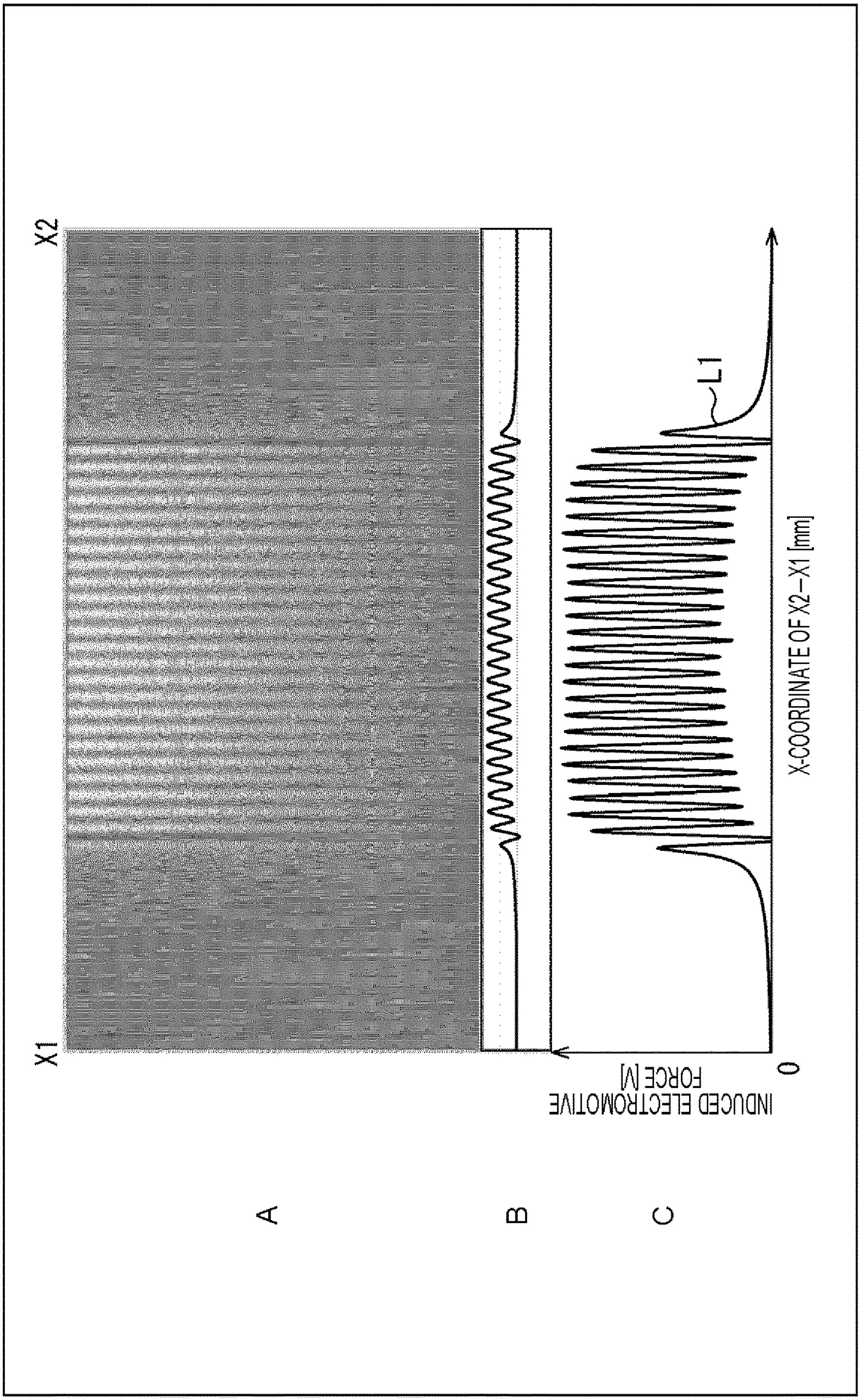
FIG. 11 is a diagram showing the result of a simulation of inductive noise corresponding to the first comparative example.

FIG. 11 shows the result of a simulation of inductive noise that occurs in a case where the first comparative example is applied to the solid-state imaging device 100.

A of FIG. 11 shows an image that is output from the solid-state imaging device 100 and has inductive noise therein. B of FIG. 11 shows changes in pixel signals in a line segment X1-X2 of the image shown in A of FIG. 11. C of FIG. 11 shows a solid line L1 representing the induced electromotive force that has caused the inductive noise in the image. The abscissa axis in C of FIG. 11 indicates the X-axis coordinate of the image, and the ordinate axis indicates the magnitude of the induced electromotive force.

Hereinafter, the solid line L1 shown in C of FIG. 11 will be used for comparison with results of simulations of inductive noise that is caused in a case where an example configuration of the conductor layers A and B constituting the light blocking structure 151 is applied to the solid-state imaging device 100.

First Example Configuration

Figure 12:
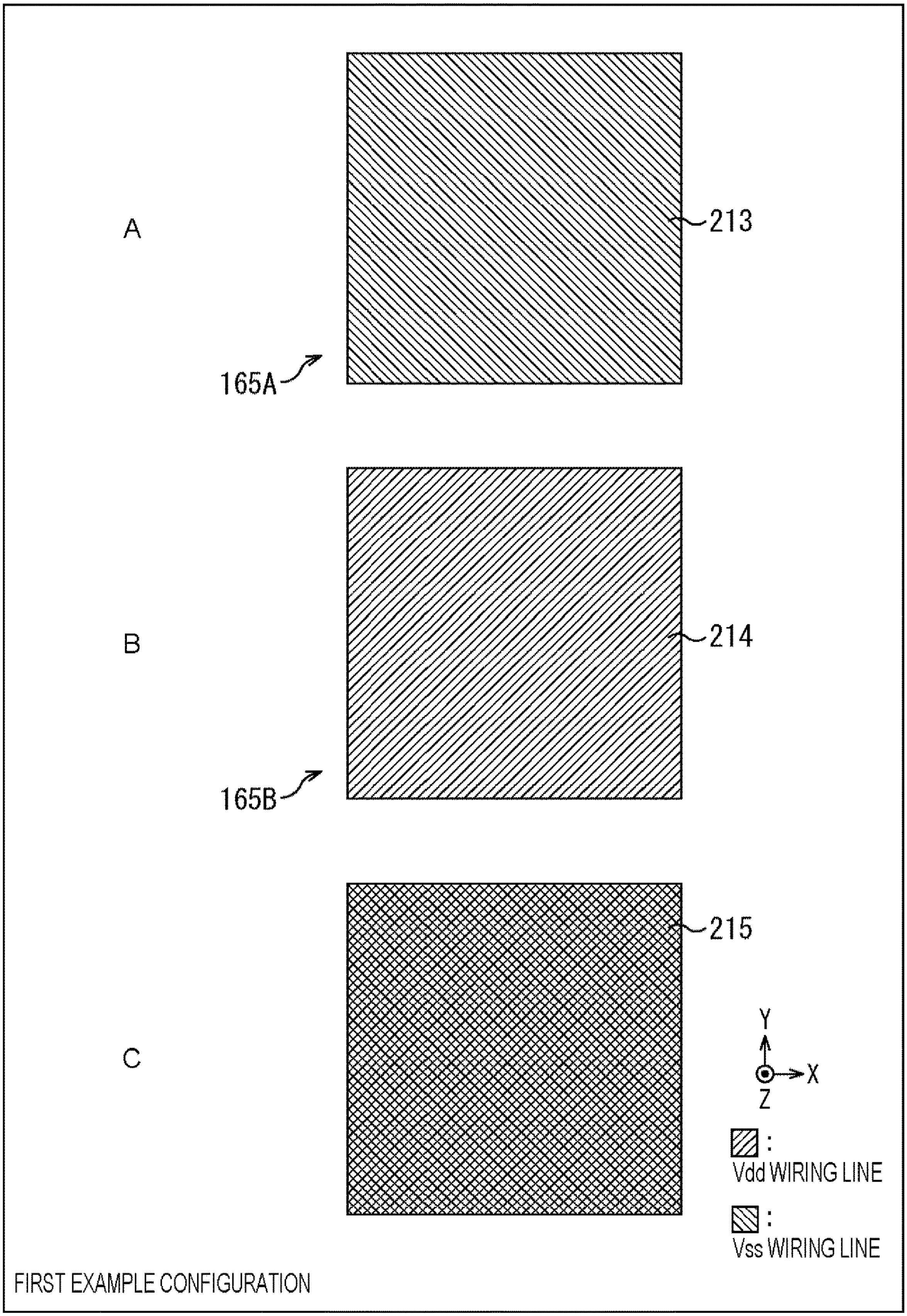
FIG. 12 is a diagram showing a first example configuration of the conductor layers A and B.

FIG. 12 shows a first example configuration of the conductor layers A and B. Note that A of FIG. 12 shows the conductor layer A, and B of FIG. 12 shows the conductor layer B. In the coordinate system in FIG. 12, the horizontal direction is the X-axis, the vertical direction is the Y-axis, and the direction perpendicular to the X-Y plane is the Z-axis.

The conductor layer A in the first example configuration is formed with a planar conductor 213. The planar conductor 213 is a wiring line (a Vss wiring line) connected to GND or a negative power supply, for example.

The conductor layer B in the first comparative example is formed with a planar conductor 214. The planar conductor 214 is a wiring line (a Vdd wiring line) connected to a positive power supply, for example.

Note that the connection destinations of the conductor layers A and B may be switched so that the planar conductor 213 is a Vdd wiring line while the planar conductor 214 is a Vss wiring line. The same applies to each example configuration described below.

C of FIG. 12 shows a state in which the conductor layers A and B shown in A and B of FIG. 12 are viewed from the side of the photodiodes 141 (the back surface side). However, a hatched region 215 in which the diagonal lines intersect in C of FIG. 12 indicates the region in which the planar conductor 213 of the conductor layer A and the planar conductor 214 of the conductor layer B overlap. Therefore, the case shown in C of FIG. 12 shows that the entire surface of the planar conductor 213 of the conductor layer A and the entire surface of the planar conductor 214 of the conductor layer B overlap. In the case of the first example configuration, the entire surface of the planar conductor 213 of the conductor layer A and the entire surface of the planar conductor 214 of the conductor layer B overlap, and thus, hot carrier light emission from the active element group 167 can be blocked without fail.

Figure 13:
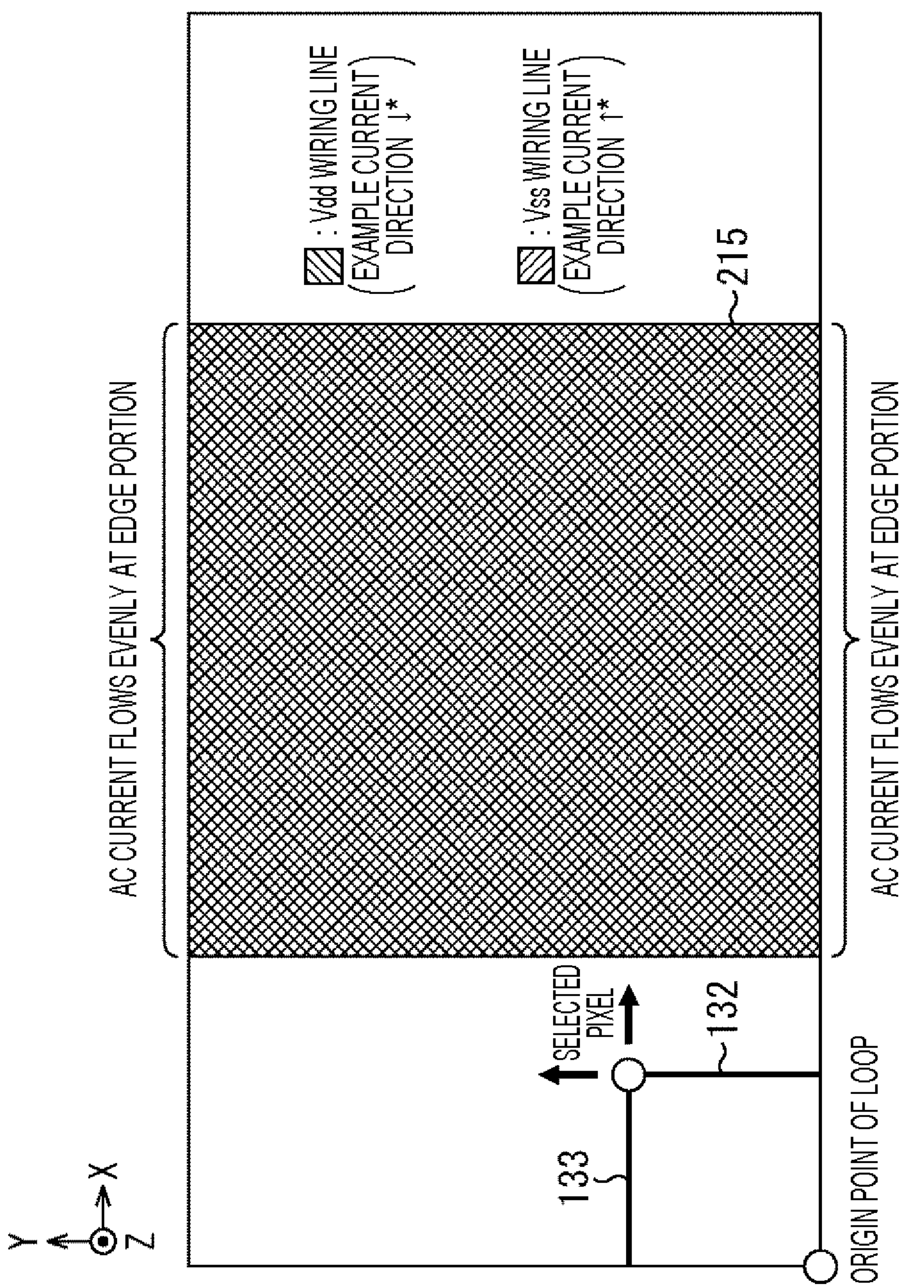
FIG. 13 is a diagram showing the conditions for the current flowing in the first example configuration.

FIG. 13 is a diagram showing the conditions for the current flowing in the first example configuration (FIG. 12).

It is assumed that an AC current flows evenly at the edge portions of the planar conductor 21 forming the conductor layer A and the planar conductor 214 forming the conductor layer B. However, the current direction changes with time. When current flows in the planar conductor 214 as a Vdd wiring line from the top side toward the bottom side of the drawing, for example, current flows in the planar conductor 213 as a Vss wiring line from the bottom side toward the top side of the drawing.

In a case where current flows as shown in FIG. 13 in the first example configuration, magnetic fluxes substantially in the X direction and in the Y direction are likely to be generated between the planar conductor 213 as a Vss wiring line and the planar conductor 214 as a Vdd wiring line by a conductor loop that has a loop plane almost perpendicular to the X-axis, and a conductor loop that has a loop plane almost perpendicular to the Y-axis. These conductor loops are formed in the cross-sections in which the planar conductors 213 and 214 are disposed, and include (cross-sections of) the planar conductors 213 and 214.

On the other hand, in the pixel array 121 of the first semiconductor substrate 101 stacked on the second semiconductor substrate 102 in which the light blocking structure 151 formed with the conductor layers A and B is formed, a victim conductor loop formed with a signal line 132 and a control line 133 is formed in the X-Y plane as shown in FIG. 13. In the victim conductor loop formed in the X-Y plane, induced electromotive force is easily generated by the magnetic flux in the Z-axis direction. The greater a change in the induced electromotive force, the poorer an image output from the solid-state imaging device 100 (or the greater the inductive noise).

Further, when the selected pixel is moved in the pixel array 121, and the effective size of the victim conductor loop formed with a signal line 132 and a control line 133 is changed accordingly, the change in the induced electromotive force becomes conspicuous.

In the case of the first example configuration, the directions of the magnetic fluxes (substantially in the X direction and the Y direction) generated from the loop plane of the aggressor conductor loop of the light blocking structure 151 formed with the conductor layers A and B are substantially orthogonal to and differ almost 90 degrees from the direction of the magnetic flux (in the Z direction) that causes an induced electromotive force in the victim conductor loop. In other words, the direction of the loop plane in which magnetic fluxes are generated from the aggressor conductor loop differs almost 90 degrees from the direction of the loop plane in which induced electromotive force is generated in the victim conductor loop. Therefore, degradation of an image output from the solid-state imaging device 100 (generation of inductive noise) is predicted to be smaller than that in the case of the first comparative example.

Figure 14:
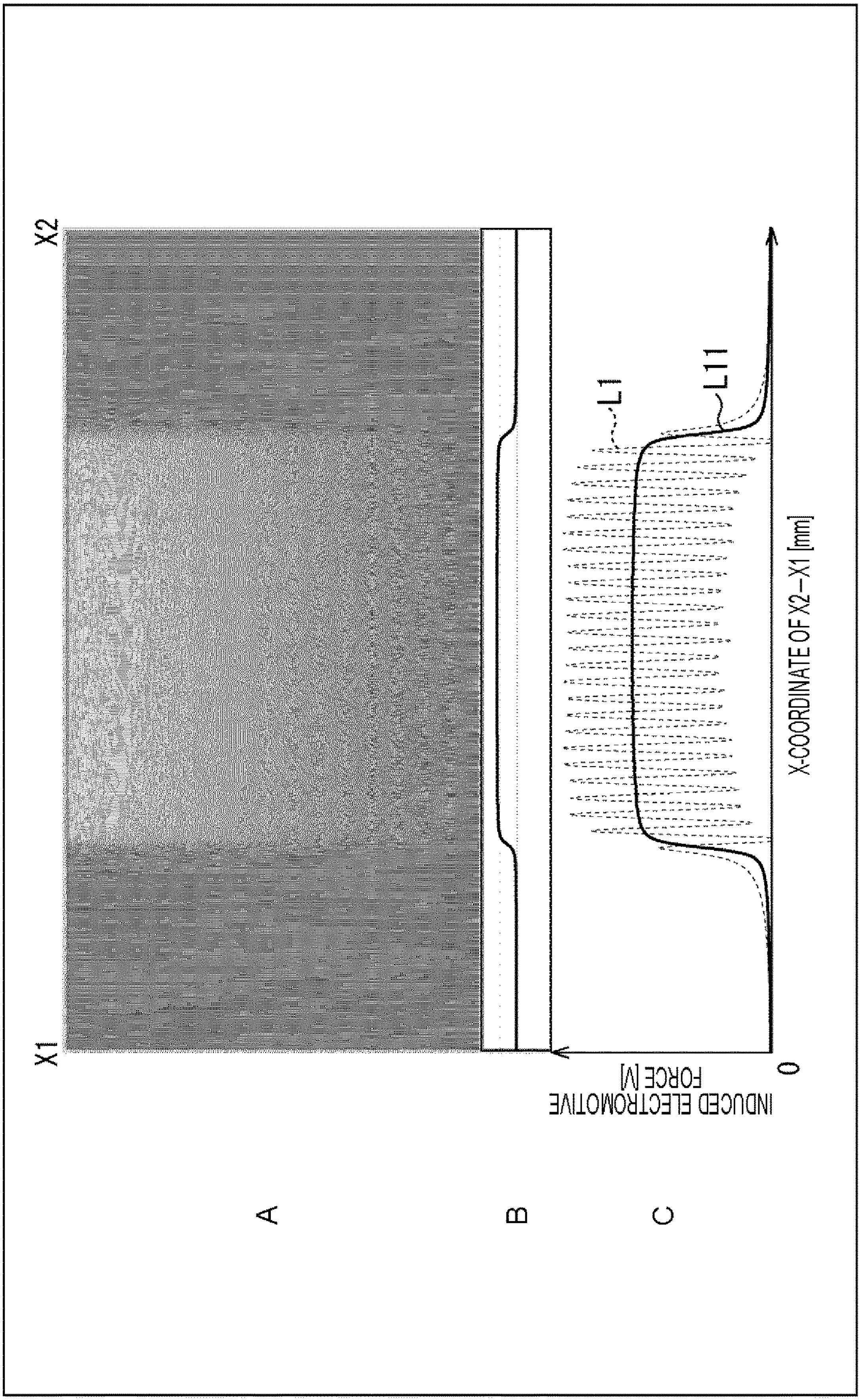
FIG. 14 is a diagram showing the result of a simulation of inductive noise corresponding to the first example configuration.

FIG. 14 shows the result of a simulation of inductive noise that occurs in a case where the first example configuration (FIG. 12) is applied to the solid-state imaging device 100.

A of FIG. 14 shows an image that is output from the solid-state imaging device 100 and may have inductive noise therein. B of FIG. 14 shows changes in pixel signals in a line segment X1-X2 of the image shown in A of FIG. 14. C of FIG. 14 shows a solid line L11 representing the induced electromotive force that has caused the inductive noise in the image. The abscissa axis in C of FIG. 14 indicates the X-axis coordinate of the image, and the ordinate axis indicates the magnitude of the induced electromotive force. Note that a dotted line L1 in C of FIG. 14 corresponds to the first comparative example (FIG. 9).

As is apparent from comparison between the solid line L11 and the dotted line L1 shown in C of FIG. 14, the first example configuration can more effectively reduce changes in the induced electromotive force generated in the victim conductor loop, than the first comparative example. Thus, generation of inductive noise in images that are output from the solid-state imaging device 100 can be reduced.

Second Example Configuration

Figure 15:
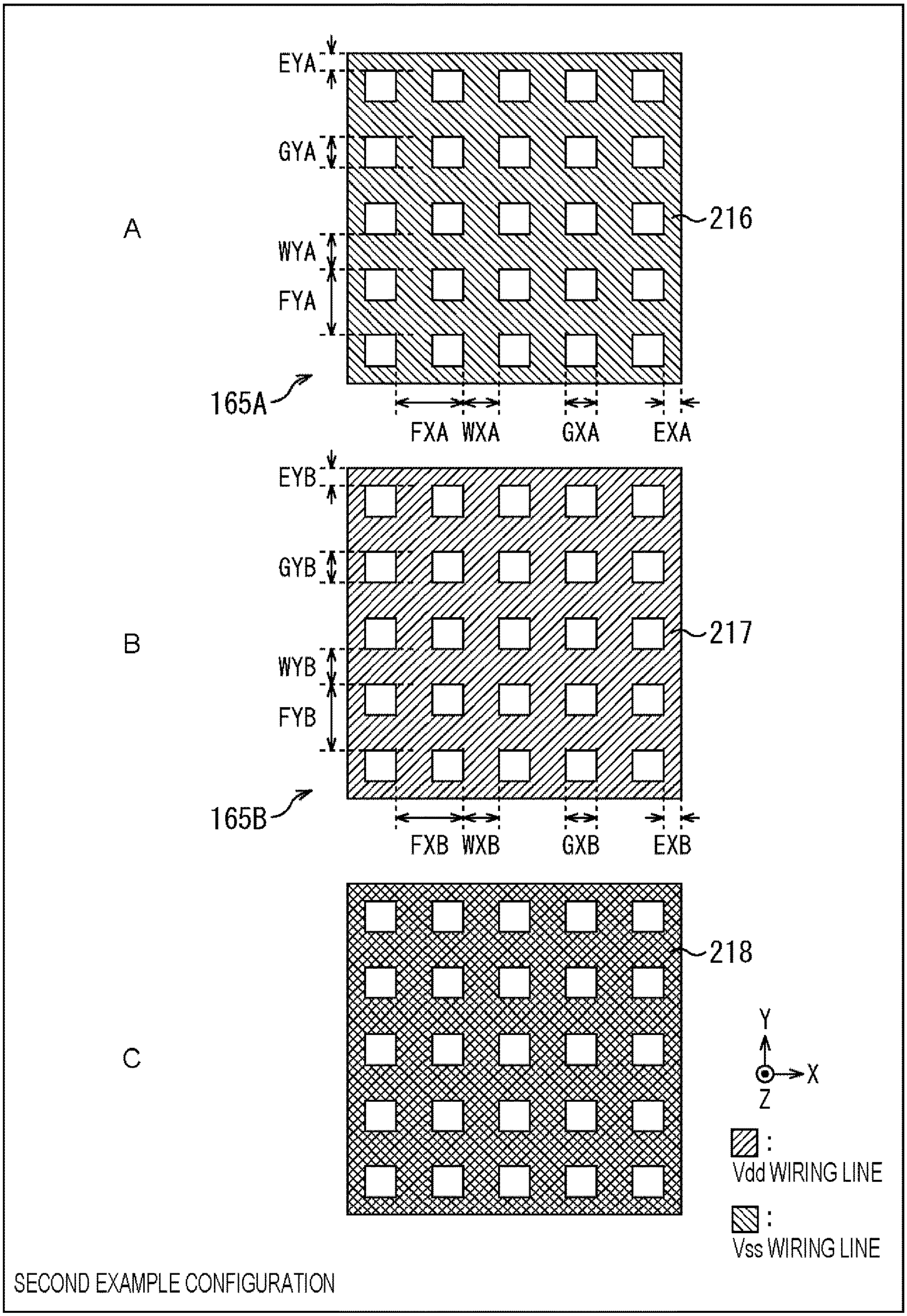
FIG. 15 is a diagram showing a second example configuration of the conductor layers A and B.

FIG. 15 shows a second example configuration of the conductor layers A and B. Note that A of FIG. 15 shows the conductor layer A, and B of FIG. 15 shows the conductor layer B. In the coordinate system in FIG. 15, the horizontal direction is the X-axis, the vertical direction is the Y-axis, and the direction perpendicular to the X-Y plane is the Z-axis.

The conductor layer A in the second example configuration is formed with a mesh conductor 216. The conductor width in the X direction in the mesh conductor 216 is represented by WXA, the gap width is represented by GXA, the conductor cycle is represented by FXA (=conductor width WXA+gap width GXA), and the edge width is represented by EXA (=conductor width WXA/2). Further, the conductor width in the Y direction in the mesh conductor 216 is represented by WYA, the gap width is represented by GYA, the conductor cycle is represented by FYA (=conductor width WYA+gap width GYA), and the edge width is represented by EYA (=conductor width WYA/2). The mesh conductor 216 is a wiring line (a Vss wiring line) connected to GND or a negative power supply, for example.

The conductor layer B in the second example configuration is formed with a mesh conductor 217. The conductor width in the X direction in the mesh conductor 217 is represented by WXB, the gap width is represented by GXB, the conductor cycle is represented by FXB (=conductor width WXB+gap width GXB), and the edge width is represented by EXB (=conductor width WXB/2). Further, the conductor width in the Y direction in the mesh conductor 217 is represented by WYB, the gap width is represented by GYB, the conductor cycle is represented by FYB (=conductor width WYB+gap width GYB), and the edge width is represented by EYB (=conductor width WYB/2). The mesh conductor 217 is a wiring line (a Vdd wiring line) connected to a positive power supply, for example.

Note that the mesh conductor 216 and the mesh conductor 217 preferably satisfy the following relationships.

Conductor width $WXA$=conductor width $WYA$=conductor width $WXB$=conductor width $WYB$ Gap width $GXA$=gap width $GYA$=gap width $GXB$=gap width $GYB$ Edge width $EXA$=edge width $EYA$=edge width $EXB$=edge width $EYB$ Conductor cycle $FXA$=conductor cycle $FYA$=conductor cycle $FXB$=conductor cycle $FYB$ C of FIG. 15 shows a state in which the conductor layers A and B shown in A and B of FIG. 15 are viewed from the side of the photodiodes 141 (the back surface side). However, a hatched region 218 in which the diagonal lines intersect in C of FIG. 15 indicates the region in which the mesh conductor 216 of the conductor layer A and the mesh conductor 217 of the conductor layer B overlap. In the case of the second example configuration, the gaps in the mesh conductor 216 forming the conductor layer A and the gaps in the mesh conductor 217 forming the conductor layer B match, and therefore, hot carrier light emission from the active element group 167 cannot be adequately blocked. Still, generation of inductive noise can be reduced as described later.

Figure 16:
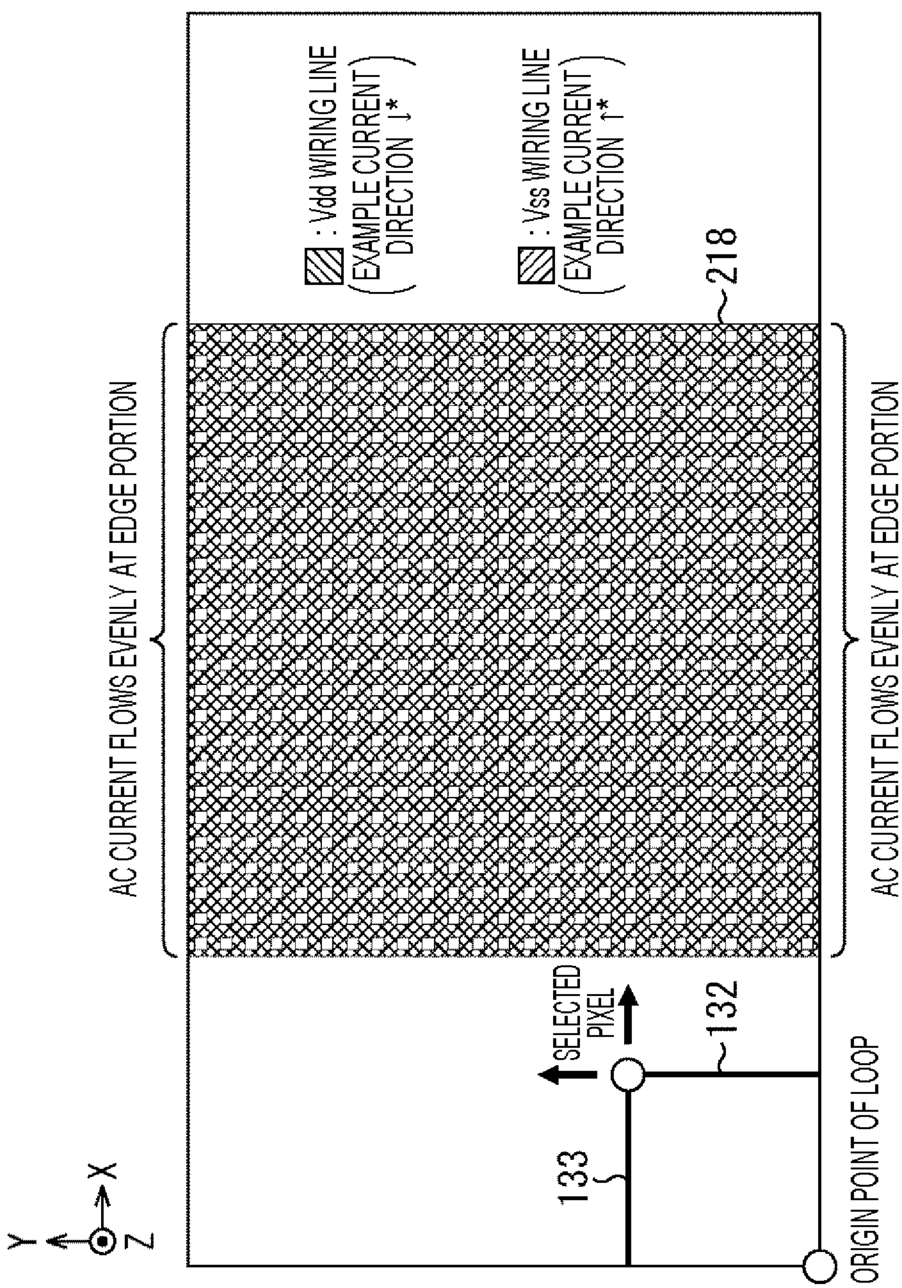
FIG. 16 is a diagram showing the conditions for the current flowing in the second example configuration.

FIG. 16 is a diagram showing the conditions for the current flowing in the second example configuration (FIG. 15).

It is assumed that an AC current flows evenly at the edge portions of the mesh conductor 216 forming the conductor layer A and the mesh conductor 217 forming the conductor layer B. However, the current direction changes with time. When current flows in the mesh conductor 217 as a Vdd wiring line from the top side toward the bottom side of the drawing, for example, current flows in the mesh conductor 216 as a Vss wiring line from the bottom side toward the top side of the drawing.

In a case where current flows as shown in FIG. 16 in the second example configuration, magnetic fluxes substantially in the X direction and in the Y direction are likely to be generated between the mesh conductor 216 as a Vss wiring line and the mesh conductor 217 as a Vdd wiring line by a conductor loop that has a loop plane almost perpendicular to the X-axis, and a conductor loop that has a loop plane almost perpendicular to the Y-axis. These conductor loops are formed in the cross-sections in which the mesh conductors 216 and 217 are disposed, and include (cross-sections of) the mesh conductors 216 and 217.

On the other hand, in the pixel array 121 of the first semiconductor substrate 101 stacked on the second semiconductor substrate 102 in which the light blocking structure 151 formed with the conductor layers A and B is formed, a victim conductor loop formed with a signal line 132 and a control line 133 is formed in the X-Y plane as shown in FIG. 16. In the victim conductor loop formed in the X-Y plane, induced electromotive force is easily generated by the magnetic flux in the Z direction. The greater a change in the induced electromotive force, the poorer an image output from the solid-state imaging device 100 (or the greater the inductive noise).

Further, when the selected pixel is moved in the pixel array 121, and the effective size of the victim conductor loop formed with a signal line 132 and a control line 133 is changed accordingly, the change in the induced electromotive force becomes conspicuous.

In the case of the second example configuration, the directions of the magnetic fluxes (substantially in the X direction and the Y direction) generated from the loop plane of the aggressor conductor loop of the light blocking structure 151 formed with the conductor layers A and B are substantially orthogonal to and differ almost 90 degrees from the direction of the magnetic flux (in the Z direction) that causes an induced electromotive force in the victim conductor loop. In other words, the direction of the loop plane in which magnetic fluxes are generated from the aggressor conductor loop differs almost 90 degrees from the direction of the loop plane in which induced electromotive force is generated in the victim conductor loop. Therefore, degradation of an image output from the solid-state imaging device 100 (generation of inductive noise) is predicted to be smaller than that in the first comparative example.

Figure 17:
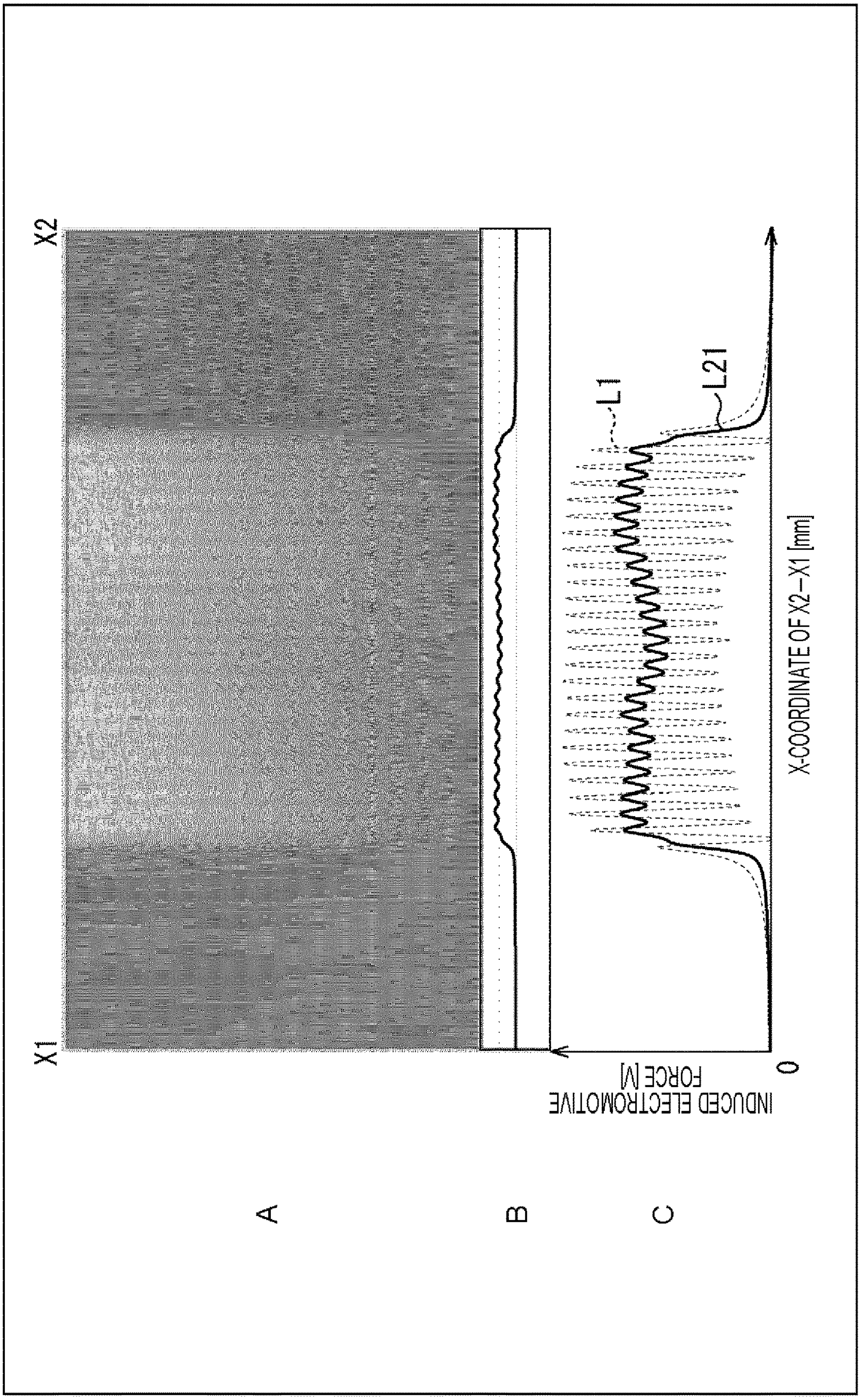
FIG. 17 is a diagram showing the result of a simulation of inductive noise corresponding to the second example configuration.

FIG. 17 shows the result of a simulation of inductive noise that occurs in a case where the second example configuration (FIG. 15) is applied to the solid-state imaging device 100.

A of FIG. 17 shows an image that is output from the solid-state imaging device 100 and may have inductive noise therein. B of FIG. 17 shows changes in pixel signals in a line segment X1-X2 of the image shown in A of FIG. 17. C of FIG. 17 shows a solid line L21 representing the induced electromotive force that has caused the inductive noise in the image. The abscissa axis in C of FIG. 17 indicates the X-axis coordinate of the image, and the ordinate axis indicates the magnitude of the induced electromotive force. Note that a dotted line L1 in C of FIG. 17 corresponds to the first comparative example (FIG. 9).

As is apparent from comparison between the solid line L21 and the dotted line L1 shown in C of FIG. 17, the second example configuration can more effectively reduce changes in the induced electromotive force generated in the victim conductor loop, than the first comparative example. Thus, generation of inductive noise in images that are output from the solid-state imaging device 100 can be reduced.

Second Comparative Example

In the second example configuration (FIG. 15), the relationship between the mesh conductor 216 forming the conductor layer A and the mesh conductor 217 forming the conductor layer B satisfies "conductor cycle FXA=conductor cycle FYA=conductor cycle FXB=conductor cycle FYB".

As the conductor cycle FXA of the conductor layer A in the X direction, the conductor cycle FYA of the conductor layer A in the Y direction, the conductor cycle FXB of the conductor layer B in the X direction, and the conductor cycle FYB of the conductor layer B in the X direction are made to match as described above, generation of inductive noise can be reduced.

Figure 18:
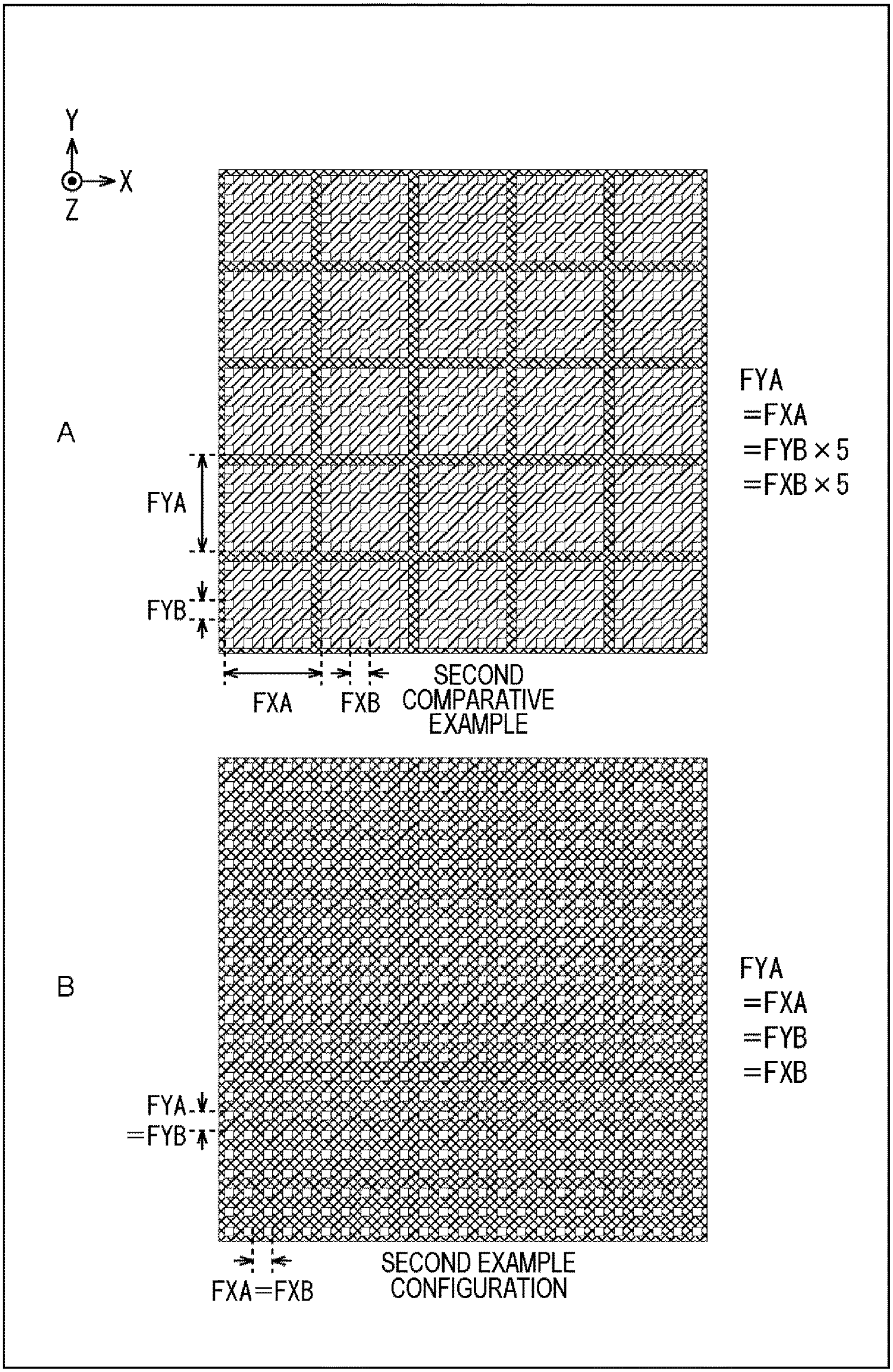
FIG. 18 is a diagram showing a second comparative example of the conductor layers A and B.
Figure 19:
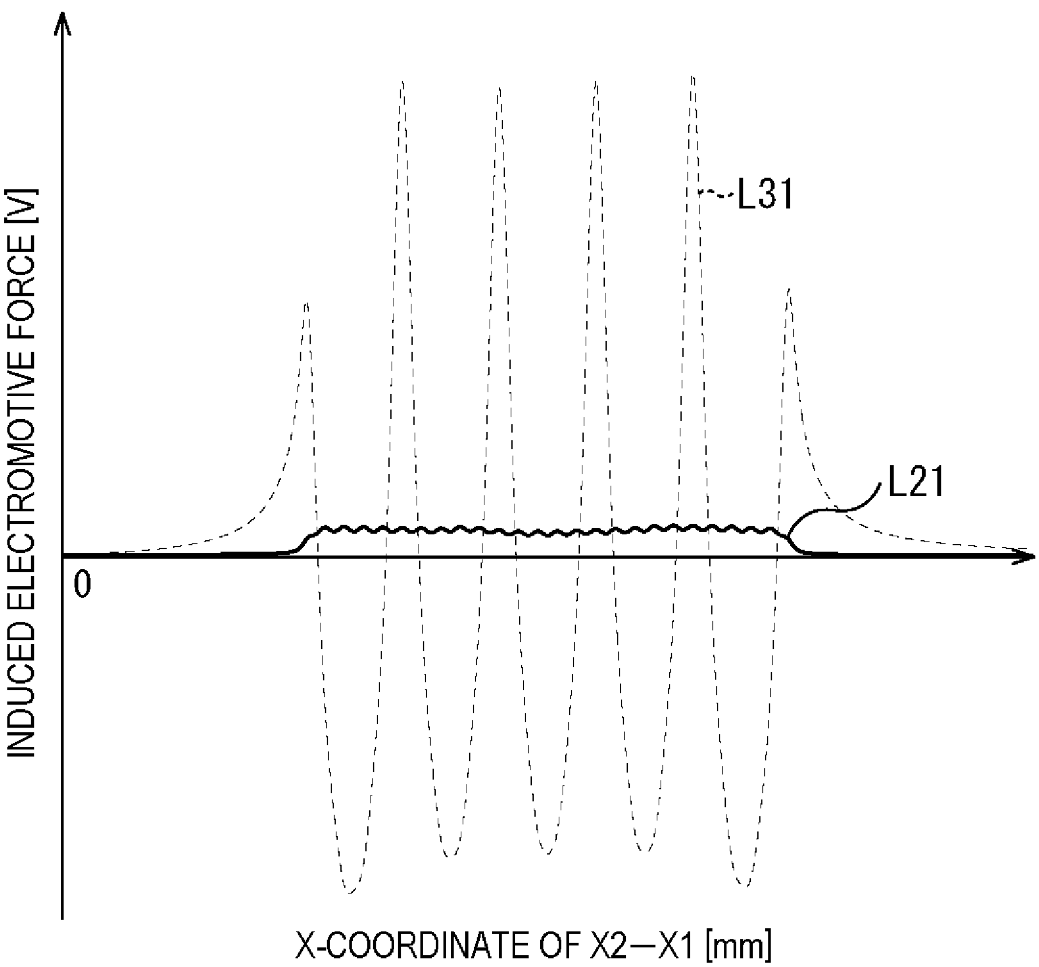
FIG. 19 is a graph showing the result of a simulation of inductive noise corresponding to the second comparative example.

FIGS. 18 and 19 are diagrams for explaining that it is possible to reduce generation of inductive noise by making all the conductor cycles of the conductor layer A and the conductor layer B equal to one another.

A of FIG. 18 shows a second comparative example that is for comparison with the second example configuration shown in FIG. 15 and is a modification of the second example configuration. In the second comparative example, the gap width GXA in the X direction and the gap width GYA in the Y direction of the mesh conductor 216 forming the conductor layer A in the second example configuration are made wider, so that the conductor cycle FXA in the X direction and the conductor cycle FYA in the Y direction become five times longer than those of the second example configuration. Note that the mesh conductor 217 forming the conductor layer B in the second comparative example is the same as that of the second example configuration.

B of FIG. 18 shows the second example configuration shown in C of FIG. 15 at the same magnification as that of A of FIG. 18.

FIG. 19 shows changes in the induced electromotive force that causes inductive noise in images as the results of simulations performed in a case where the second comparative example (A of FIG. 18) and the second example configuration (B of FIG. 18) are applied to the solid-state imaging device 100. Note that the conditions for the current flowing in the second comparative example are similar to those shown in FIG. 16. The abscissa axis in FIG. 19 indicates the X-axis coordinate of the image, and the ordinate axis indicates the magnitude of the induced electromotive force.

A solid line L21 in FIG. 19 corresponds to the second example configuration, and a dotted line L31 corresponds to the second comparative example.

As is apparent from comparison between the solid line L21 and the dotted line L31, the second example configuration can more effectively reduce changes in the induced electromotive force generated in the victim conductor loop, and more effectively reduce inductive noise, than the second comparative example.

Third Comparative Example

Meanwhile, generation of inductive noise can also be reduced in a case where the conductor width of the mesh conductor forming the conductor layer A in the second comparative example is made greater.

Figure 20:
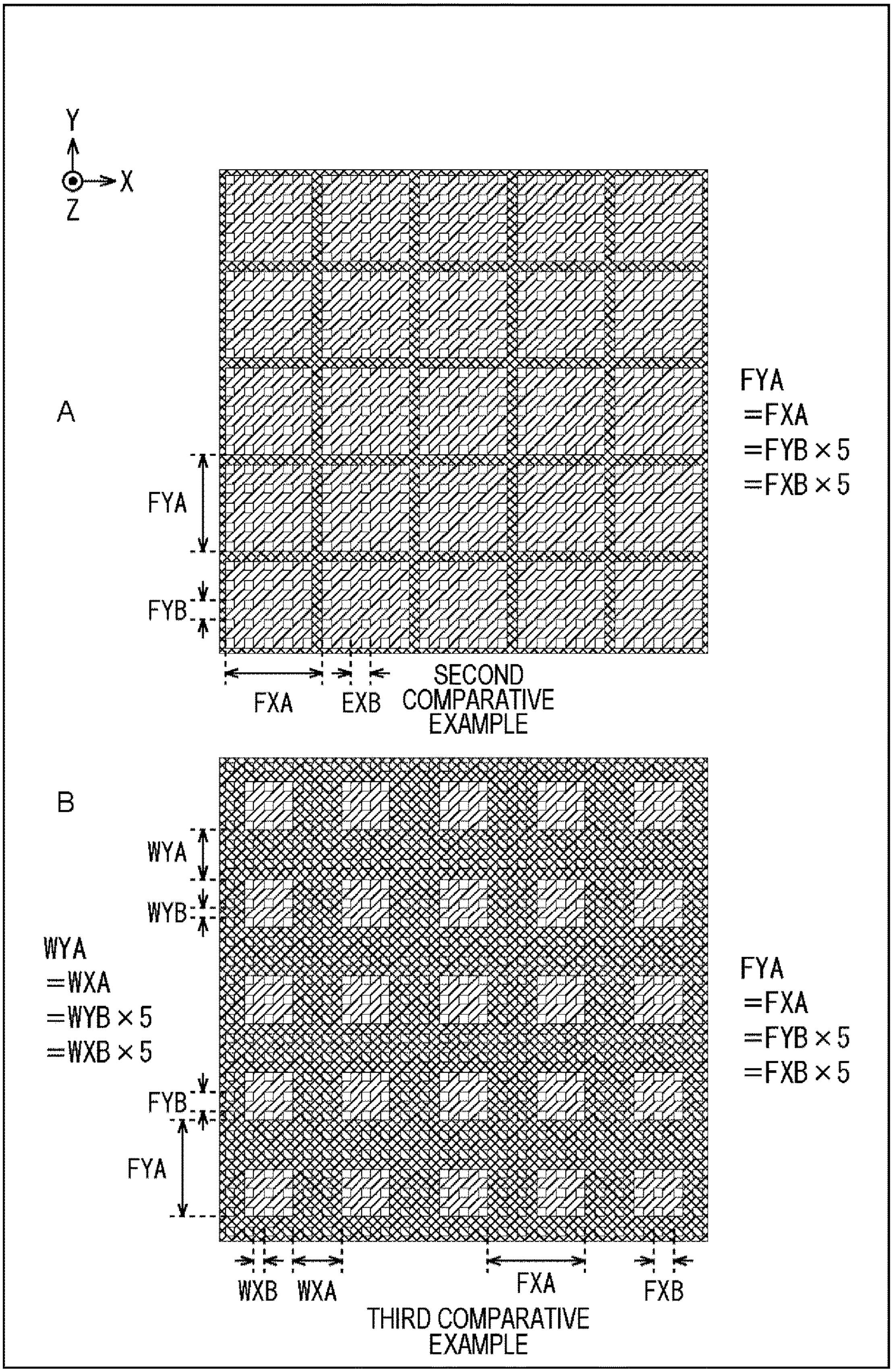
FIG. 20 is a diagram showing a third comparative example of the conductor layers A and B.
Figure 21:
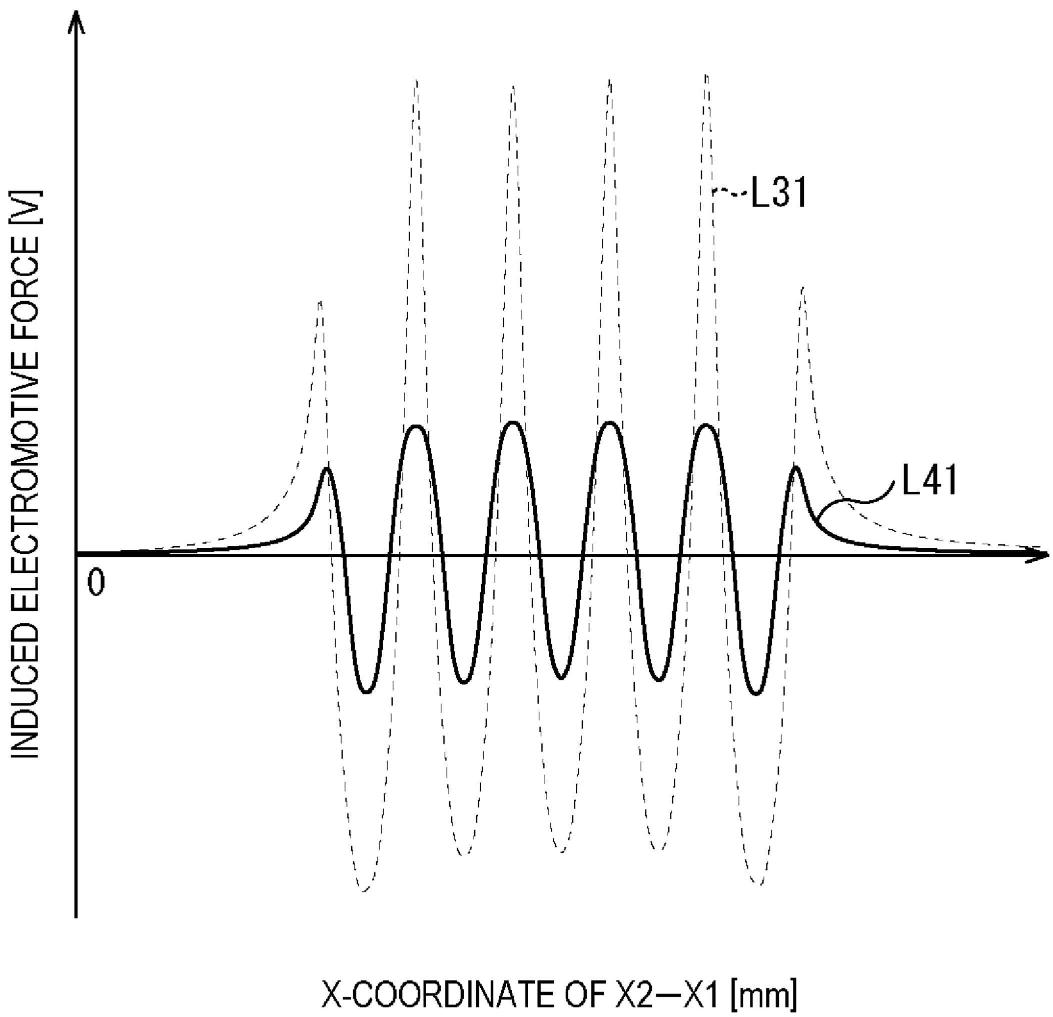
FIG. 21 is a graph showing the result of a simulation of inductive noise corresponding to the third comparative example.

FIGS. 20 and 21 are diagrams for explaining that it is possible to reduce generation of inductive noise by increasing the conductor width of the mesh conductor forming the conductor layer A.

A of FIG. 20 again shows the second comparative example shown in A of FIG. 18.

B of FIG. 20 shows a third comparative example that is for comparison with the second comparative example, and is a modification of the second example configuration. In the third comparative example, the conductor widths WXA and WYA in the X direction and the Y direction of the mesh conductor 216 forming the conductor layer A in the second example configuration are made five times greater than those of the second example configuration. Note that the mesh conductor 217 forming the conductor layer B in the third comparative example is the same as that of the second example configuration.

FIG. 21 shows changes in the induced electromotive force that causes inductive noise in images as the results of simulations performed in a case where the third comparative example and the second comparative example are applied to the solid-state imaging device 100. Note that the conditions for the current flowing in the third comparative example are similar to those shown in FIG. 16. The abscissa axis in FIG. 21 indicates the X-axis coordinate of the image, and the ordinate axis indicates the magnitude of the induced electromotive force.

A solid line L41 in FIG. 21 corresponds to the third comparative example, and a dotted line L31 corresponds to the second comparative example.

As is apparent from comparison between the solid line L41 and the dotted line L31, the third comparative example can more effectively reduce changes in the induced electromotive force generated in the victim conductor loop, and more effectively reduce inductive noise, than the second comparative example.

Third Example Configuration

Figure 22:
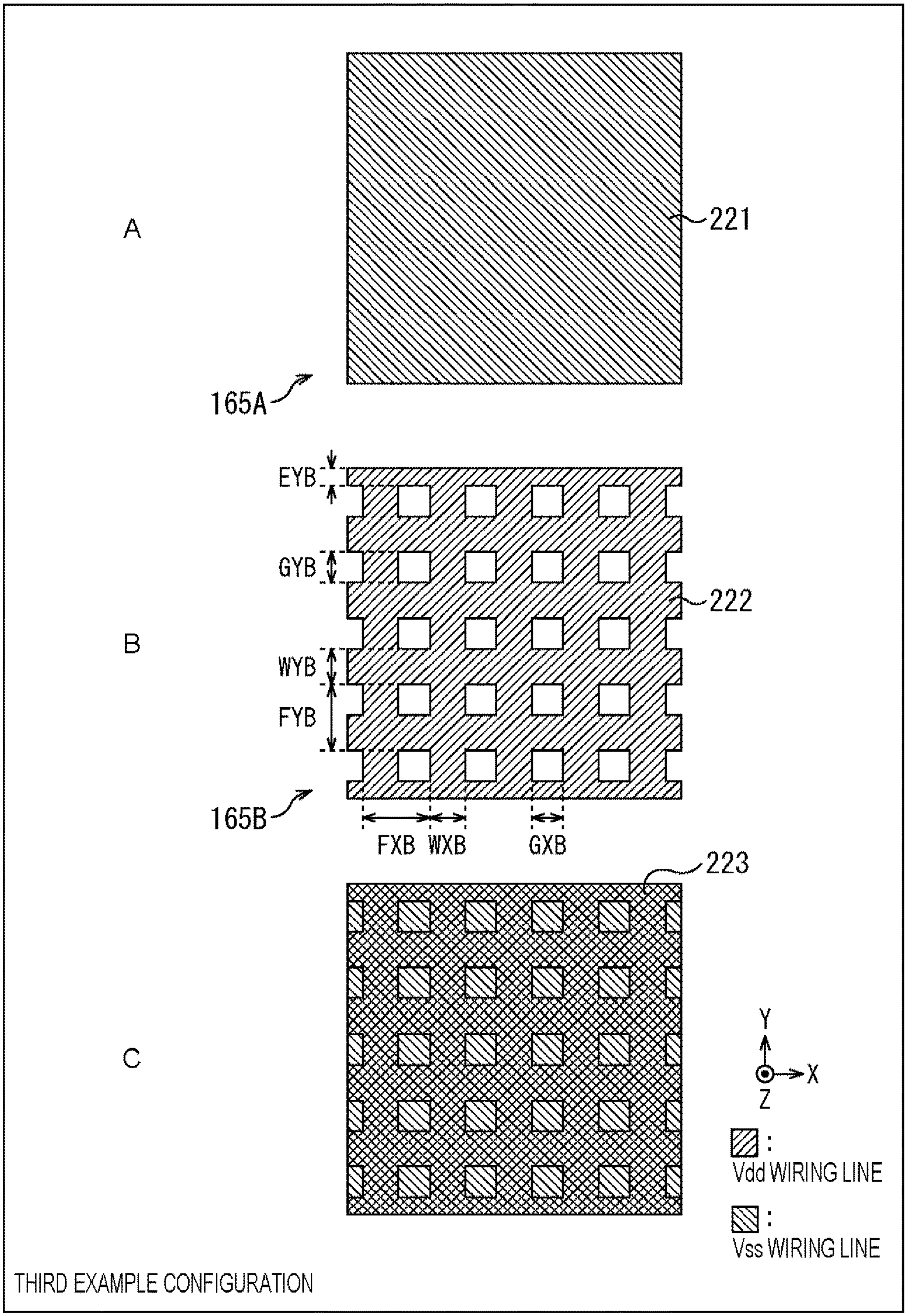
FIG. 22 is a diagram showing a third example configuration of the conductor layers A and B.

Next, FIG. 22 shows a third example configuration of the conductor layers A and B. Note that A of FIG. 22 shows the conductor layer A, and B of FIG. 22 shows the conductor layer B. In the coordinate system in FIG. 22, the horizontal direction is the X-axis, the vertical direction is the Y-axis, and the direction perpendicular to the X-Y plane is the Z-axis.

The conductor layer A in the third example configuration is formed with a planar conductor 221. The planar conductor 221 is a wiring line (a Vss wiring line) connected to GND or a negative power supply, for example.

The conductor layer B in the third example configuration is formed with a mesh conductor 222. The conductor width in the X direction in the mesh conductor 222 is represented by WXB, the gap width is represented by GXB, and the conductor cycle is represented by FXB (=conductor width WXB+gap width GXB). Further, the conductor width in the Y direction in the mesh conductor 222 is represented by WYB, the gap width is represented by GYB, the conductor cycle is represented by FYB (=conductor width WYB+gap width GYB), and the edge width is represented by EYB. The mesh conductor 222 is a wiring line (a Vdd wiring line) connected to a positive power supply, for example.

Note that the mesh conductor 222 preferably satisfies the following relationships.

Conductor width $WXB$=conductor width $WYB$

Gap width $GXB$=gap width $GYB$

Edge width $EYB$=conductor width $WYB/2$

Conductor cycle $FXB$=conductor cycle $FYB$

As the conductor widths, the conductor cycles, and the gap widths are made the same in the X direction and the Y direction as shown in the above relationships, the wiring resistance and the wiring impedance become uniform in the X direction and the Y direction of the mesh conductor 222, and accordingly, the magnetic field resistance and the voltage drop can be made uniform in the X direction and the Y direction.

Further, as the edge width BIB is set at ½ of the conductor width WYB, the induced electromotive force to be generated in the victim conductor loop due to the magnetic field generated around the edge portions of the mesh conductor 222 can be reduced.

C of FIG. 22 shows a state in which the conductor layers A and B shown in A and B of FIG. 22 are viewed from the side of the photodiodes 141 (the back surface side). However, a hatched region 223 in which the diagonal lines intersect in C of FIG. 22 indicates the region in which the planar conductor 221 of the conductor layer A and the mesh conductor 222 of the conductor layer B overlap. In the case of the third example configuration, the active element group 167 is covered with at least one of the conductor layer A or the conductor layer B, so that hot carrier light emission from the active element group 167 can be blocked.

Figure 23:
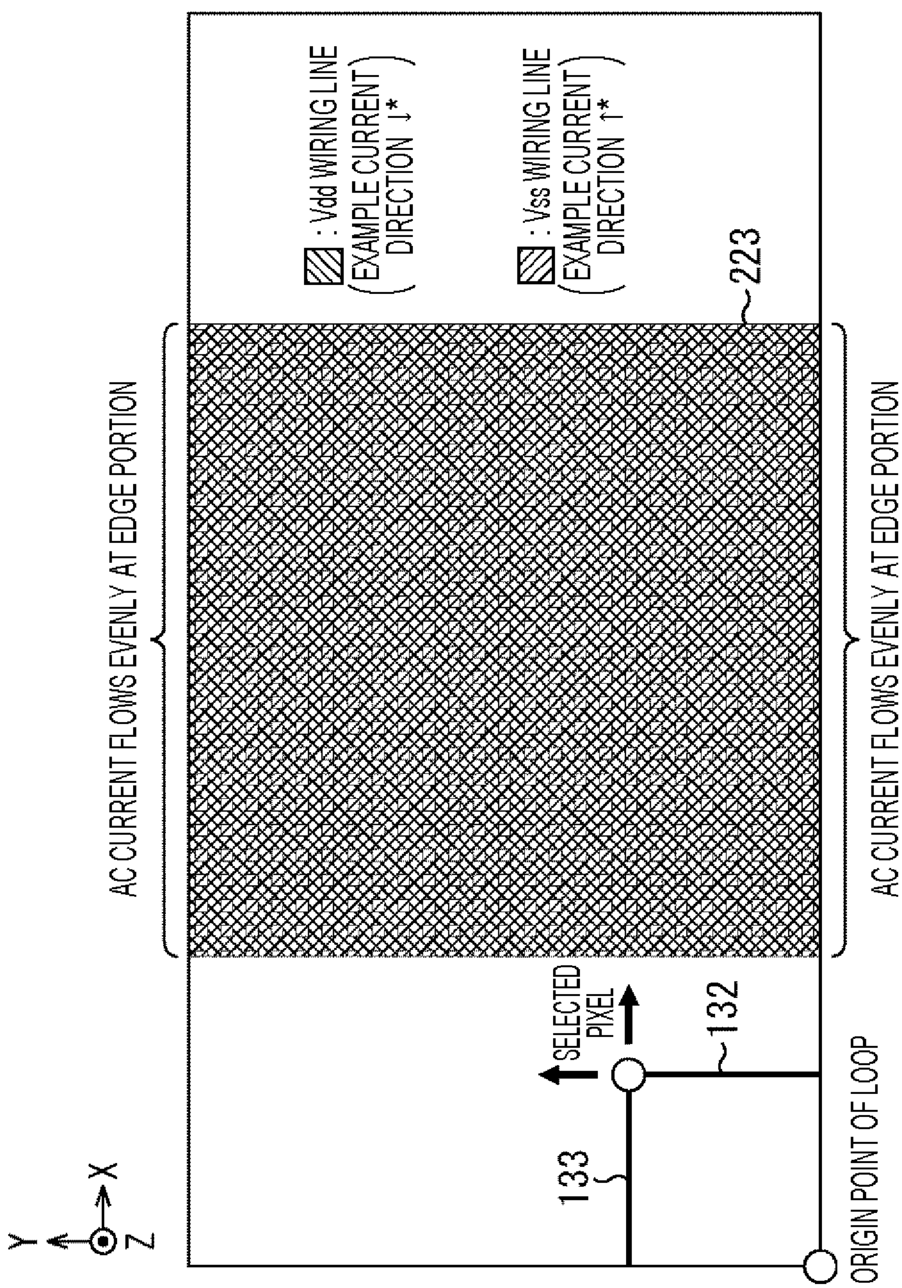
FIG. 23 is a diagram showing the conditions for the current flowing in the third example configuration.

FIG. 23 is a diagram showing the conditions for the current flowing in the third example configuration (FIG. 22).

It is assumed that an AC current flows evenly at the edge portions of the planar conductor 221 forming the conductor layer A and the mesh conductor 222 forming the conductor layer B. However, the current direction changes with time. When current flows in the mesh conductor 222 as a Vdd wiring line from the top side toward the bottom side of the drawing, for example, current flows in the planar conductor 221 as a Vss wiring line from the bottom side toward the top side of the drawing.

In a case where current flows as shown in FIG. 23 in the third example configuration, magnetic fluxes substantially in the X direction and in the Y direction are likely to be generated between the planar conductor 221 as a Vss wiring line and the mesh conductor 222 as a Vdd wiring line by a conductor loop that has a loop plane almost perpendicular to the X-axis, and a conductor loop that has a loop plane almost perpendicular to the Y-axis. These conductor loops are formed in the cross-sections in which the planar conductor 221 and the mesh conductor 222 are disposed, and include (cross-sections of) the planar conductor 221 and the mesh conductor 222.

On the other hand, in the pixel array 121 of the first semiconductor substrate 101 stacked on the second semiconductor substrate 102 in which the light blocking structure 151 formed with the conductor layers A and B is formed, a victim conductor loop formed with a signal line 132 and a control line 133 is formed in the X-Y plane. In the victim conductor loop formed in the X-Y plane, induced electromotive force is easily generated by the magnetic flux in the Z direction. The greater a change in the induced electromotive force, the poorer an image output from the solid-state imaging device 100 (or the greater the inductive noise).

Further, when the selected pixel is moved in the pixel array 121, and the effective size of the victim conductor loop formed with a signal line 132 and a control line 133 is changed accordingly, the change in the induced electromotive force becomes conspicuous.

In the case of the third example configuration, the directions of the magnetic fluxes (substantially in the X direction and the Y direction) generated from the loop plane of the aggressor conductor loop of the light blocking structure 151 formed with the conductor layers A and B are substantially orthogonal to and differ almost 90 degrees from the direction of the magnetic flux (in the Z direction) that causes an induced electromotive force in the victim conductor loop. In other words, the direction of the loop plane in which magnetic fluxes are generated from the aggressor conductor loop differs almost 90 degrees from the direction of the loop plane in which induced electromotive force is generated in the victim conductor loop. Therefore, degradation of an image output from the solid-state imaging device 100 (generation of inductive noise) is predicted to be smaller than that in the first comparative example.

Figure 24:
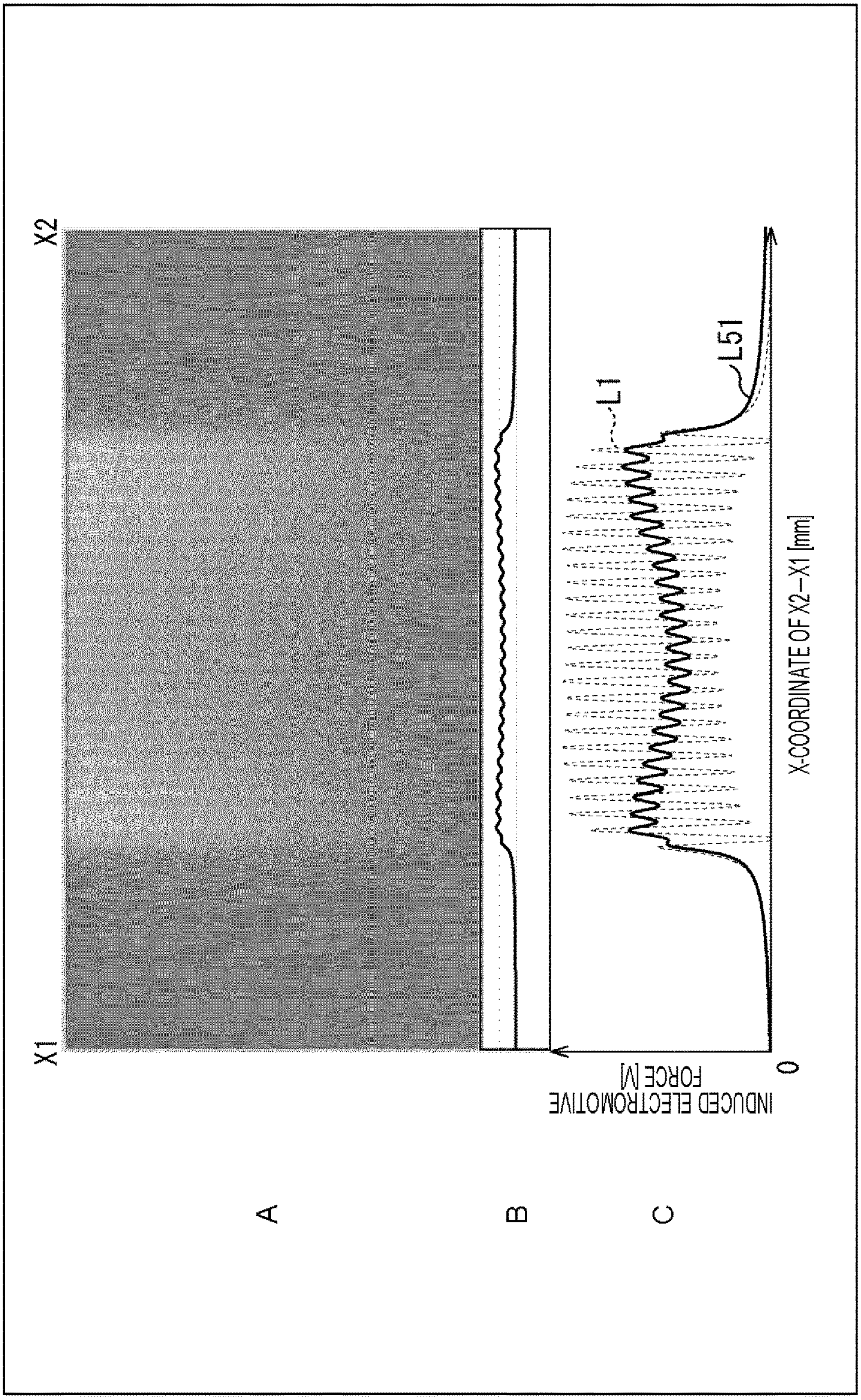
FIG. 24 is a diagram showing the result of a simulation of inductive noise corresponding to the third example configuration.

FIG. 24 shows the result of a simulation of inductive noise that occurs in a case where the third example configuration (FIG. 22) is applied to the solid-state imaging device 100.

A of FIG. 24 shows an image that is output from the solid-state imaging device 100 and may have inductive noise therein B of FIG. 24 shows changes in pixel signals in a line segment X1-X2 of the image shown in A of FIG. 24. C of FIG. 24 shows a solid line L51 representing the induced electromotive force that has caused the inductive noise in the image. The abscissa axis in C of FIG. 24 indicates the X-axis coordinate of the image, and the ordinate axis indicates the magnitude of the induced electromotive force. Note that a dotted line L1 in C of FIG. 24 corresponds to the first comparative example (FIG. 9).

As is apparent from comparison between the solid line L51 and the dotted line L1 shown in C of FIG. 24, the third example configuration can more effectively reduce changes in the induced electromotive force generated in the victim conductor loop, than the first comparative example. Thus, generation of inductive noise in images that are output from the solid-state imaging device 100 can be reduced.

Fourth Example Configuration

Figure 25:
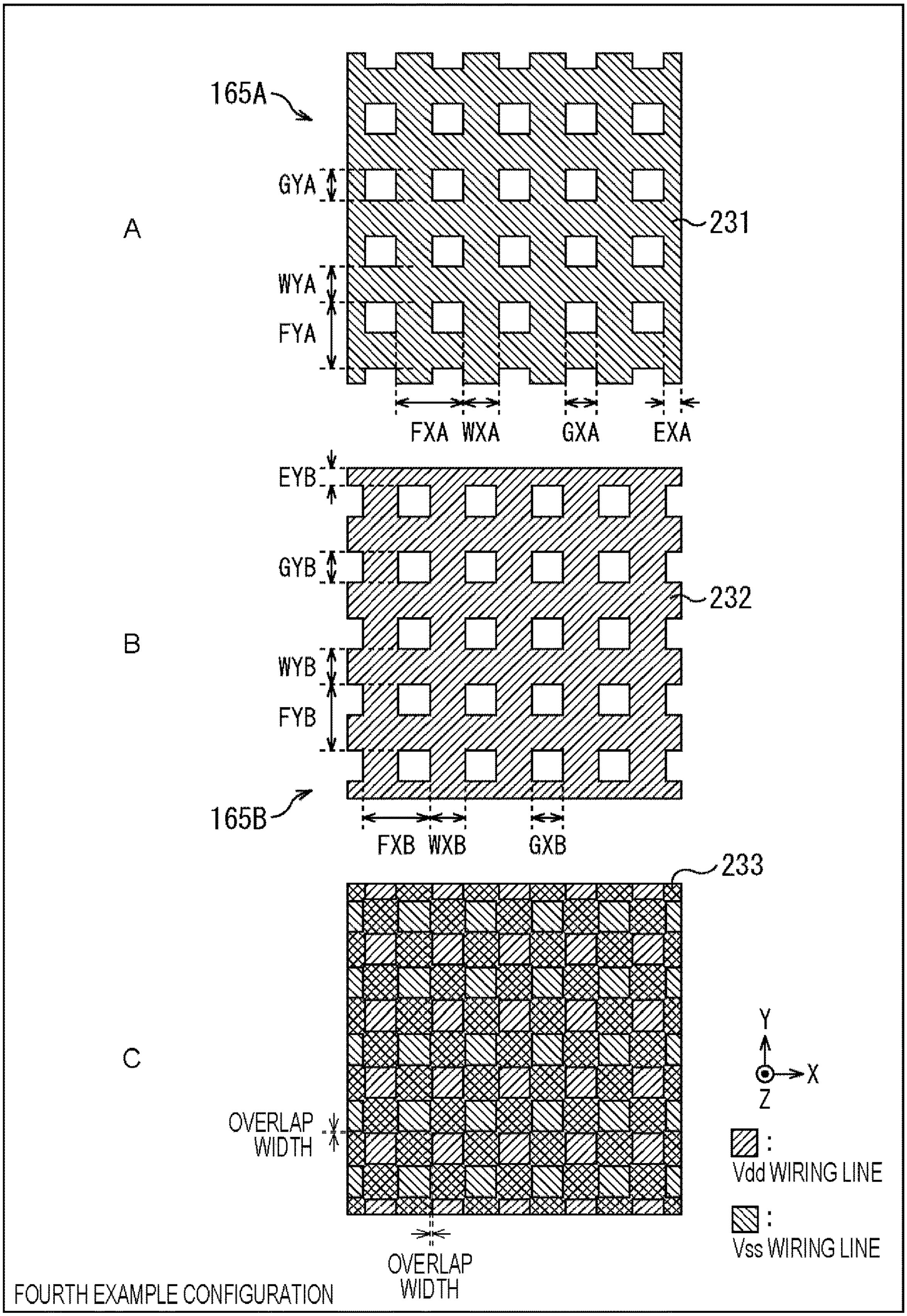
FIG. 25 is a diagram showing a fourth example configuration of the conductor layers A and B.

Next, FIG. 25 shows a fourth example configuration of the conductor layers A and B. Note that A of FIG. 25 shows the conductor layer A, and B of FIG. 25 shows the conductor layer B. In the coordinate system in FIG. 25, the horizontal direction is the X-axis, the vertical direction is the Y-axis, and the direction perpendicular to the X-Y plane is the Z-axis.

The conductor layer A in the fourth example configuration is formed with a mesh conductor 231. The conductor width in the X direction in the mesh conductor 231 is represented by WXA, the gap width is represented by GXA, the conductor cycle is represented by FXA (=conductor width WXA+gap width GXA), and the edge width is represented by EXA (=conductor width WXA/2). Further, the conductor width in the Y direction in the mesh conductor 231 represented by WYA, the gap width is represented by GYA, and the conductor cycle is represented by FYA (=conductor width WYA+gap width GYA). The mesh conductor 231 is a wiring line (a Vss wiring line) connected to GND or a negative power supply, for example.

The conductor layer B in the fourth example configuration is formed with a mesh conductor 232. The conductor width in the X direction in the mesh conductor 232 is represented by WXB, the gap width is represented by GXB, and the conductor cycle is represented by FXB (=conductor width WXB+gap width GXB). Further, the conductor width in the Y direction in the mesh conductor 232 is represented by WYB, the gap width is represented by GYB, the conductor cycle is represented by FYB (=conductor width WYB+gap width GYB), and the edge width is represented by EYB (=conductor width WYB/2). The mesh conductor 232 is a wiring line (a Vdd wiring line) connected to a positive power supply, for example.

Note that the mesh conductor 231 and the mesh conductor 232 preferably satisfy the following relationships.

Conductor width $WXA$=conductor width $WYA$=conductor width $WXB$=conductor width $WYB$ Gap width $GXA$=gap width $GYA$=gap width $GXB$=gap width $GYB$ Edge width $EXA$=edge width $EYB$ Conductor cycle $FXA$=conductor cycle $FYA$=conductor cycle $FXB$=conductor cycle $FYB$ Conductor width $WYA$=2×overlap width+gap width $GYA$ Conductor width $WXA$=2×overlap width+gap width $GXA$ Conductor width $WYB$=2×overlap width+gap width $GYB$ Conductor width $WXB$=2×overlap width+gap width $GXB$ Here, the overlap width is the width of the overlapping portion at which the conductor portions overlap in a case where the mesh conductor 231 of the conductor layer A and the mesh conductor 232 of the conductor layer B are disposed in an overlapping manner.

As all the conductor cycles in the X direction and the Y direction of the mesh conductor 231 and the mesh conductor 232 are made to match as shown in the above relationships, the current distribution in the mesh conductor 231 and the current distribution in the mesh conductor 232 can be made substantially uniform, and be made to have opposite characteristics. Accordingly, the magnetic field generated by the current distribution in the mesh conductor 231 and the magnetic field generated by the current distribution in the mesh conductor 232 can be effectively canceled out.

Also, as all the conductor cycles, the conductor widths, and the gap widths in the X direction and the Y direction of the mesh conductor 231 and the mesh conductor 232 are made uniform, the wiring resistance and the wiring impedance become uniform in the X direction and the Y direction of the mesh conductor 231 and the mesh conductor 232, and accordingly, the magnetic field resistance and the voltage drop can be made uniform in the X direction and the Y direction.

Further, as the edge width EXA of the mesh conductor 231 is set at ½ of the conductor width WXA, the induced electromotive force to be generated in the victim conductor loop due to the magnetic field generated around the edge portions of the mesh conductor 231 can be reduced. Also, as the edge width EYB of the mesh conductor 232 is set at ½ of the conductor width WYB, the induced electromotive force to be generated in the victim conductor loop due to the magnetic field generated around the edge portions of the mesh conductor 231 can be reduced.

Note that, instead of edge portions provided in the X direction of the mesh conductor 231 of the conductor layer A, edge portions may be provided in the X direction of the mesh conductor 232 of the conductor layer B. Also, instead of edge portions provided in the Y direction of the mesh conductor 232 of the conductor layer B, edge portions may be provided in the Y direction of the mesh conductor 231 of the conductor layer A.

C of FIG. 25 shows a state in which the conductor layers A and B shown in A and B of FIG. 25 are viewed from the side of the photodiodes 141 (the back surface side). However, a hatched region 233 in which the diagonal lines intersect in C of FIG. 25 indicates the region in which the mesh conductor 231 of the conductor layer A and the mesh conductor 232 of the conductor layer B overlap. In the case of the fourth example configuration, the active element group 167 is covered with at least one of the conductor layer A or the conductor layer B, so that hot carrier light emission from the active element group 167 can be blocked.

However, to completely block hot carrier light emission with the mesh conductor 231 of the conductor layer A and the mesh conductor 232 of the conductor layer B, it is necessary to satisfy the following relationships.

Conductor width $WYA$≥gap width $GYA$

Conductor width $WXA$≥gap width $GXA$

Conductor width $WYB$≥gap width $GYB$

Conductor width $WXB$≥gap width $GXB$

In this case, the following relationships are satisfied.

Conductor width $WYA$=2×overlap width gap width $GYA$

Conductor width $WXA$=2×overlap width+gap width $GXA$

Conductor width $WYB$=2×overlap width+gap width $GYB$

Conductor width $WXB$=2×overlap width+gap width $GXB$

In the fourth example configuration, in a case where current flows in a manner similar to that in the case shown FIG. 23, magnetic fluxes substantially in the X direction and in the Y direction are likely to be generated between the mesh conductor 231 as a Vss wiring line and the mesh conductor 232 as a Vdd wiring line by a conductor loop that has a loop plane almost perpendicular to the X-axis, and a conductor loop that has a loop plane almost perpendicular to the Y-axis. These conductor loops are formed in the cross-sections in which the mesh conductors 231 and 232 are disposed, and include (cross-sections of) the mesh conductors 231 and 232.

Fifth Example Configuration

Figure 26:
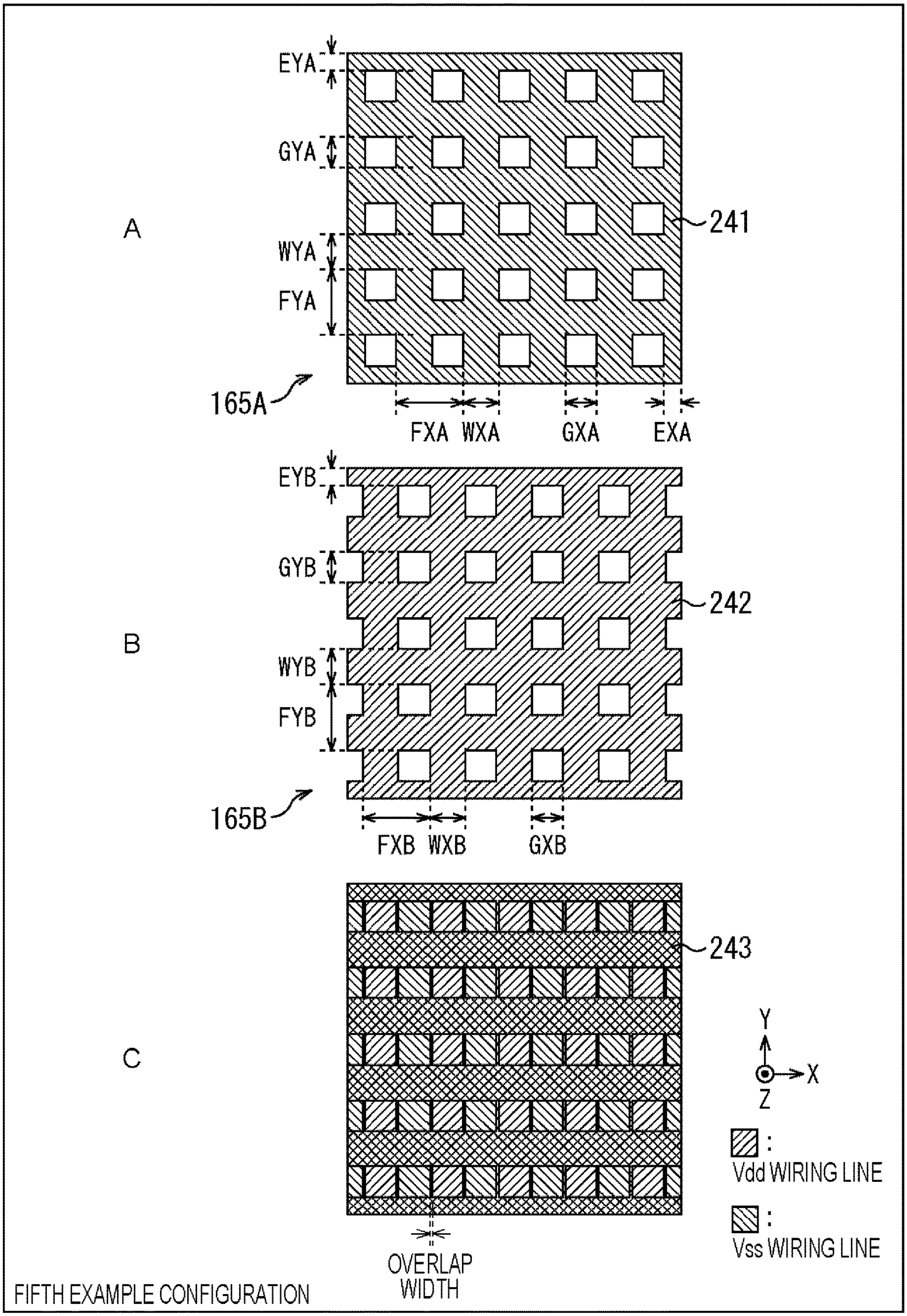
FIG. 26 is a diagram showing a fifth example configuration of the conductor layers A and B.

Next, FIG. 26 shows a fifth example configuration of the conductor layers A and B. Note that A of FIG. 26 shows the conductor layer A, and B of FIG. 26 shows the conductor layer B. In the coordinate system in FIG. 26, the horizontal direction is the X-axis, the vertical direction is the Y-axis, and the direction perpendicular to the X-Y plane is the Z-axis.

The conductor layer A in the fifth example configuration is formed with a mesh conductor 241. The mesh conductor 241 is obtained by moving the mesh conductor 231 forming the conductor layer A in the fourth example configuration (FIG. 25) in the Y direction by ½ of the conductor cycle FYA. The mesh conductor 241 is a wiring line (a Vss wiring line) connected to GND or a negative power supply, for example.

The conductor layer B in the fifth example configuration is formed with a mesh conductor 242. The mesh conductor 242 has a shape similar to the mesh conductor 232 forming the conductor layer B in the fourth example configuration (FIG. 25), and therefore, explanation thereof is not made herein. The mesh conductor 242 is a wiring line (a Vdd wiring line) connected to a positive power supply, for example.

Note that the mesh conductor 241 and the mesh conductor 242 preferably satisfy the following relationships.

Conductor width $WXA$=conductor width $WYA$=conductor width $WXB$=conductor width $WYB$ Gap width $GXA$=gap width $GYA$=gap width $GXB$=gap width $GYB$ Edge width $EXA$=edge width $EYB$ Conductor cycle $FXA$=conductor cycle $FYA$=conductor cycle $FXB$=conductor cycle $FYB$ Conductor width $WYA$=2×overlap width+gap width $GYA$ Conductor width $WXA$=2×overlap width+gap width $GXA$ Conductor width $WYB$=2×overlap width+gap width $GYB$ Conductor width $WXB$=2×overlap width+gap width $GXB$ Here, the overlap width is the width of the overlapping portion at which the conductor portions overlap in a case where the mesh conductor 241 of the conductor layer A and the mesh conductor 242 of the conductor layer B are disposed in an overlapping manner.

C of FIG. 26 shows a state in which the conductor layers A and B shown in A and B of FIG. 26 are viewed from the side of the photodiodes 141 (the back surface side). However, a hatched region 243 in which the diagonal lines intersect in C of FIG. 26 indicates the region in which the mesh conductor 241 of the conductor layer A and the mesh conductor 242 of the conductor layer B overlap. In the case of the fifth example configuration, the active element group 167 is covered with at least one of the conductor layer A or the conductor layer B, so that hot carrier light emission from the active element group 167 can be blocked.

Further, in the case of the fifth example configuration, the overlapping region 243 between the mesh conductor 241 and the mesh conductor 242 extends in the X direction. In the region 243 in which the mesh conductor 241 and the mesh conductor 242 overlap, currents having different polarities from each other flow in the mesh conductor 241 and the mesh conductor 242, so that the magnetic fields generated from the region 243 cancel each other out. Thus, generation of inductive noise near the region 243 can be reduced.

In the fifth example configuration, in a case where current flows in a manner similar to that in the case shown FIG. 23, magnetic fluxes substantially in the X direction and in the Y direction are likely to be generated between the mesh conductor 241 as a Vss wiring line and the mesh conductor 242 as a Vdd wiring line by a conductor loop that has a loop plane almost perpendicular to the X-axis, and a conductor loop that has a loop plane almost perpendicular to the Y-axis. These conductor loops are formed in the cross-sections in which the mesh conductors 241 and 242 are disposed, and include (cross-sections of) the mesh conductors 241 and 242.

Sixth Example Configuration

Figure 27:
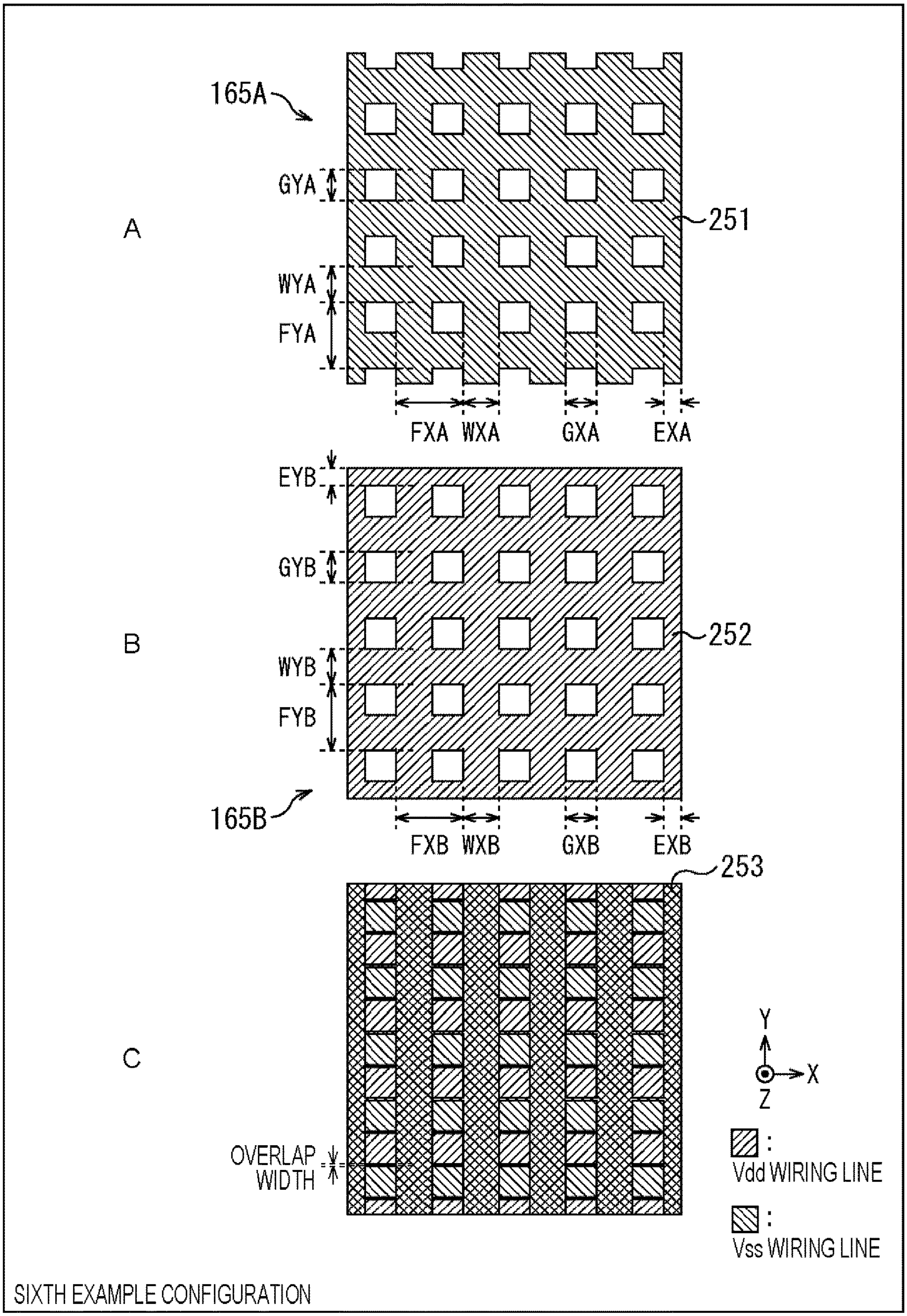
FIG. 27 is a diagram showing a sixth example configuration of the conductor layers A and B.

Next, FIG. 27 shows a sixth example configuration of the conductor layers A and B. Note that A of FIG. 27 shows the conductor layer A, and B of FIG. 27 shows the conductor layer B. In the coordinate system in FIG. 27, the horizontal direction is the X-axis, the vertical direction is the Y-axis, and the direction perpendicular to the X-Y plane is the Z-axis.

The conductor layer A in the sixth example configuration is formed with a mesh conductor 251. The mesh conductor 251 has a shape similar to the mesh conductor 231 forming the conductor layer A in the fourth example configuration (FIG. 25), and therefore, explanation thereof is not made herein. The mesh conductor 251 is a wiring line (a Vss wiring line) connected to GND or a negative power supply, for example.

The conductor layer B in the sixth example configuration is formed with a mesh conductor 252. The mesh conductor 252 is obtained by moving the mesh conductor 232 forming the conductor layer B in the fourth example configuration (FIG. 25) in the X direction by ½ of the conductor cycle FXB. The mesh conductor 252 is a wiring line (a Vdd wiring line) connected to a positive power supply, for example.

Note that the mesh conductor 251 and the mesh conductor 252 preferably satisfy the following relationships.

Conductor width $WXA$=conductor width $WYA$=conductor width $WXB$=conductor width $WYB$ Gap width $GXA$=gap width $GYA$=gap width $GXB$=gap width $GYB$ Edge width $EXA$=edge width $EYB$ Conductor cycle $FXA$=conductor cycle $FYA$=conductor cycle $FXB$=conductor cycle $FYB$ Conductor width $WYA$=2×overlap width+gap width $GYA$ Conductor width $WXA$=2×overlap width+gap width $GXA$ Conductor width $WYB$=2×overlap width+gap width $GYB$ Conductor width $WXB$=2×overlap width+gap width $GXB$ Here, the overlap width is the width of the overlapping portion at which the conductor portions overlap in a case where the mesh conductor 251 of the conductor layer A and the mesh conductor 252 of the conductor layer B are disposed in an overlapping manner.

C of FIG. 27 shows a state in which the conductor layers A and B shown in A and B of FIG. 27 are viewed from the side of the photodiodes 141 (the back surface side). However, a hatched region 253 in which the diagonal lines intersect in C of FIG. 27 indicates the region in which the mesh conductor 251 of the conductor layer A and the mesh conductor 252 of the conductor layer B overlap. In the case of the sixth example configuration, the active element group 167 is covered with at least one of the conductor layer A or the conductor layer B, so that hot carrier light emission from the active element group 167 can be blocked.

In the sixth example configuration, in a case where current flows a manner similar to that in the case shown FIG. 23, magnetic fluxes substantially in the X direction and in the Y direction are likely to be generated between the mesh conductor 251 as a Vss wiring line and the mesh conductor 252 as a Vdd wiring line by a conductor loop that has a loop plane almost perpendicular to the X-axis, and a conductor loop that has a loop plane almost perpendicular to the Y-axis. These conductor loops are formed in the cross-sections in which the mesh conductors 251 and 252 are disposed, and include (cross-sections of) the mesh conductors 251 and 252.

Further, in the case of the sixth example configuration, the overlapping region 253 between the mesh conductor 251 and the mesh conductor 252 extends in the Y direction. In this region 253 in which the mesh conductor 251 and the mesh conductor 252 overlap, currents having different polarities from each other flow in the mesh conductor 251 and the mesh conductor 252, so that the magnetic fields generated from the region 253 cancel each other out. Thus, generation of inductive noise near the region 253 can be reduced.

<Results of Simulations of the Fourth Through Sixth Example Configurations>

Figure 28:
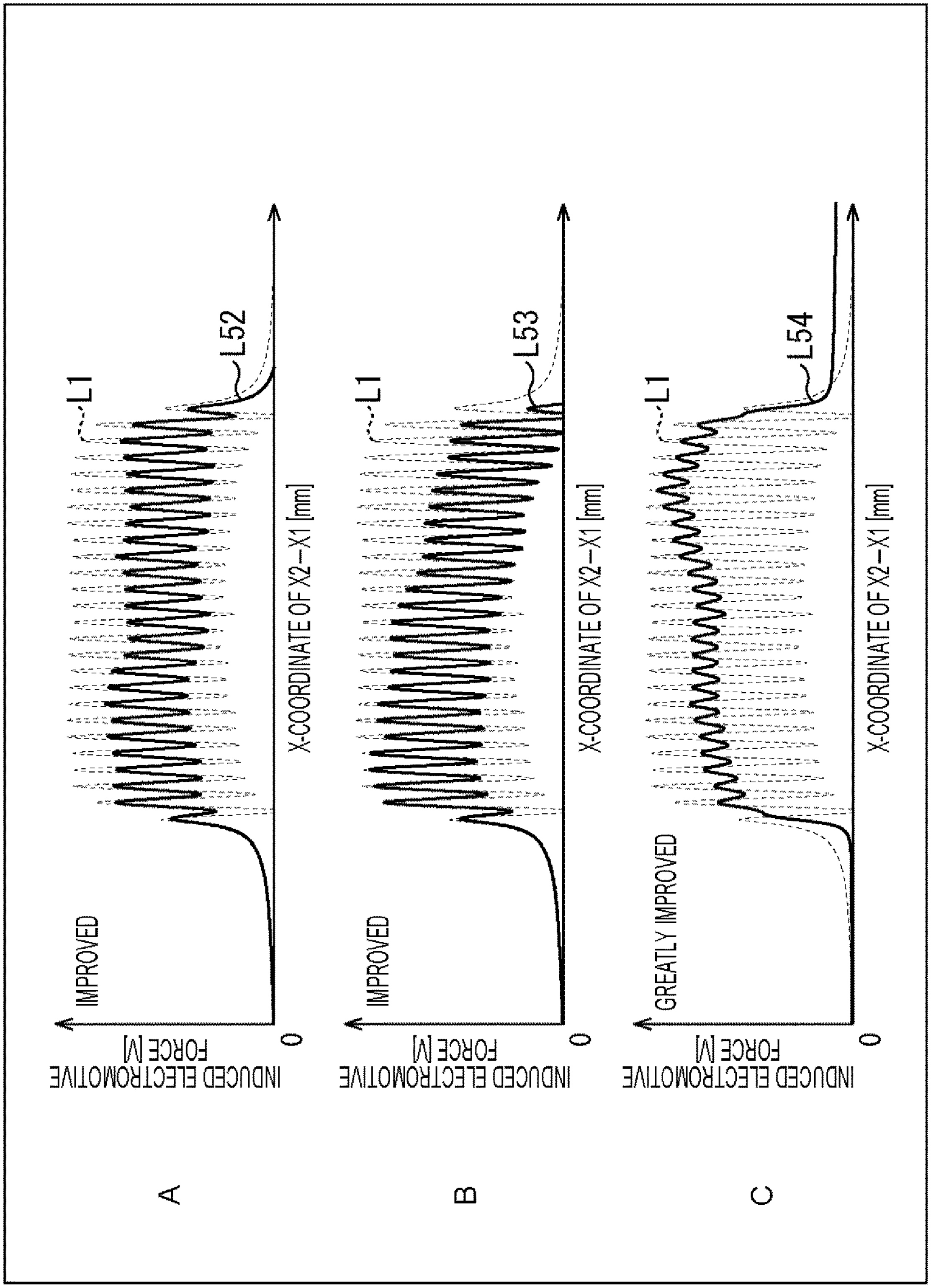
FIG. 28 is a diagram showing the results of inductive noise simulations corresponding to the fourth through sixth example configurations.

FIG. 28 shows changes in the induced electromotive force that causes inductive noise in images as the results of simulations performed in the cases where the fourth through sixth example configurations (FIGS. 25 through 27) are applied to the solid-state imaging device 100. Note that the conditions for the current flowing in the fourth through sixth example configurations are similar to those shown in FIG. 23. The abscissa axis in FIG. 28 indicates the X-axis coordinate of the image, and the ordinate axis indicates the magnitude of the induced electromotive force.

A solid line L52 in A of FIG. 28 corresponds to the fourth example configuration (FIG. 25), and a dotted line L1 corresponds to the first comparative example (FIG. 9). As is apparent from comparison between the solid line L52 and the dotted line L1, the fourth example configuration can more effectively reduce changes in the induced electromotive force generated in the victim conductor loop, and more effectively reduce inductive noise, than the first comparative example.

A solid line L53 in B of FIG. 28 corresponds to the fifth example configuration (FIG. 26), and the dotted line L1 corresponds to the first comparative example (FIG. 9). As is apparent from comparison between the solid line L53 and the dotted line L1, the fifth example configuration can more effectively reduce changes in the induced electromotive force generated in the victim conductor loop, and more effectively reduce inductive noise, than the first comparative example.

A solid line L54 in C of FIG. 28 corresponds to the sixth example configuration (FIG. 27), and the dotted line L1 corresponds to the first comparative example (FIG. 9). As is apparent from comparison between the solid line L54 and the dotted line L1, the sixth example configuration can more effectively reduce changes in the induced electromotive force generated in the victim conductor loop, and more effectively reduce inductive noise, than the first comparative example.

Further, as is apparent from comparison among the solid lines 152 through 154, the sixth example configuration can more effectively reduce changes in the induced electromotive force generated in the victim conductor loop, and more effectively reduce inductive noise, than the fourth example configuration and the fifth example configuration.

Seventh Example Configuration

Figure 29:
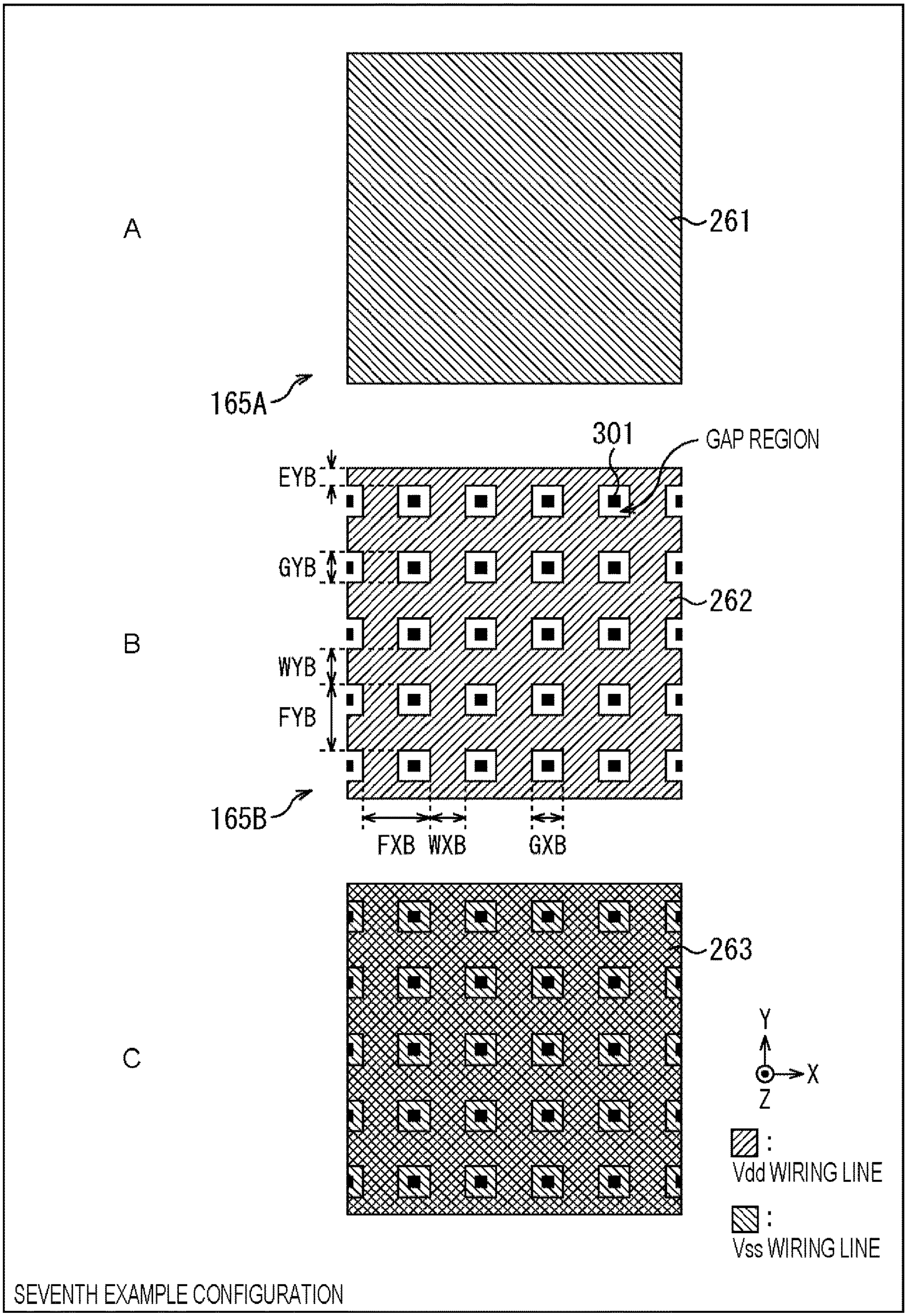
FIG. 29 is a diagram showing a seventh example configuration of the conductor layers A and B.

Next, FIG. 29 shows a seventh example configuration of the conductor layers A and B. Note that A of FIG. 29 shows the conductor layer A, and B of FIG. 29 shows the conductor layer B. In the coordinate system in FIG. 29, the horizontal direction is the X-axis, the vertical direction is the Y-axis, and the direction perpendicular to the X-Y plane is the Z-axis.

The conductor layer A in the seventh example configuration is formed with a planar conductor 261. The planar conductor 261 is a wiring line (a Vss wiring line) connected to GND or a negative power supply, for example.

The conductor layer B in the seventh example configuration is formed with a mesh conductor 262 and relay conductors 301. The mesh conductor 262 has a shape similar to the mesh conductor 222 of the conductor layer B in the third example configuration (FIG. 22), and therefore, explanation thereof is not made herein. The mesh conductor 262 is a wiring line (a Vdd wiring line) connected to a positive power supply, for example.

The relay conductors (the other conductors) 301 are disposed in gap regions that are not the conductor of the mesh conductor 262, are electrically insulated from the mesh conductor 262, and are connected to Vss to which the planar conductor 261 of the conductor layer A is connected.

The shape of the relay conductors 301 is any appropriate shape, and is preferably a symmetrical circular or polygonal shape such as a rotationally symmetrical shape or a mirror-symmetrical shape. Each relay conductor 301 can be disposed at the center or any other appropriate position in a gap region in the mesh conductor 262. The relay conductors 301 may be connected to a conductor layer as a Vss wiring line different from the conductor layer A. The relay conductors 301 may be connected to a conductor layer as a Vss wiring line on a side closer to the active element group 167 than the conductor layer B. The relay conductors 301 can be connected to a conductor layer different from the conductor layer A, a conductor layer closer to the active element group 167 than the conductor layer B, or the like, through conductor vias (VIA) extending in the Z direction.

C of FIG. 29 shows a state in which the conductor layers A and B shown in A and B of FIG. 29 are viewed from the side of the photodiodes 141 (the back surface side). However, a hatched region 263 in which the diagonal lines intersect in C of FIG. 29 indicates the region in which the planar conductor 261 of the conductor layer A and the mesh conductor 262 of the conductor layer B overlap. In the case of the seventh example configuration, the active element group 167 is covered with at least one of the conductor layer A or the conductor layer B, so that hot carrier light emission from the active element group 167 can be blocked.

Further, in the case of the seventh example configuration, the relay conductors 301 are provided, so that the planar conductor 261 as a Vss wiring line can be connected to the active element group 167 at substantially the shortest distance or a short distance. As the planar conductor 261 and the active element group 167 are connected at substantially the shortest distance or a short distance, it is possible to reduce the voltage drop, the energy loss, or the inductive noise between the planar conductor 261 and the active element group 167.

Figure 30:
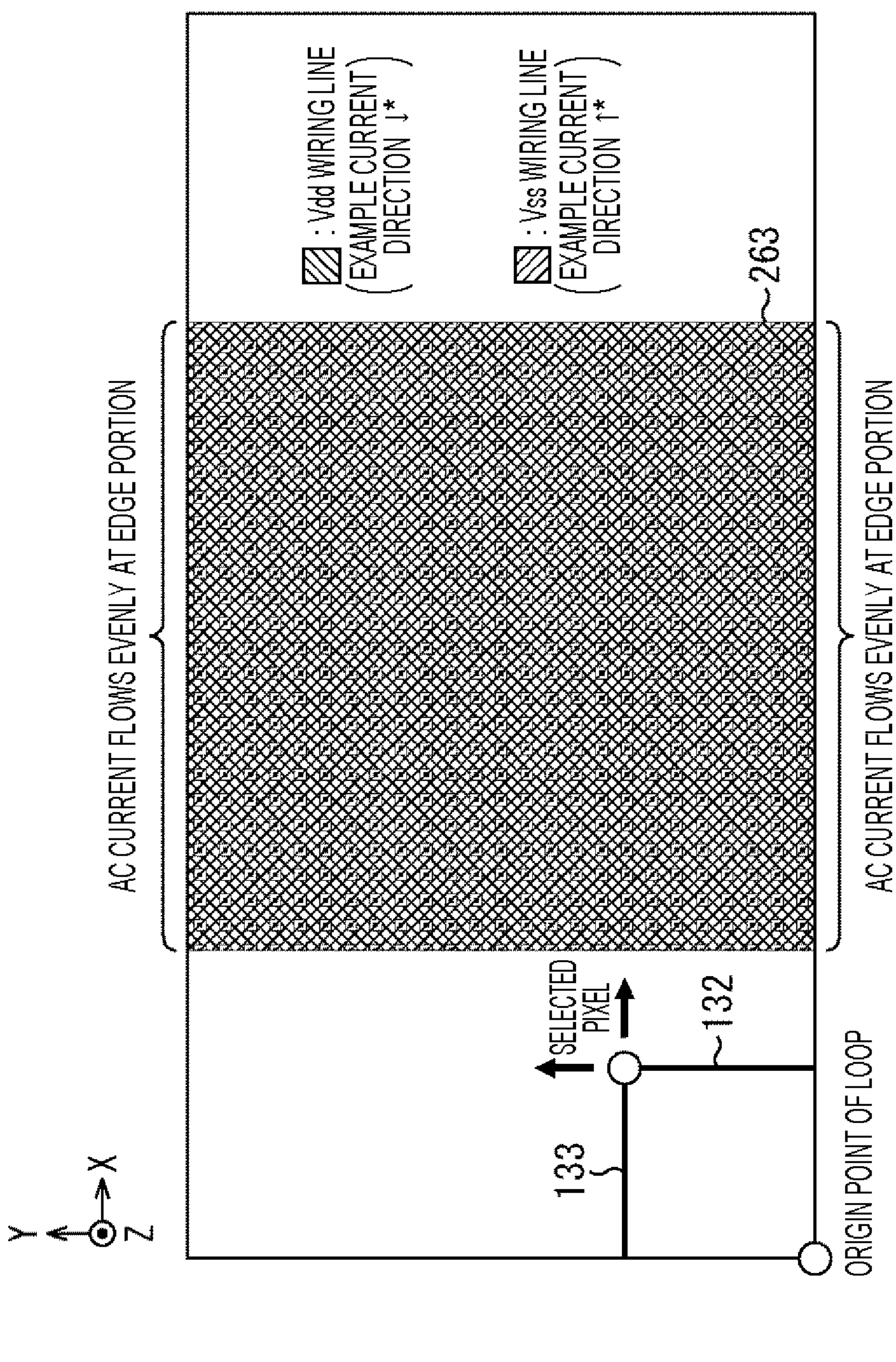
FIG. 30 is a diagram showing the conditions for the current flowing in the seventh example configuration.

FIG. 30 is a diagram showing the conditions for the current flowing in the seventh example configuration (FIG. 29).

It is assumed that an AC current flows evenly at the edge portions of the planar conductor 261 forming the conductor layer A and the mesh conductor 262 forming the conductor layer B. However, the current direction changes with time. When current flows in the mesh conductor 262 as a Vdd wiring line from the top side toward the bottom side of the drawing, for example, current flows in the planar conductor 261 as a Vss wiring line from the bottom side toward the top side of the drawing.

In a case where current flows as shown in FIG. 30 in the seventh example configuration, magnetic fluxes substantially in the X direction and the Y direction are likely to be generated between the planar conductor 261 as a Vss wiring line and the mesh conductor 262 as a Vdd wiring line by a conductor loop that has a loop plane almost perpendicular to the X-axis, and a conductor loop that has a loop plane almost perpendicular to the Y-axis. These conductor loops are formed in the cross-sections in which the planar conductor 261 and the mesh conductor 262 are disposed, and include (cross-sections of) the planar conductor 261 and the mesh conductor 262.

On the other hand, in the pixel array 121 of the first semiconductor substrate 101 stacked on the second semiconductor substrate 102 in which the light blocking structure 151 formed with the conductor layers A and B is formed, a victim conductor loop formed with a signal line 132 and a control line 133 is formed in the X-Y plane. In the victim conductor loop formed in the X-Y plane, induced electromotive force is easily generated by the magnetic flux in the Z direction. The greater a change in the induced electromotive force, the poorer an image output from the solid-state imaging device 100 (or the greater the inductive noise).

Further, when the selected pixel is moved in the pixel array 121, and the effective size of the victim conductor loop formed with a signal line 132 and a control line 133 is changed accordingly, the change in the induced electromotive force becomes conspicuous.

In the case of the seventh example configuration, the directions of the magnetic fluxes (substantially in the X direction and the Y direction) generated from the loop plane of the aggressor conductor loop of the light blocking structure 151 formed with the conductor layers A and B are substantially orthogonal to and differ almost 90 degrees from the direction of the magnetic flux (in the Z direction) that causes an induced electromotive force in the victim conductor loop. In other words, the direction of the loop plane in which magnetic fluxes are generated from the aggressor conductor loop differs almost 90 degrees from the direction of the loop plane in which induced electromotive force is generated in the victim conductor loop. Therefore, degradation of an image output from the solid-state imaging device 100 (generation of inductive noise) is predicted to be smaller than that in the first comparative example.

Figure 31:
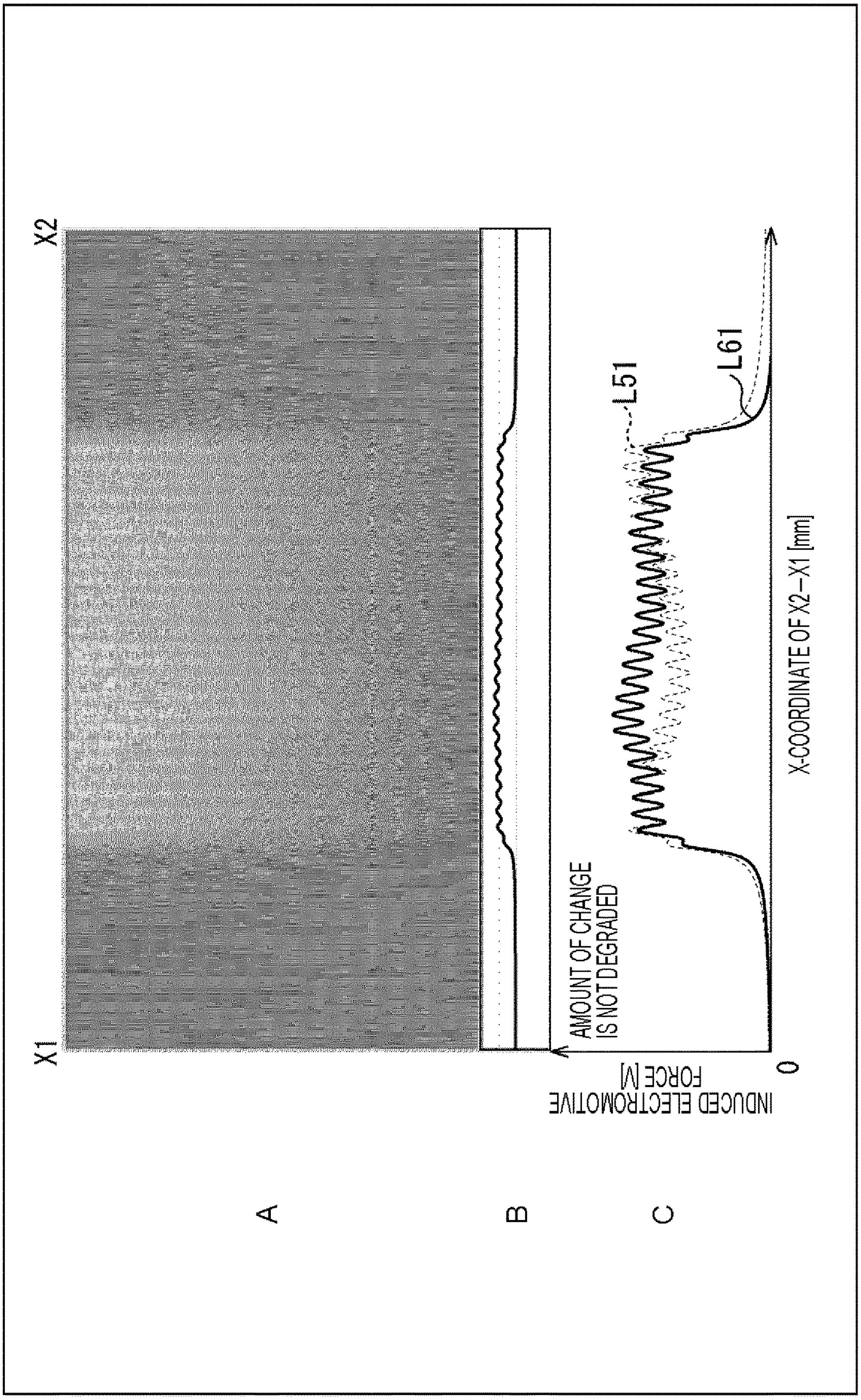
FIG. 31 is a diagram showing the result of a simulation of inductive noise corresponding to the seventh example configuration.

FIG. 31 shows the result of a simulation of inductive noise that occurs in a case where the seventh example configuration (FIG. 29) is applied to the solid-state imaging device 100.

A of FIG. 31 shows an image that is output from the solid-state imaging device 100 and may have inductive noise therein. B of FIG. 31 shows changes in pixel signals in a line segment X1-X2 of the image shown in A of FIG. 31. C of FIG. 31 shows a solid line L61 representing the induced electromotive force that has caused the inductive noise in the image. The abscissa axis in C of FIG. 31 indicates the X-axis coordinate of the image, and the ordinate axis indicates the magnitude of the induced electromotive force. Note that a dotted line L51 in C of FIG. 31 corresponds to the third example configuration (FIG. 22).

As is apparent from comparison between the solid line L61 and the dotted line L51 shown in C of FIG. 31, the seventh example configuration does not degrade the changes in the induced electromotive force generated in the victim conductor loop, compared with the third example configuration. That is, in the seventh example configuration in which the relay conductors 301 are disposed in the gaps in the mesh conductor 262 of the conductor layer B, generation of inductive noise in images output from the solid-state imaging device 100 can also be reduced to the same degree as in the third example configuration. However, this simulation result is a simulation result in a case where the planar conductor 261 is not connected to the active element group 167, and the mesh conductor 262 is not connected to the active element group 167. For example, in a case where the planar conductor 261 and at least part of the active element group 167 are connected at substantially the shortest distance or a short distance through a conductor via or the like, or in a case where the mesh conductor 262 and at least part of the active element group 167 are connected at substantially the shortest distance or a short distance through a conductor via or the like, the amount of current flowing in the planar conductor 261 or the mesh conductor 262 gradually decreases depending on the position. In such a case, there is also that a condition the relay conductors 301 are adopted so that the voltage drop, energy loss, and inductive noise significantly decrease by more than half.

Eighth Example Configuration

Figure 32:
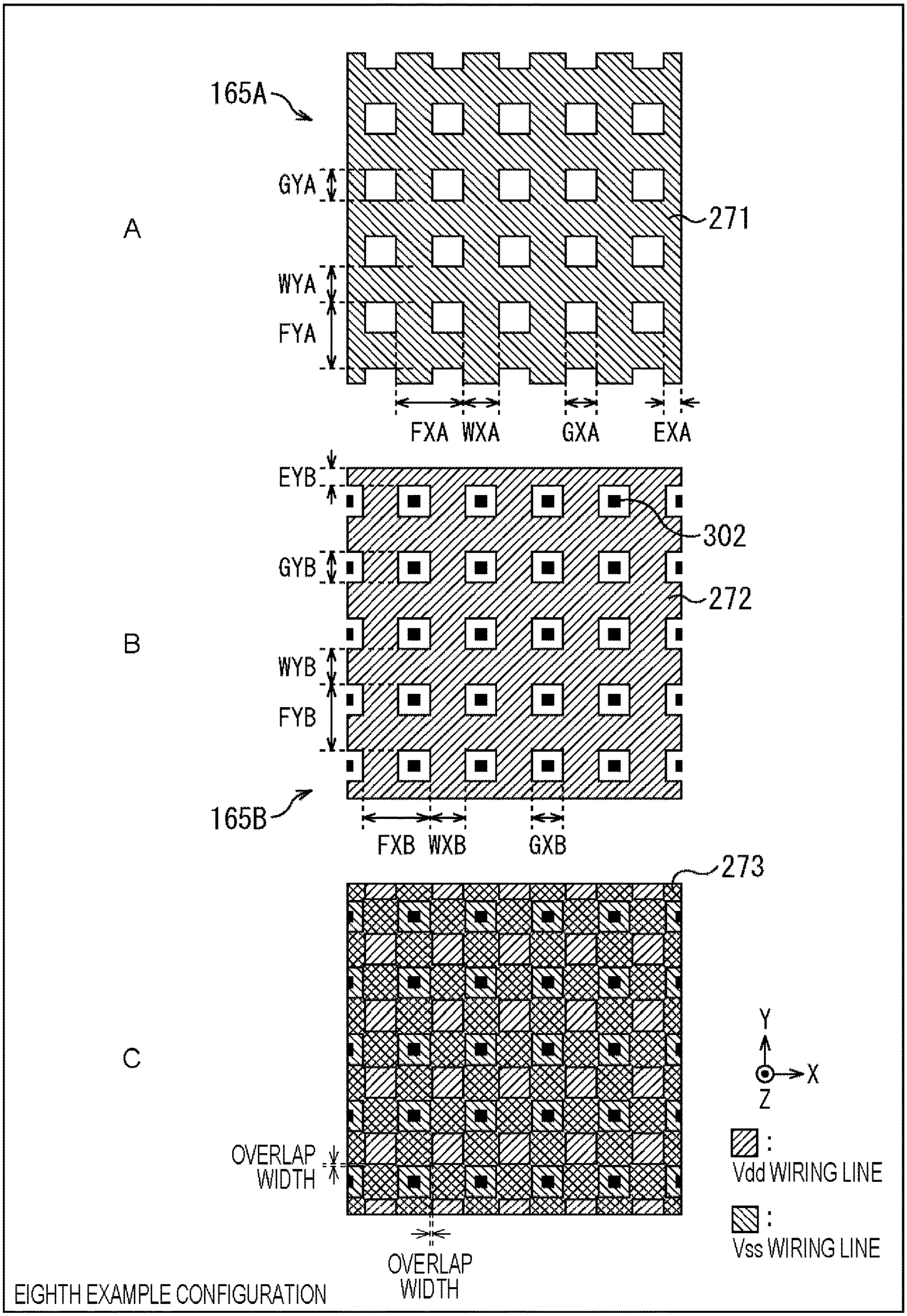
FIG. 32 is a diagram showing an eighth example configuration of the conductor layers A and B.

Next, FIG. 32 shows an eighth example configuration of the conductor layers A and B. Note that A of FIG. 32 shows the conductor layer A, and B of FIG. 32 shows the conductor layer B. In the coordinate system in FIG. 32, the horizontal direction is the X-axis, the vertical direction is the Y-axis, and the direction perpendicular to the X-Y plane is the Z-axis.

The conductor layer A in the eighth example configuration is formed with a mesh conductor 271. The mesh conductor 271 has a shape similar to the mesh conductor 231 of the conductor layer A in the fourth example configuration (FIG. 25), and therefore, explanation thereof is not made herein.

The mesh conductor 271 is a wiring line (a Vss wiring line) connected to GND or a negative power supply, for example.

The conductor layer B in the eighth example configuration is formed with a mesh conductor 272 and relay conductors 302. The mesh conductor 272 has a shape similar to the mesh conductor 232 of the conductor layer B in the fourth example configuration (FIG. 25), and therefore, explanation thereof is not made herein. The mesh conductor 232 is a wiring line (a Vdd wiring line) connected to a positive power supply, for example.

The relay conductors (the other conductors) 302 are disposed in gap regions that are not the conductor of the mesh conductor 272, are electrically insulated from the mesh conductor 272, and are connected to Vss to which the mesh conductor 271 of the conductor layer A is connected.

Note that the shape of the relay conductors 302 is any appropriate shape, and is preferably a symmetrical circular or polygonal shape such as a rotationally symmetrical shape or a mirror-symmetrical shape. Each relay conductor 302 can be disposed at the center or any other appropriate position in a gap region in the mesh conductor 272. The relay conductors 302 may be connected to a conductor layer as a Vss wiring line different from the conductor layer A. The relay conductors 302 may be connected to a conductor layer as a Vss wiring line on a side closer to the active element group 167 than the conductor layer B. The relay conductors 302 can be connected to a conductor layer different from the conductor layer A, a conductor layer closer to the active element group 167 than the conductor layer B, or the like, through conductor vias (VIA) extending in the Z direction.

C of FIG. 32 shows a state in which the conductor layers A and B shown in A and B of FIG. 32 are viewed from the side of the photodiodes 141 (the back surface side). However, a hatched region 273 in which the diagonal lines intersect in C of FIG. 32 indicates the region in which the mesh conductor 271 of the conductor layer A and the mesh conductor 272 of the conductor layer B overlap. In the case of the eighth example configuration, the active element group 167 is covered with at least one of the conductor layer A or the conductor layer B, so that hot carrier light emission from the active element group 167 can be blocked.

In the eighth example configuration, in a case where current flows in a manner similar to that in the case shown FIG. 30, magnetic fluxes substantially in the X direction and in the Y direction are likely to be generated between the mesh conductor 271 as a Vss wiring line and the mesh conductor 272 as a Vdd wiring line by a conductor loop that has a loop plane almost perpendicular to the X-axis, and a conductor loop that has a loop plane almost perpendicular to the Y-axis. These conductor loops are formed in the cross-sections in which the mesh conductors 271 and 272 are disposed, and include (cross-sections of) the mesh conductors 271 and 272.

Further, in the case of the eighth example configuration, the relay conductors 302 are provided, so that the mesh conductor 271 as a Vss wiring line can be connected to the active element group 167 at substantially the shortest distance or a short distance. As the mesh conductor 271 and the active element group 167 are connected at substantially the shortest distance or a short distance, it is possible to reduce the voltage drop, the energy loss, or the inductive noise between the mesh conductor 271 and the active element group 167.

Ninth Example Configuration

Figure 33:
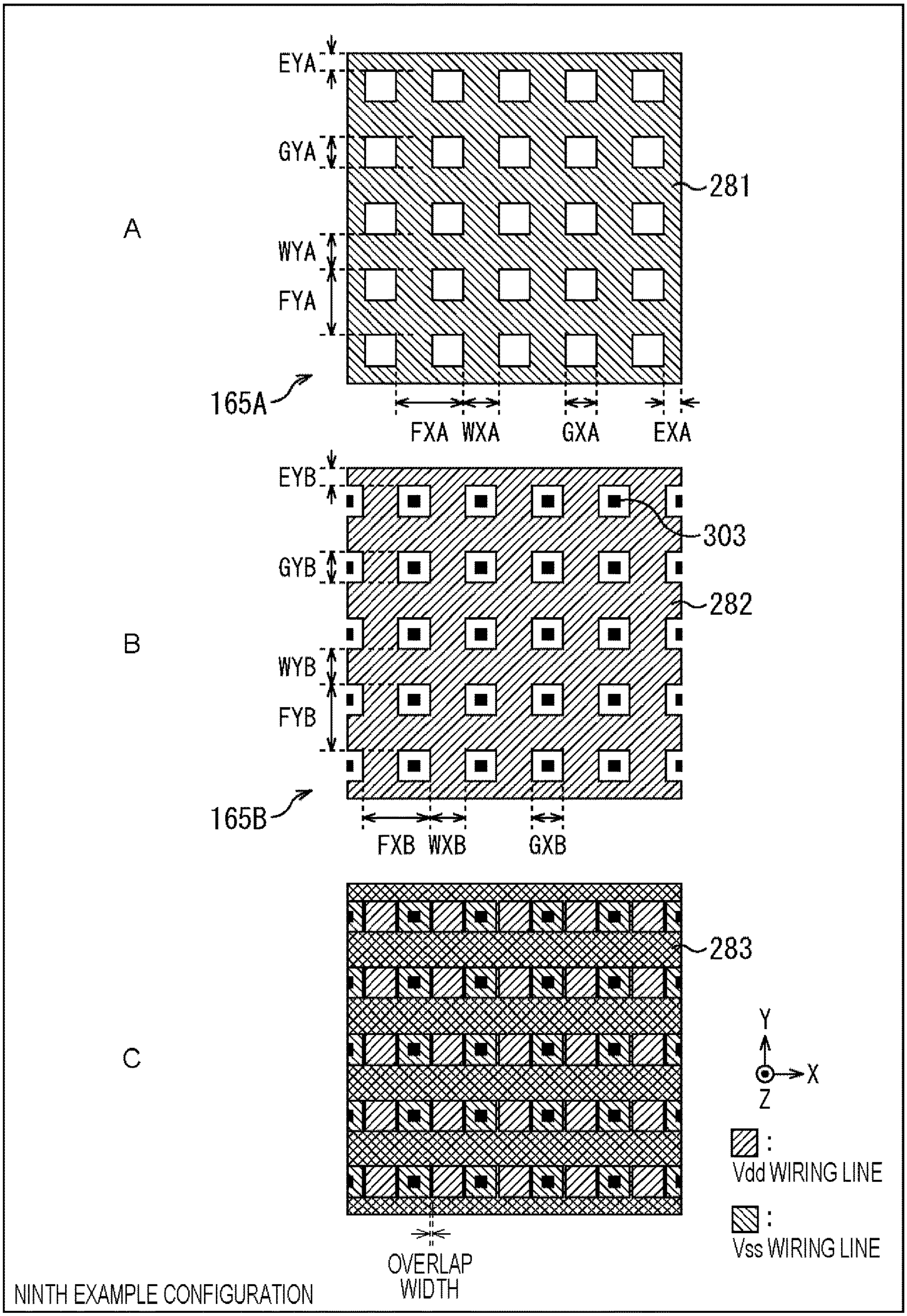
FIG. 33 is a diagram showing a ninth example configuration of the conductor layers A and B.

Next, FIG. 33 shows a ninth example configuration of the conductor layers A and B. Note that A of FIG. 33 shows the conductor layer A, and B of FIG. 33 shows the conductor layer B. In the coordinate system in FIG. 33, the horizontal direction is the X-axis, the vertical direction is the Y-axis, and the direction perpendicular to the X-Y plane is the Z-axis.

The conductor layer A in the ninth example configuration is formed with a mesh conductor 281. The mesh conductor 281 has a shape similar to the mesh conductor 241 of the conductor layer A in the fifth example configuration (FIG. 26), and therefore, explanation thereof is not made herein. The mesh conductor 281 is a wiring line (a Vss wiring line) connected to GND or a negative power supply, for example.

The conductor layer B in the ninth example configuration is formed with a mesh conductor 282 and relay conductors 303. The mesh conductor 282 has a shape similar to the mesh conductor 242 of the conductor layer B in the fifth example configuration (FIG. 26), and therefore, explanation thereof is not made herein. The mesh conductor 282 is a wiring line (a Vdd wiring line) connected to a positive power supply, for example.

The relay conductors (the other conductors) 303 are disposed in gap regions that are not the conductor of the mesh conductor 282, are electrically insulated from the mesh conductor 282, and are connected to Vss to which the mesh conductor 281 of the conductor layer A is connected.

Note that the shape of the relay conductors 303 is any appropriate shape, and is preferably a symmetrical circular or polygonal shape such as a rotationally symmetrical shape or a mirror-symmetrical shape. Each relay conductor 303 can be disposed at the center or any other appropriate position in a gap region in the mesh conductor 282. The relay conductors 303 may be connected to a conductor layer as a Vss wiring line different from the conductor layer A. The relay conductors 303 may be connected to a conductor layer as a Vss wiring line on a side closer to the active element group 167 than the conductor layer B. The relay conductors 303 can be connected to a conductor layer different from the conductor layer A, a conductor layer closer to the active element group 167 than the conductor layer B, or the like, through conductor vias (VIA) extending in the Z direction.

C of FIG. 33 shows a state in which the conductor layers A and B shown in A and B of FIG. 33 are viewed from the side of the photodiodes 141 (the back surface side). However, a hatched region 283 in which the diagonal lines intersect in C of FIG. 33 indicates the region in which the mesh conductor 281 of the conductor layer A and the mesh conductor 282 of the conductor layer B overlap. In the case of the ninth example configuration, the active element group 167 is covered with at least one of the conductor layer A or the conductor layer B, so that hot carrier light emission from the active element group 167 can be blocked.

In the ninth example configuration, in a case where current flows in a manner similar to that in the case shown FIG. 30, magnetic fluxes substantially in the X direction and in the Y direction are likely to be generated between the mesh conductor 281 as a Vss wiring line and the mesh conductor 282 as a Vdd wiring line by a conductor loop that has a loop plane almost perpendicular to the X-axis, and a conductor loop that has a loop plane almost perpendicular to the Y-axis. These conductor loops are formed in the cross-sections in which the mesh conductors 281 and 282 are disposed, and include (cross-sections of) the mesh conductors 281 and 282.

Further, in the case of the ninth example configuration, the relay conductors 303 are provided, so that the mesh conductor 281 as a Vss wiring line can be connected to the active element group 167 at substantially the shortest distance or a short distance. As the mesh conductor 281 and the active element group 167 are connected at substantially the shortest distance or a short distance, it is possible to reduce the voltage drop, the energy loss, or the inductive noise between the mesh conductor 281 and the active element group 167.

Tenth Example Configuration

Figure 34:
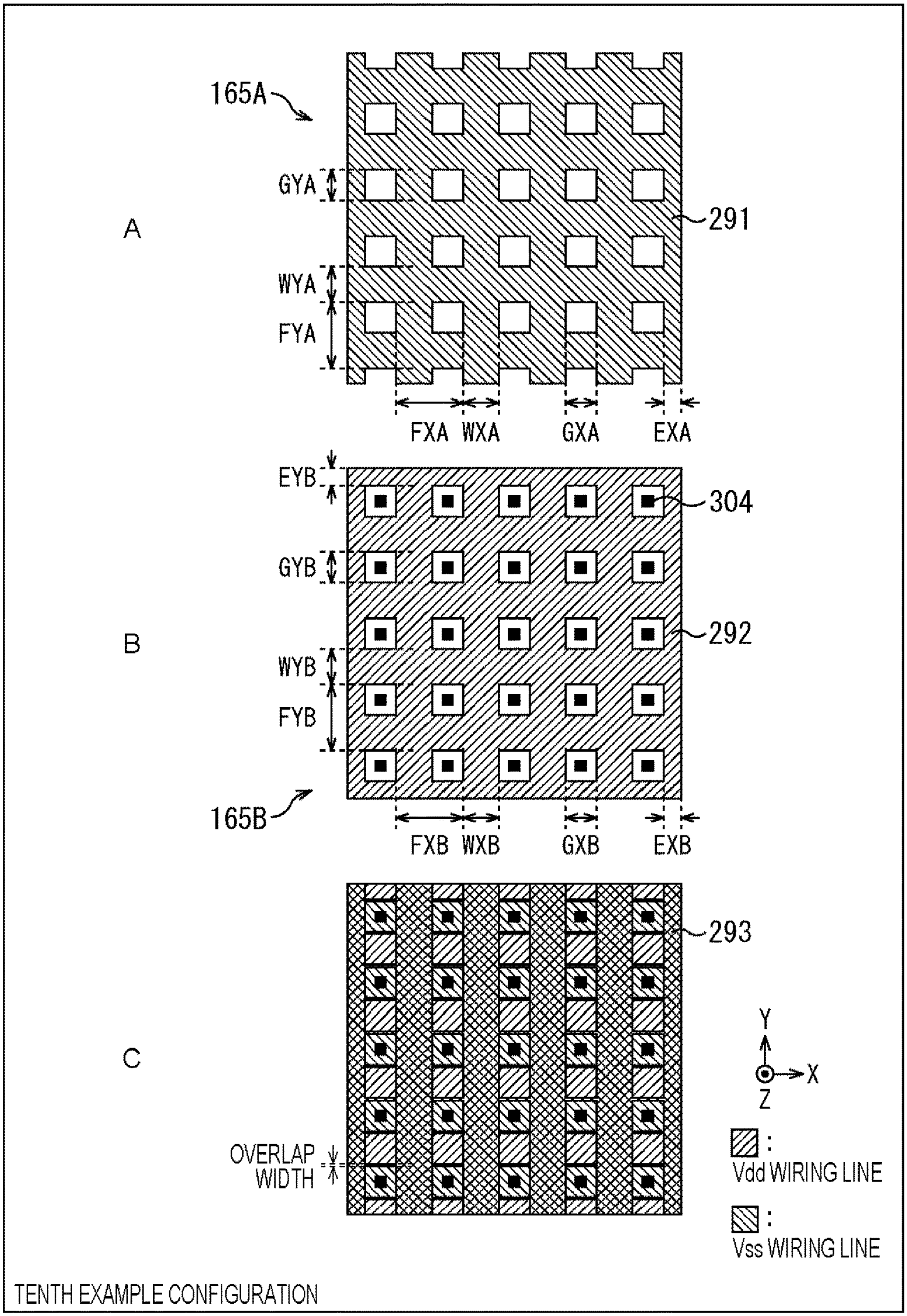
FIG. 34 is a diagram showing a tenth example configuration of the conductor layers A and B.

Next, FIG. 34 shows a tenth example configuration of the conductor layers A and B. Note that A of FIG. 34 shows the conductor layer A, and B of FIG. 34 shows the conductor layer B. In the coordinate system in FIG. 34, the horizontal direction is the X-axis, the vertical direction is the Y-axis, and the direction perpendicular to the X-Y plane is the Z-axis.

The conductor layer A in the tenth example configuration is formed with a mesh conductor 291. The mesh conductor 291 has a shape similar to the mesh conductor 251 of the conductor layer A in the sixth example configuration (FIG. 27), and therefore, explanation thereof is not made herein. The mesh conductor 291 is a wiring line (a Vss wiring line) connected to GND or a negative power supply, for example.

The conductor layer B in the tenth example configuration is formed with a mesh conductor 292 and relay conductors 304. The mesh conductor 292 has a shape similar to the mesh conductor 252 of the conductor layer B in the sixth example configuration (FIG. 27), and therefore, explanation thereof is not made herein. The mesh conductor 292 is a wiring line (a Vdd wiring line) connected to a positive power supply, for example.

The relay conductors (the other conductors) 304 are disposed in gap regions that are not the conductor of the mesh conductor 292, are electrically insulated from the mesh conductor 292, and are connected to Vss to which the mesh conductor 291 of the conductor layer A is connected.

Note that the shape of the relay conductors 304 is any appropriate shape, and is preferably a symmetrical circular or polygonal shape such as a rotationally symmetrical shape or a mirror-symmetrical shape. Each relay conductor 304 can be disposed at the center or any other appropriate position in a gap region in the mesh conductor 292. The relay conductors 304 may be connected to a conductor layer as a Vss wiring line different from the conductor layer A. The relay conductors 304 may be connected to a conductor layer as a Vss wiring line on a side closer to the active element group 167 than the conductor layer B. The relay conductors 304 can be connected to a conductor layer different from the conductor layer A, a conductor layer closer to the active element group 167 than the conductor layer B, or the like, through conductor vias (VIA) extending in the Z direction.

C of FIG. 34 shows a state in which the conductor layers A and B shown in A and B of FIG. 34 are viewed from the side of the photodiodes 141 (the back surface side). However, a hatched region 293 in which the diagonal lines intersect in C of FIG. 34 indicates the region in which the mesh conductor 291 of the conductor layer A and the mesh conductor 292 of the conductor layer B overlap. In the case of the tenth example configuration, the active element group 167 is covered with at least one of the conductor layer A or the conductor layer B, so that hot carrier light emission from the active element group 167 can be blocked.

In the tenth example configuration, in a case where current flows in a manner similar to that in the case shown FIG. 30, magnetic fluxes substantially in the X direction and in the Y direction are likely to be generated between the mesh conductor 291 as a Vss wiring line and the mesh conductor 292 as a Vdd wiring line by a conductor loop that has a loop plane almost perpendicular to the X-axis, and a conductor loop that has a loop plane almost perpendicular to the Y-axis. These conductor loops are formed in the cross-sections in which the mesh conductors 291 and 292 are disposed, and include (cross-sections of) the mesh conductors 291 and 292.

Further, in the case of the tenth example configuration, the relay conductors 304 are provided, so that the mesh conductor 291 as a Vss wiring line can be connected to the active element group 167 at substantially the shortest distance or a short distance. As the mesh conductor 291 and the active element group 167 are connected at substantially the shortest distance or a short distance, it is possible to reduce the voltage drop, the energy loss, or the inductive noise between the mesh conductor 291 and the active element group 167.

<Results of Simulations of the Eighth through Tenth Example Configurations>

Figure 35:
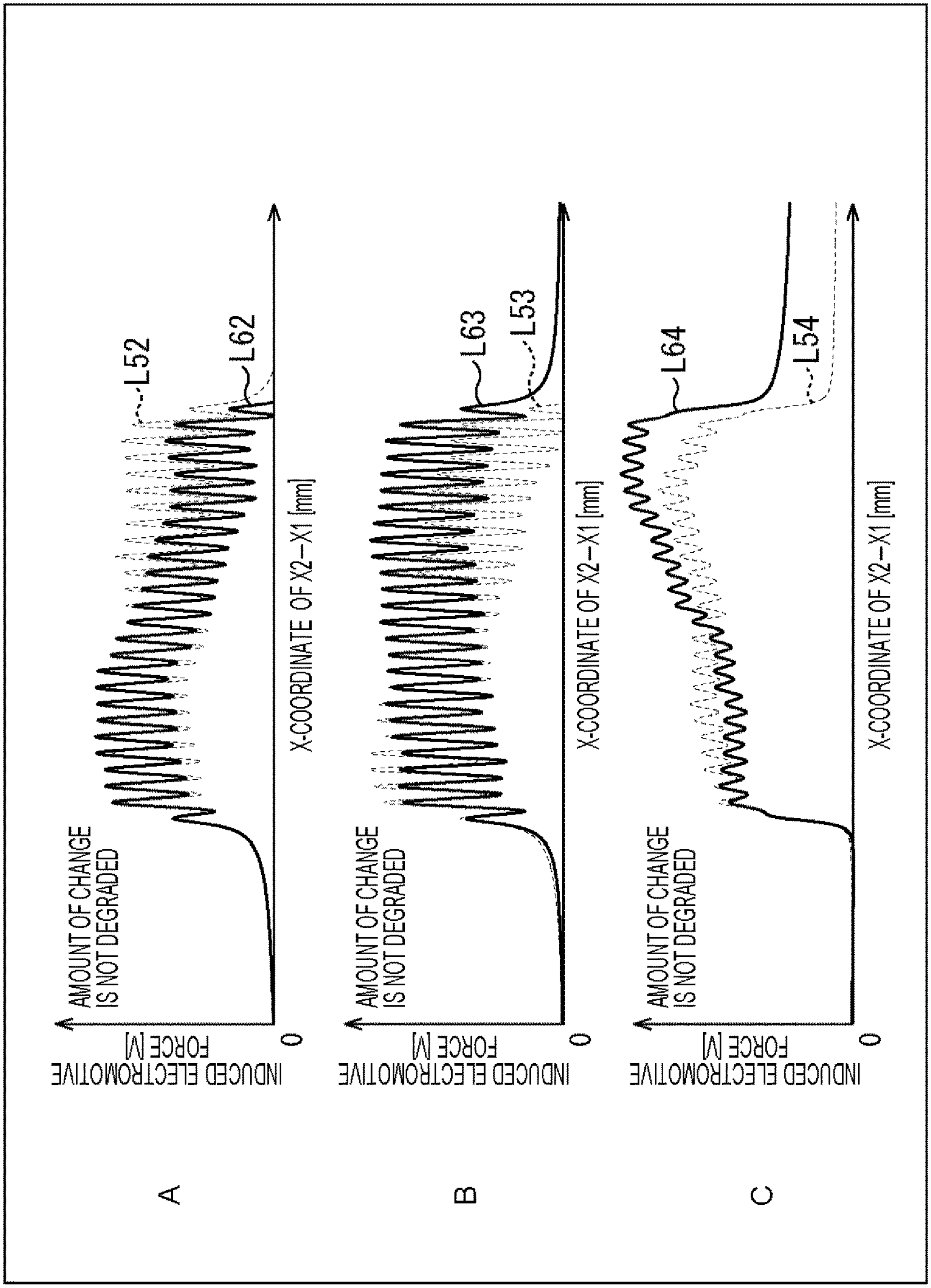
FIG. 35 is a diagram showing the results of inductive noise simulations corresponding to the eighth through tenth example configurations.

FIG. 35 shows changes in the induced electromotive force that causes inductive noise in images as the results of simulations performed in the cases where the eighth through tenth example configurations (FIGS. 32 through 34) are applied to the solid-state imaging device 100. Note that the conditions for the current flowing in the eighth through tenth example configurations are similar to those shown in FIG. 30. The abscissa axis in FIG. 35 indicates the X-axis coordinate of the image, and the ordinate axis indicates the magnitude of the induced electromotive force.

A solid line L62 in A of FIG. 35 corresponds to the eighth example configuration 32), and a dotted line L52 corresponds to the fourth example configuration (FIG. 25). As is apparent from comparison between the solid line L62 and the dotted line L52, the eighth example configuration does not degrade the changes in the induced electromotive force generated in the victim conductor loop, compared with the fourth example configuration. That is, in the eighth example configuration in which the relay conductors 302 are disposed in the gaps in the mesh conductor 272 of the conductor layer B, generation of inductive noise in images output from the solid-state imaging device 100 can also be reduced to the same degree as in the fourth example configuration. However, this simulation result is a simulation result in a case where the mesh conductor 271 is not connected to the active element group 167, and the mesh conductor 272 is not connected to the active element group 167. For example, in a case where the mesh conductor 271 and at least part of the active element group 167 are connected at substantially the shortest distance or a short distance through a conductor via or the like, or in a case where the mesh conductor 272 and at least part of the active element group 167 are connected at substantially the shortest distance or a short distance through a conductor via or the like, the amount of current flowing in the mesh conductor 271 or the mesh conductor 272 gradually decreases depending on the position. In such a case, there is also a condition that the relay conductors 302 are adopted so that the voltage drop, energy loss, and inductive noise significantly decrease by more than half.

A solid line L63 in B of FIG. 35 corresponds to the ninth example configuration (FIG. 33), and a dotted line 153 corresponds to the fifth example configuration (FIG. 26). As is apparent from comparison between the solid line L63 and the dotted line L53, the ninth example configuration does not degrade the changes in the induced electromotive force generated in the victim conductor loop, compared with the fifth example configuration. That is, in the ninth example configuration in which the relay conductors 303 are disposed in the gaps in the mesh conductor 282 of the conductor layer B, generation of inductive noise in images output from the solid-state imaging device 100 can also be reduced to the same degree as in the fifth example configuration. However, this simulation result is a simulation result in a case where the mesh conductor 281 is not connected to the active element group 167, and the mesh conductor 282 is not connected to the active element group 167. For example, in a case where the mesh conductor 281 and at least part of the active element group 167 are connected at substantially the shortest distance or a short distance through a conductor via or the like, or in a case where the mesh conductor 282 and at least part of the active element group 167 are connected at substantially the shortest distance or a short distance through a conductor via or the like, the amount of current flowing in the mesh conductor 281 or the mesh conductor 282 gradually decreases depending on the position. In such a case, there is also a condition that the relay conductors 303 are adopted so that the voltage drop, energy loss, and inductive noise significantly decrease by more than half.

A solid line L64 in C of FIG. 35 corresponds to the tenth example configuration (FIG. 34), and a dotted line 154 corresponds to the sixth example configuration (FIG. 27). As is apparent from comparison between the solid line L64 and the dotted line L54, the tenth example configuration does not degrade the changes in the induced electromotive force generated in the victim conductor loop, compared with the sixth example configuration. That is, in the tenth example configuration in which the relay conductors 304 are disposed in the gaps in the mesh conductor 292 of the conductor layer B, generation of inductive noise in images output from the solid-state imaging device 100 can also be reduced to the same degree as in the sixth example configuration. However, this simulation result is a simulation result in a case where the mesh conductor 291 is not connected to the active element group 167, and the mesh conductor 292 is not connected to the active element group 167. For example, in a case where the mesh conductor 291 and at least part of the active element, group 167 are connected at substantially the shortest distance or a short distance through a conductor via or the like, or in a case where the mesh conductor 292 and at least part of the active element group 167 are connected at substantially the shortest distance or a short distance through a conductor via or the like, the amount of current flowing in the mesh conductor 291 or the mesh conductor 292 gradually decreases depending on the position. In such a case, there is also a condition that the relay conductors 304 are adopted so that the voltage drop, energy loss, and inductive noise significantly decrease by more than half.

Further, as is apparent from comparison among the solid lines 162 through 164, the tenth example configuration can more effectively reduce changes in the induced electromotive force generated in the victim conductor loop, and more effectively reduce inductive noise, than the eighth example configuration and the ninth example configuration.

Eleventh Example Configuration

Figure 36:
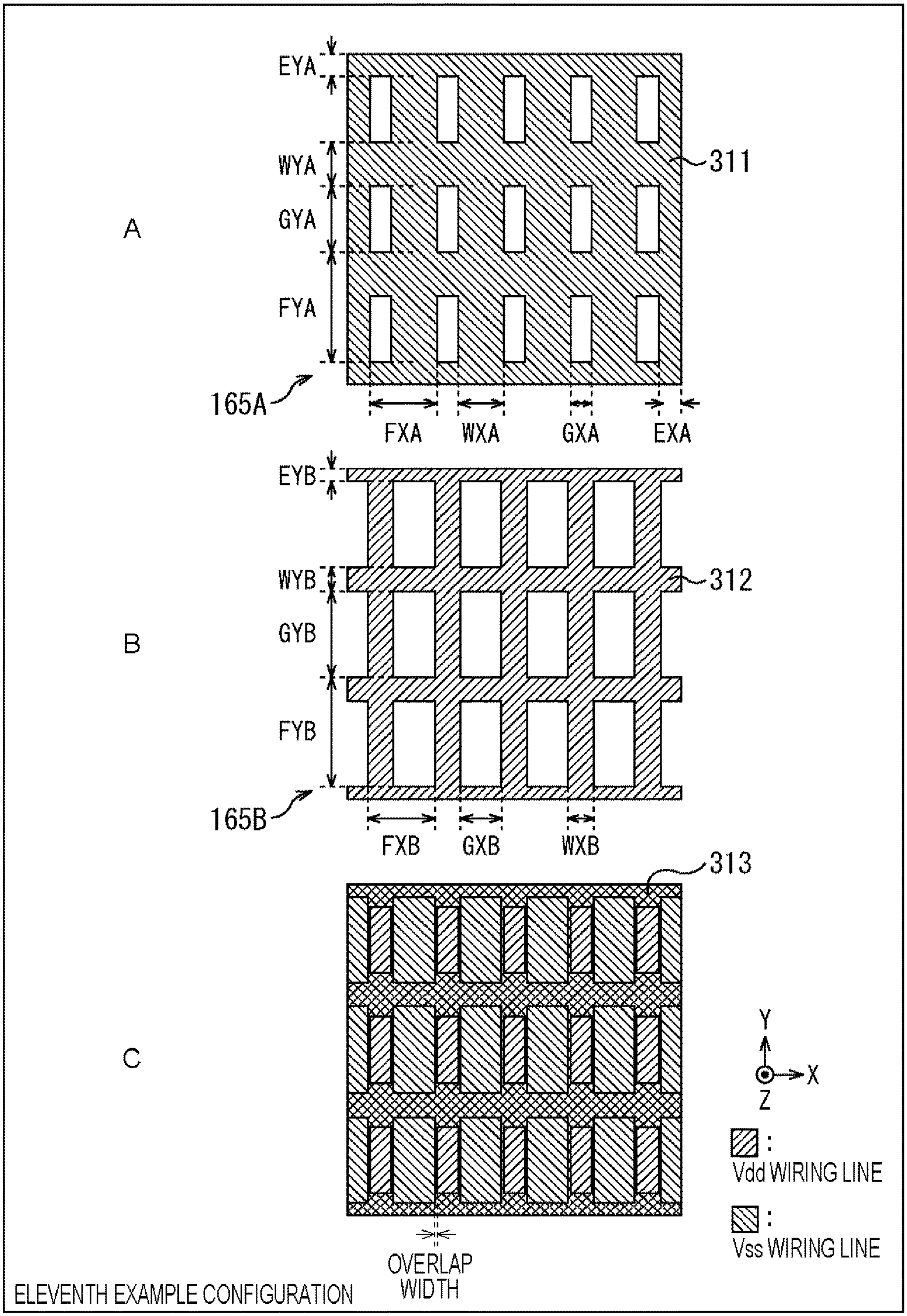
FIG. 36 is a diagram showing an eleventh example configuration of the conductor layers A and B.

Next, FIG. 36 shows an eleventh example configuration of the conductor layers A and B. Note that A of FIG. 36 shows the conductor layer A, and B of FIG. 36 shows the conductor layer B. In the coordinate system in FIG. 36, the horizontal direction is the X-axis, the vertical direction is the Y-axis, and the direction perpendicular to the X-Y plane is the Z-axis.

The conductor layer A in the eleventh example configuration is formed with a mesh conductor 311 having different resistance values in the X direction (a first direction) and the Y direction (a second direction). The mesh conductor 311 is a wiring line (a Vss wiring line) connected to GND or a negative power supply, for example.

The conductor width in the X direction in the mesh conductor 311 is represented by WXA, the gap width is represented by GXA, the conductor cycle is represented by FXA (=conductor width WXA+gap width GXA), and the edge width is represented by EXA (=conductor width WXA/2). Further, the conductor width in the Y direction is the mesh conductor 311 is represented by WYA, the gap width is represented by GYA, the conductor cycle is represented by FYA (=conductor width WYA+gap width GYA), and the edge width is represented by EYA (=conductor width WYA/2). In the mesh conductor 311, "gap width GYA>gap width GXA" is satisfied. Accordingly, each gap region of the mesh conductor 311 has a shape that is longer in the Y direction than in the X direction, the resistance values differ between the X direction and the Y direction, and the resistance value in the Y direction is smaller than the resistance value in the X direction.

The conductor layer B in the eleventh example configuration is formed with a mesh conductor 312 having different resistance values in the X direction and the Y direction. The mesh conductor 312 is a wiring line (a Vdd wiring line) connected to a positive power supply, for example.

The conductor width in the X direction in the mesh conductor 312 is represented by WXB, the gap width is represented by GXB, and the conductor cycle is represented by FXB (=conductor width WXB+gap width GXB). Further, the conductor width in the Y direction in the mesh conductor 312 is represented by WYB, the gap width is represented by GYB, the conductor cycle is represented by FYB (=conductor width WYB+gap width GYB), and the edge width is represented by EYB (=conductor width WYB/2). In the mesh conductor 312, "gap width GYB>gap width GXB" is satisfied. Accordingly, each gap region of the mesh conductor 312 has a shape that is longer in the Y direction than in the X direction, the resistance values differ between the X direction and the Y direction, and the resistance value in the Y direction is smaller than the resistance value in the X direction.

Note that, in a case where the sheet resistance value of the mesh conductor 311 is greater than the sheet resistance value of the mesh conductor 312, the mesh conductor 311 and the mesh conductor 312 preferably satisfy the following relationships.

$$\text{Conductor width } WYA \geq \text{conductor width } WYB$$

$$\text{Conductor width } WXA \geq \text{conductor width } WXB$$

$$\text{Gap width } GXA \leq \text{gap width } GXB$$

$$\text{Gap width } GYA \leq \text{gap width } GYB$$

In a case where the sheet resistance value of the mesh conductor 311 is smaller than the sheet resistance value of the mesh conductor 312, on the other hand, the mesh conductor 311 and the mesh conductor 312 preferably satisfy the following relationships.

$$\text{Conductor width } WYA \leq \text{conductor width } WYB$$

$$\text{Conductor width } WXA \leq \text{conductor width } WXB$$

$$\text{Gap width } GXA \geq \text{gap width } GXB$$

$$\text{Gap width } GYA \geq \text{gap width } GYP$$

Further, the sheet resistance values and the conductor widths of the mesh conductors 311 and 312 satisfy the following relationships.

(Sheet resistance value of mesh conductor 311)/(sheet resistance value of mesh conductor 312)≈conductor width *WYA*/conductor width *WYB*

(Sheet resistance value of mesh conductor 311)/(sheet resistance value of mesh conductor 312)≈conductor width *WXA*/conductor width *WXB*

The limitations related to the dimensional relationships disclosed in this specification are not essential, and the current distribution in the mesh conductor 311 and the current distribution in the mesh conductor 312 are substantially equal, substantially the same, or substantially similar current distributions. In addition to that, these current distributions are preferably designed to have opposite characteristics.

For example, the ratio between the wiring resistance of the mesh conductor 311 in the X direction and the wiring resistance of the mesh conductor 311 in the Y direction, and the ratio between the wiring resistance of the mesh conductor 312 in the X direction and the wiring resistance of the mesh conductor 312 in the Y direction are preferably designed to be substantially the same.

Also, the ratio between the wiring inductance of the mesh conductor 311 in the X direction and the wiring inductance of the mesh conductor 311 in the Y direction, and the ratio between the wiring inductance of the mesh conductor 312 in the X direction and the wiring inductance of the mesh conductor 312 in the Y direction are preferably designed to be substantially the same.

Further, the ratio between the wiring capacitance of the mesh conductor 311 in the X direction and the wiring capacitance of the mesh conductor 311 in the Y direction, and the ratio between the wiring capacitance of the mesh conductor 312 in the X direction and the wiring capacitance of the mesh conductor 312 in the Y direction are preferably designed to be substantially the same.

Also, the ratio between the wiring impedance of the mesh conductor 311 in the X direction and the wiring impedance of the mesh conductor 311 in the Y direction, and the ratio between the wiring impedance of the mesh conductor 312 in the X direction and the wiring impedance of the mesh conductor 312 in the Y direction are preferably designed to be substantially the same.

In other words, it is preferable to satisfy one of the relationships shown below, but satisfying this relationship is not essential:

(wiring resistance of mesh conductor 311 in *X* direction×wiring resistance of mesh conductor 312 in *Y* direction)≈(wiring resistance of mesh conductor 312 in *X* direction×wiring resistance of mesh conductor 311 in *Y* direction);

(wiring inductance of mesh conductor 311 in *X* direction×wiring inductance of mesh conductor 312 in *Y* direction)≈(wiring inductance of the mesh conductor 312 in *X* direction×wiring inductance of mesh conductor 311 in *Y* direction);

(wiring capacitance of mesh conductor 311 in *X* direction×wiring capacitance of mesh conductor 312 in *Y* direction)≈(wiring capacitance of mesh conductor 312 in *X* direction×wiring capacitance of mesh conductor 311 in *Y* direction); or (wiring impedance of mesh conductor 311 in *X* direction×wiring impedance of mesh conductor 312 in *Y* direction)≈(wiring impedance of mesh conductor 312 in *X* direction×wiring impedance of mesh conductor 311 in *Y* direction).

Note that the wiring resistances, wiring inductances, wiring capacitances, and wiring impedances described above can be replaced with conductor resistances, conductor inductances, conductor capacitances, and conductor impedances, respectively.

Note that the impedance Z, the resistance R, the inductance L, and the capacitance C described above have the relationship, Z=R+jωL+1÷(jωC), with an angular frequency ω and an imaginary unit j.

Note that the relationship of these ratios may be satisfied in the entire mesh conductor 311 and the entire mesh conductor 312, or may be satisfied within partial ranges of the mesh conductor 311 and the mesh conductor 312. The relationship is only required to be satisfied within any appropriate ranges.

Further, it is possible to adopt a circuit that performs adjustment so that the current distributions become substantially equal, substantially the same, or substantially similar, and have opposite characteristics.

As the relationships shown above are satisfied, the current distribution in the mesh conductor 311 and the current distribution in the mesh conductor 312 can be made substantially uniform, and be made to have opposite characteristics. Accordingly, the magnetic field generated by the current distribution in the mesh conductor 311 and the magnetic field generated by the current distribution in the mesh conductor 312 can be effectively canceled out.

C of FIG. 36 shows a state in which the conductor layers A and B shown in A and B of FIG. 36 are viewed from the side of the photodiodes 141 (the back surface side). However, a hatched region 313 in which the diagonal lines intersect in C of FIG. 36 indicates the region in which the mesh conductor 311 of the conductor layer A and the mesh conductor 312 of the conductor layer B overlap. In the case of the eleventh example configuration, the active element group 167 is covered with at least one of the conductor layer A or the conductor layer B, so that hot carrier light emission from the active element group 167 can be blocked.

Further, in the case of the eleventh example configuration, the overlapping region 313 between the mesh conductor 311 and the mesh conductor 312 extends in the X direction. In the region 313 in which the mesh conductor 311 and the mesh conductor 312 overlap, currents having different polarities from each other flow in the mesh conductor 311 and the mesh conductor 312, so that the magnetic fields generated from the region 313 cancel each other out. Thus, generation of inductive noise near the region 313 can be reduced.

Further, in the case of the eleventh example configuration, the gap width GYA in the Y direction and the gap width GXA in the X direction of the mesh conductor 311 are designed to be different, and the gap width GYB in the Y direction and the gap width GXB in the X direction of the mesh conductor 312 are designed to be different.

As the mesh conductors 311 and 312 are designed to have shapes with different gap widths in the X direction and the Y direction as described above, restrictions can be maintained on the size of the wiring regions, the size of the void regions, the occupancy of the wiring region in each conductor layer, and the like, at the time of the actual conductor layer designing and manufacturing. Thus, the degree of freedom in wiring layout design can be increased. Further, the wiring lines can be designed in a layout that is advantageous in terms of voltage drop (IR-Drop), inductive noise, and the like, compared with a case where the gap widths have no difference.

Figure 37:
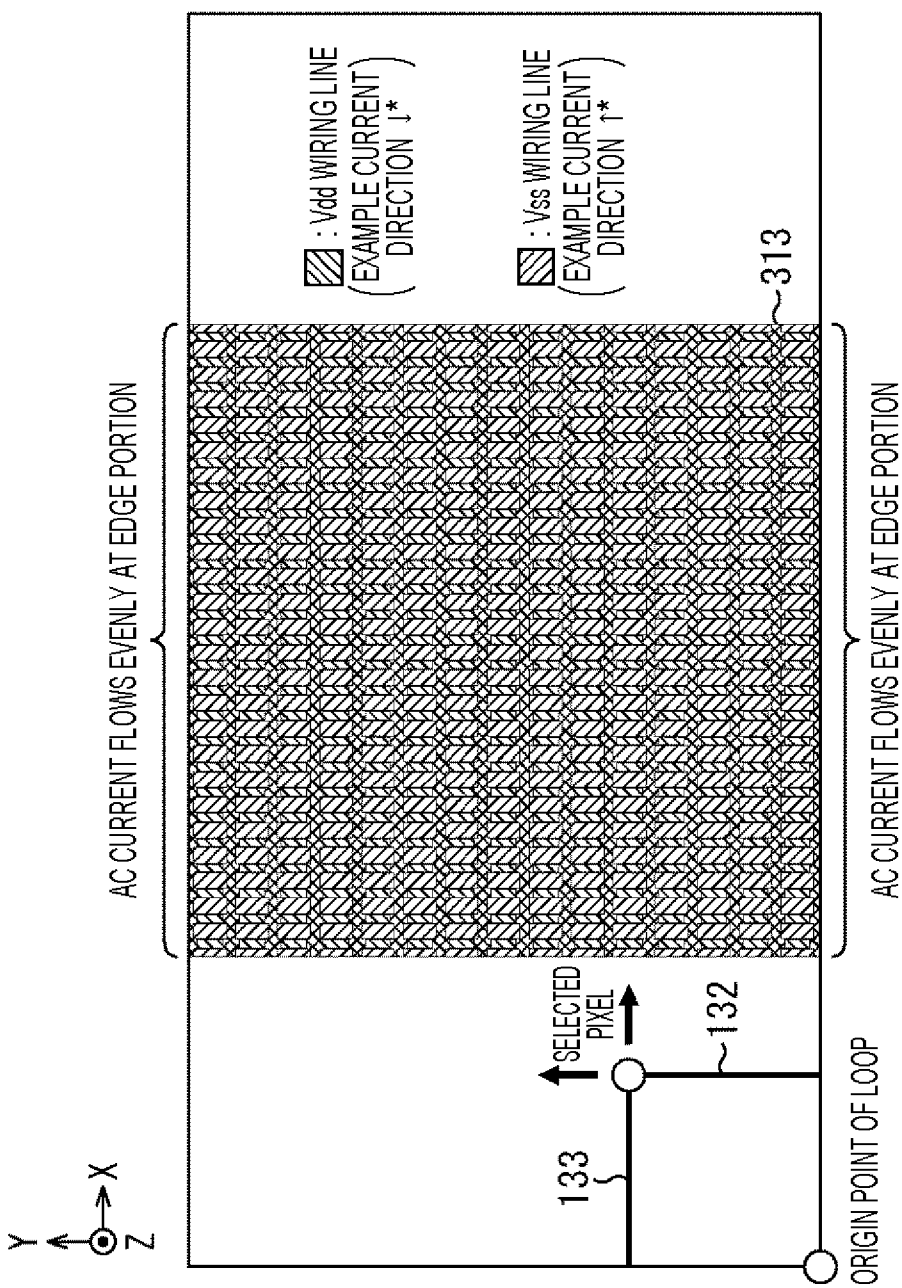
FIG. 37 is a diagram showing the conditions for the current flowing in the eleventh example configuration.

FIG. 37 is a diagram showing the conditions for the current flowing in the eleventh example configuration (FIG. 36).

It is assumed that an AC current flows evenly at the edge portions of the mesh conductor 311 forming the conductor layer A and the mesh conductor 312 forming the conductor layer B. However, the current direction changes with time. When current flows in the mesh conductor 312 as a Vdd wiring line from the top side toward the bottom side of the drawing, for example, current flows in the mesh conductor 311 as a Vss wiring line from the bottom side toward the top side of the drawing.

In a case where current flows as shown in FIG. 37 in the eleventh example configuration, magnetic fluxes substantially in the X direction and in the Y direction are likely to be generated between the mesh conductor 311 as a Vss wiring line and the mesh conductor 312 as a Vdd wiring line by a conductor loop that has a loop plane almost perpendicular to the X-axis, and a conductor loop that has a loop plane almost perpendicular to the Y-axis. These conductor loops are formed in the cross-sections in which the mesh conductors 311 and 312 are disposed, and include (cross-sections of) the mesh conductors 311 and 312. A magnetic field substantially in the X direction is easily generated.

On the other hand, in the pixel array 121 of the first semiconductor substrate 101 stacked on the second semiconductor substrate 102 in which the light blocking structure 151 formed with the conductor layers A and B is formed, a victim conductor loop formed with a signal line 132 and a control line 133 is formed in the X-Y plane. In the victim conductor loop formed in the X-Y plane, induced electromotive force is easily generated by the magnetic flux in the Z direction. The greater a change in the induced electromotive force, the poorer an image output from the solid-state imaging device 100 (or the greater the inductive noise).

Further, when the selected pixel is moved in the pixel array 121, and the effective size of the victim conductor loop formed with a signal line 132 and a control line 133 is changed accordingly, the change in the induced electromotive force becomes conspicuous.

In the case of the eleventh example configuration, the directions of the magnetic fluxes (substantially in the X direction and the Y direction) generated from the loop plane of the aggressor conductor loop of the light blocking structure 151 formed with the conductor layers A and B are substantially orthogonal to and differ almost 90 degrees from the direction of the magnetic flux (in the Z direction) that causes an induced electromotive force in the victim conductor loop. In other words, the direction of the loop plane in which magnetic fluxes are generated from the aggressor conductor loop differs almost 90 degrees from the direction of the loop plane in which induced electromotive force is generated in the victim conductor loop. Therefore, degradation of an image output from the solid-state imaging device 100 (generation of inductive noise) is predicted to be smaller than that in the first comparative example.

Figure 38:
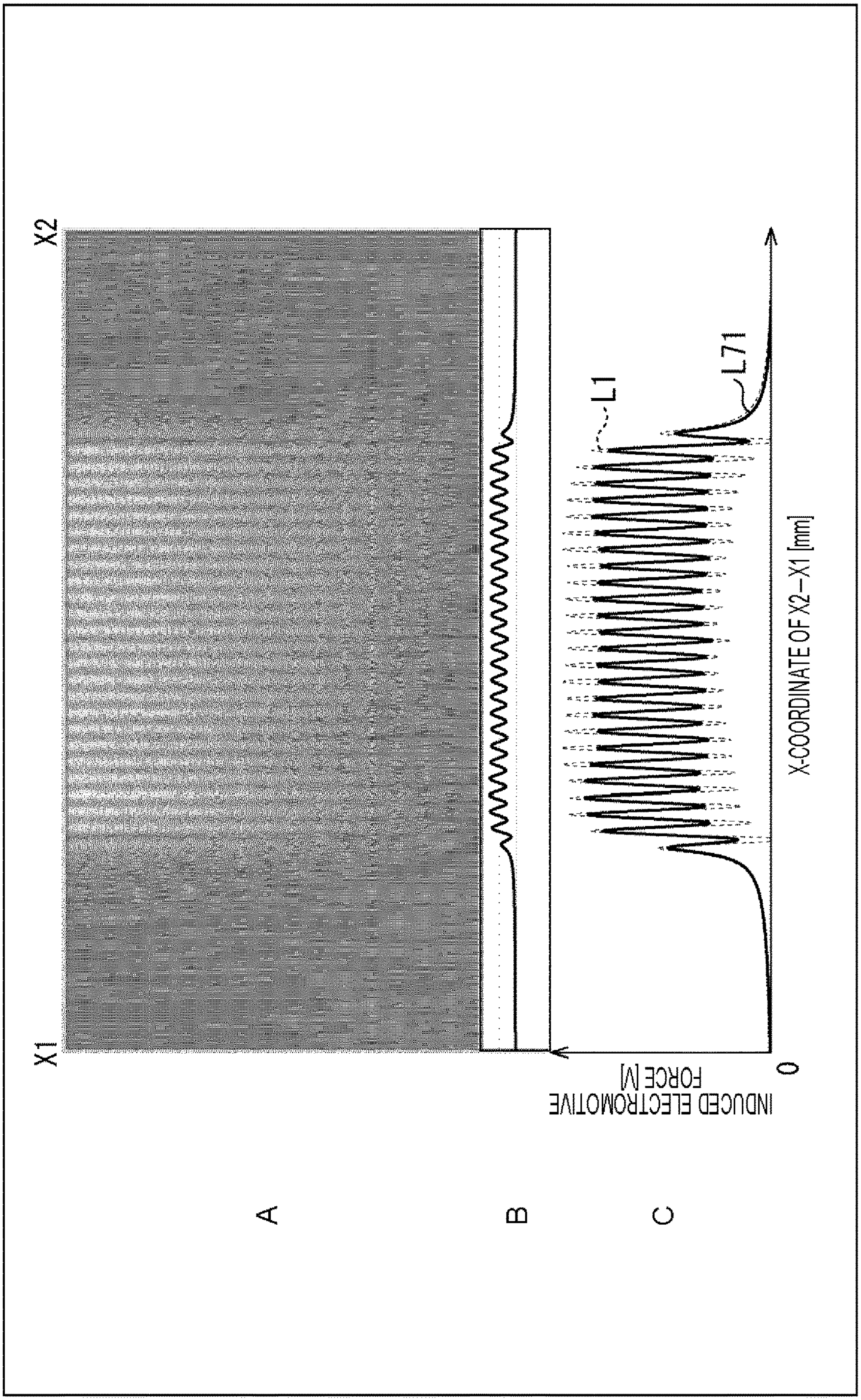
FIG. 38 is a diagram showing the result of a simulation of inductive noise corresponding to the eleventh example configuration.

FIG. 38 shows the result of a simulation of inductive noise that occurs in a case where the eleventh example configuration (FIG. 36) is applied to the solid-state imaging device 100.

A of FIG. 38 shows an image that is output from the solid-state imaging device 100 and may have inductive noise therein. B of FIG. 38 shows changes in pixel signals in a line segment X1-X2 of the image shown in A of FIG. 38. C of FIG. 38 shows a solid line L71 representing the induced electromotive force that has caused the inductive noise in the image. The abscissa axis in C of FIG. 38 indicates the X-axis coordinate of the image, and the ordinate axis indicates the magnitude of the induced electromotive force. Note that a dotted line L1 in C of FIG. 38 corresponds to the first comparative example (FIG. 9).

As is apparent from comparison between the solid line L71 and the dotted line L1 shown in C of FIG. 38, the eleventh example configuration can more effectively reduce changes in the induced electromotive force generated in the victim conductor loop, and more effectively reduce inductive noise, than the first comparative example.

Note that the eleventh example configuration may be rotated 90 degrees in the X-Y plane when used. Alternatively, the eleventh example configuration may be rotated any desired angle other than 90 degrees when used. For example, the eleventh example configuration may be designed obliquely with respect to the X-axis and the Y-axis.

Twelfth Example Configuration

Figure 39:
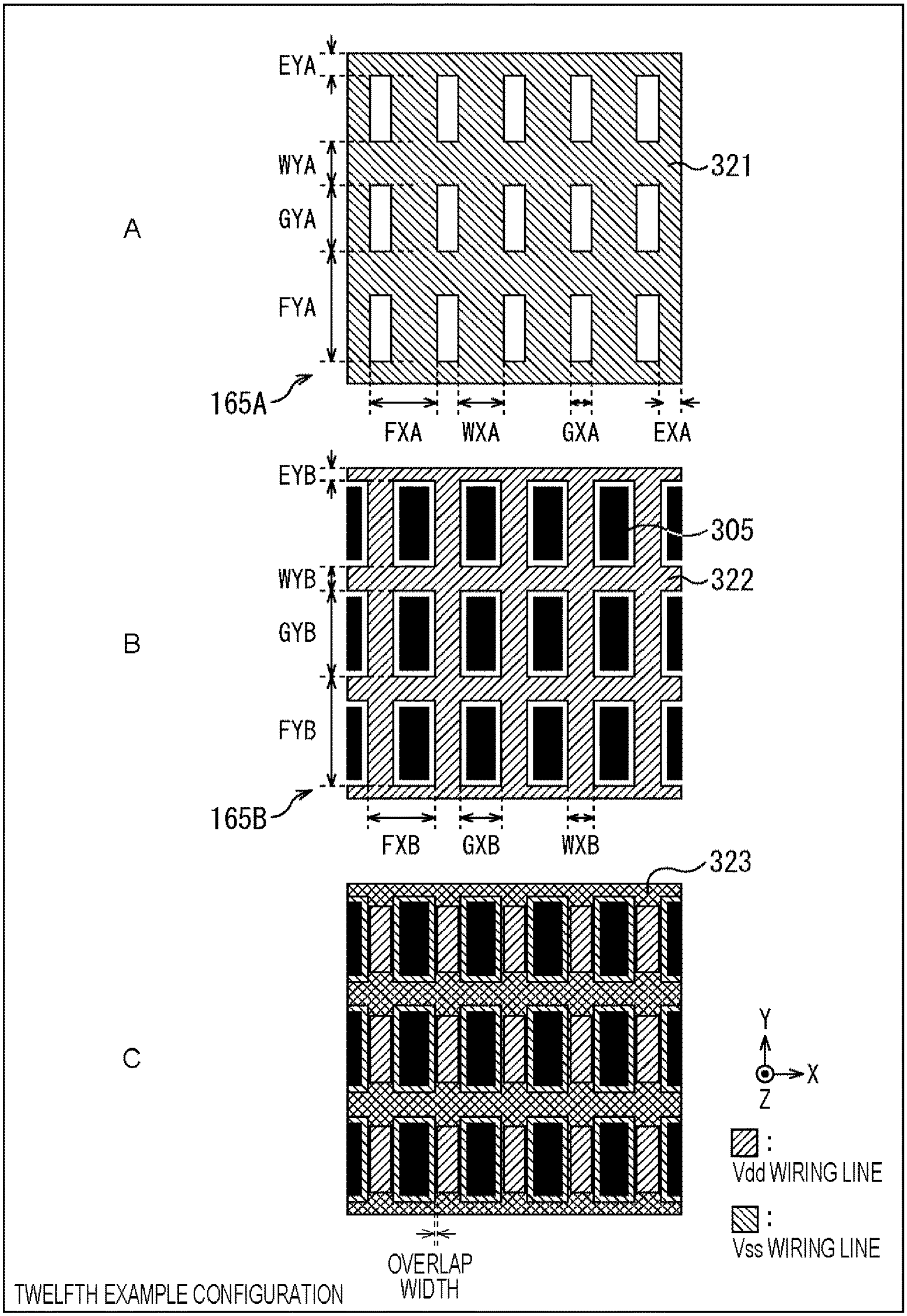
FIG. 39 is a diagram showing a twelfth example configuration of the conductor layers A and B.

Next, FIG. 39 shows a twelfth example configuration of the conductor layers A and B. Note that A of FIG. 39 shows the conductor layer A, and B of FIG. 39 shows the conductor layer B. In the coordinate system in FIG. 39, the horizontal direction is the X-axis, the vertical direction is the Y-axis, and the direction perpendicular to the X-Y plane is the Z-axis.

The conductor layer A in the twelfth example configuration is formed with a mesh conductor 321. The mesh conductor 321 has a shape similar to the mesh conductor 311 of the conductor layer A in the eleventh example configuration (FIG. 36), and therefore, explanation thereof is not made herein. The mesh conductor 321 is a wiring line (a Vss wiring line) connected to GND or a negative power supply, for example.

The conductor layer B in the twelfth example configuration is formed with a mesh conductor 322 and relay conductors 305. The mesh conductor 322 has a shape similar to the mesh conductor 312 of the conductor layer B in the eleventh example configuration (FIG. 36), and therefore, explanation thereof is not made herein. The mesh conductor 322 is a wiring line (a Vdd wiring line) connected to a positive power supply, for example.

The relay conductors (the other conductors) 305 are disposed in gap regions that are not the conductor of the mesh conductor 322 and are long in the Y direction, are electrically insulated from the mesh conductor 322, and are connected to Vss to which the mesh conductor 321 of the conductor layer A is connected.

Note that the shape of the relay conductors 305 is any appropriate shape, and is preferably a symmetrical circular or polygonal shape such as a rotationally symmetrical shape or a mirror-symmetrical shape. Each relay conductor 305 can be disposed at the center or any other appropriate position in a gap region in the mesh conductor 322. The relay conductors 305 may be connected to a conductor layer as a Vss wiring line different from the conductor layer A. The relay conductors 305 may be connected to a conductor layer as a Vss wiring line on a side closer to the active element group 167 than the conductor layer B. The relay conductors 305 can be connected to a conductor layer different from the conductor layer A, a conductor layer closer to the active element group 167 than the conductor layer B, or the like, through conductor vias (VIA) extending in the Z direction.

C of FIG. 39 shows a state in which the conductor layers A and B shown in A and B of FIG. 39 are viewed from the side of the photodiodes 141 (the back surface side). However, a hatched region 323 in which the diagonal lines intersect in C of FIG. 39 indicates the region in which the mesh conductor 321 of the conductor layer A and the mesh conductor 322 of the conductor layer B overlap. In the case of the twelfth example configuration, the active element group 167 is covered with at least one of the conductor layer A or the conductor layer B, so that hot carrier light emission from the active element group 167 can be blocked.

In the twelfth example configuration, in a case where current flows in a manner similar to that in the case shown FIG. 37, magnetic fluxes substantially in the X direction and in the Y direction are likely to be generated between the mesh conductor 321 as a Vss wiring line and the mesh conductor 322 as a Vdd wiring line by a conductor loop that has a loop plane almost perpendicular to the X-axis, and a conductor loop that has a loop plane almost perpendicular to the Y-axis. These conductor loops are formed in the cross-sections in which the mesh conductors 321 and 322 are disposed, and include (cross-sections of) the mesh conductors 321 and 322.

Further, in the case of the twelfth example configuration, the overlapping region 323 between the mesh conductor 321 and the mesh conductor 322 extends in the X direction. In the region 323 in which the mesh conductor 321 and the mesh conductor 322 overlap, currents having different polarities from each other flow in the mesh conductor 321 and the mesh conductor 322, so that the magnetic fields generated from the region 323 cancel each other out. Thus, generation of inductive noise near the region 323 can be reduced.

Further, in the case of the twelfth example configuration, the relay conductors 305 are provided, so that the mesh conductor 321 as a Vss wiring line can be connected to the active element group 167 at substantially the shortest distance or a short distance. As the mesh conductor 321 and the active element group 167 are connected at substantially the shortest distance or a short distance, it is possible to reduce the voltage drop, the energy loss, or the inductive noise between the mesh conductor 321 and the active element group 167.

Note that the twelfth example configuration may be rotated 90 degrees in the X-Y plane when used. Alternatively, the eleventh example configuration may be rotated any desired angle other than 90 degrees when used. For example, the eleventh example configuration may be designed obliquely with respect to the X-axis and the Y-axis.

Thirteenth Example Configuration

Figure 40:
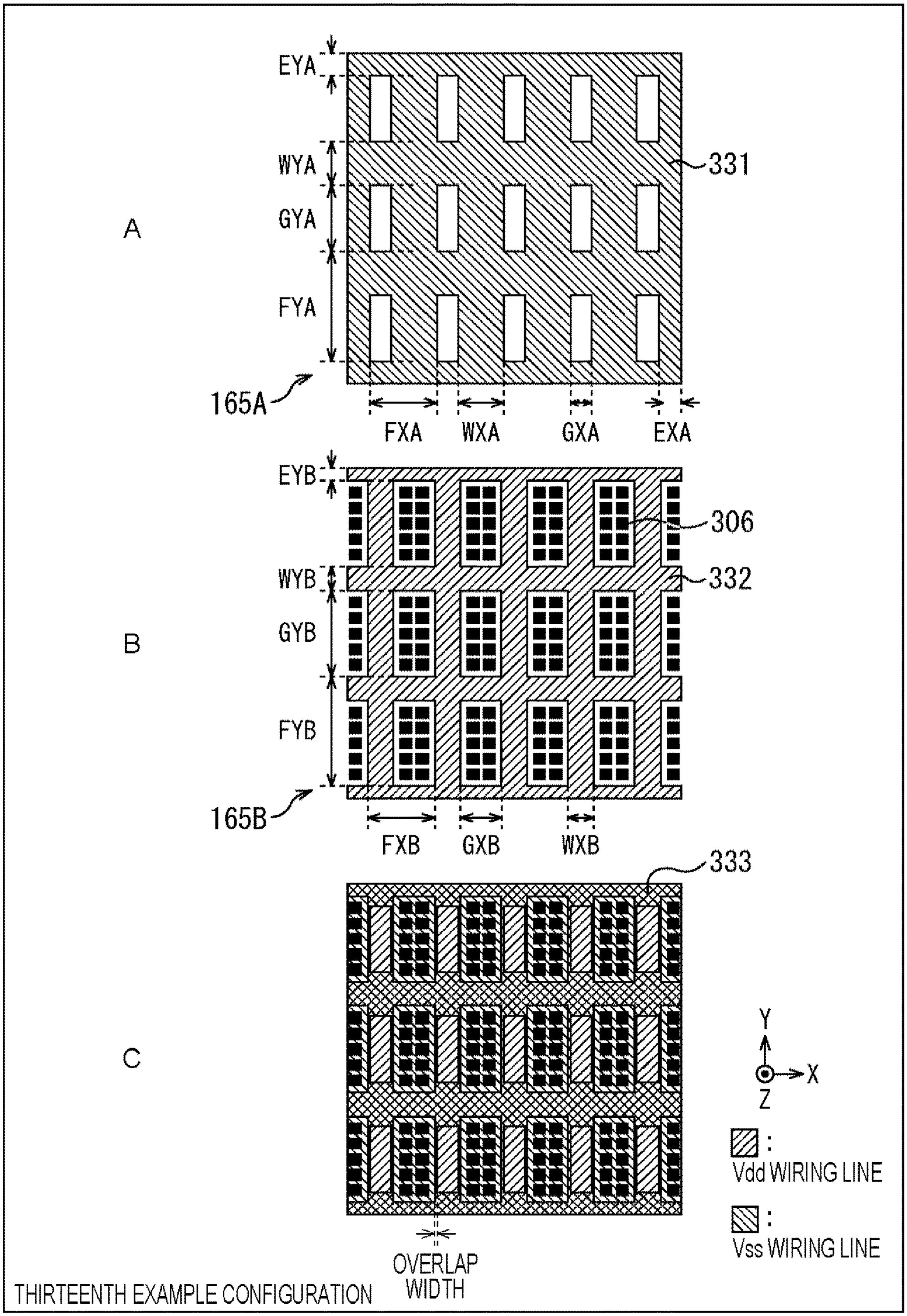
FIG. 40 is a diagram showing a thirteenth example configuration of the conductor layers A and B.

Next, FIG. 40 shows a thirteenth example configuration of the conductor layers A and B. Note that A of FIG. 40 shows the conductor layer A, and B of FIG. 40 shows the conductor layer B. In the coordinate system in FIG. 40, the horizontal direction is the X-axis, the vertical direction is the Y-axis, and the direction perpendicular to the X-Y plane is the Z-axis.

The conductor layer A in the thirteenth example configuration is formed with a mesh conductor 331. The mesh conductor 331 has a shape similar to the mesh conductor 311 of the conductor layer A in the eleventh example configuration (FIG. 36), and therefore, explanation thereof is not made herein. The mesh conductor 331 is a wiring line (a Vss wiring line) connected to GND or a negative power supply, for example.

The conductor layer B in the thirteenth example configuration is formed with a mesh conductor 332 and relay conductors 306. The mesh conductor 332 has a shape similar to the mesh conductor 312 of the conductor layer B in the eleventh example configuration (FIG. 36), and therefore, explanation thereof is not made herein. The mesh conductor 332 is a wiring line (a Vdd wiring line) connected to a positive power supply, for example.

Each of the relay conductors (the other conductors) 306 is obtained by dividing a relay conductor 305 of the twelfth example configuration (FIG. 39) into a plurality of (10 in the case shown in FIG. 40) portions at intervals. The relay conductors 306 are disposed in gap regions that are long in the Y direction of the mesh conductor 332, are electrically insulated from the mesh conductor 332, and are connected to Vss to which the mesh conductor 331 of the conductor layer A is connected. The number of divisions of the relay conductors and the presence/absence of connection to Vss may differ depending on regions. In this case, the current distributions can be finely adjusted at the time of designing, and thus, inductive noise and voltage drop (IR-Drop) can be reduced.

Note that the shape of the relay conductors 306 is any appropriate shape, and is preferably a symmetrical circular or polygonal shape such as a rotationally symmetrical shape or a mirror-symmetrical shape. The number of divisions of the relay conductors 306 can be changed as appropriate. Each relay conductor 306 can be disposed at the center or any other appropriate position in a gap region in the mesh conductor 332. The relay conductors 306 may be connected to a conductor layer as a Vss wiring line different from the conductor layer A. The relay conductors 306 may be connected to a conductor layer as a Vss wiring line on a side closer to the active element group 167 than the conductor layer B. The relay conductors 306 can be connected to a conductor layer different from the conductor layer A, a conductor layer closer to the active element group 167 than the conductor layer B, or the like, through conductor vias (VIA) extending in the Z direction.

C of FIG. 40 shows a state in which the conductor layers A and B shown in A and B of FIG. 40 are viewed from the side of the photodiodes 141 (the back surface side). However, a hatched region 333 in which the diagonal lines intersect in C of FIG. 40 indicates the region in which the mesh conductor 331 of the conductor layer A and the mesh conductor 332 of the conductor layer B overlap. In the case of the thirteenth example configuration, the active element group 167 is covered with at least one of the conductor layer A or the conductor layer B, so that hot carrier light emission from the active element group 167 can be blocked.

In the thirteenth example configuration, in a case where current flows in a manner similar to that in the case shown FIG. 37, magnetic fluxes substantially in the X direction and in the Y direction are likely to be generated between the mesh conductor 331 as a Vss wiring line and the mesh conductor 332 as a Vdd wiring line by a conductor loop that has a loop plane almost perpendicular to the X-axis, and a conductor loop that has a loop plane almost perpendicular to the Y-axis. These conductor loops are formed in the cross-sections in which the mesh conductors 331 and 332 are disposed, and include (cross-sections of) the mesh conductors 331 and 332.

Further, the case of the thirteenth example configuration, the overlapping region 333 between the mesh conductor 331 and the mesh conductor 332 extends in the X direction in the region 333, currents having different polarities from each other flow in the mesh conductor 331 and the mesh conductor 332, so that the magnetic fields generated from the region 333 cancel each other out. Thus, generation of inductive noise near the region 333 can be reduced.

Further, in the case of the thirteenth example configuration, the relay conductors 306 are provided, so that the mesh conductor 331 as a Vss wiring line can be connected to the active element group 167 at substantially the shortest distance or a short distance. As the mesh conductor 331 and the active element group 167 are connected at substantially the shortest distance or a short distance, it is possible to reduce the voltage drop, the energy loss, or the inductive noise between the mesh conductor 331 and the active element group 167.

Furthermore, in the thirteenth example configuration, as each of the relay conductors 306 is divided into a plurality of portions, the current distribution in the conductor layer A and the current distribution in the conductor layer B can be made substantially uniform and of the opposite polarities, and thus, the magnetic field generated from the conductor layer A and the magnetic field generated from the conductor layer B can cancel each other out. Accordingly, in the thirteenth example configuration, a difference in current distribution between the Vdd wiring line and the Vss wiring line can be made difficult to be caused by an external factor. In view of the above, the sixteenth example configuration is preferable in a case where the current distributions in the X-Y plane are complicated, or where the impedances of the conductors connected to the mesh conductors 331 and 332 differ between the Vdd wiring line and the Vss wiring line.

Note that the thirteenth example configuration may be rotated 90 degrees in the X-Y plane when used. Alternatively, the eleventh example configuration may be rotated any desired angle other than 90 degrees when used. For example, the eleventh example configuration may be designed obliquely with respect to the X-axis and the Y-axis.

<Results of Simulations of the Twelfth and Thirteenth Example Configurations>

Figure 41:
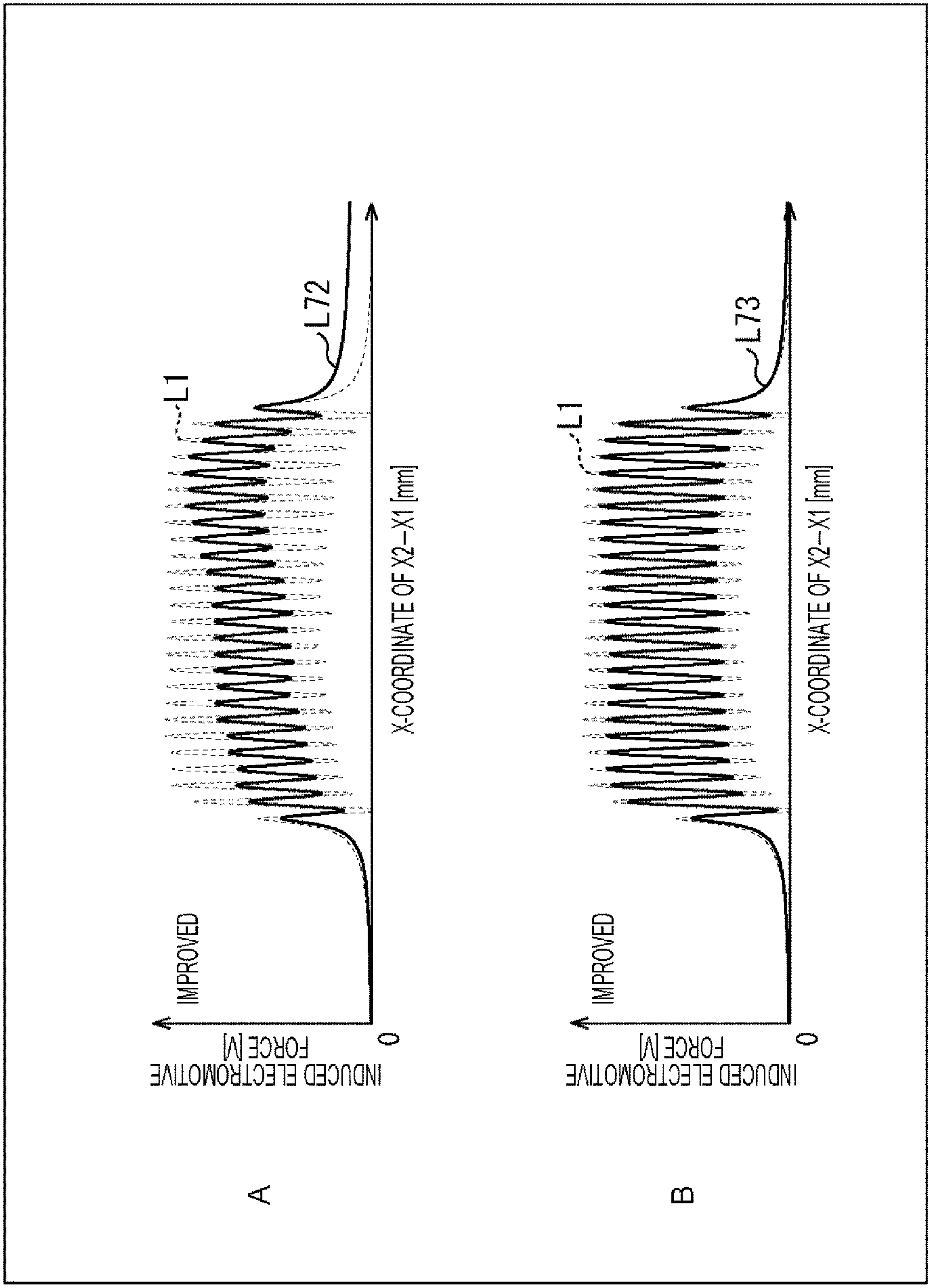
FIG. 41 is a diagram showing the results of inductive noise simulations corresponding to the twelfth and thirteenth example configurations.

FIG. 41 shows changes in the induced electromotive force that causes inductive noise in images as the results of simulations performed in the cases where the twelfth example configuration (FIG. 39) and the thirteenth example configuration. (FIG. 40) are applied to the solid-state imaging device 100. Note that the conditions for the current flowing in the twelfth and thirteenth example configurations are similar to those shown in FIG. 37. The abscissa axis in FIG. 41 indicates the X-axis coordinate of the image, and the ordinate axis indicates the magnitude of the induced electromotive force.

A solid line L72 in A of FIG. 41 corresponds to the twelfth example configuration (FIG. 39), and a dotted line L1 corresponds to the first comparative example (FIG. 9). As is apparent from comparison between the solid line L72 and the dotted line L1, the twelfth example configuration causes smaller changes in the induced electromotive force generated in the victim conductor loop, compared with the first comparative example. Accordingly, compared with the first comparative example, the twelfth example configuration can reduce more effectively inductive noise in images that are output from the solid-state imaging device 100. However, this simulation result is a simulation result in a case where the mesh conductor 321 is not connected to the active element group 167, and the mesh conductor 322 is not connected to the active element group 167. For example, in a case where the mesh conductor 321 and at least part of the active element group 167 are connected at substantially the shortest distance or a short distance through a conductor via or the like, or in a case where the mesh conductor 322 and at least part of the active element group 167 are connected at substantially the shortest distance or a short distance through a conductor via or the like, the amount of current flowing in the mesh conductor 321 or the mesh conductor 322 gradually decreases depending on the position. In such a case, there is also a condition that the relay conductors 305 are adopted so that the voltage drop, energy loss, and inductive noise significantly decrease by more than half.

A solid line L73 in B of FIG. 41 corresponds to the thirteenth example configuration (FIG. 40), and a dotted line L1 corresponds to the first comparative example (FIG. 9). As is apparent from comparison between the solid line L73 and the dotted line L1, the thirteenth example configuration causes smaller changes in the induced electromotive force generated in the victim conductor loop, compared with the first comparative example. Accordingly, compared with the first comparative example, the thirteenth example configuration can reduce more effectively inductive noise in images that are output from the solid-state imaging device 100. However, this simulation result is a simulation result in a case where the mesh conductor 331 is not connected to the active element group 167, and the mesh conductor 332 is not connected to the active element group 167. For example, in a case where the mesh conductor 331 and at least part of the active element group 167 are connected at substantially the shortest distance or a short distance through a conductor via or the like, or in a case where the mesh conductor 332 and at least part of the active element group 167 are connected at substantially the shortest distance or a short distance through a conductor via or the like, the amount of current flowing in the mesh conductor 331 or the mesh conductor 332 gradually decreases depending on the position. In such a case, there is also a condition that the relay conductors 306 are adopted so that the voltage drop, energy loss, and inductive noise significantly decrease by more than half.

<5. Example Layouts of Electrodes in the Semiconductor Substrate in which the Conductor Layers A and B are Formed>

The following is a description of the layout of electrodes in a semiconductor substrates in which conductors having different resistance values in the X direction and the Y direction are formed as in the eleventh through thirteenth example configurations of the conductor layers A and B described above.

Note that, in example cases described below, the thirteenth example configuration (FIG. 40) formed with the conductor layers A and B including conductors (the mesh conductors 331 and 332) that have a smaller resistance value in the Y direction than the resistance value in the X direction is formed in a semiconductor substrate. However, similar examples apply in cases where the eleventh and twelfth example configurations of the conductor layers A and B including conductors having a smaller resistance value in the Y direction than the resistance value in the X direction are formed in semiconductor substrates.

In the thirteenth example configuration of the conductor layers A and B formed on a semiconductor substrate, the resistance value of the conductors (the mesh conductors 331 and 332) in the Y direction is smaller than the resistance value in the X direction, and accordingly, current flows more easily in the Y direction. Therefore, to minimize the voltage drop (IR-Drop) in the conductors of the thirteenth example configuration of the conductor layers A and B, a plurality of pads (electrodes) disposed in a semiconductor substrate is preferably arranged more densely in the X direction in which the resistance value is greater than in the Y direction in which the resistance value is smaller. However, the pads may be arranged more densely in the Y direction than in the X direction.

<First Example Layout of Pads in a Semiconductor Substrate>

Figure 42:
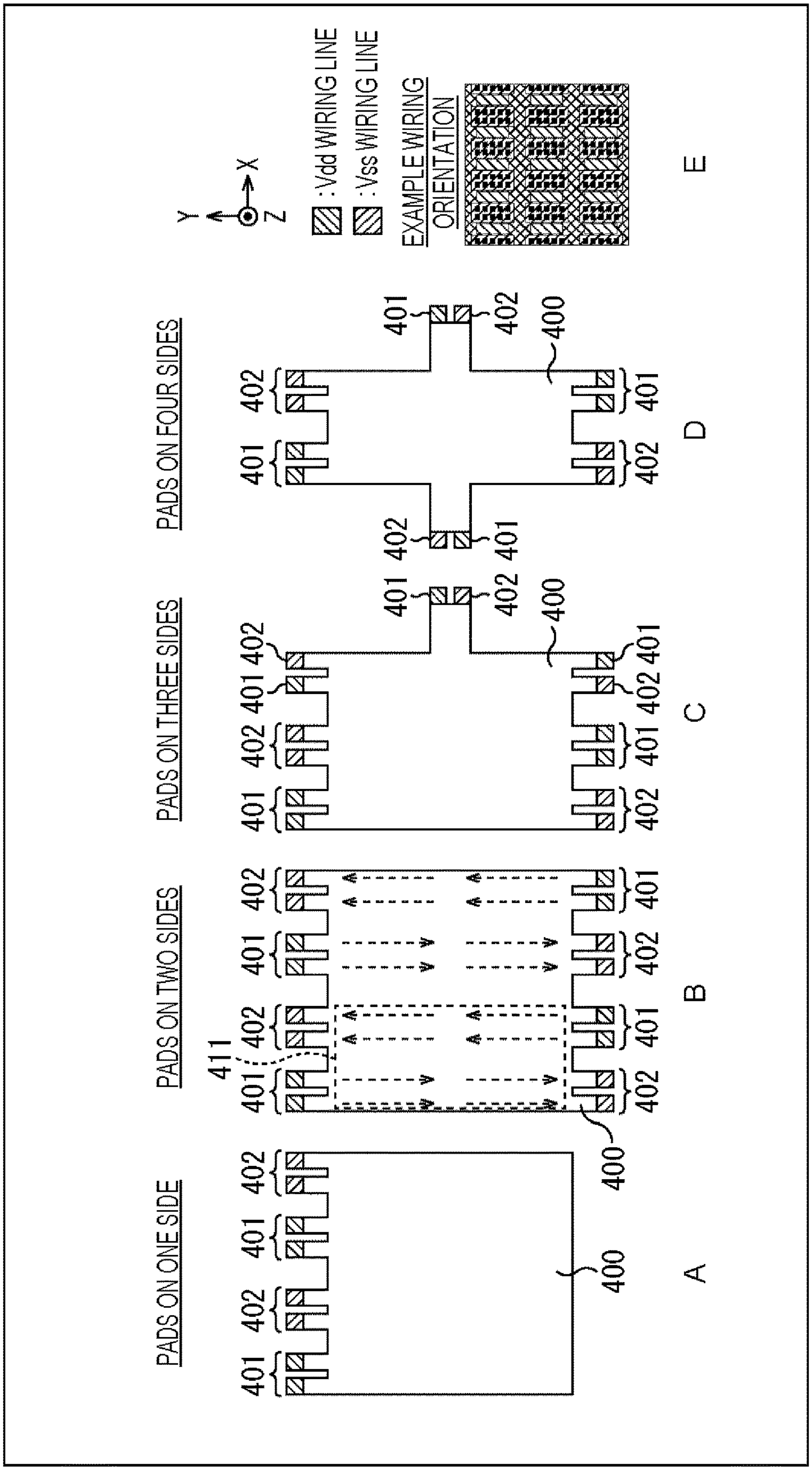
FIG. 42 is plan views showing a first example layout of pads in a semiconductor substrate.

FIG. 42 is a plan view showing a first example layout in which pads are arranged more densely in the X direction than in the Y direction in a semiconductor substrate. Note that, in the coordinate system in FIG. 42, the horizontal direction is the X-axis, the vertical direction is the Y-axis, and the direction perpendicular to the X-Y plane is the Z-axis.

A of FIG. 42 shows a case where pads are arranged on one side of a wiring region 400 in which a plurality of the thirteenth example configurations (FIG. 40) formed with the conductor layers A and P is formed. B of FIG. 42 shows a case where pads are arranged on two sides facing each other in the Y direction of the wiring region 400 in which a plurality of the thirteenth example configurations (FIG. 40) formed with the conductor layers A and B is formed. Note that dotted arrows in the drawing indicate an example of the direction of the current flowing therein, and a current loop 411 formed by the current indicated by the dotted arrows is generated. The direction of the current indicated by the dotted arrows changes by the moment.

C of FIG. 42 shows a case where pads are arranged on three sides of the wiring region 400 in which a plurality of the thirteenth example configurations (FIG. 40) formed with the conductor layers A and B is formed. D of FIG. 42 shows a case where pads are arranged on the four sides of the wiring region 400 in which a plurality of the thirteenth example configurations (FIG. 40) formed with the conductor layers A and B is formed. E of FIG. 42 shows the orientation of the plurality of the thirteenth example configurations of the conductor layers A and B formed in the wiring region 400.

Pads 401 disposed in the wiring region 400 are connected to Vdd wiring lines, and pads 402 are wiring lines (Vss wiring lines) connected to GND or a negative power supply, for example.

In the case of the first example layout shown in FIG. 42, each of the pads 401 and 402 is formed with one or a plurality of (two in the case shown in FIG. 42) pads arranged adjacent to each other. The pads 401 and 402 are arranged adjacent to each other. A pad 401 formed with one pad and a pad 402 formed with one pad are arranged adjacent to each other, and a pad 401 formed with two pads and a pad 402 formed with two pads are arranged adjacent to each other. The polarities of the pads 401 and 402 (the connection destinations being a Vdd wiring line or a Vss wiring line) are the opposite of each other. The number of the pads 401 and the number of pads 402 disposed in the wiring region 400 are substantially the same.

With this arrangement, the flowing current distributions in the conductor layers A and B formed in the wiring region 400 can be made substantially uniform and to have the opposite polarities. Thus, the magnetic fields generated from the respective conductor layers A and B, and the induced electromotive forces based on these magnetic fields can be effectively canceled out.

Further, as shown in B, C, and D of FIG. 42, in a case where pads are formed on two or more sides of the wiring region 400, the polarities of the pads facing each other on the opposite sides are the opposite of each other. With this arrangement, currents in the same direction are easily distributed at positions where the X-coordinate of the wiring region 400 is the same but the Y-coordinate is different, as indicated by the dotted arrows in B of FIG. 42.

<Second Example Layout of Pads a Semiconductor Substrate>

Figure 43:
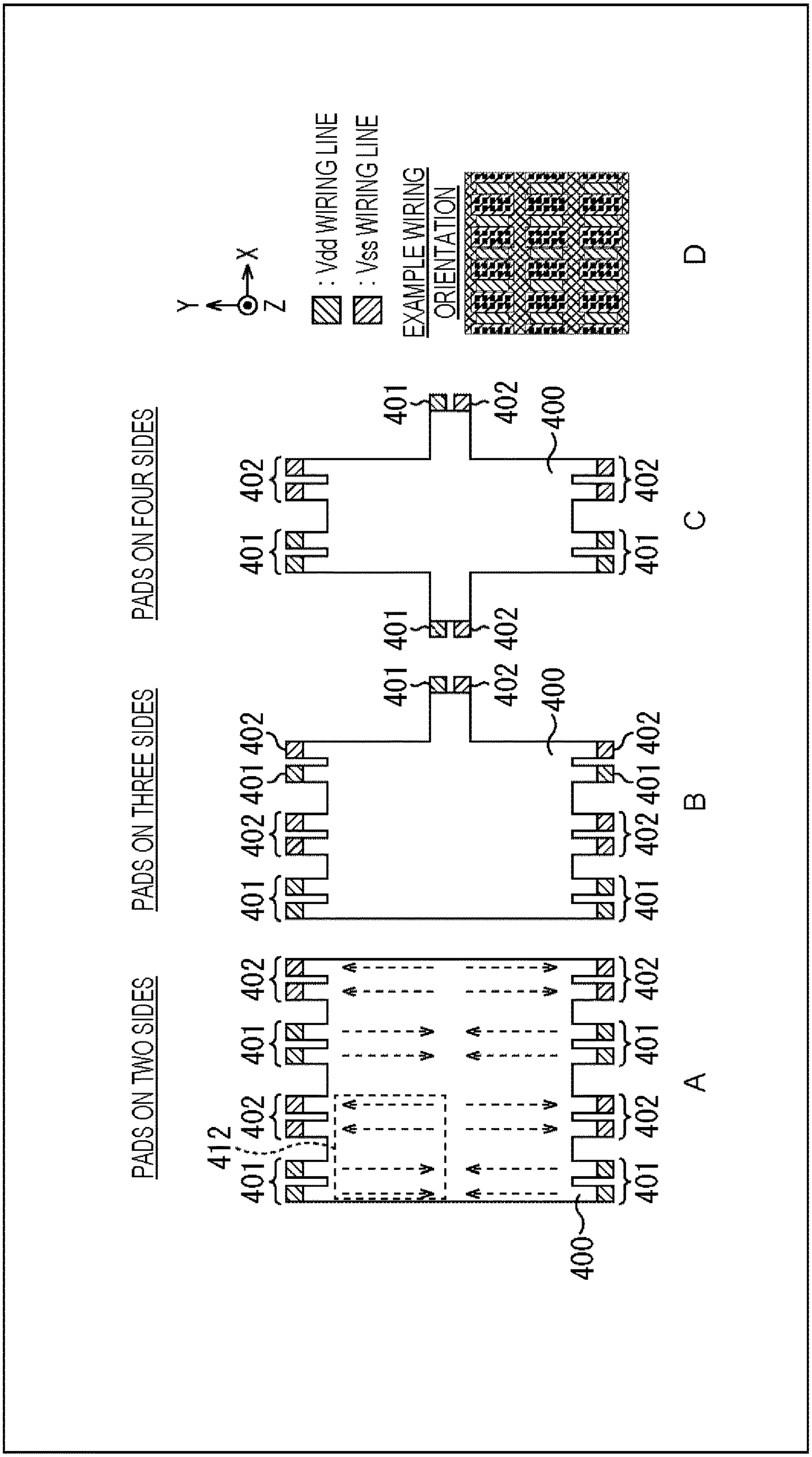
FIG. 43 is plan views showing a second example layout of pads in a semiconductor substrate.

Next, FIG. 43 is a plan view showing a second example layout in which pads are arranged more densely in the X direction than in the Y direction in a semiconductor substrate. Note that, in the coordinate system in FIG. 43, the horizontal direction is the X-axis, the vertical direction is the Y-axis, and the direction perpendicular to the X-Y plane is the Z-axis.

A of FIG. 43 shows a case where pads are arranged on two sides facing each other in the Y direction of the wiring region 400 in which a plurality of the thirteenth example configurations (FIG. 40) formed with the conductor layers A and B is formed. Note that dotted arrows in the drawing indicate the direction of the current flowing therein, and a current loop 412 formed by the current indicated by the dotted arrows is generated. The direction of the current indicated by the dotted arrows changes by the moment.

B of FIG. 43 shows a case where pads are arranged on three sides of the wiring region 400 in which a plurality of the thirteenth example configurations (FIG. 40) formed with the conductor layers A and B is formed. C of FIG. 43 shows a case where pads are arranged on the four sides of the wiring region 400 in which a plurality of the thirteenth example configurations (FIG. 40) formed with the conductor layers A and B is formed. D of FIG. 43 shows the orientation of the plurality of the thirteenth example configurations of the conductor layers A and B formed in the wiring region 400.

Pads 401 disposed in the wiring region 400 are connected to Vdd wiring lines, and pads 402 are wiring lines (Vss wiring lines) connected to GND or a negative power supply, for example.

In the case of the second example layout shown in FIG. 43, each of the pads 401 and 402 is formed with a plurality of (two in the case shown in FIG. 43) pads arranged adjacent to each other. The pads 401 and 402 are arranged adjacent to each other. A pad 401 formed with one pad and a pad 402 formed with one pad are arranged adjacent to each other, and a pad 401 formed with two pads and a pad 402 formed with two pads are arranged adjacent to each other. The polarities of the pads 401 and 402 (the connection destinations being a Vdd wiring line or a Vss wiring line) are the opposite of each other. The number of the pads 401 and the number of pads 402 disposed in the wiring region 400 are substantially the same.

With this arrangement, the flowing current distributions in the conductor layers A and B formed in the wiring region 400 can be made substantially uniform and to have the opposite polarities. Thus, the magnetic fields generated from the respective conductor layers A and B, and the induced electromotive forces based on these magnetic fields can be effectively canceled out.

Further, in the second example layout, the polarities of the pads facing each other on the opposite sides are the same. However, some of the pads facing each other on the opposite sides may have the opposite polarities. With this arrangement, a current loop 412 smaller than the current loop 411 shown in B of FIG. 42 is generated in the wiring region 400. The size of the current loop affects the magnetic field distribution range. The smaller the electric field loop, the narrower the magnetic field distribution range. Therefore, in the second example layout, the magnetic field distribution range is narrower than that in the first example layout. Thus, in the second example layout, the induced electromotive force to be generated, and the inductive noise based on the induced electromotive force can be made smaller than those in the first example layout.

<Third Example Layout of Pads in a Semiconductor Substrate>

Figure 44:
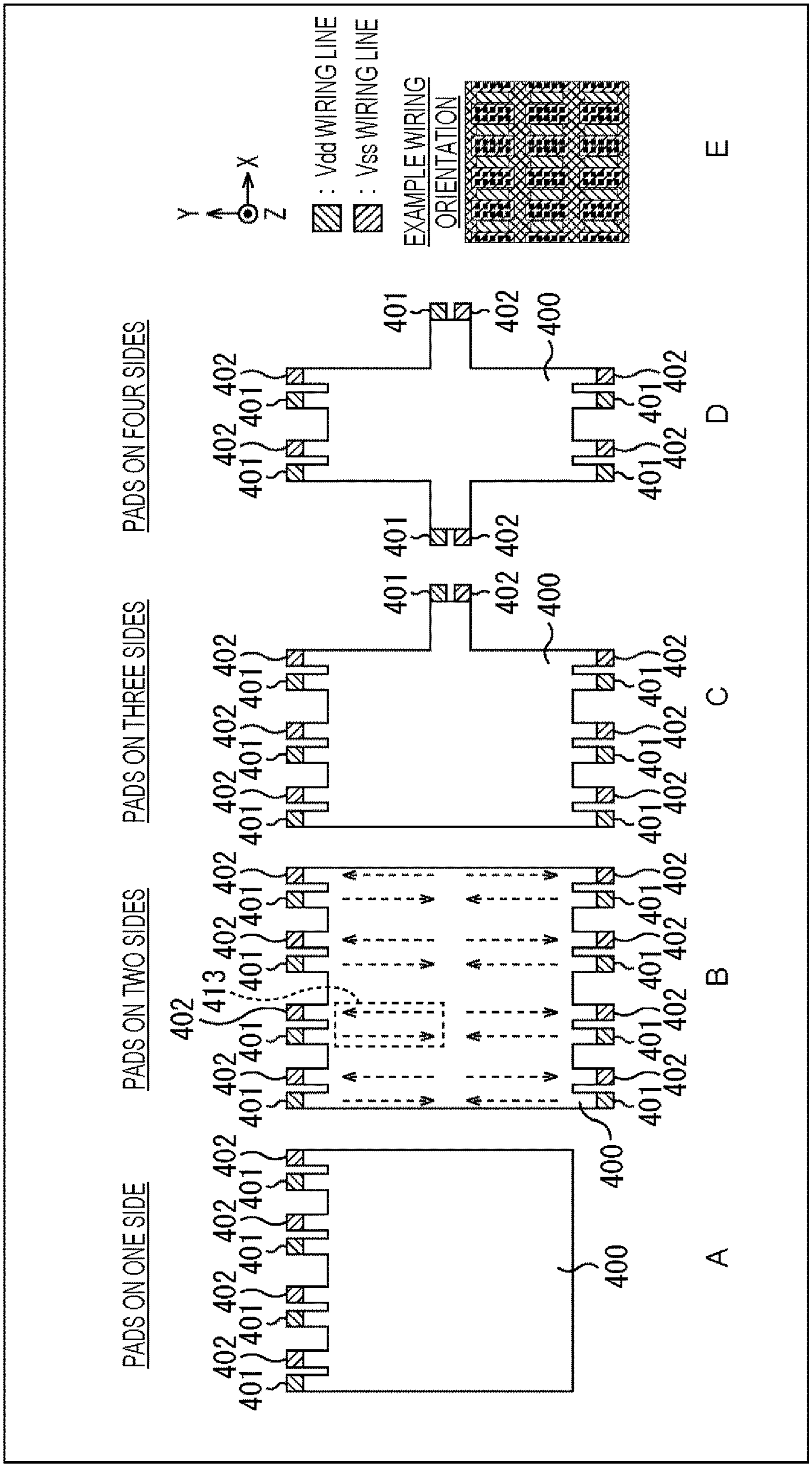
FIG. 44 is plan views showing a third example layout of pads in a semiconductor substrate.

Next, FIG. 44 is a plan view showing a third example layout in which pads are arranged more densely in the X direction than in the Y direction in a semiconductor substrate. Note that, in the coordinate system in FIG. 44, the horizontal direction is the X-axis, the vertical direction is the Y-axis, and the direction perpendicular to the X-Y plane is the Z-axis.

A of FIG. 44 shows a case where pads are arranged on one side of a wiring region 400 in which a plurality of the thirteenth example configurations (FIG. 40) formed with the conductor layers A and B is formed. B of FIG. 44 shows a case where pads are arranged on two sides facing each other in the Y direction of the wiring region 400 in which a plurality of the thirteenth example configurations (FIG. 40) formed with the conductor layers A and B is formed. Note that dotted arrows in the drawing indicate the direction of the current flowing therein, and a current loop 413 formed by the current indicated by the dotted arrows is generated.

C of FIG. 44 shows a case where pads are arranged on three sides of the wiring region 400 in which a plurality of the thirteenth example configurations (FIG. 40) formed with the conductor layers A and B is formed. D of FIG. 44 shows a case where pads are arranged on the four sides of the wiring region 400 in which a plurality of the thirteenth example configurations (FIG. 40) formed with the conductor layers A and B is formed. B of FIG. 44 shows the orientation of the plurality of the thirteenth example configurations of the conductor layers A and B formed in the wiring region 400.

Pads 401 disposed in the wiring region 400 are connected to Vdd wiring lines, and pads 402 are wiring lines (Vss wiring lines) connected to GND or a negative power supply, for example.

In the case of the third example layout shown in FIG. 44, the polarity of each pad (the connection destination being a Vdd wiring line or a Vss wiring line) forming a pad group formed with a plurality of (two in the case shown in FIG. 44) pads arranged adjacent to each other is the opposite. The number of pads 401 disposed on one side or all sides of the wiring region 400 is substantially the same as the number of pads 402.

Further, in the third example layout, the polarities of the pads facing each other on the opposite sides are the same. However, some of the pads facing each other on the opposite sides may have the opposite polarities.

With this arrangement, a current loop 413 smaller than the current loop 412 shown in A of FIG. 43 is generated in the wiring region 400. Therefore, in the third example layout, the magnetic field distribution range is narrower than that in the second example layout. Thus, in the third example layout, the induced electromotive force to be generated, and the inductive noise based on the induced electromotive force can be made smaller than those in the second example layout.

<Examples of Conductors Having Different Resistance Values in the Y Direction and the X Direction>

Figure 45:
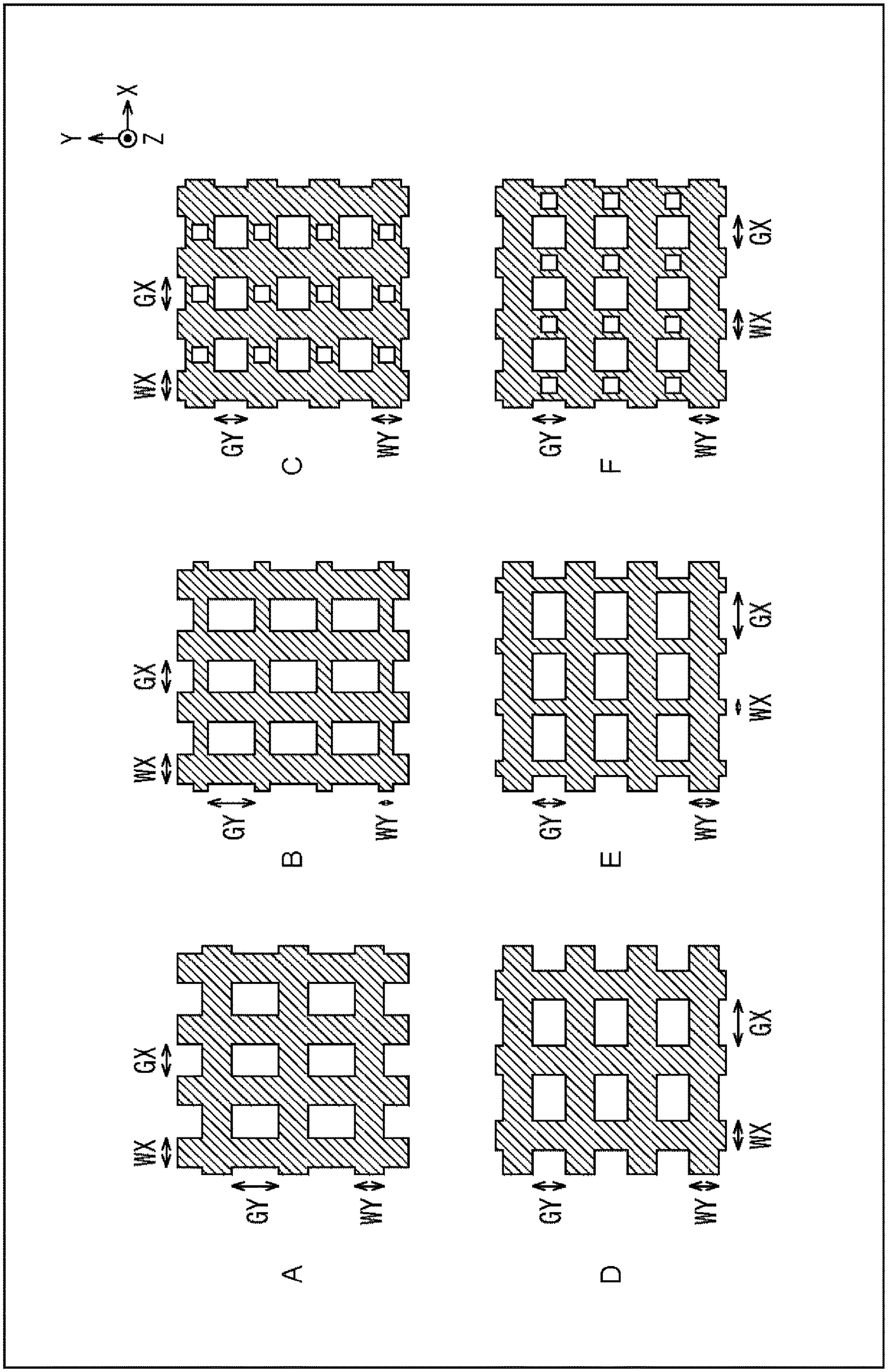
FIG. 45 is a diagram showing examples of conductors each having different resistance values in the X direction and the Y direction.

FIG. 45 is a plan view showing other examples of the conductors forming the conductor layers A and B. Specifically, FIG. 45 is plan views showing examples of conductors having different resistance values in the Y direction and the X direction. Note that A through C of FIG. 45 show examples in which the resistance value in the Y direction is smaller than the resistance value in the X direction, and D through F of FIG. 45 show examples in which the resistance value in the X direction is smaller than the resistance value in the Y direction.

A of FIG. 45 shows a mesh conductor in which the conductor width WX in the X direction and the conductor width WY in the Y direction are equal, and the gap width GX in the X direction is smaller than the gap width GY in the Y direction. B of FIG. 45 shows a mesh conductor in which the conductor width WX in the X direction is greater than the conductor width WY in the Y direction, and the gap width GX in the X direction is smaller than the gap width GY in the Y direction. C of FIG. 45 shows a mesh conductor in which the conductor width WX in the X direction and the conductor width WY in the Y direction are equal, the gap width GX in the X direction is equal to the gap width GY in the Y direction, and holes are formed in regions in the portions that have the conductor width WY and are long in the X direction. The regions do not intersect with the portions that have the conductor width WX and are long in the Y direction.

D of FIG. 45 shows a mesh conductor in which the conductor width WX in the X direction and the conductor width WY in the Y direction are equal, and the gap width GX in the X direction is greater than the gap width GY in the Y direction. E of FIG. 45 shows a mesh conductor in which the conductor width WX in the X direction is smaller than the conductor width WY in the Y direction, and the gap width GX in the X direction is greater than the gap width GY in the Y direction. F of FIG. 45 shows a mesh conductor in which the conductor width WX in the X direction and the conductor width WY in the Y direction are equal, the gap width GX in the X direction is equal to the gap width GY in the Y direction, and holes are formed in regions in the portions that have the conductor width WX and are long in the Y direction. The regions do not intersect with the portions that have the conductor width WY and are long in the X direction.

In the first through third example layouts of pads in the wiring region 400 shown in FIGS. 42 through 44, the resistance value in the Y direction as shown in A through C of FIG. 45 is smaller than the resistance value in the X direction. Thus, in a case where conductors in which current flows easily in the Y direction are formed in the wiring region 400, the effect to reduce the voltage drop (IR-Drop) in the conductors is achieved.

Further, in the first through third example layouts of pads in the wiring region 400 shown in FIGS. 42 through 44, the resistance value in the X direction as shown in D through F of FIG. 45 is smaller than the resistance value in the Y direction. In a case where conductors in which current flows easily in the X direction are formed in the wiring region 400, the current diffuses easily in the X direction, and the magnetic fields in the vicinity of the pads disposed on the sides of the wiring region 400 are less likely to concentrate. Accordingly, the effect to reduce generation of inductive noise can be expected.

<6. Modifications of Example Configurations of the Conductor Layers A and B>

Next, modifications of some of the above first through thirteenth example configurations of the conductor layers A and B are described.

Figure 46:
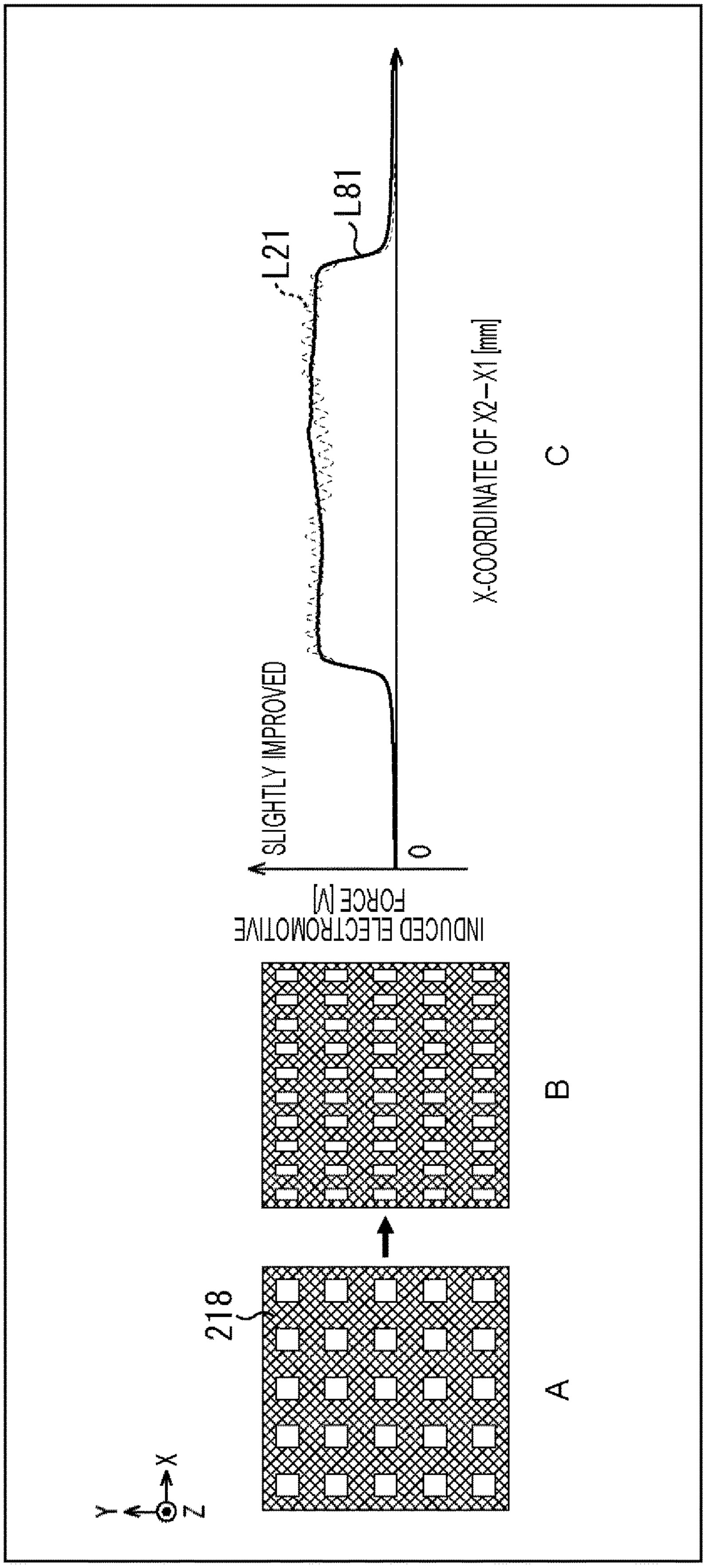
FIG. 46 is a diagram showing a modification in which the conductor cycle in the X direction of the second example configuration of the conductor layers and B is halved, and the effects of the modification.

FIG. 46 is a diagram showing a modification in which the conductor cycle in the X direction of the second example configuration (FIG. 15) of the conductor layers A and B is halved, and the effects of the modification. Note that A of FIG. 46 shows the second example configuration of the conductor layers A and B, and B of FIG. 46 shows the modification of the second example configuration of the conductor layers A and B.

C of FIG. 46 shows changes in the induced electromotive force that causes inductive noise in images as the results of a simulation performed in a case where the modification shown in B of FIG. 46 is applied to the solid-state imaging device 100. Note that the conditions for the current flowing in this modification are similar to those shown in FIG. 13. The abscissa axis in FIG. 46 indicates the X-axis coordinate of the image, and the ordinate axis indicates the magnitude of the induced electromotive force.

A solid line L81 in C of FIG. 46 corresponds to the modification shown in B of FIG. 46, and a dotted line L21 corresponds to the second example configuration (FIG. 15). As is apparent from comparison between the solid line L81 and the dotted line L21, this modification causes slightly smaller changes in the induced electromotive force generated in the victim conductor loop, compared with the second example configuration. Accordingly, it is clear that this modification can make the inductive noise slightly smaller than that in the second example configuration.

Figure 47:
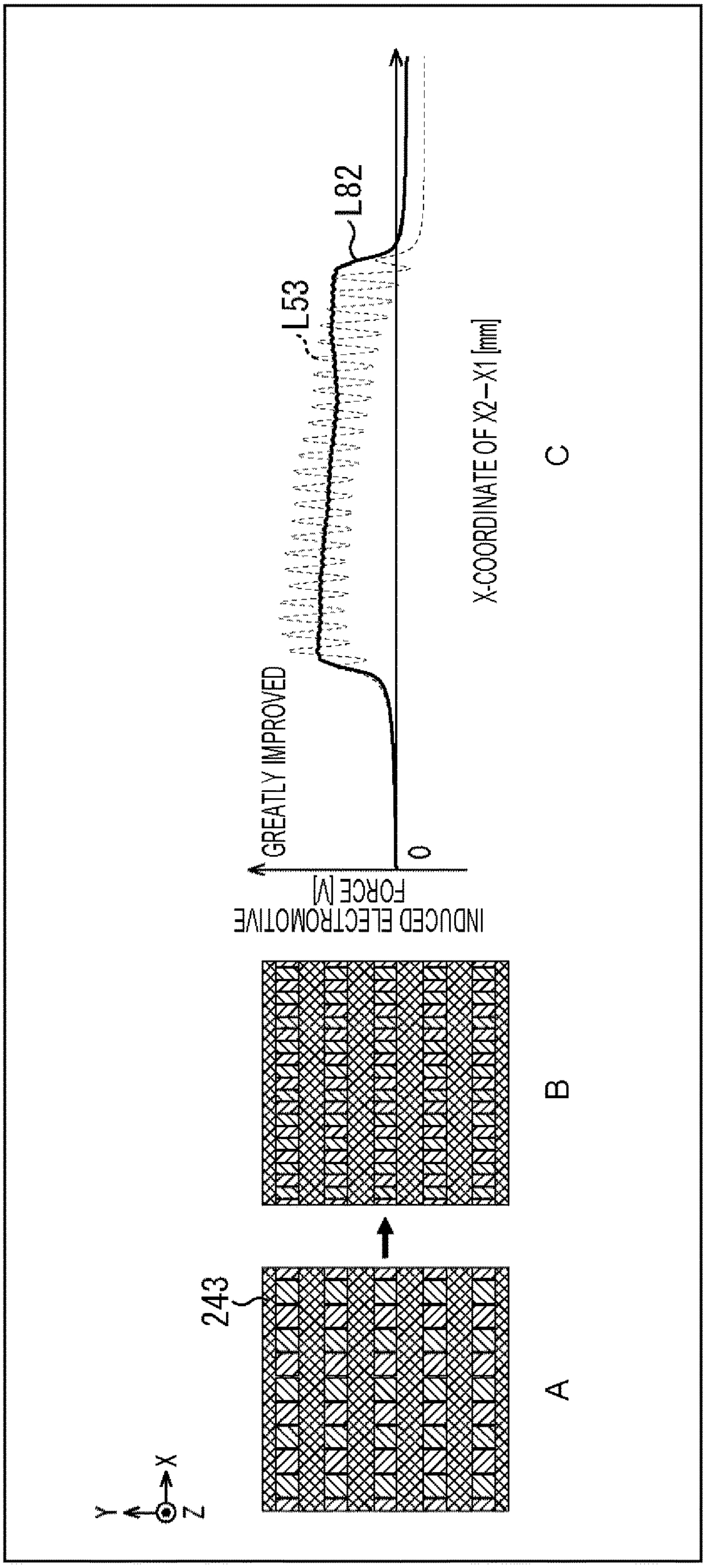
FIG. 47 is a diagram showing a modification in which the conductor cycle in the X direction of the fifth example configuration of the conductor layers A and B is halved, and the effects of the modification.

FIG. 47 is a diagram showing a modification in which the conductor cycle in the X direction of the fifth example configuration (FIG. 26) of the conductor layers A and B is halved, and the effects of the modification. Note that A of FIG. 47 shows the fifth example configuration of the conductor layers A and B, and B of FIG. 47 shows the modification of the fifth example configuration of the conductor layers A and B.

C of FIG. 47 shows changes in the induced electromotive force that causes inductive noise in images as the results of a simulation performed in a case where the modification shown in B of FIG. 47 is applied to the solid-state imaging device 100. Note that the conditions for the current flowing in this modification are similar to those shown in FIG. 23. The abscissa axis in FIG. 47 indicates the X-axis coordinate of the image, and the ordinate axis indicates the magnitude of the induced electromotive force.

A solid line L82 in r of FIG. 47 corresponds to the modification shown in B of FIG. 47, and a dotted line L53 corresponds to the fifth example configuration (FIG. 26). As is apparent from comparison between the solid line L82 and the dotted line L53, this modification causes significantly smaller changes in the induced electromotive force generated in the victim conductor loop, compared with the fifth example configuration. Accordingly, it is clear that this modification can make the inductive noise much smaller than that in the fifth example configuration.

Figure 48:
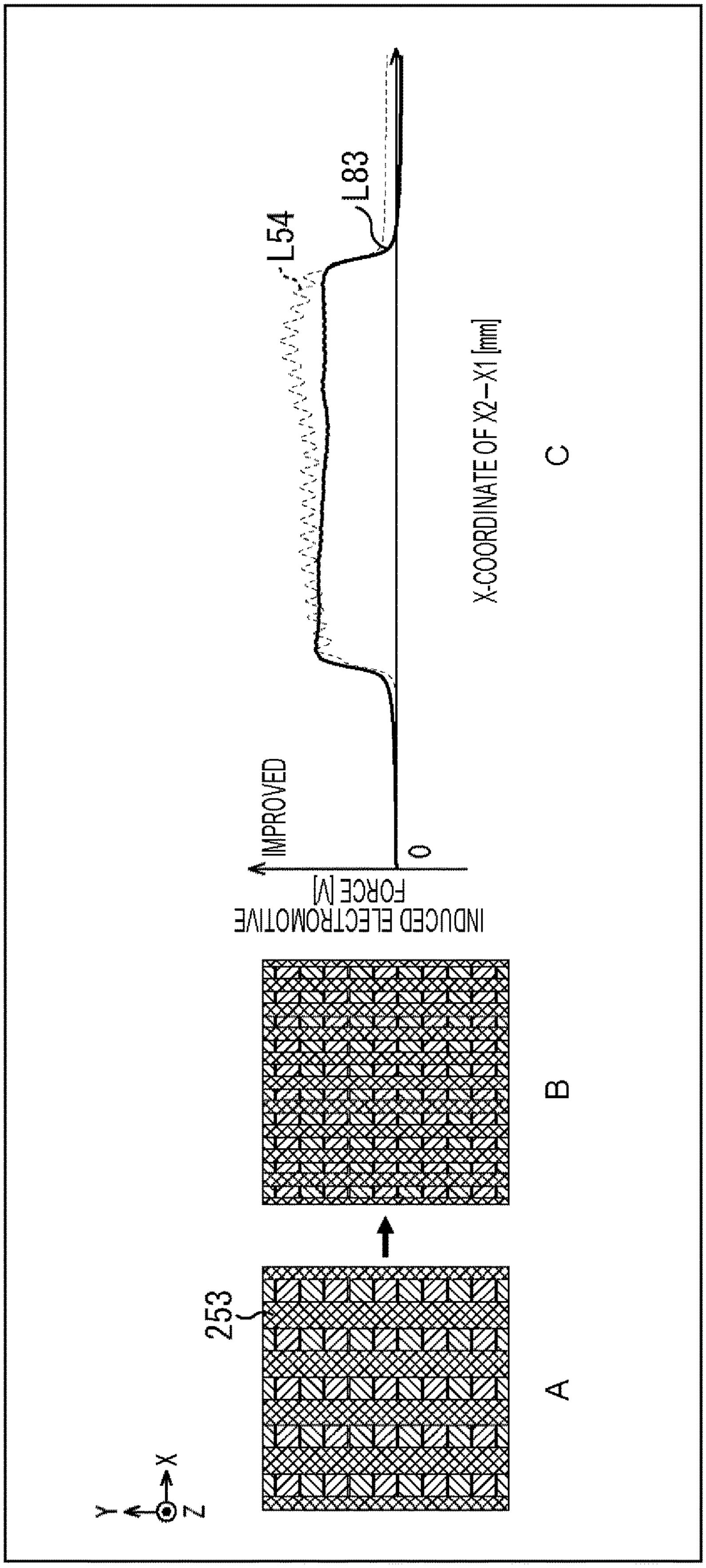
FIG. 48 is a diagram showing a modification in which the conductor cycle in the X direction of the sixth example configuration of the conductor layers A and B is halved, and the effects of the modification.

FIG. 48 is a diagram showing a modification in which the conductor cycle in the X direction of the sixth example configuration (FIG. 27) of the conductor layers A and B is halved, and the effects of the modification. Note that A of FIG. 48 shows the sixth example configuration of the conductor layers A and B, and B of FIG. 48 shows the modification of the sixth example configuration of the conductor layers A and B.

C of FIG. 48 shows changes in the induced electromotive force that causes inductive noise in images as the results of a simulation performed in a case where the modification shown in B of FIG. 48 is applied to the solid-state imaging device 100. Note that the conditions for the current flowing in this modification are similar to those shown in FIG. 23. The abscissa axis in FIG. 48 indicates the X-axis coordinate of the image, and the ordinate axis indicates the magnitude of the induced electromotive force.

A solid line L83 in C of FIG. 48 corresponds to the modification shown in B of FIG. 48, and a dotted line L54 corresponds to the sixth example configuration (FIG. 27). As is apparent from comparison between the solid line L83 and the dotted line L54, this modification causes smaller changes in the induced electromotive force generated in the victim conductor loop, compared with the sixth example configuration. Accordingly, it is clear that this modification can make the inductive noise smaller than that in the sixth example configuration.

Figure 49:
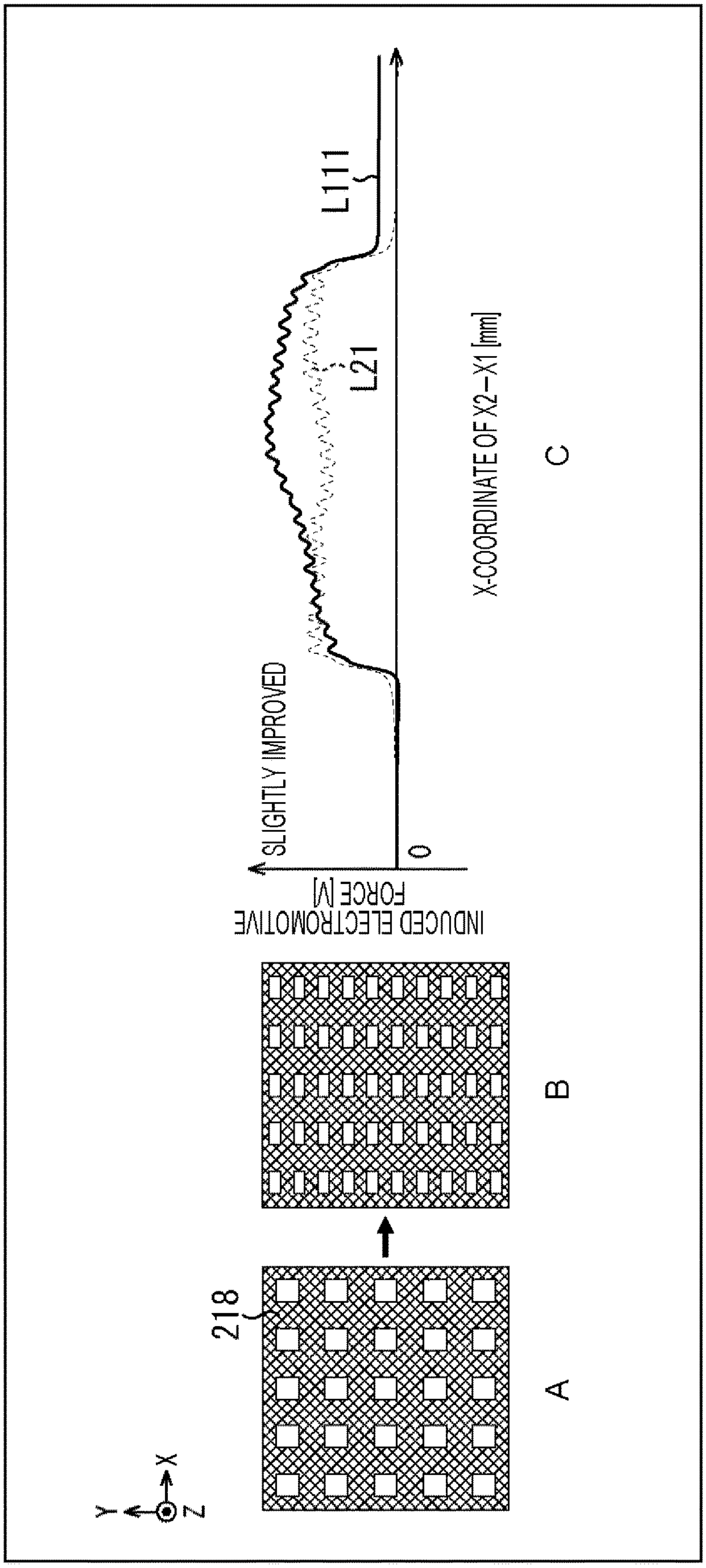
FIG. 49 is a diagram showing a modification in which the conductor cycle in the Y direction of the second example configuration of the conductor layers A and B is halved, and the effects of the modification.

FIG. 49 is a diagram showing a modification in which the conductor cycle in the Y direction of the second example configuration (FIG. 15) of the conductor layers A and B is halved, and the effects of the modification. Note that A of FIG. 49 shows the second example configuration of the conductor layers A and B, and B of FIG. 49 shows the modification of the second example configuration of the conductor layers A and B.

C of FIG. 49 shows changes in the induced electromotive force that causes inductive noise in images as the results of a simulation performed in a case where the modification shown in B of FIG. 49 is applied to the solid-state imaging device 100. Note that the conditions for the current flowing in this modification are similar to those shown in FIG. 13. The abscissa axis in FIG. 49 indicates the X-axis coordinate of the image, and the ordinate axis indicates the magnitude of the induced electromotive force.

A solid line L111 in C of FIG. 49 corresponds to the modification shown in B of FIG. 49, and a dotted line L21 corresponds to the second example configuration. As is apparent from comparison between the solid line L111 and the dotted line L21, this modification causes slightly smaller changes in the induced electromotive force generated in the victim conductor loop, compared with the second example configuration. Accordingly, it is clear that this modification can make the inductive noise slightly smaller than that in the second example configuration.

Figure 50:
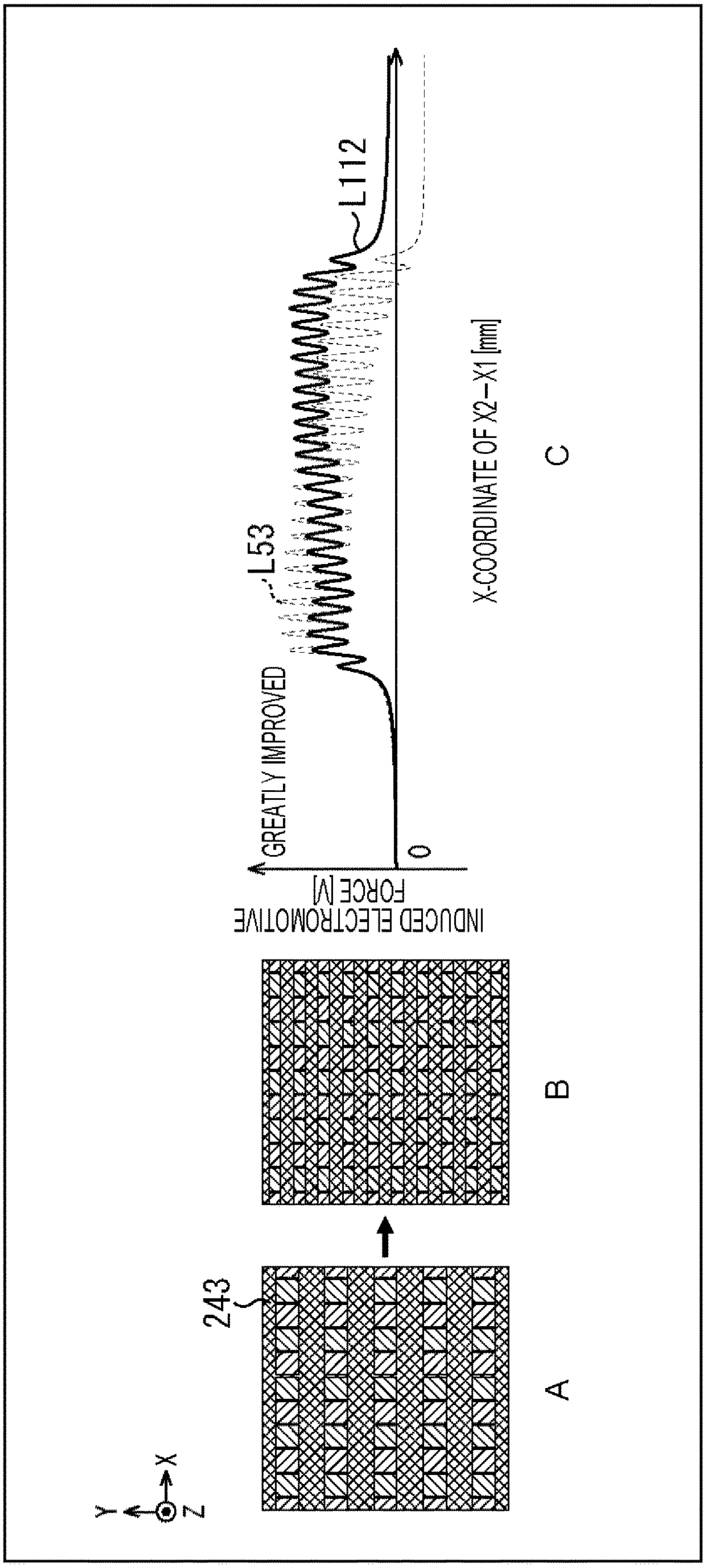
FIG. 50 is a diagram showing a modification in which the conductor cycle in the Y direction of the fifth example configuration of the conductor layers A and B is halved, and the effects of the modification.

FIG. 50 is a diagram showing a modification in which the conductor cycle in the Y direction of the fifth example configuration (FIG. 26) of the conductor layers A and B is halved, and the effects of the modification. Note that A of FIG. 50 shows the fifth example configuration of the conductor layers A and B, and B of FIG. 50 shows the modification of the fifth example configuration of the conductor layers A and B.

C of FIG. 50 shows changes in the induced electromotive force that causes inductive noise in images as the results of a simulation performed in a case where the modification shown in B of FIG. 50 is applied to the solid-state imaging device 100. Note that the conditions for the current flowing in this modification are similar to those shown in FIG. 23. The abscissa axis in FIG. 50 indicates the X-axis coordinate of the image, and the ordinate axis indicates the magnitude of the induced electromotive force.

A solid line L112 in C of FIG. 50 corresponds to the modification shown in B of FIG. 50, and a dotted line 153 corresponds to the fifth example configuration. As is apparent from comparison between the solid line L112 and the dotted line L53, this modification causes significantly smaller changes in the induced electromotive force generated in the victim conductor loop, compared with the fifth example configuration. Accordingly, it is clear that this modification can make the inductive noise much smaller than that in the fifth example configuration.

Figure 51:
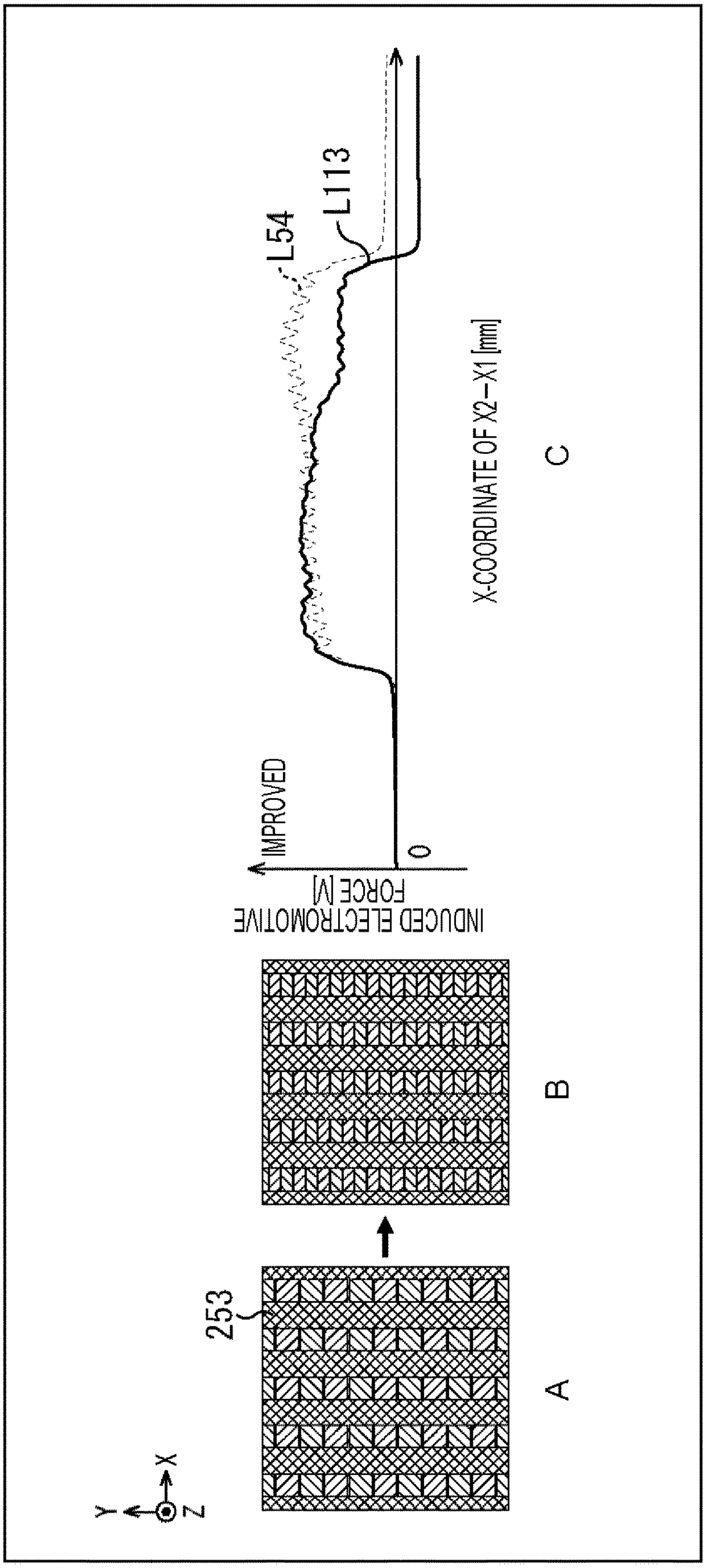
FIG. 51 is a diagram showing a modification in which the conductor cycle in the Y direction of the sixth example configuration of the conductor layers A and B is halved, and the effects of the modification.

FIG. 51 is a diagram showing a modification in which the conductor cycle in the Y direction of the sixth example configuration (FIG. 27) of the conductor layers A and B is halved, and the effects of the modification. Note that A of FIG. 51 shows the sixth example configuration of the conductor layers A and B, and B of FIG. 51 shows the modification of the sixth example configuration of the conductor layers A and B.

C of FIG. 51 shows changes in the induced electromotive force that causes inductive noise in images as the results of a simulation performed in a case where the modification shown in B of FIG. 51 is applied to the solid-state imaging device 100. Note that the conditions for the current flowing in this modification are similar to those shown in FIG. 23. The abscissa axis in FIG. 51 indicates the X-axis coordinate of the image, and the ordinate axis indicates the magnitude of the induced electromotive force.

A solid line L113 in C of FIG. 51 corresponds to the modification shown in B of FIG. 51, and a dotted line L54 corresponds to the sixth example configuration. As is apparent from comparison between the solid line L113 and the dotted line L54, this modification causes smaller changes in the induced electromotive force generated in the victim conductor loop, compared with the sixth example configuration. Accordingly, it is clear that this modification can make the inductive noise smaller than that in the sixth example configuration.

Figure 52:
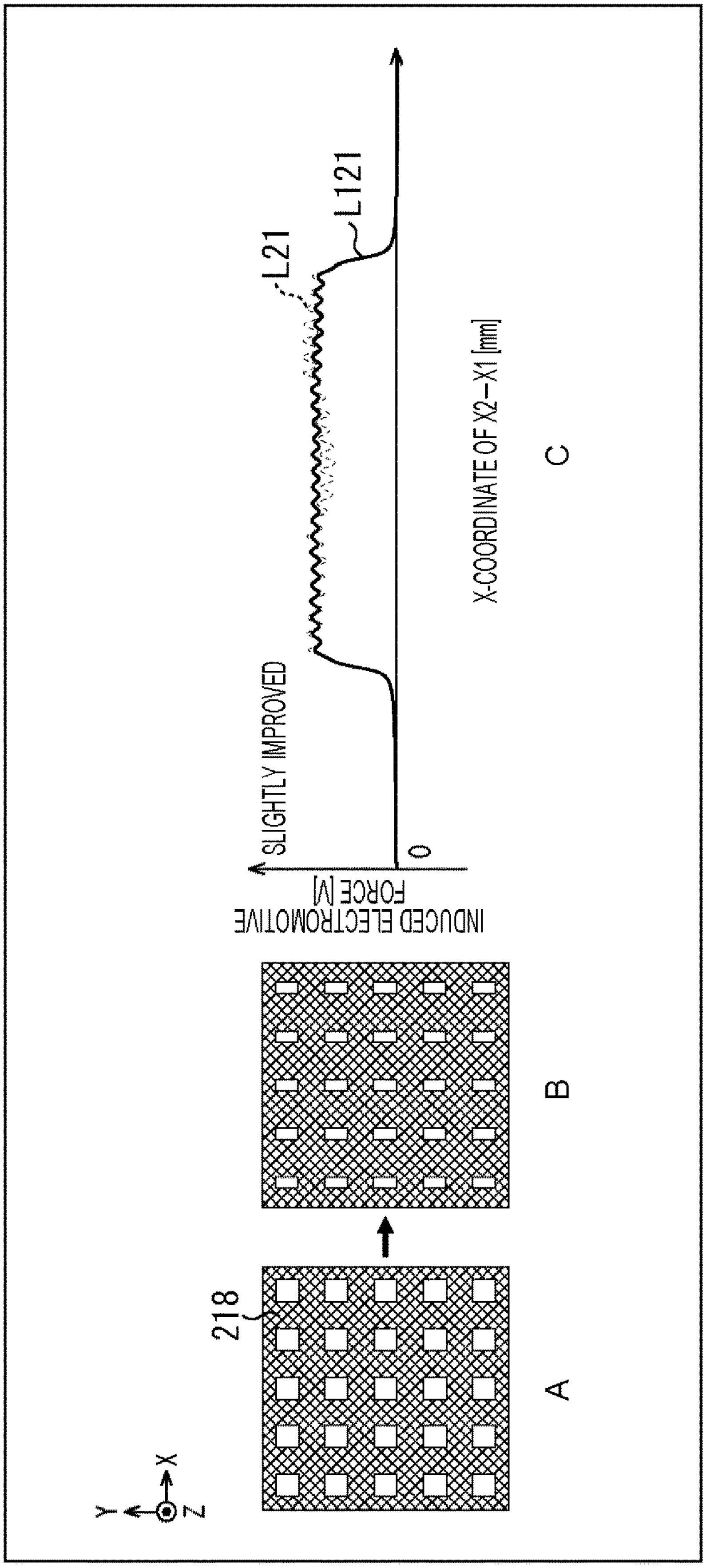
FIG. 52 a diagram showing a modification in which the conductor width in the X direction of the second example configuration of the conductor layers A and B is doubled, and the effects of the modification.

FIG. 52 is a diagram showing a modification in which the conductor width in the X direction of the second example configuration (FIG. 15) of the conductor layers A and B is doubled, and the effects of the modification. Note that A of FIG. 52 shows the second example configuration of the conductor layers A and B, and B of FIG. 52 shows the modification of the second example configuration of the conductor layers A and B.

C of FIG. 52 shows changes in the induced electromotive force that causes inductive noise in images as the results of a simulation performed in a case where the modification shown in B of FIG. 52 is applied to the solid-state imaging device 100. Note that the conditions for the current flowing in this modification are similar to those shown in FIG. 13. The abscissa axis in FIG. 52 indicates the X-axis coordinate of the image, and the ordinate axis indicates the magnitude of the induced electromotive force.

A solid line L121 in C of FIG. 52 corresponds to the modification shown in B of FIG. 52, and a dotted line L21 corresponds to the second example configuration. As is apparent from comparison between the solid line L121 and the dotted line L21, this modification causes slightly smaller changes in the induced electromotive force generated in the victim conductor loop, compared with the second example configuration. Accordingly, it is clear that this modification can make the inductive noise slightly smaller than that in the second example configuration.

Figure 53:
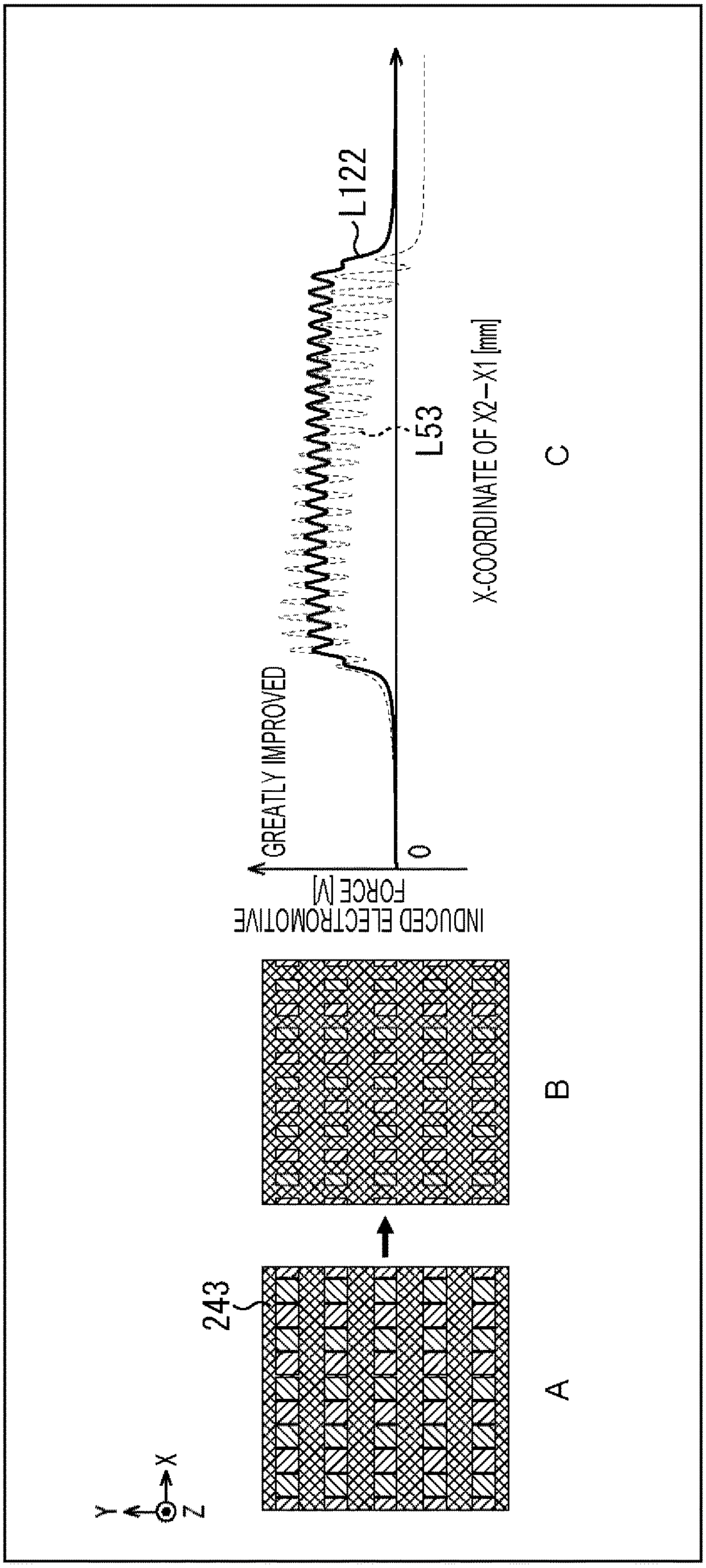
FIG. 53 is a diagram showing a modification in which the conductor width in the X direction of the fifth example configuration of the conductor layers A and B is doubled, and the effects of the modification.

FIG. 53 is a diagram showing a modification in which the conductor width in the X direction of the fifth example configuration (FIG. 26) of the conductor layers A and B is doubled, and the effects of the modification. Note that A of FIG. 53 shows the fifth example configuration of the conductor layers A and B, and B of FIG. 53 shows the modification of the fifth example configuration of the conductor layers A and B.

C of FIG. 53 shows changes in the induced electromotive force that causes inductive noise in images as the results of a simulation performed in a case where the modification shown in B of FIG. 53 is applied to the solid-state imaging device 100. Note that the conditions for the current flowing in this modification are similar to those shown in FIG. 23. The abscissa axis in FIG. 53 indicates the X-axis coordinate of the image, and the ordinate axis indicates the magnitude of the induced electromotive force.

A solid line L122 in C of FIG. 53 corresponds to the modification shown in B of FIG. 53, and a dotted line L53 corresponds to the fifth example configuration. As is apparent from comparison between the solid line L122 and the dotted line L53, this modification causes significantly smaller changes in the induced electromotive force generated in the victim conductor loop, compared with the fifth example configuration. Accordingly, it is clear that this modification can make the inductive noise much smaller than that in the fifth example configuration.

Figure 54:
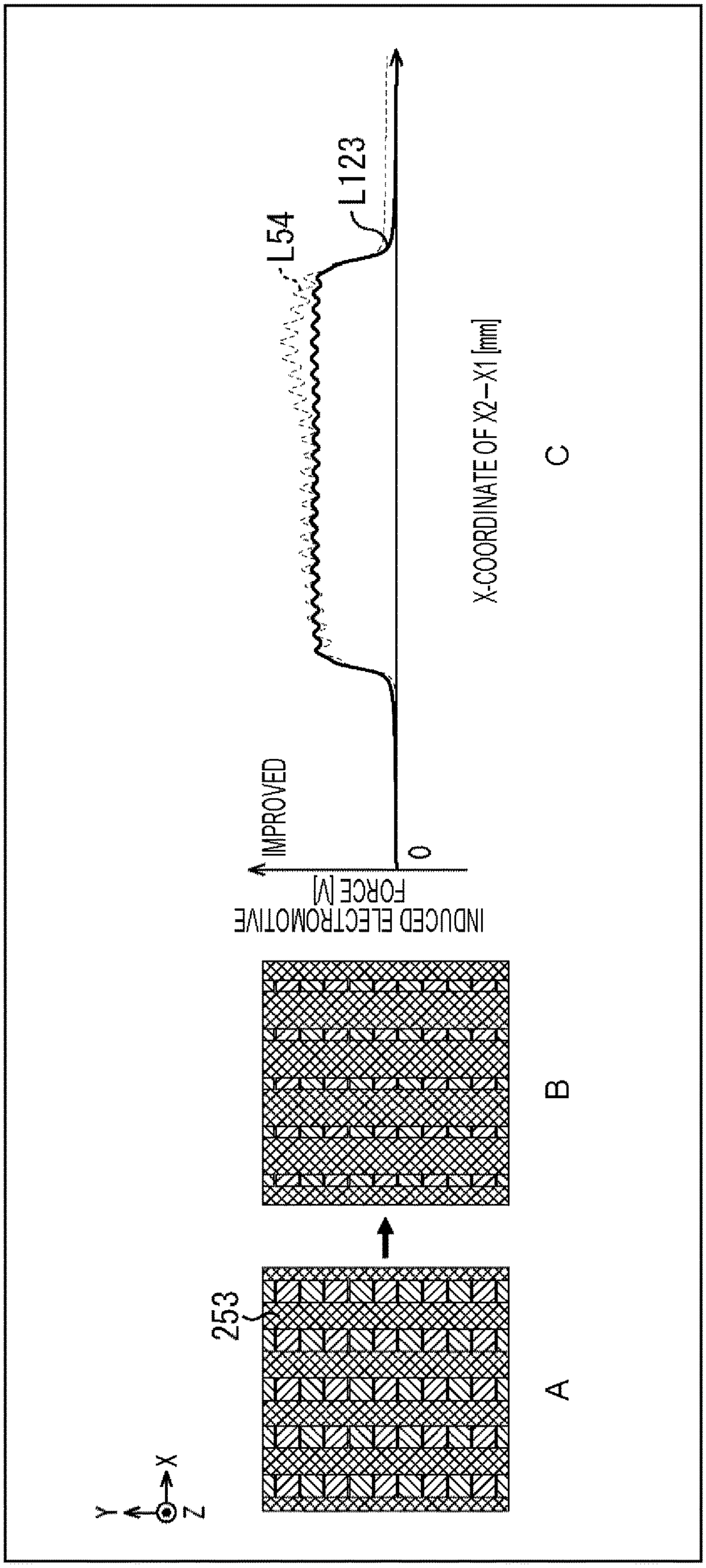
FIG. 54 is a diagram showing a modification in which the conductor width in the X direction of the sixth example configuration of the conductor layers A and B is doubled, and the effects of the modification.

FIG. 54 is a diagram showing a modification in which the conductor width in the X direction of the sixth example configuration (FIG. 27) of the conductor layers A and B is doubled, and the effects of the modification. Note that A of FIG. 54 shows the sixth example configuration of the conductor layers A and B, and B of FIG. 54 shows the modification of the sixth example configuration of the conductor layers A and B.

C of FIG. 54 shows changes in the induced electromotive force that causes inductive noise in images as the results of a simulation performed in a case where the modification shown in B of FIG. 54 is applied to the solid-state imaging device 100. Note that the conditions for the current flowing in this modification are similar to those shown in FIG. 23. The abscissa axis in FIG. 54 indicates the X-axis coordinate of the image, and the ordinate axis indicates the magnitude of the induced electromotive force.

A solid line L123 in C of FIG. 54 corresponds to the modification shown in B of FIG. 54, and a dotted line L54 corresponds to the sixth example configuration. As is apparent from comparison between the solid line L123 and the dotted line L54, this modification causes smaller changes in the induced electromotive force generated in the victim conductor loop, compared with the sixth example configuration. Accordingly, it is clear that this modification can make the inductive noise smaller than that in the sixth example configuration.

Figure 55:
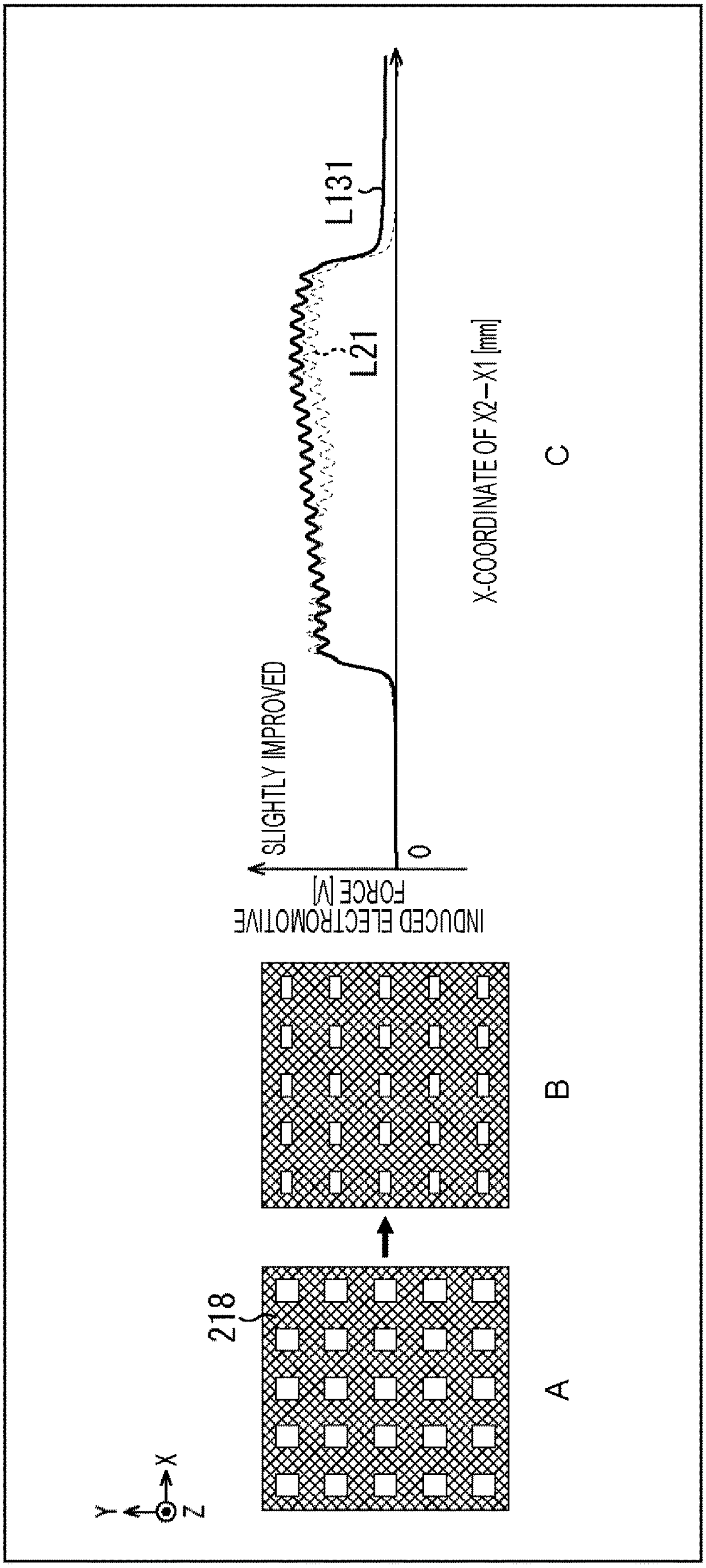
FIG. 55 is a diagram showing a modification in which the conductor width in the Y direction of the second example configuration of the conductor layers A and B is doubled, and the effects of the modification.

FIG. 55 is a diagram showing a modification in which the conductor width in the Y direction of the second example configuration (FIG. 15) of the conductor layers A and B is doubled, and the effects of the modification. Note that A of FIG. 55 shows the second example configuration of the conductor layers A and B, and B of FIG. 55 shows the modification of the second example configuration of the conductor layers A and B.

C of FIG. 55 shows changes in the induced electromotive force that causes inductive noise in images as the results of a simulation performed in a case where the modification shown in B of FIG. 55 is applied to the solid-state imaging device 100. Note that the conditions for the current flowing in this modification are similar to those shown in FIG. 13. The abscissa axis in FIG. 55 indicates the X-axis coordinate of the image, and the ordinate axis indicates the magnitude of the induced electromotive force.

A solid line L131 in C FIG. 55 corresponds to the modification shown in B of FIG. 55, and a dotted line L21 corresponds to the second example configuration. As is apparent from comparison between the solid line L131 and the dotted line L21, this modification causes slightly smaller changes in the induced electromotive force generated in the victim conductor loop, compared with the second example configuration. Accordingly, it is clear that this modification can make the inductive noise slightly smaller than that in the second example configuration.

Figure 56:
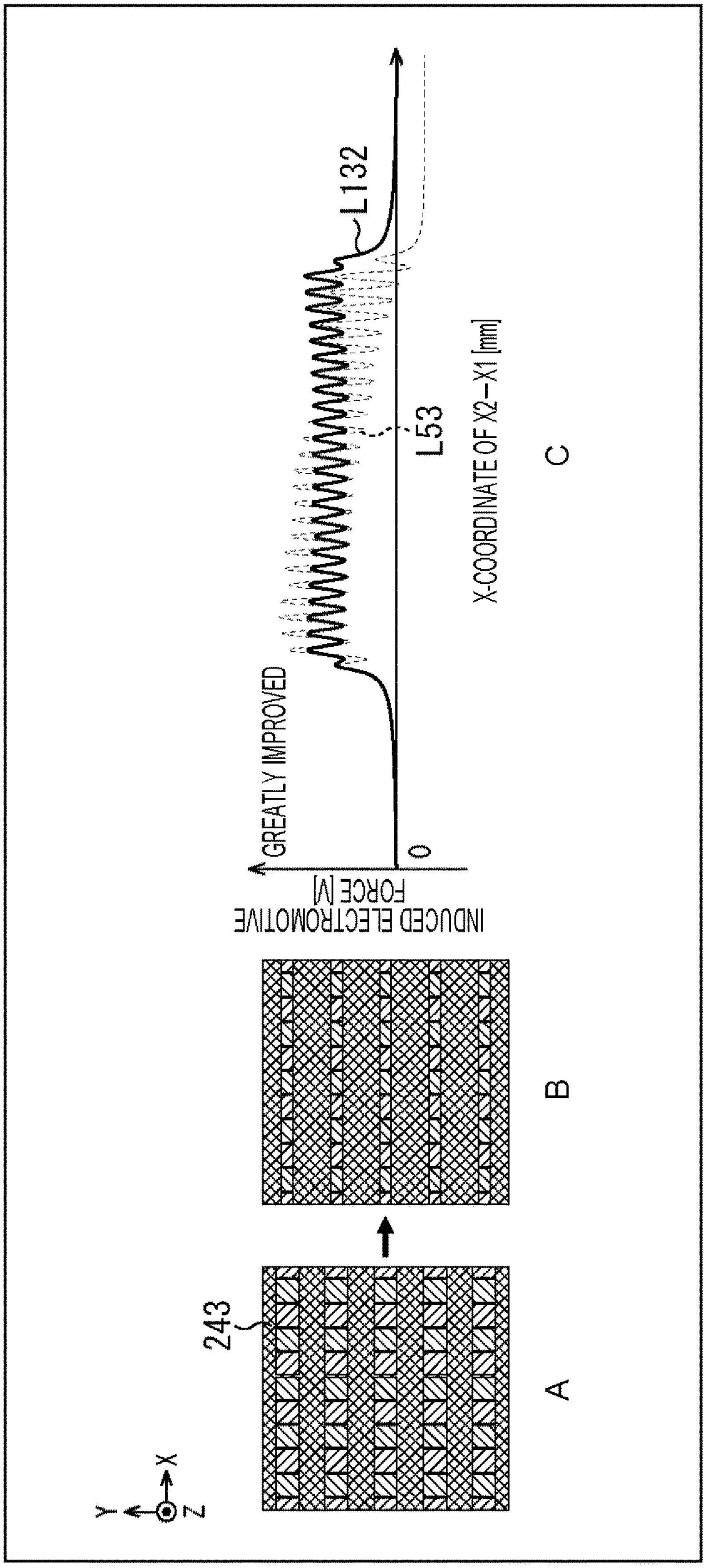
FIG. 56 is a diagram showing a modification in which the conductor width in the Y direction of the fifth example configuration of the conductor layers A and B is doubled, and the effects of the modification.

FIG. 56 is a diagram showing a modification in which the conductor width in the Y direction of the fifth example configuration (FIG. 26) of the conductor layers A and B is doubled, and the effects of the modification. Note that A of FIG. 56 shows the fifth example configuration of the conductor layers A and B, and B of FIG. 56 shows the modification of the fifth example configuration of the conductor layers A and B.

C of FIG. 56 shows changes in the induced electromotive force that causes inductive noise in images as the results of a simulation performed in a case where the modification shown in B of FIG. 56 is applied to the solid-state imaging device 100. Note that the conditions for the current flowing in this modification are similar to those shown in FIG. 23. The abscissa axis in FIG. 56 indicates the X-axis coordinate of the image, and the ordinate axis indicates the magnitude of the induced electromotive force.

A solid line L132 in C of FIG. 56 corresponds to the modification shown in B of FIG. 56, and a dotted line 153 corresponds to the fifth example configuration. As is apparent from comparison between the solid line L132 and the dotted line L53, this modification causes significantly smaller changes in the induced electromotive force generated in the victim conductor loop, compared with the fifth example configuration. Accordingly, it is clear that this modification can make the inductive noise much smaller than that in the fifth example configuration.

Figure 57:
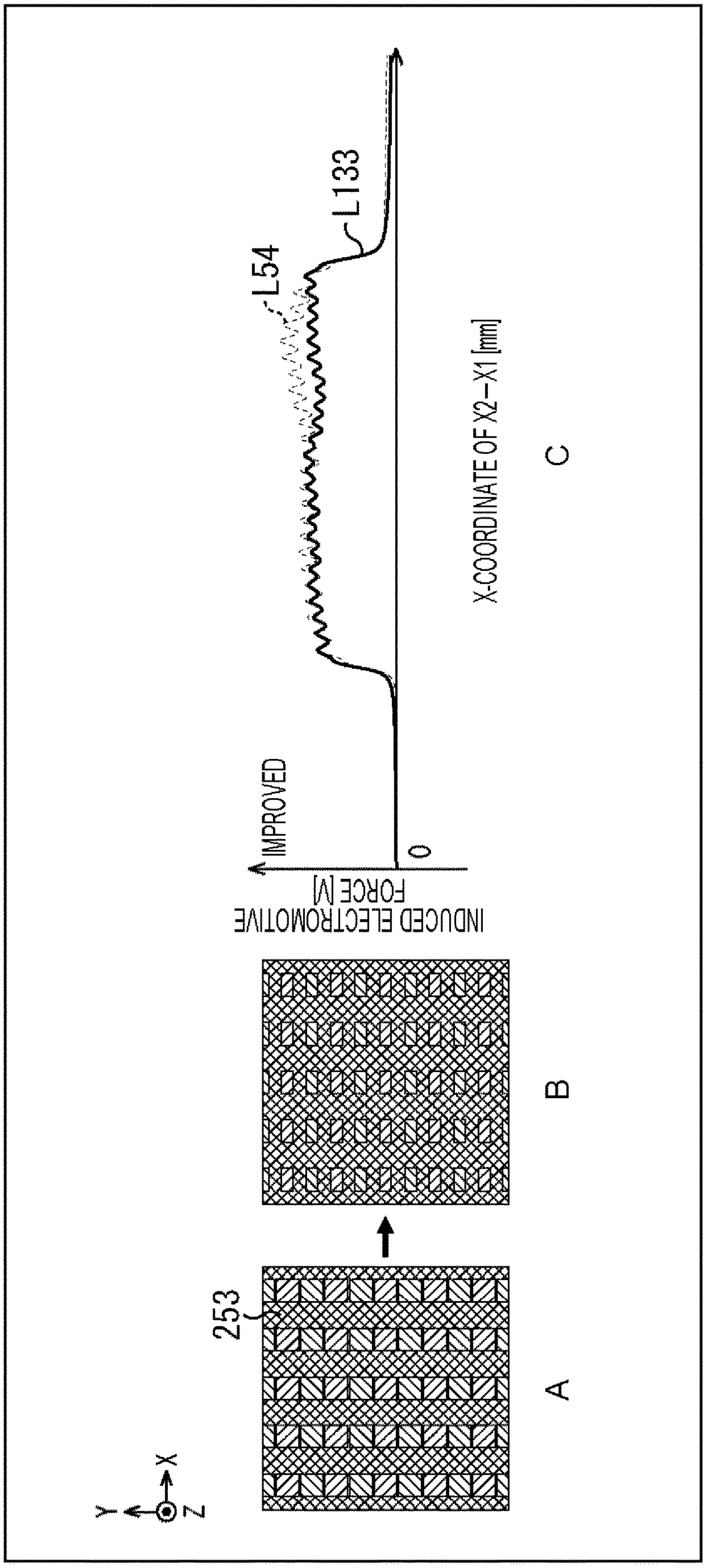
FIG. 57 is a diagram showing a modification in which the conductor width in the Y direction of the sixth example configuration of the conductor layers A and B is doubled, and the effects of the modification.

FIG. 57 is a diagram showing a modification in which the conductor width in the Y direction of the sixth example configuration (FIG. 27) of the conductor layers A and B is doubled, and the effects of the modification. Note that A of FIG. 57 shows the sixth example configuration of the conductor layers A and B, and B of FIG. 57 shows the modification of the sixth example configuration of the conductor layers A and B.

C of FIG. 57 shows changes in the induced electromotive force that causes inductive noise in images as the results of a simulation performed in a case where the modification shown in B of FIG. 57 is applied to the solid-state imaging device 100. Note that the conditions for the current flowing in this modification are similar to those shown in FIG. 23. The abscissa axis in FIG. 57 indicates the X-axis coordinate of the image, and the ordinate axis indicates the magnitude of the induced electromotive force.

A solid line L133 in C of FIG. 57 corresponds to the modification shown in B of FIG. 57, and a dotted line 154 corresponds to the sixth example configuration. As is apparent from comparison between the solid line L133 and the dotted line L54, this modification causes smaller changes in the induced electromotive force generated in the victim conductor loop, compared with the sixth example configuration. Accordingly, it is clear that this modification can make the inductive noise smaller than that in the sixth example configuration.

<7. Modifications of Mesh Conductors>

Figure 58:
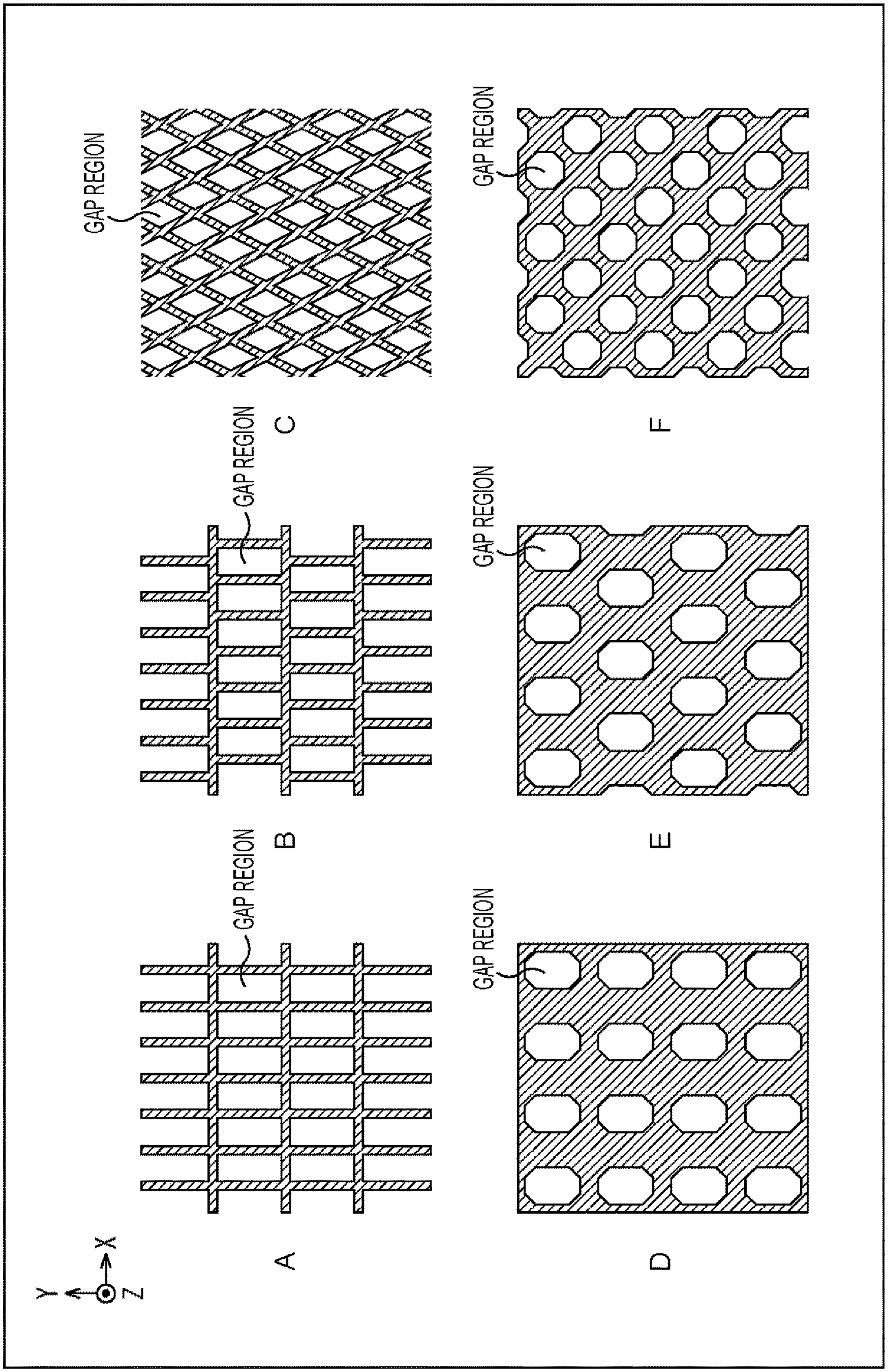
FIG. 58 is a diagram showing modifications of mesh conductors forming the respective example configurations of the conductor layers A and B.

Next, FIG. 58 is plan views showing modifications of mesh conductors that can be applied to each of the above example configurations of the conductor layers A and B.

A of FIG. 58 shows a simplified view of the shape of a mesh conductor used in each of the above example configurations of the conductor layers A and B. In the mesh conductors used in each of the above example configurations of the conductor layers A and B, the gap regions have a rectangular shape, and each rectangular gap region is linearly aligned in the X direction and the Y direction.

B of FIG. 58 is a simplified view of a first modification of the mesh conductor. In the first modification of the mesh conductor, the gap regions are rectangular, and the respective gap regions are linearly aligned in the X direction and are shifted in each row in the Y direction.

C of FIG. 58 is a simplified view of a second modification of the mesh conductor. In the second modification of the mesh conductor, the gap regions are rhombus-shaped, and each gap region is linearly aligned in an oblique direction.

D of FIG. 58 is a simplified view of a third modification of the mesh conductor. In the third modification of the mesh conductor, the gap regions are not rectangular but circular or polygonal (octagonal in the case shown in D of FIG. 58), and each gap region is linearly aligned both in the X direction and the Y direction.

E of FIG. 58 is a simplified view of a fourth modification of the mesh conductor. In the fourth modification of the mesh conductor, the gap regions are not rectangular but circular or polygonal (octagonal in the case shown in E of FIG. 58), and the respective gap regions is linearly aligned in the X direction and are shifted in each row in the Y direction.

F of FIG. 58 is a simplified view of a fifth modification of the mesh conductor. In the fifth modification of the mesh conductor, the gap regions are not rectangular but circular or polygonal (octagonal in the case shown in F of FIG. 58), and each gap region is linearly aligned in an oblique direction.

Note that the shape of the mesh conductor applicable to the respective example configurations of the conductor layers A and B is not limited to the modifications shown in FIG. 58, and is only required to be a mesh-like shape.

<8. Various Effects>

<Improvement of the Degree of Freedom in Layout Design>

As described above, in each of the example configurations of the conductor layers A and B, planar conductors or mesh conductors are adopted. In general, a mesh conductor (a grid conductor) has a wiring structure that is cyclic in the X direction and the Y direction. Therefore, if a mesh conductor that has a basic cyclic structure that is a unit (one cycle) of a cyclic structure is designed, the basic cyclic structure is repeatedly disposed in the X direction and the Y direction, so that the wiring layout can be designed readily than in a case where linear conductors are used. In other words, in a case where mesh conductors are used, the degree of freedom in layout is higher than in a case where linear conductors are used. Accordingly, the number of steps, the time, and the cost required for layout design can be reduced.

Figure 59:
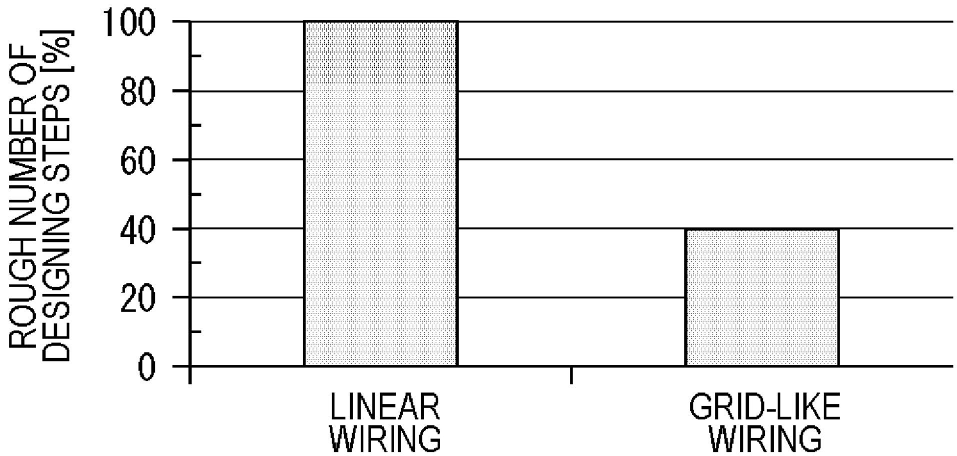
FIG. 59 is a graph for explaining an increase in the degree of freedom in layout.

FIG. 59 is a graph showing the results of simulations of the number of designing steps in a case where a layout of circuit wiring lines satisfying predetermined conditions is designed with linear conductors, and the number of designing steps in a case where a layout is designed with mesh conductors (grid conductors).

In the cases shown in FIG. 59, if the number of designing steps in a case where the designing is conducted with linear conductors is set as 100%, the number or designing steps in a case where the designing is conducted with mesh conductors (grid conductors) will be about 40%, which proves that the number of designing steps can be significantly reduced.

<Reduction of Voltage Drop (IR-Drop)>

Figure 60:
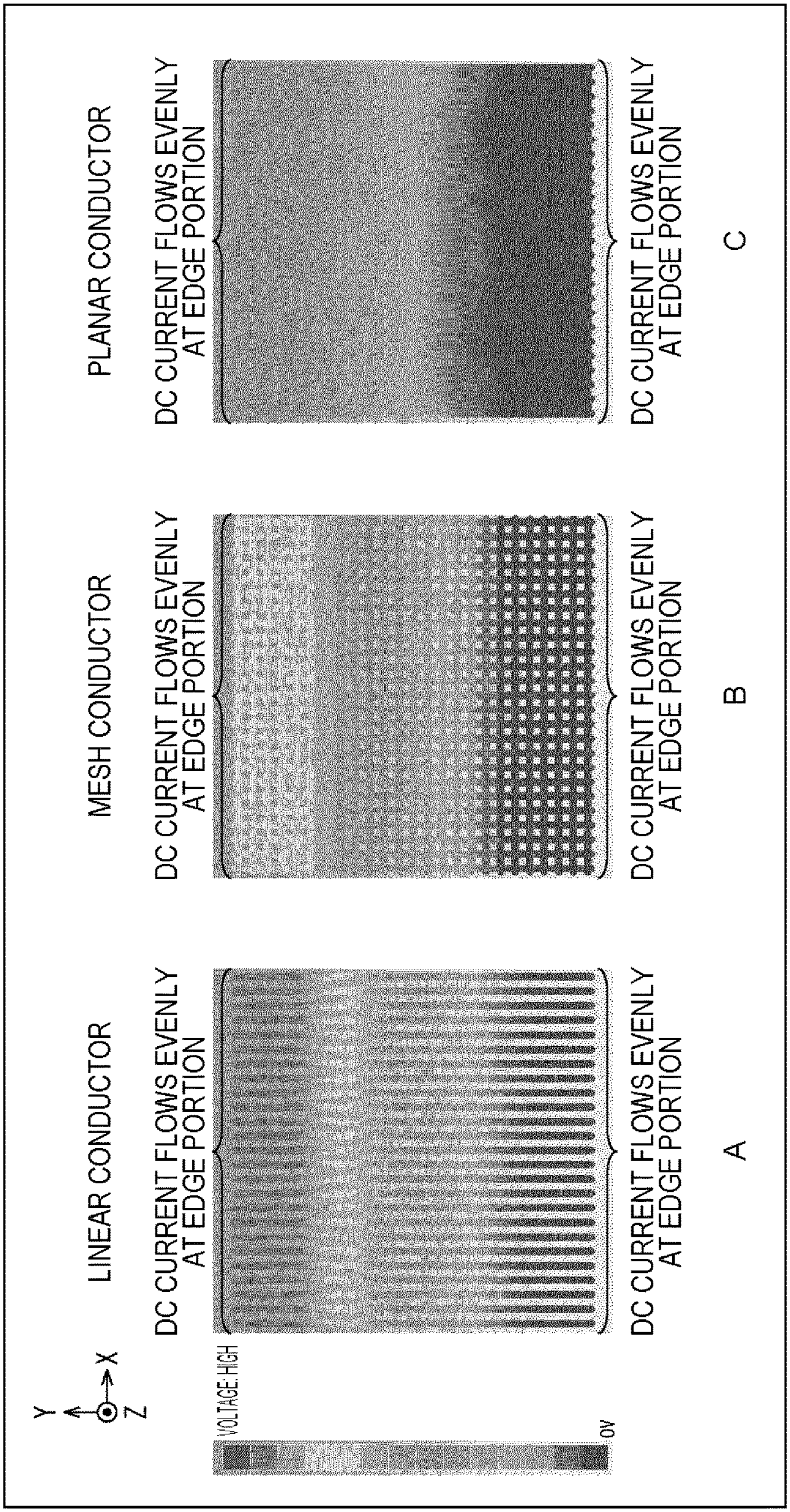
FIG. 60 is a diagram for explaining decreases in voltage drop (IR-Drop).

FIG. 60 is a diagram showing voltage changes in cases where a DC current is applied in the Y direction under the same conditions to conductors that are arranged in the X-Y plane and are of the same material but have different shapes.

A of FIG. 60 corresponds to a linear conductor, B of FIG. 60 corresponds to a mesh conductor, C of FIG. 60 corresponds to a planar conductor, and the shades of color indicate the voltage. As is apparent from comparison among A, B, and C of FIG. 60, the voltage change is the largest in the linear conductor, followed by the mesh conductor and the planar conductor in this order.

Figure 61:
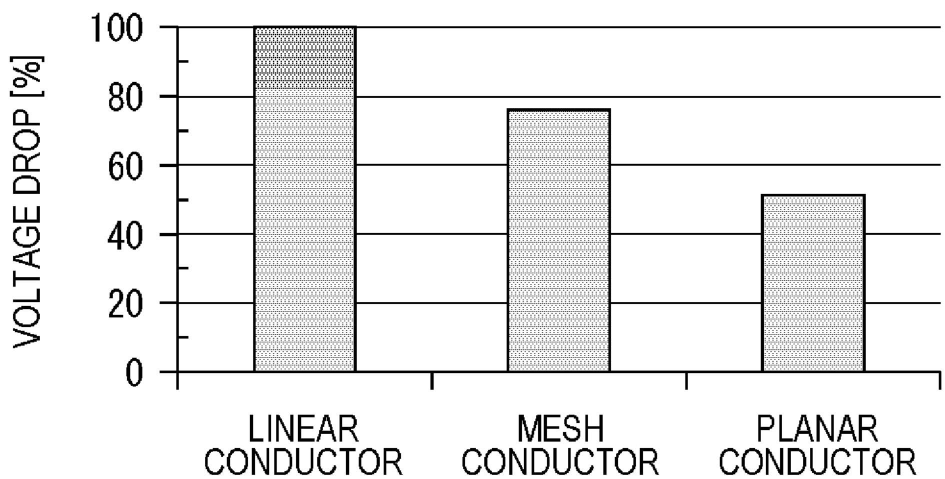
FIG. 61 is a graph for explaining decreases in voltage drop (IR-Drop).

FIG. 61 is a graph showing relative voltage drops in the mesh conductor and the planar conductor, with the voltage drop in the linear conductor shown in A of FIG. 60 being 100%.

As is apparent from FIG. 61, compared with the linear conductor, the planar conductor and the mesh conductor can more effectively reduce the voltage drop (IR-Drop) that can be a fatal obstacle to driving of the semiconductor device.

However, it is known that planar conductors cannot be manufactured in many cases by today's semiconductor substrate processing process. Therefore, it is practical to adopt an example configuration in which mesh conductors are used for both the conductor layers A and B. However, this is not the case in a case where the semiconductor substrate processing process has evolved to allow manufacturing of planar conductors. As for the uppermost metal layer and the lowermost metal layer of the metal layers, planar conductors can be manufactured in some cases.

<Reduction of Capacitive Noise>

The conductors (planar conductors or mesh conductors) forming the conductor layers A and B might cause not only inductive noise but also capacitive noise in a victim conductor loop formed with a signal line 132 and a control line 133.

Here, capacitive noise means that, in a case where a voltage is applied to the conductors forming the conductor layers A and B, a voltage is generated in the signal line 132 and the control line 133 by capacitive coupling between the conductors and the signal line 132 and the control line 133, and the applied voltage further changes, to generate voltage noise in the signal line 132 and the control line 133. This voltage noise turns into noise in a pixel signal.

It is considered that the magnitude of capacitive noise is substantially proportional to the electrostatic capacitance or the voltage between the conductors forming the conductor layers A and B, and the wiring lines such as the signal line 132 and the control line 133. Regarding the electrostatic capacitance, the electrostatic capacitance between the two conductors is $C=\varepsilon*S/d$ in a case where the overlapping area between the two conductors (one may be a conductor, and the other may be a wiring line) is S, the two conductors are arranged in parallel at a distance d, and a dielectric material having a permittivity $\varepsilon$ is uniformly inserted between the conductors. Accordingly, it is clear that the larger the overlapping area S between the two conductors, the greater the capacitive noise.

Figure 62:
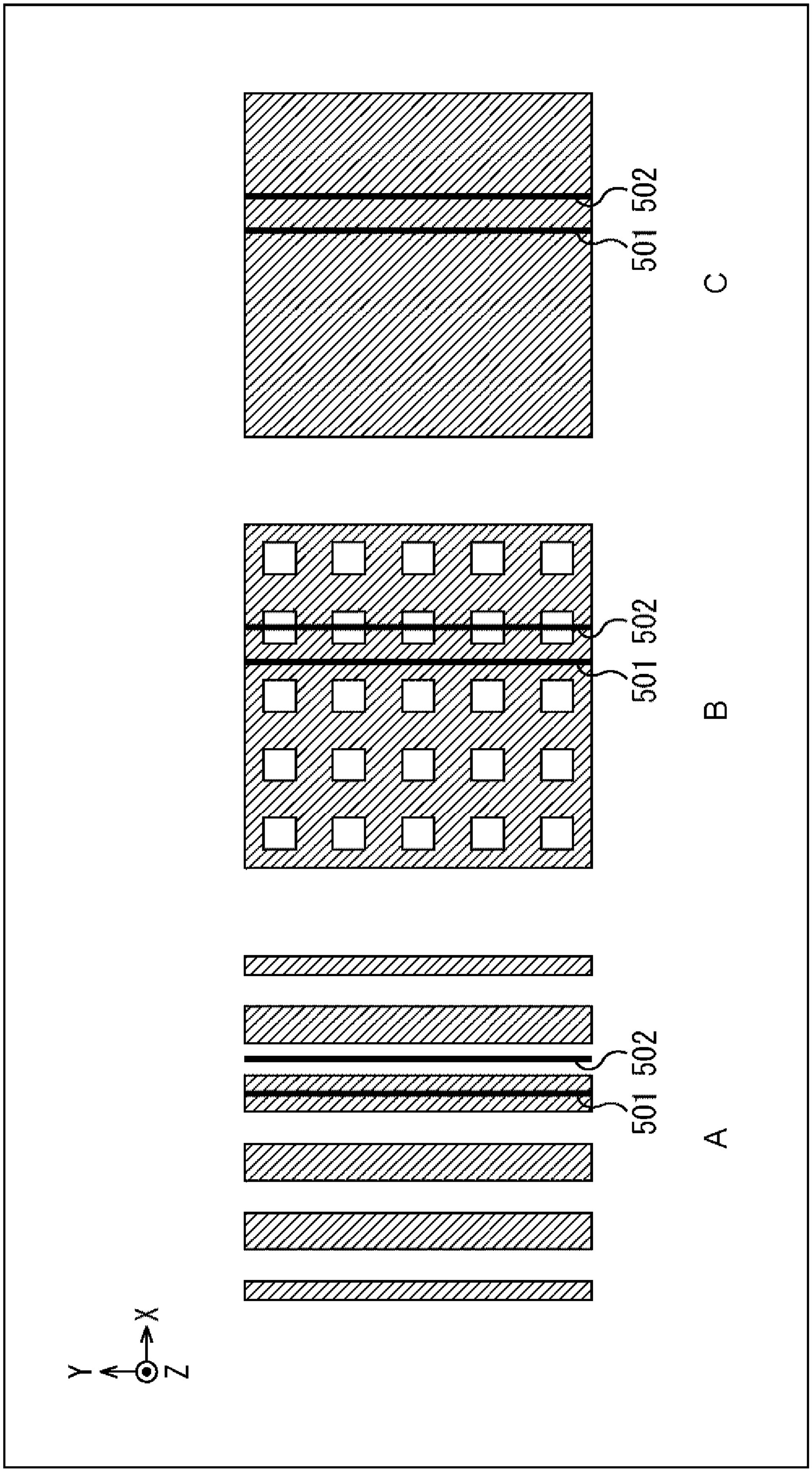
FIG. 62 is a diagram for explaining decreases in capacitive noise.

FIG. 62 is a diagram for explaining a difference in electrostatic capacitance between conductors of the same material that are arranged in the X-Y plane and have different shapes, and the other conductors (wiring lines).

A of FIG. 62 shows a linear conductor that is long in the Y direction, and wiring lines 501 and 502 (corresponding to the signal line 132 and the control line 133) that are linearly formed in the Y direction at a distance in the Z direction from the linear conductor. However, the entire wiring line 501 overlaps a conductor region of the linear conductor, but the entire wiring line 502 overlaps a gap region of the linear conductor and does not have any area that overlaps the conductor region.

B of FIG. 62 shows a mesh conductor, and wiring lines 501 and 502 that are linearly formed in the Y direction at a distance in the Z direction from the mesh conductor. However, the entire wiring line 501 overlaps the conductor region of the mesh conductor, but substantially a half of the wiring line 502 overlaps the conductor region of the mesh conductor.

C of FIG. 62 shows a planar conductor, and wiring lines 501 and 502 that are linearly formed in the Y direction at a distance in the Z direction from the planar conductor. However, the entire wiring lines 501 and 502 overlap the conductive region of the planar conductor.

In a case where the differences between the electrostatic capacitance of the conductor (the linear conductor, the mesh conductor, or the planar conductor) and the wiring line 501, and the electrostatic capacitance of the conductor (the linear conductor, the mesh conductor, or the planar conductor) and the wiring line 502 are compared among A, B, and C of FIG. 62, the linear conductor has the largest difference, followed by the mesh conductor and the planar conductor in this manner.

That is, in the linear conductor, the difference in the electrostatic capacitance between the linear conductor and the wiring lines is large due to the difference in the X-Y coordinates of the wiring lines, and generation of capacitive noise also greatly differs. Therefore, there is a possibility that noise in a pixel signal will be highly visible in an image.

On the other hand, in the mesh conductor or the planar conductor, the difference in electrostatic capacitance between the conductor and the wiring lines due to the difference in the X-Y coordinates of the wiring lines smaller than that in the linear conductor, and accordingly, generation of capacitive noise can be made smaller. Thus, noise in pixel signals due to capacitive noise can be reduced.

<Reduction of Radiative Noise>

As described above, mesh conductors are used in each of the example configurations of the conductor layers A and B, except for the first example configuration. A mesh conductor can be expected to have the effect to reduce radiative noise. Here, radiative noise includes radiative noise from the inside of the solid-state imaging device 100 toward the outside (unnecessary radiation) and radiative noise from the outside of the solid-state imaging device 100 toward the inside (transmitted noise).

Radiative noise from the outside of the solid-state imaging device 100 toward the inside may cause voltage noise in the signal line 132 and the like, and noise in pixel signals. Therefore, in a case where an example configuration using a mesh conductor as at least one of the conductor layers A and B is adopted, the effect to reduce voltage noise and noise in pixel signals can be expected.

The conductor cycle of a mesh conductor affects the frequency band of radiative noise that can be reduced by the mesh conductor. Therefore, in a case where mesh conductors with different conductor cycles are used as the conductor layers A and B, radiative noise can be reduced in a wider frequency band than in a case where mesh conductors having the same conductor frequency are used as the conductor layers A and B.

Note that the effects described above are merely examples and are not limitation, and the present technology may have other effects.

<9. Example Configurations in which Extension Portions Differ>

Meanwhile, in a case where the wiring layer 165A as the conductor layer A or the wiring layer 165B as the conductor layer B is connected to pads 401 or 402, wiring extension portions for connecting to pads 401 or 402 are formed, as shown in FIGS. 42 through 44, for example. The wiring extension portions are normally designed to have a narrow wiring line width in compliance with the pad size.

Figure 63:
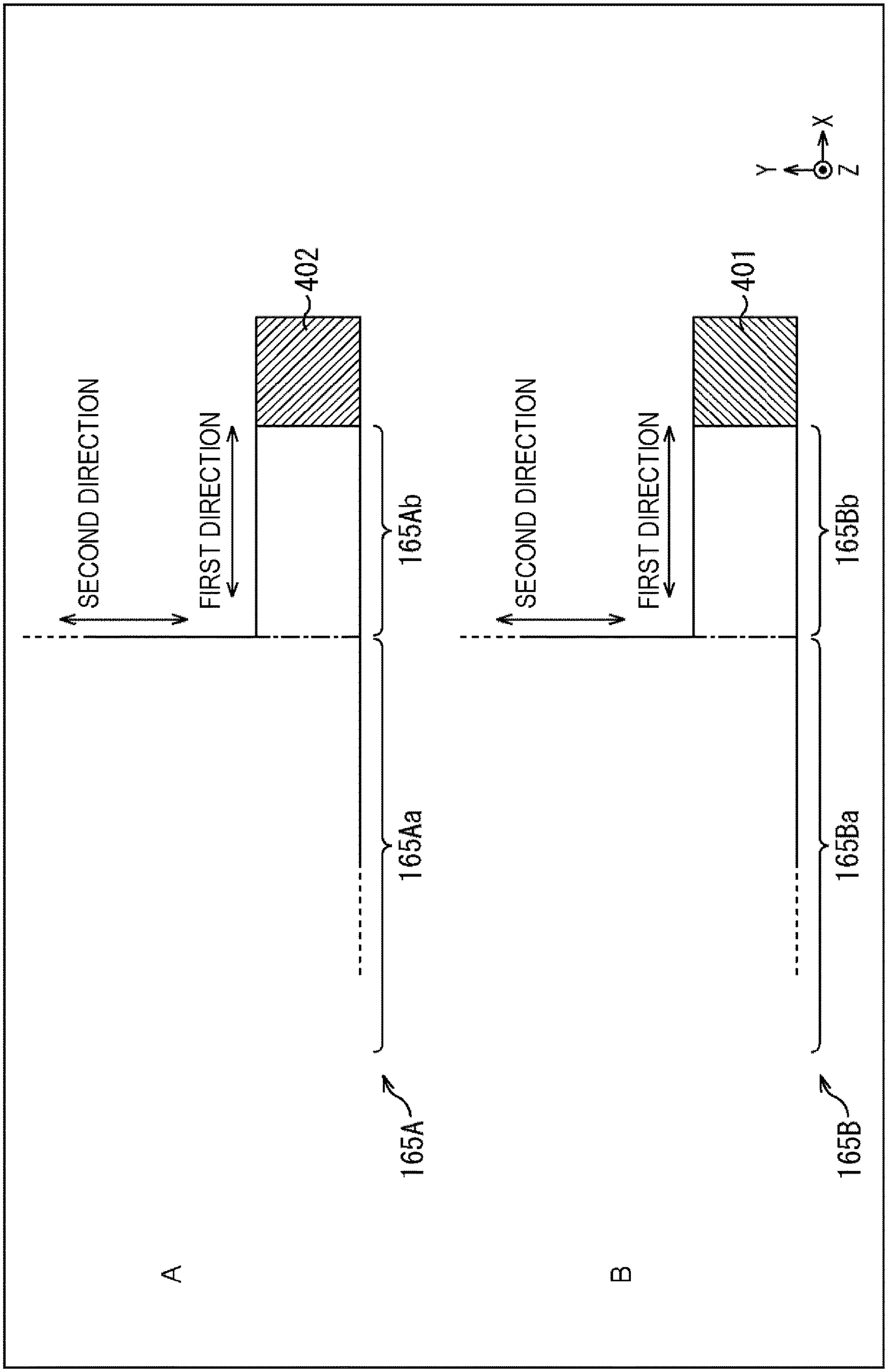
FIG. 63 is a diagram for explaining a main conductor portion and an extension conductor portion of each conductor layer.

Therefore, as shown in A of FIG. 63, the wiring layer 165A (the conductor layer A) is considered as divided into a main conductor portion 165Aa and an extension conductor portion 165Ab, for example. The main conductor portion 165Aa is a portion whose principal purposes are to block hot carrier light emission from the active element group 167 and to reduce generation of inductive noise, and has a larger area than the extension conductor portion 165Ab. The extension conductor portion 165Ab is a portion whose principal purposes are to connect the main conductor portion 165Aa and a pad 402, and to supply a predetermined voltage such as GND or a negative power supply (Vss) to the main conductor portion 165Aa. The extension conductor portion 165Ab has at least one of the lengths (widths) in the X direction (the first direction) or the Y direction (the second direction) shorter (smaller) than the length (width) of the main conductor portion 165Aa. A connecting portion that is indicated by a dot-and-dash line between the main conductor portion 165Aa and the extension conductor portion 165Ab in A of FIG. 63 is referred to as a joint portion.

Likewise, the wiring layer 165B (the conductor layer B) is considered as divided into a main conductor portion 165Ba and an extension conductor portion 165Bb, as shown in B of FIG. 63. The main conductor portion 165Ba is a portion whose principal purposes are to block hot carrier light emission from the active element group 167 and to reduce generation of inductive noise, and has a larger area than the extension conductor portion 165Bb. The extension conductor portion 165Bb is a portion whose principal purposes are to connect the main conductor portion 165Ba and a pad 401, and to supply a predetermined voltage such as a positive power supply (Vdd) to the main conductor portion 165Ba. The extension conductor portion 165Bb has at least one of the lengths (widths) in the X direction (the first direction) or the Y direction (the second direction) shorter (smaller) than the length (width) of the main conductor portion 165Ba. A connecting portion that is indicated by a dot-and-dash line between the main conductor portion 165Ba and the extension conductor portion 165Bb in B of FIG. 63 is referred to as a joint portion.

Note that, in a case where the wiring layer 165A (the conductor layer A) and the wiring layer 165B (the conductor layer B) are not distinguished from each other, and the main conductor portion 165Aa and the main conductor portion 165Ba are collectively referred to, and in a case where the extension conductor portion 165Ab and the extension conductor portion 165Bb are collectively referred to, these main conductor portions and these extension conductor portions are referred to as the main conductor portions **165*a* and the extension conductor portions 165*b***, respectively.

In FIG. 63, the extension conductor portion 165Ab and the extension conductor portion 165Bb have been described on the assumption that they are connected to the pad 401 or 402, for easier understanding. However, the extension conductor portion 165Ab and the extension conductor portion 165Bb are not necessarily connected to the pad 401 or 402, and may be connected to some other wiring line or an electrode.

Further, FIG. 63 shows an example in which the pad 401 and the pad 402 have substantially the same shape, and are disposed at substantially the same position. However, the pad 401 and the pad 402 are not limited to this. For example, the pad 401 and the pad 402 may have different shapes from each other, or may be disposed at different positions from each other. Alternatively, the pad 401 and the pad 402 may be designed to have a smaller size than that in the example shown in FIG. 63, may be designed not to be in contact with each other in the wiring layer 165A, may be designed not to be in contact with each other in the wiring layer 165B, and a plurality of pads 401 and a plurality of pads 402 may be provided.

Further, in the example shown in FIG. 63, the positions of the edge portions of the main conductor portion 165Aa and the extension conductor portion 165Ab in the Y direction are substantially the same. However, the positions of the edge portions in the Y direction are not necessarily the same. For example, the main conductor portion 165Aa and the extension conductor portion 165Ab may be designed so that the positions of the edge portions do not match. Likewise, in the example shown in FIG. 63, the positions of the edge portions of the main conductor portion 165Ba and the extension conductor portion 165Bb in the Y direction are substantially the same. However, the positions of the edge portions in the Y direction are not, necessarily the same. For example, the main conductor portion 165Ba and the extension conductor portion 165Bb may be designed so that the positions of the edge portions do not match. The relationships between the shapes and the positions of the main conductor portions **165*a* and the extension conductor portions 165*b*, and the pads 401 and 402** are also similar in each of the example configurations described below.

In the first through thirteenth example configurations described above, in the wiring layer 165A, the main conductor portion 165Aa and the extension conductor portion 165Ab are not specifically distinguished from each other, and both the main conductor portion 165Aa and the extension conductor portion 165Ab are formed with the same wiring pattern such as a planar conductor or a mesh conductor.

In the wiring layer 165B, the main conductor portion 165Ba and the extension conductor portion 165Bb are not specifically distinguished from each other either, and both the main conductor portion 165Ba and the extension conductor portion 165Bb are also formed with the same wiring pattern such as a planar conductor or a mesh conductor.

Figure 64:
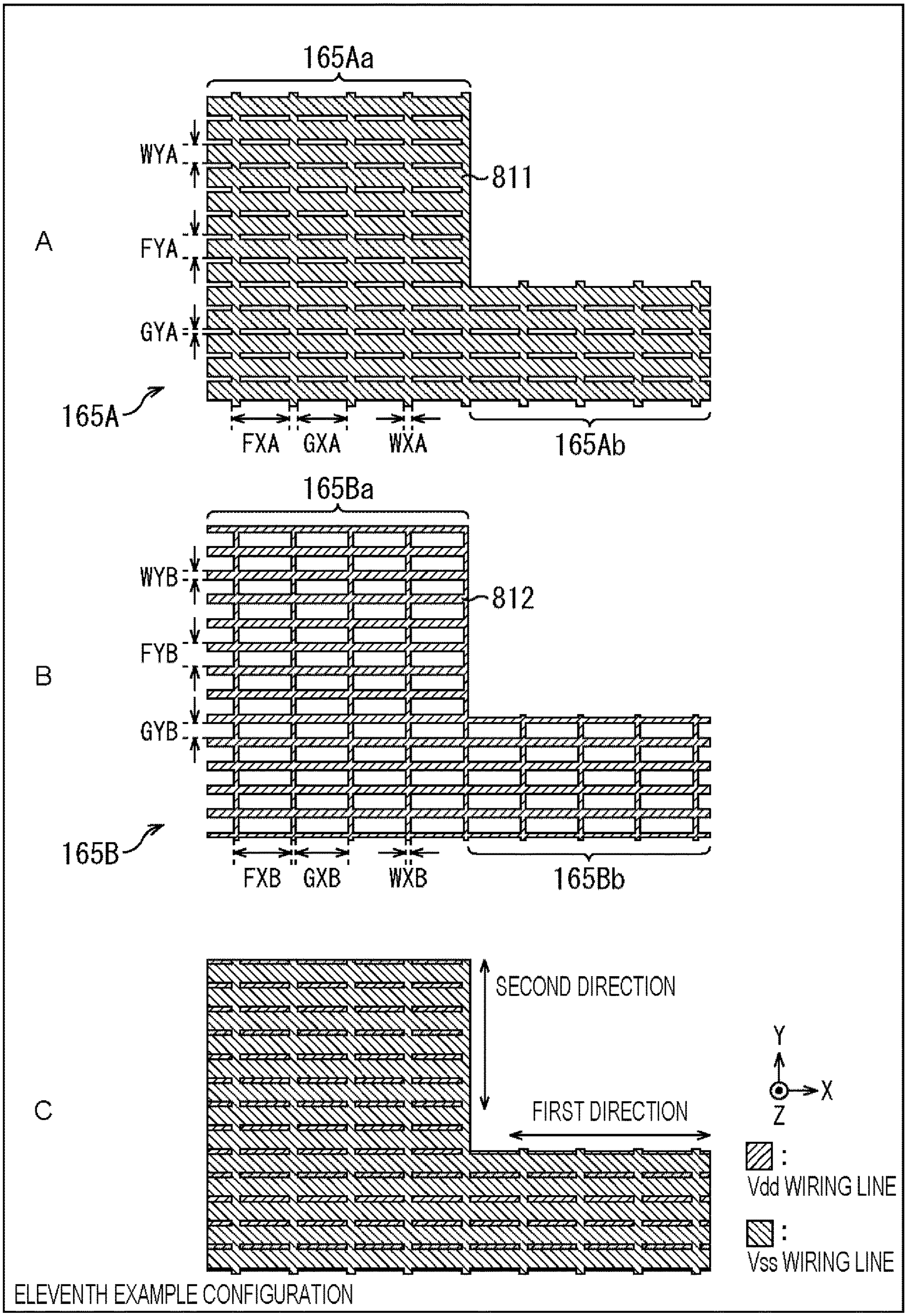
FIG. 64 is a diagram showing the eleventh example configuration of the conductor layers A and B.

FIG. 64 shows an example in which the eleventh example configuration in FIG. 36 as an example of the first through thirteenth example configurations described above is applied to the wiring layer 165A and the wiring layer 165B with different wiring patterns.

A of FIG. 64 shows the conductor layer A (the wiring layer 165A), and B of FIG. 64 shows the conductor layer B (the wiring layer 165B). In the coordinate system in FIG. 64, the horizontal direction is the X-axis, the vertical direction is the Y-axis, and the direction perpendicular to the X-Y plane is the Z-axis.

In the eleventh example configuration shown in FIG. 36, the mesh conductor 311 of the conductor layer A in A of FIG. 36 is an example in which the conductor width WXA in the X direction is greater than the gap width GXA. On the other hand, in the mesh conductor 811 of the conductor layer A in A of FIG. 64, the conductor width WXA in the X direction is smaller than the gap width GXA. Meanwhile, in the Y direction, the mesh conductor 311 shown in A of FIG. 36 has an example shape in which the conductor width WYA is smaller than the gap width GYA. However, the mesh conductor 811 of the conductor layer A in A of FIG. 64 has a shape in which the conductor width WYA is greater than the gap width GYA. The mesh conductor 311 of the conductor layer A shown in A of FIG. 36 has an example shape in which the conductor width WYA and the conductor width WXA are substantially the same, but the mesh conductor 811 of the conductor layer A in A of FIG. 64 has a shape in which the conductor width WYA is greater than the conductor width WXA. Further, in both the main conductor portion 165Aa and the extension conductor portion 165Ab of the mesh conductor 811 of the conductor layer A in A of FIG. 64, the same pattern is cyclically disposed with the conductor cycle FXA in the X direction, and the same pattern is cyclically disposed with the conductor cycle FYA in the Y direction.

The conductor layer B has a shape in which the ratio of the gap width GXB to the conductor width WXB (gap width GXB/conductor width WXB) in the X direction of the mesh conductor 812 of the conductor layer B in B of FIG. 64 is higher than the ratio of the gap width GXB to the conductor width WXB (gap width GXB/conductor width WXB) in the X direction of the mesh conductor 312 of the conductor layer B shown in B of FIG. 36. In other words, in the mesh conductor 812 of the conductor layer B in B of FIG. 64, the difference between the conductor width WXB and the gap width GXB is larger than that in the mesh conductor 312 of the conductor layer B shown in B of FIG. 36. In the Y direction, the ratio of the gap width GYB to the conductor width WYB (gap width GYB/conductor width WYB) of the mesh conductor 812 of the conductor layer B in B of FIG. 64 is lower than the ratio of the gap width GYB to the conductor width WYB (gap width GYB/conductor width WYB) of the mesh conductor 312 of the conductor layer B shown in B of FIG. 36. The mesh conductor 312 of the conductor layer B shown in B of FIG. 36 has an example shape in which the conductor width WYB and the conductor width WXB are substantially the same, but the mesh conductor 812 of the conductor layer B in B of FIG. 64 has a shape in which the conductor width WYB is greater than the conductor width WXB. Further, in both the main conductor portion 165Ba and the extension conductor portion 165Bb of the mesh conductor 812 of the conductor layer B in B of FIG. 64, the same pattern is cyclically disposed with the conductor cycle FXB in the X direction, and the same pattern is cyclically disposed with the conductor cycle FYB in the Y direction.

C of FIG. 64 shows a state in which the conductor layers A and B shown in A and B of FIG. 64 are viewed from the side of the conductor layer A (the side of the photodiodes 141). C of FIG. 64 does not show the region of the conductor layer B that overlaps the conductor layer A and is hidden.

As shown in C of FIG. 64, in the case of the eleventh example configuration, the active element group 167 is covered with at least one of the conductor layer A or the conductor layer B, so that hot carrier light emission from the active element group 167 can be blocked, and generation of inductive noise can be reduced.

As described above, the first through thirteenth example configurations described above are examples in which the main conductor portion 165Aa and the extension conductor portion 165Ab in the wiring layer 165A (the conductor layer A) are not specifically distinguished from each other and are formed with the same wiring pattern, and the main conductor portion 165Ba and the extension conductor portion 165Bb in the wiring layer 165B (the conductor layer B) are not specifically distinguished from each other either and are also formed with the same wring pattern.

However, since the extension conductor portion 165*b* is designed to have a smaller area than the main conductor portion 165*a*, current concentrates on the extension conductor portion 165*b*. Therefore, the wiring resistance is preferably made lower, and the main conductor portion 165*a* is preferably designed to easily diffuse current therein.

In view of the above, in the example configurations described below, the wiring pattern of the extension conductor portion 165Ab differs from the wiring pattern of the main conductor portion 165Aa in the wiring layer 165A (the conductor layer A), and the wiring pattern of the extension conductor portion 165Bb also differs from the wiring pattern of the main conductor portion 165Ba in the wiring layer 165B (the conductor layer B).

Fourteenth Example Configuration

Figure 65:
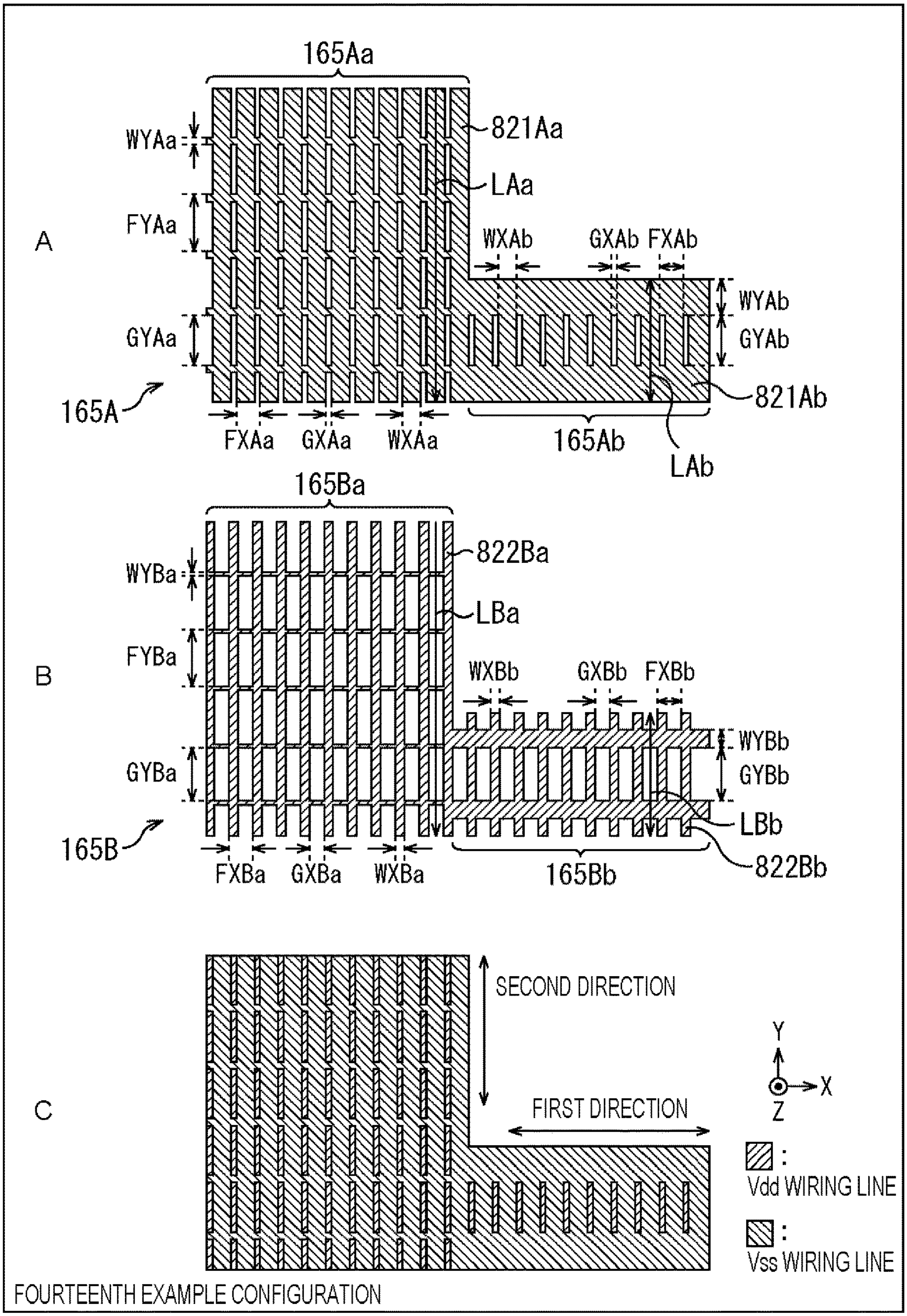
FIG. 65 is a diagram showing a fourteenth example configuration of the conductor layers A and B.

FIG. 65 shows a fourteenth example configuration of the conductor layers A and B. Note that A of FIG. 65 shows the conductor layer A, and B of FIG. 65 shows the conductor layer B. In the coordinate system in FIG. 65, the horizontal direction is the X-axis, the vertical direction is the Y-axis, and the direction perpendicular to the X-Y plane is the Z-axis.

As shown in A of FIG. 65, the conductor layer A in the fourteenth example configuration includes a mesh conductor 821Aa of the main conductor portion 165Aa and a mesh conductor 821Ab of the extension conductor portion 165Ab. The mesh conductor 821Aa and the mesh conductor 821Ab are wiring lines (Vss wiring lines) connected to GND or a negative power supply, for example.

The mesh conductor 821Aa of the main conductor portion 165Aa is designed to have a conductor width WXAa and a gap width GXAa, and have the same pattern cyclically disposed with a conductor cycle FXAa in the X direction. The mesh conductor 821Aa is designed to have a conductor width WYAa and a gap width GYAa, and have the same pattern cyclically disposed with a conductor cycle FYAa in the Y direction. Accordingly, the mesh conductor 821Aa has a shape including a repetitive pattern in which a predetermined basic pattern is repeatedly disposed with a conductor cycle in at least one of the X direction or the Y direction.

The mesh conductor 821Ab of the extension conductor portion 165Ab is designed to have a conductor width WXAb and a gap width GXAb, and have the same pattern cyclically disposed with a conductor cycle FXAb in the X direction. The mesh conductor 821Ab also has a conductor width WYAb and a gap width GYAb in the Y direction. Accordingly, the mesh conductor 821Ab has a shape including a repetitive pattern in which a predetermined basic pattern is repeatedly disposed with a conductor cycle in at least one of the X direction or the Y direction.

Further, when the corresponding conductor width WXA, gap width GXA, conductor width WYA, and gap width GYA of the mesh conductor 821Aa of the main conductor portion 165Aa and the mesh conductor 821Ab of the extension conductor portion 165Ab are compared, at least one of the widths is a different value from the others, and the repetitive pattern of the mesh conductor 821Ab of the extension conductor portion 165Ab is different from the repetitive pattern of the mesh conductor 821Aa of the main conductor portion 165Aa.

Comparison between the total length LAa of the mesh conductor 821Aa of the main conductor portion 165Aa in the Y direction and the total length LAb of the mesh conductor 821Ab of the extension conductor portion 165Ab in the Y direction shows that the total length LAa of the mesh conductor 821Aa is longer than the total length LAb of the mesh conductor 821Ab. Therefore, the mesh conductor 821Ab of the extension conductor portion 165Ab has a larger voltage drop (particularly, IR-Drop), having a larger amount of current concentrating therein than in the mesh conductor 821Aa of the main conductor portion 165Aa.

Here, the repetitive pattern of the mesh conductor 821Ab of the extension conductor portion 165Ab has such a shape that current flows at least in the first direction, with the X direction toward the main conductor portion 165Aa being the first direction. The conductor width (wiring line width) WYAb in the second direction (Y direction) orthogonal to the first direction is designed to be greater than the conductor width (wiring line width) WYAa in the second direction of the mesh conductor 821Aa of the main conductor portion 165Aa. With this arrangement, the wiring resistance of the mesh conductor 821Ab of the extension conductor portion 165Ab, which is the current concentration portion, can be lowered, and accordingly, the voltage drop can be further reduced. Although an example in which the conductor width WYAb is greater than the conductor width WYAa has been described, the present technology is not limited to this. For example, the conductor width WXAb may be designed to be greater than the conductor width WXAa. With this arrangement, the wiring resistance of the mesh conductor 821Ab can be lowered, and accordingly, the voltage drop can be further reduced.

Further, at least part of the mesh conductor 821Aa of the main conductor portion 165Aa has a pattern (a shape) in which current flows more easily in the Y direction (second direction) than in the X direction (first direction). Specifically, the wiring line widths (the conductor width WXAa and the conductor width WYAa) and/or the wiring intervals (the gap width GXAa and the gap width GYAa) differ from each other, so that the wiring resistance in the Y direction is lower than in the X direction. With this arrangement, in the main conductor portion 165Aa having the total length LAa, which is longer than the total length LAb of the mesh conductor 821Ab, current diffuses easily in the Y direction. Accordingly, electrode concentration in the vicinity of the joint portion between the main conductor portion 165Aa and the extension conductor portion 165Ab can be alleviated, and inductive noise can be further reduced.

As shown in B of FIG. 65, the conductor layer B in the fourteenth example configuration includes a mesh conductor 822Ba of the main conductor portion 165Ba and a mesh conductor 822Bb of the extension conductor portion 165Bb. The mesh conductor 822Ba and the mesh conductor 822Bb are wiring lines (Vdd wiring lines) connected to a positive power supply, for example.

The mesh conductor 822Ba, of the main conductor portion 165Ba is designed to have a conductor width WXBa and a gap width GXBa, and have the same pattern cyclically disposed with a conductor cycle FXBa in the X direction. The mesh conductor 822Ba, is also designed to have a conductor width WYBa and a gap width GYBa, and have the same pattern cyclically disposed with a conductor cycle FYBa in the Y direction. Accordingly, the mesh conductor 822Ba has a shape including a repetitive pattern in which a predetermined basic pattern is repeatedly disposed with a conductor cycle in at least one of the X direction or the Y direction.

The mesh conductor 822Bb of the extension conductor portion 165Bb is designed to have a conductor width WXBb and a gap width GXBb, and have the same pattern cyclically disposed with a conductor cycle FXBb in the X direction. The mesh conductor 822Bb also has a conductor width WYBb and a gap width GYBb in the Y direction. Accordingly, the mesh conductor 822Bb has a shape including a repetitive pattern in which a predetermined basic pattern is repeatedly disposed with a conductor cycle in at least one of the X direction or the Y direction.

Further, when the corresponding conductor width WXB, gap width GXB, conductor width WYB, and gap width GYB of the mesh conductor 822Ba of the main conductor portion 165Ba and the mesh conductor 822Bb of the extension conductor portion 165Bb are compared, at least one of the widths is a different value from the others, and the repetitive pattern of the mesh conductor 822Bb of the extension conductor portion 165Bb is different from the repetitive pattern of the mesh conductor 822Ba of the main conductor portion 165Ba.

Comparison between the total length LBa of the mesh conductor 822Ba of the main conductor portion 165Ba in the Y direction and the total length LBb of the mesh conductor 822Bb of the extension conductor portion 165Bb in the Y direction shows that the total length LBa of the mesh conductor 822Ba is longer than the total length LBb of the mesh conductor 822Bb. Therefore, the mesh conductor 822Bb of the extension conductor portion 165Bb has a larger voltage drop (particularly, IR-Drop), having a larger amount of current concentrating therein than in the mesh conductor 822Ba of the main conductor portion 165Ba.

Here, the repetitive pattern of the mesh conductor 822Bb of the extension conductor portion 165Bb has such a shape that current flows at least in the first direction, with the X direction toward the main conductor portion 165Ba being the first direction. The conductor width (wiring line width) WYBb in the second direction (Y direction) orthogonal to the first direction is designed to be greater than the conductor width (wiring line width) WYBa in the second direction of the mesh conductor 822Ba of the main conductor portion 165Ba. With this arrangement, the wiring resistance of the mesh conductor 822Bb of the extension conductor portion 165Bb, which is the current concentration portion, can be lowered, and accordingly, the voltage drop can be further reduced. Although an example in which the conductor width WYBb is greater than the conductor width WYBa has been described, the present technology is not limited to this. For example, the conductor width WXBb may be designed to be greater than the conductor width WXBa. With this arrangement, the wiring resistance of the mesh conductor 822Bb can be lowered, and accordingly, the voltage drop can be further reduced.

Further, at least part of the mesh conductor 822Ba of the main conductor portion 165Ba has a pattern (a shape) in which current flows more easily in the Y direction (second direction) than in the X direction (first direction). Specifically, the wiring line widths (the conductor width WXBa and the conductor width WYBa) and/or the wiring intervals (the gap width GXBa and the gap width GYBa) differ from each other, so that the wiring resistance in the Y direction is lower than in the X direction. With this arrangement, in the main conductor portion 165Ba having the total length LBa, which is longer than the total length LBb of the mesh conductor 822Bb, current diffuses easily in the Y direction. Accordingly, electrode concentration in the vicinity of the joint portion between the main conductor portion 165Ba and the extension conductor portion 165Bb can be alleviated, and inductive noise can be further reduced.

As described above, according to the fourteenth example configuration, in the wiring layer 165A (the conductor layer A), the repetitive pattern of the mesh conductor 821Ab of the extension conductor portion 165Ab is formed with a different pattern from the repetitive pattern of the mesh conductor 821Aa of the main conductor portion 165Aa, and the main conductor portion 165Aa and the extension conductor portion 165Ab are electrically connected. Thus, the wiring resistance of the extension conductor portion 165Ab can be lowered, and the voltage drop can be further reduced. In the wiring layer 165B (the conductor layer B), the repetitive pattern of the mesh conductor 822Bb of the extension conductor portion 165Bb is also formed with a different pattern from the repetitive pattern of the mesh conductor 822Ba of the main conductor portion 165Ba, and the main conductor portion 165Ba and the extension conductor portion 165Bb are electrically connected. Thus, the wiring resistance of the extension conductor portion 165Bb can be lowered, and the voltage drop can be further reduced.

Further, as shown in C of FIG. 65, when the conductor layer A and the conductor layer B are stacked, the active element group 167 is covered by at least one of the conductor layers A and B. That is, the main conductor portion 165Aa of the wiring layer 165A and the main conductor portion 165Ba of the wiring layer 165B constitute a light blocking structure, and the extension conductor portion 165Ab of the wiring layer 165A and the extension conductor portion 165Bb of the wiring layer 165B constitute a light blocking structure. With this arrangement, hot carrier light emission from the active element group 167 can be blocked in the fourteenth example configuration, as in the first through thirteenth example configurations described above.

<Modifications of the Fourteenth Example Configuration>

Figure 66:
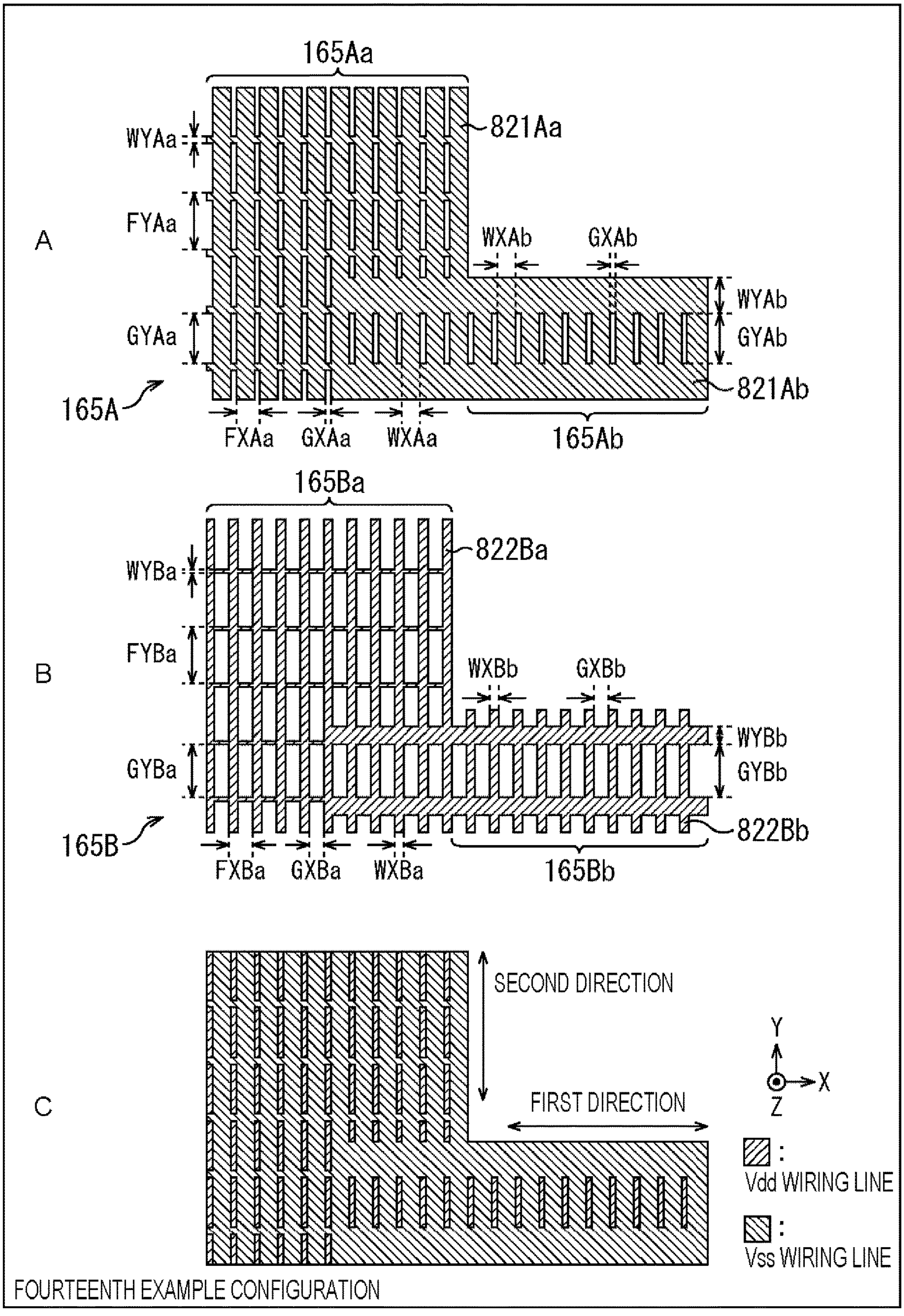
FIG. 66 is a diagram showing a first modification of the fourteenth example configuration of the conductor layers A and B.
Figure 67:
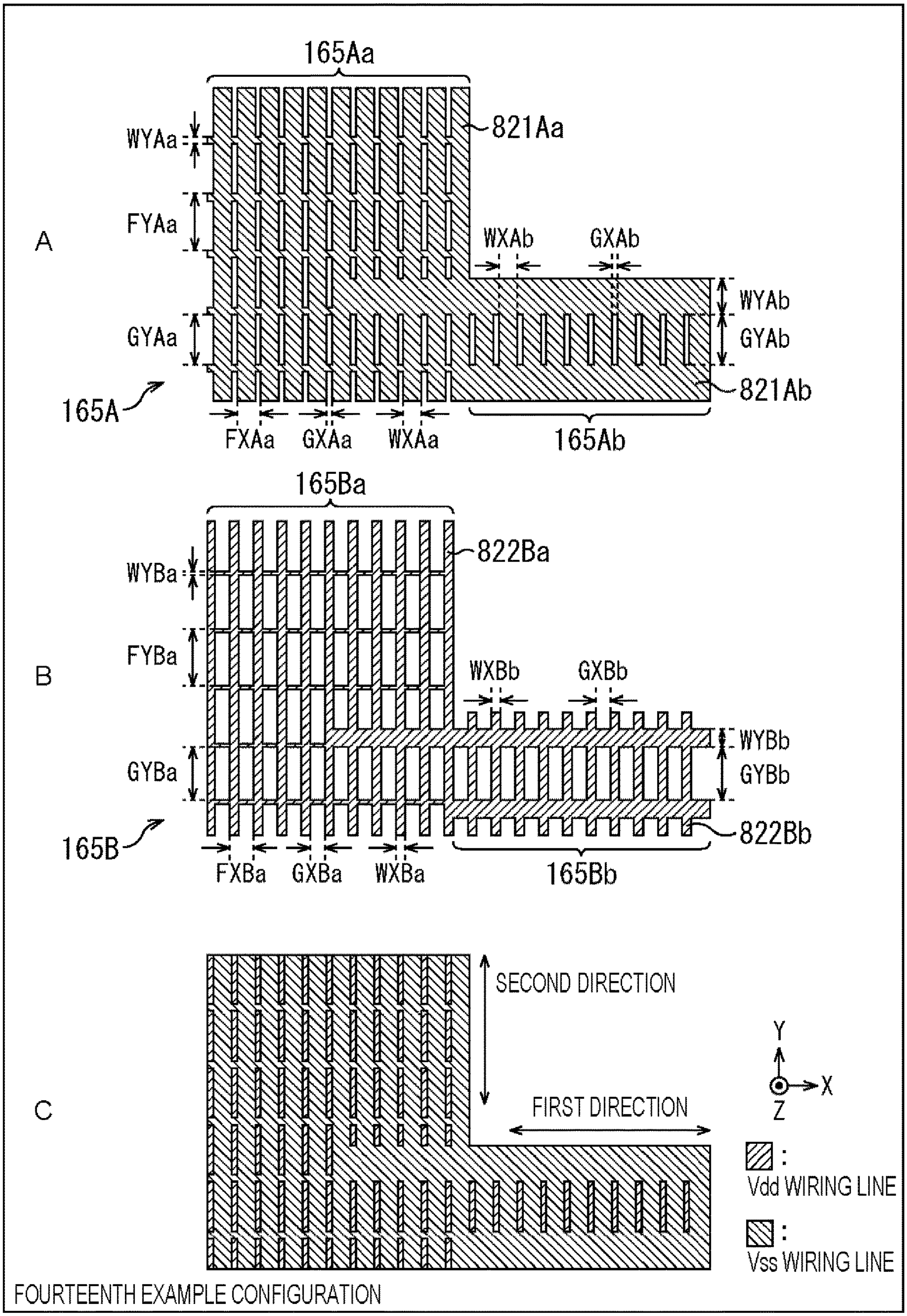
FIG. 67 is a diagram showing a second modification of the fourteenth example configuration of the conductor layers A and B.
Figure 68:
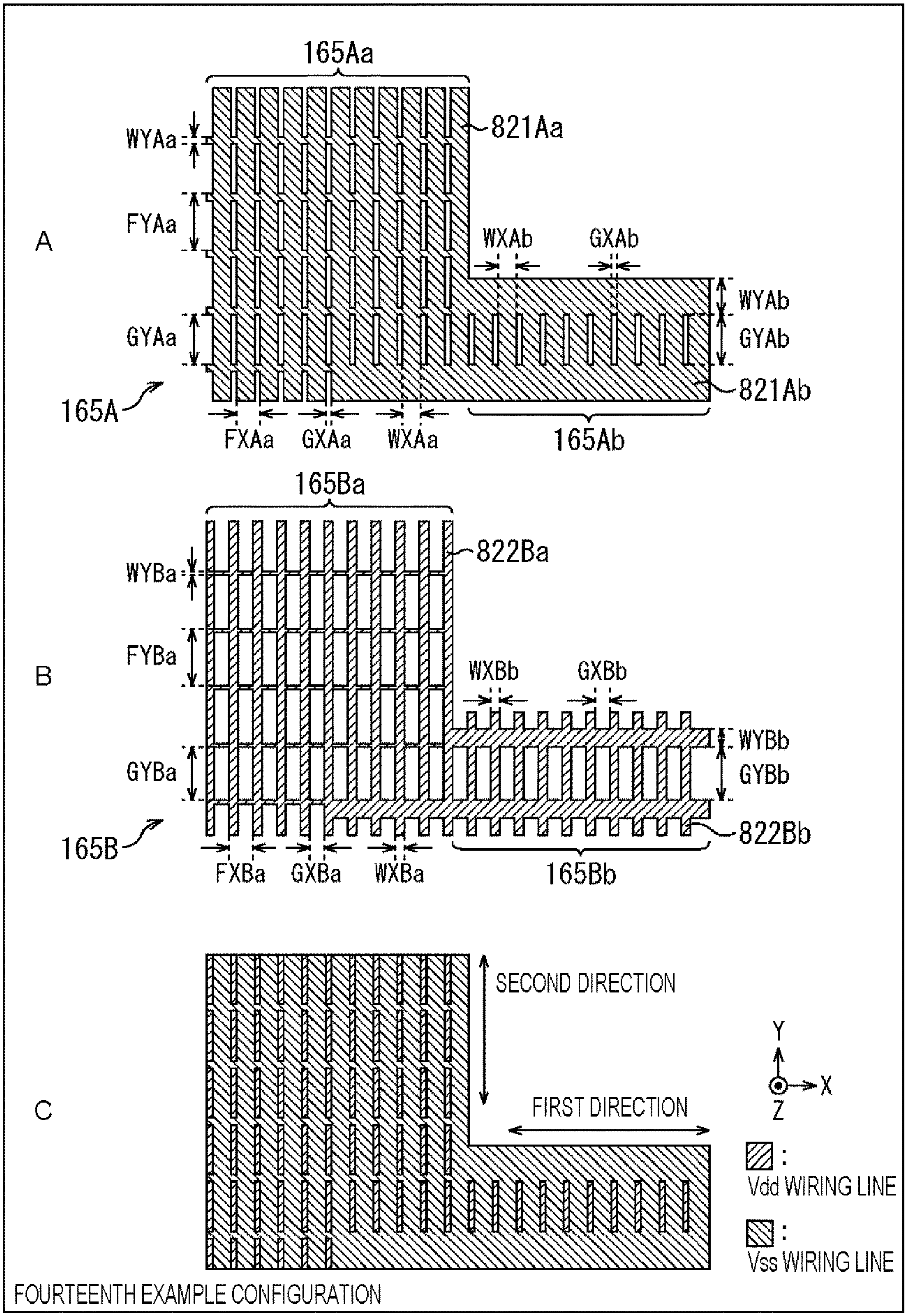
FIG. 68 is a diagram showing a third modification of the fourteenth example configuration of the conductor layers A and B.

FIGS. 66 through 68 show first through third modifications of the fourteenth example configuration. Note that A through C of FIGS. 66 through 68 correspond to A through C of FIG. 65, respectively, and the same reference symbols as those in FIG. 65 are used. Therefore, explanation of the common aspects is not made herein, and the different aspects are explained.

In the fourteenth example configuration shown in FIG. 65, the joint portion between the main conductor portion 165Aa and the extension conductor portion 165Ab in the wiring layer 165A (the conductor layer A) is located on a side of the rectangle surrounding the outer periphery of the main conductor portion 165Aa, but the joint portion is not necessarily located at such a position.

For example, as shown in A of FIG. 66, the main conductor portion 165Aa and the extension conductor portion 165Ab may be connected so that the mesh conductor 821Ab of the extension conductor portion 165Ab enters the inside of the rectangle surrounding the outer periphery of the main conductor portion 165Aa.

Further, as shown in A of FIG. 67 and A of FIG. 68, for example, the main conductor portion 165Aa and the extension conductor portion 165Ab may be connected so that only a part of the wiring lines among the plurality of the wiring lines of the conductor width WYAb extending toward the main conductor portion 165Aa of the mesh conductor 821Ab of the extension conductor portion 165Ab enters the inside of the rectangle surrounding the outer periphery of the main conductor portion 165Aa. In the mesh conductor 821Ab of the extension conductor portion 165Ab in A of FIG. 67, the upper wiring line of the two wiring lines of the conductor width WYAb extends so as to enter the inside of the rectangle surrounding the outer periphery of the main conductor portion 165Aa. In the mesh conductor 821Ab of the extension conductor portion 165Ab in A of FIG. 68, the lower wiring line extends so as to enter the inside of the rectangle surrounding the outer periphery of the main conductor portion 165Aa.

The same applies to the wiring layer 165B (the conductor layer B). That is, in the fourteenth example configuration shown in FIG. 65, the joint portion between the main conductor portion 165Ba and the extension conductor portion 165Bb is located on a side of the rectangle surrounding the outer periphery of the main conductor portion 165Ba, but the joint portion is not necessarily located at such a position.

For example, as shown in B of FIG. 66, the main conductor portion 165Ba and the extension conductor portion 165Bb may be connected so that the mesh conductor 822Bb of the extension conductor portion 165Bb enters the inside of the rectangle surrounding the outer periphery of the main conductor portion 165Ba.

Further, as shown in B of FIG. 67 and B of FIG. 68, for example, the main conductor portion 165Ba and the extension conductor portion 165Bb may be connected so that only a part of the wiring lines among the plurality of the wiring lines of the conductor width WYBb extending toward the main conductor portion 165Ba of the mesh conductor 822Bb of the extension conductor portion 165Bb enters the inside of the rectangle surrounding the outer periphery of the main conductor portion 165Ba. In the mesh conductor 822Bb of the extension conductor portion 165Bb in B of FIG. 67, the upper wiring line of the two wiring lines of the conductor width WYBb extends so as to enter the inside of the rectangle surrounding the outer periphery of the main conductor portion 165Ba. In the mesh conductor 822Bb of the extension conductor portion 165Bb in B of FIG. 68, the lower wiring line extends so as to enter the inside of the rectangle surrounding the outer periphery of the main conductor portion 165Ba.

As shown in FIGS. 66 through 68, the shape of the connecting portion between the main conductor portion 165*a* and the extension conductor portion 165*b* may be designed in a complicated manner.

In the first through third modifications of the fourteenth example configuration shown in FIGS. 66 through 68, the main conductor portion 165Aa and the extension conductor portion 165Ab are connected so that the mesh conductor 821Ab of the extension conductor portion 165Ab enters the inside of the rectangle surrounding the outer periphery of the main conductor portion 165Aa. However, the mesh conductor 821Aa of the main conductor portion 165Aa may protrude outwardly from the rectangle surrounding the outer periphery of the main conductor portion 165Aa and enter the side of the extension conductor portion 165Ab. Alternatively, the mesh conductor 822Ba of the main conductor portion 165Ba may protrude outwardly from the rectangle surrounding the outer periphery of the main conductor portion 165Ba and enter the side of the extension conductor portion 165Bb.

Fifteenth Example Configuration

Figure 69:
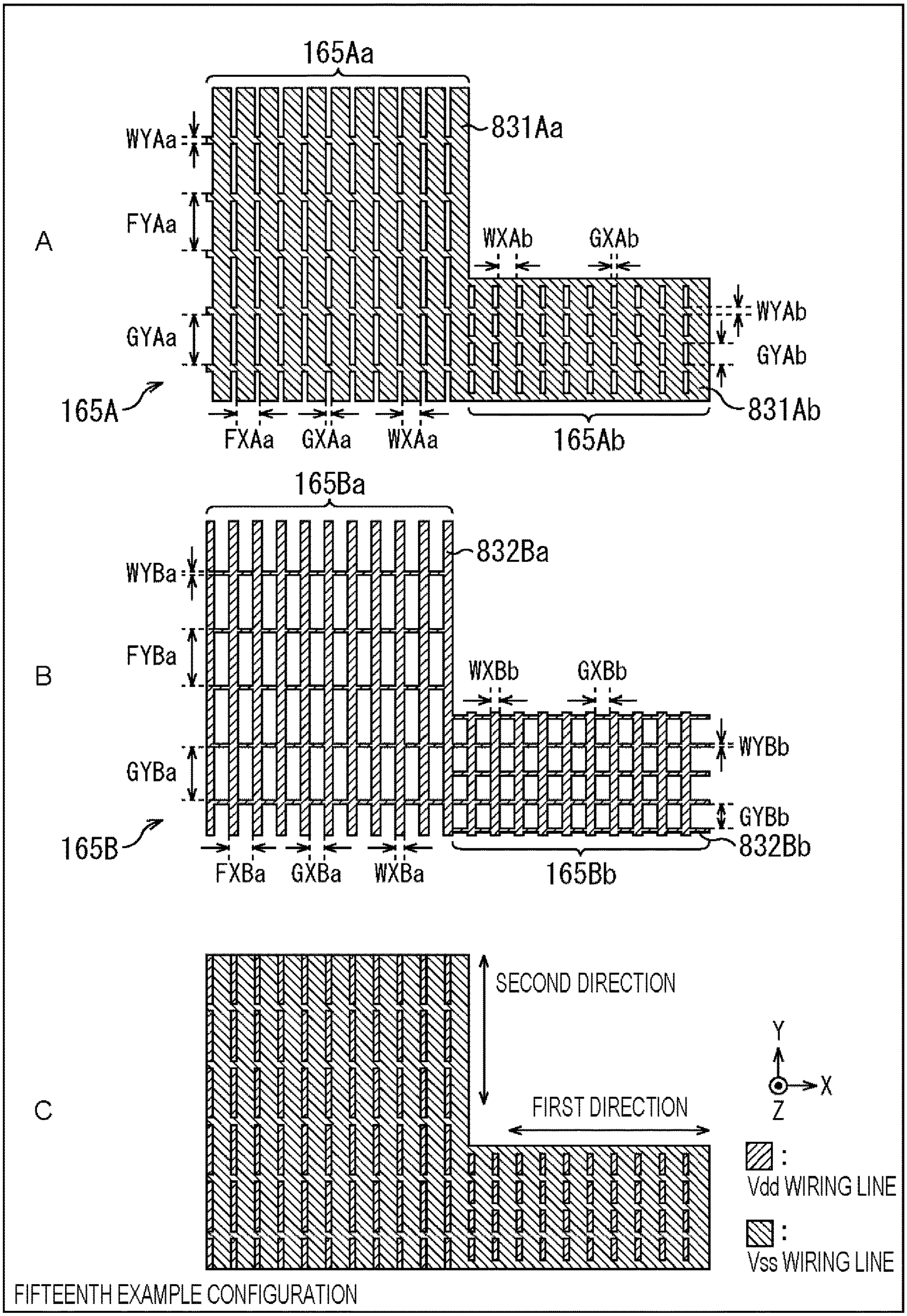
FIG. 69 is a diagram showing a fifteenth example configuration of the conductor layers A and B.

FIG. 69 shows a fifteenth example configuration of the conductor layers A and B. Note that A of FIG. 69 shows the conductor layer A, and B of FIG. 69 shows the conductor layer B. In the coordinate system in FIG. 69, the horizontal direction is the X-axis, the vertical direction is the Y-axis, and the direction perpendicular to the X-Y plane is the Z-axis.

As shown in A of FIG. 69, the conductor layer A in the fifteenth example configuration includes a mesh conductor 831Aa of the main conductor portion 165Aa and a mesh conductor 831Ab of the extension conductor portion 165Ab. The mesh conductor 831Aa and the mesh conductor 831Ab are wiring lines (Vss wiring lines) connected to GND or a negative power supply, for example.

The mesh conductor 831Aa of the main conductor portion 165Aa is similar to the mesh conductor 821Aa of the main conductor portion 165Aa in be fourteenth example configuration shown in FIG. 65. On the other hand, the mesh conductor 831Ab of the extension conductor portion 165Ab is different from the mesh conductor 821Ab of the extension conductor portion 165Ab in the fourteenth example configuration shown in FIG. 65.

Specifically, the gap width GYAb in the Y direction of the mesh conductor 831Ab of the extension conductor portion 165Ab is designed to be smaller than the gap width GYAa the Y direction of the mesh conductor 831Aa of the main conductor portion 165Aa. In the fourteenth example configuration shown in FIG. 65, the gap width GYAb in the Y direction of the mesh conductor 821Ab of the extension conductor portion 165Ab is the same as the gap width GYAa in the Y direction of the mesh conductor 821Aa of the main conductor portion 165Aa.

As the gap width GYAb in the Y direction of the mesh conductor 831Ab of the extension conductor portion 165Ab is designed to be smaller than the gap width GYAa in the Y direction of the mesh conductor 831Aa of the main conductor portion 165Aa as above, the wiring resistance of the mesh conductor 831Ab of the extension conductor portion 165Ab that is a current concentration portion can be lowered, and accordingly, the voltage drop can be further reduced. Although an example in which the gap width GYAb is smaller than the gap width GYAa has been described, the present technology is not limited to this. For example, the gap width GXAb may be designed to be smaller than the gap width GXAa. With this arrangement, the wiring resistance of the mesh conductor 831Ab can be lowered, and accordingly, the voltage drop can be further reduced.

As shown in B of FIG. 69, the conductor layer B in the fifteenth example configuration includes a mesh conductor 832Ba of the main conductor portion 165Ba and a mesh conductor 832Bb of the extension conductor portion 165Bb. The mesh conductor 832Ba and the mesh conductor 832Bb are wiring lines (Vdd wiring lines) connected to a positive power supply, for example.

The mesh conductor 832Ba of the main conductor portion 165Ba is similar to the mesh conductor 822Ba of the main conductor portion 165Ba in the fourteenth example configuration shown in FIG. 65. On the other hand, the mesh conductor 832Bb of the extension conductor portion 165Bb is different from the mesh conductor 822Bb of the extension conductor portion 165Bb in the fourteenth example configuration shown in FIG. 65.

Specifically, the gap width Gap width GYBb in the Y direction of the mesh conductor 832Bb of the extension conductor portion 165Bb is designed to be smaller than the gap width GYBa in the Y direction of the mesh conductor 832Ba of the main conductor portion 165Ba. In the fourteenth example configuration shown in FIG. 65, the gap width GYBb in the Y direction of the mesh conductor 822Bb of the extension conductor portion 165Bb is the same as the can width GYBa in the second direction of the mesh conductor 822Ba of the main conductor portion 165Ba.

As the gap width GYBb in the Y direction of the mesh conductor 832Bb of the extension conductor portion 165Bb is designed to be smaller than the gap width GYBa in the Y direction of the mesh conductor 832Ba of the main conductor portion 165Ba as above, the wiring resistance of the mesh conductor 832Bb of the extension conductor portion 165Bb that is a current concentration portion can be lowered, and accordingly, the voltage drop can be further reduced. Although an example in which the gap width GYBb is smaller than the gap width GYBa has been described, the present technology is not limited to this. For example, the gap width GXBb may be designed to be smaller than the gap width GXBa. With this arrangement, the wiring resistance of the mesh conductor 832Bb can be lowered, and accordingly, the voltage drop can be further reduced.

Further, as shown in C of FIG. 69, when the conductor layer A and the conductor layer B are stacked, the active element group 167 is covered by at least one of the conductor layers A and B. That is, the main conductor portion 165Aa of the wiring layer 165A and the main conductor portion 165Ba of the wiring layer 165B constitute a light blocking structure, and the extension conductor portion 165Ab of the wiring layer 165A and the extension conductor portion 165Bb of the wiring layer 165B constitute a light blocking structure. With this arrangement, hot carrier light emission from the active element group 167 can also be blocked in the fifteenth example configuration.

<First Modification of the Fifteenth Example Configuration>

Figure 70:
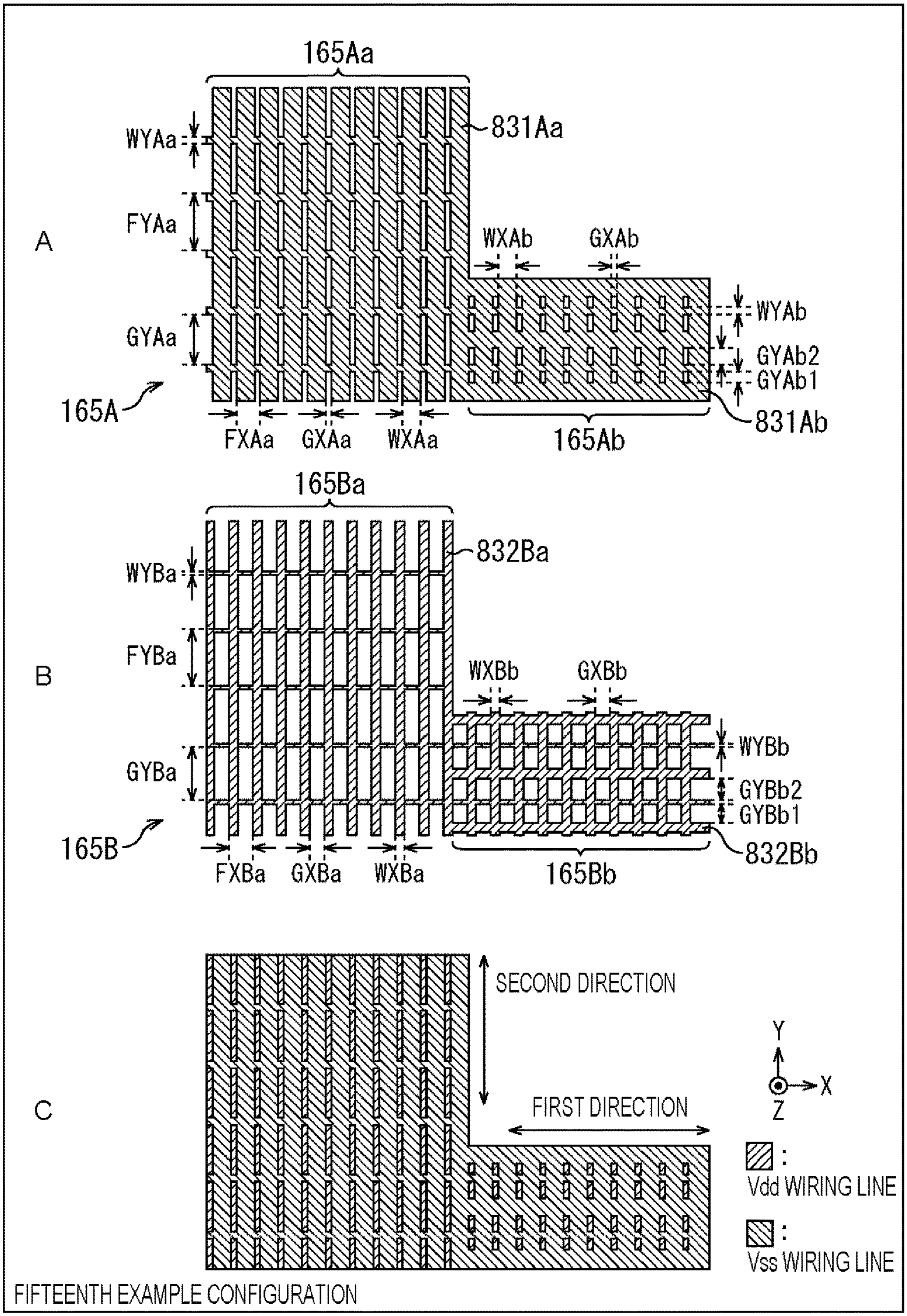
FIG. 70 is a diagram showing a first modification of the fifteenth example configuration of the conductor layers A and B.

FIG. 70 shows a first modification of the fifteenth example configuration. Note that A of FIG. 70 shows the conductor layer A, and B of FIG. 70 shows the conductor layer B. C of FIG. 70 shows a state in which the conductor layers A and B shown in A and B of FIG. 70 are viewed from the side of the conductor layer A. In the coordinate system in FIG. 70, the horizontal direction is the X-axis, the vertical direction is the Y-axis, and the direction perpendicular to the X-Y plane is the Z-axis.

The first modification of the fifteenth example configuration differs from the fifteenth example configuration shown in FIG. 69 in that all the gap widths GYAb in the Y direction of the extension conductor portion 165Ab of the wiring layer 165A are not uniform. Specifically, as shown in A of FIG. 70, the mesh conductor 831Ab of the extension conductor portion 165Ab of the wiring layer 165A has two kinds of gap widths GYAb: a small gap width GYAb1 and a great gap width GYAb2.

This modification also differs from the fifteenth example configuration shown in FIG. 69 in that all the gap widths GYBb in the Y direction of the extension conductor portion 165Bb of the wiring layer 165B are not uniform. Specifically, as shown in B of FIG. 70, the mesh conductor 832Bb of the extension conductor portion 165Bb of the wiring layer 165B has two kinds of gap widths GYBb: a small gap width GYBb1 and a great gap width GYBb2.

As shown in C of FIG. 70, in the first modification of the fifteenth example configuration, the extension conductor portion 165Ab of the wiring layer 165A and the extension conductor portion 165Bb of the wiring layer 165B constitute a light blocking structure in a state in which the conductor layer A and the conductor layer B are stacked.

<Second Modification of the Fifteenth Example Configuration>

Figure 71:
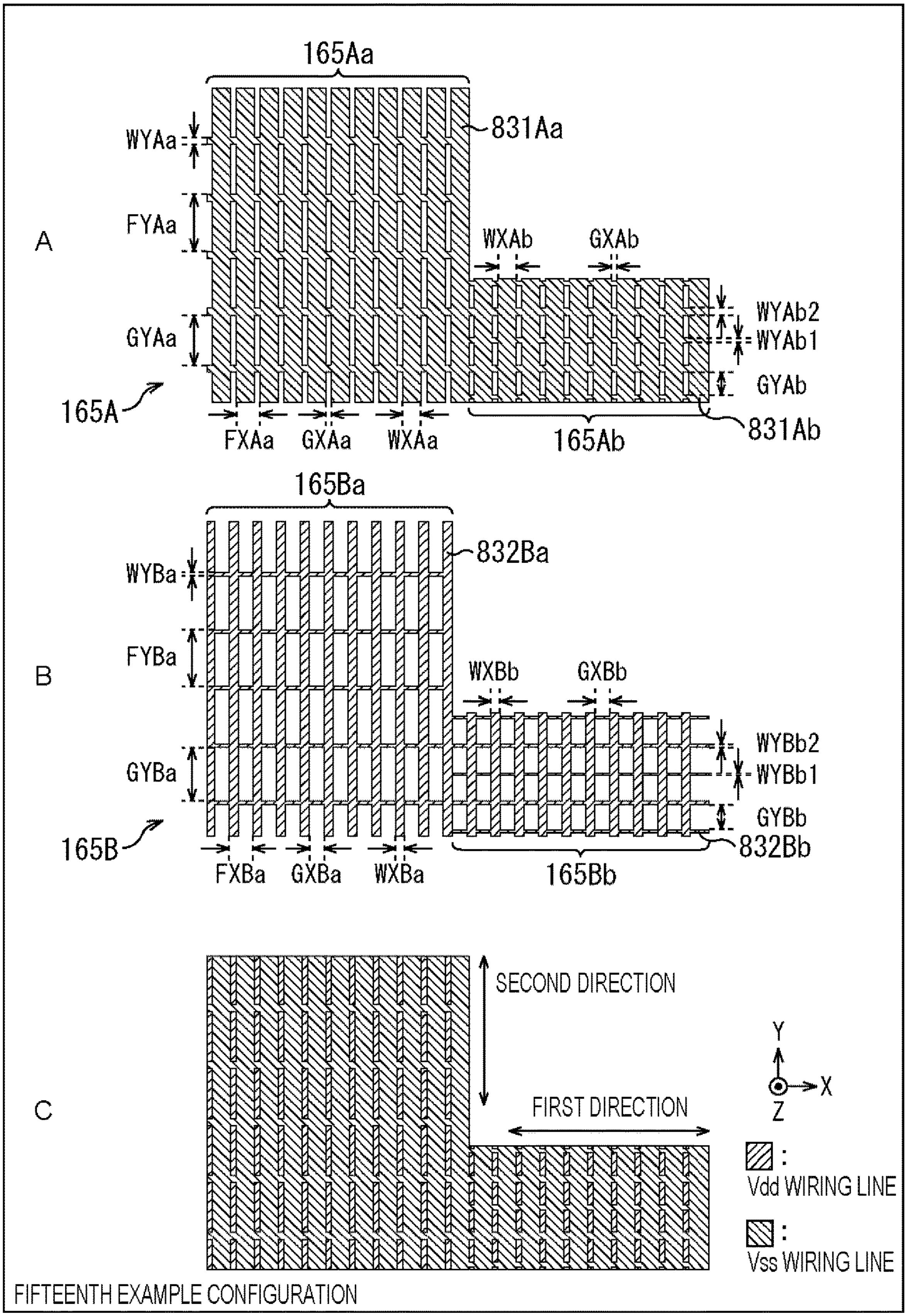
FIG. 71 is a diagram showing a second modification of the fifteenth example configuration of the conductor layers A and B.

FIG. 71 shows a second modification of the fifteenth example configuration. Note that A of FIG. 71 shows the conductor layer A, and B of FIG. 71 shows the conductor layer B. C of FIG. 71 shows a state in which the conductor layers A and B shown in A and B of FIG. 71 are viewed from the side of the conductor layer A. In the coordinate system in FIG. 71, the horizontal direction is the X-axis, the vertical direction is the Y-axis, and the direction perpendicular to the X-Y plane is the Z-axis.

The second modification of the fifteenth example configuration differs from the fifteenth example configuration shown in FIG. 69 in that all the conductor widths WYAb in the Y direction of the extension conductor portion 165Ab of the wiring layer 165A are not uniform. Specifically, as shown in A of FIG. 71, the mesh conductor 831Ab of the extension conductor portion 165Ab of the wiring layer 165A has two kinds of conductor widths WYAb: a small conductor width WYAb1 and a great conductor width WYAb2.

This modification also differs from the fifteenth example configuration shown in FIG. 69 in that all the conductor widths WYBb in the Y direction of the extension conductor portion 165Bb of the wiring layer 165B are not uniform. Specifically, as shown in B of FIG. 71, the mesh conductor 832Bb of the extension conductor portion 165Bb of the wiring layer 165B has two conductor widths WYBb: a small conductor width WYBb1 and a great conductor width WYBb2.

As shown in C of FIG. 71, in the second modification of the fifteenth example configuration, the extension conductor portion 165Ab of the wiring layer 165A and the extension conductor portion 165Bb of the wiring layer 165B constitute a light blocking structure in a state in which the conductor layer A and the conductor layer B are stacked.

As shown in the first modification and the second modification of the fifteenth example configuration, the gap widths GYAb or the conductor widths WYAb of the extension conductor portion 165Ab of the wiring layer 165A, or the gap widths GYBb or the conductor width WYBb of the extension conductor portion 165Bb of the wiring layer 165B are made non-uniform, so that the degree of freedom in wiring can be increased. In each conductor layer, there are normally constraints on the occupancy of the conductor region. However, as the degree of freedom in wiring is increased, the wiring resistances of the extension conductor portions 165Ab and 165Bb can be minimized within the constraints on the occupancy, and accordingly, the voltage drop can be further reduced. Although modifications have been described through an example in which all the gap widths GYAb are not uniform, an example in which all the gap widths GYBb are not uniform, an example in which all the conductor widths WYAb are not uniform, and an example in which all the conductor widths WYBb are not uniform. However, the present technology is not limited to these examples. For example, all the gap widths GXAb in the X direction, all the gap widths GXBb in the X direction, all the conductor widths WXAb in the X direction, or all the conductor widths WXBb in the X direction may be designed to be non-uniform. As the degree of freedom in wiring can also be increased in these cases, the voltage drop can be further reduced for a reason similar to that described above.

Sixteenth Example Configuration

Figure 72:
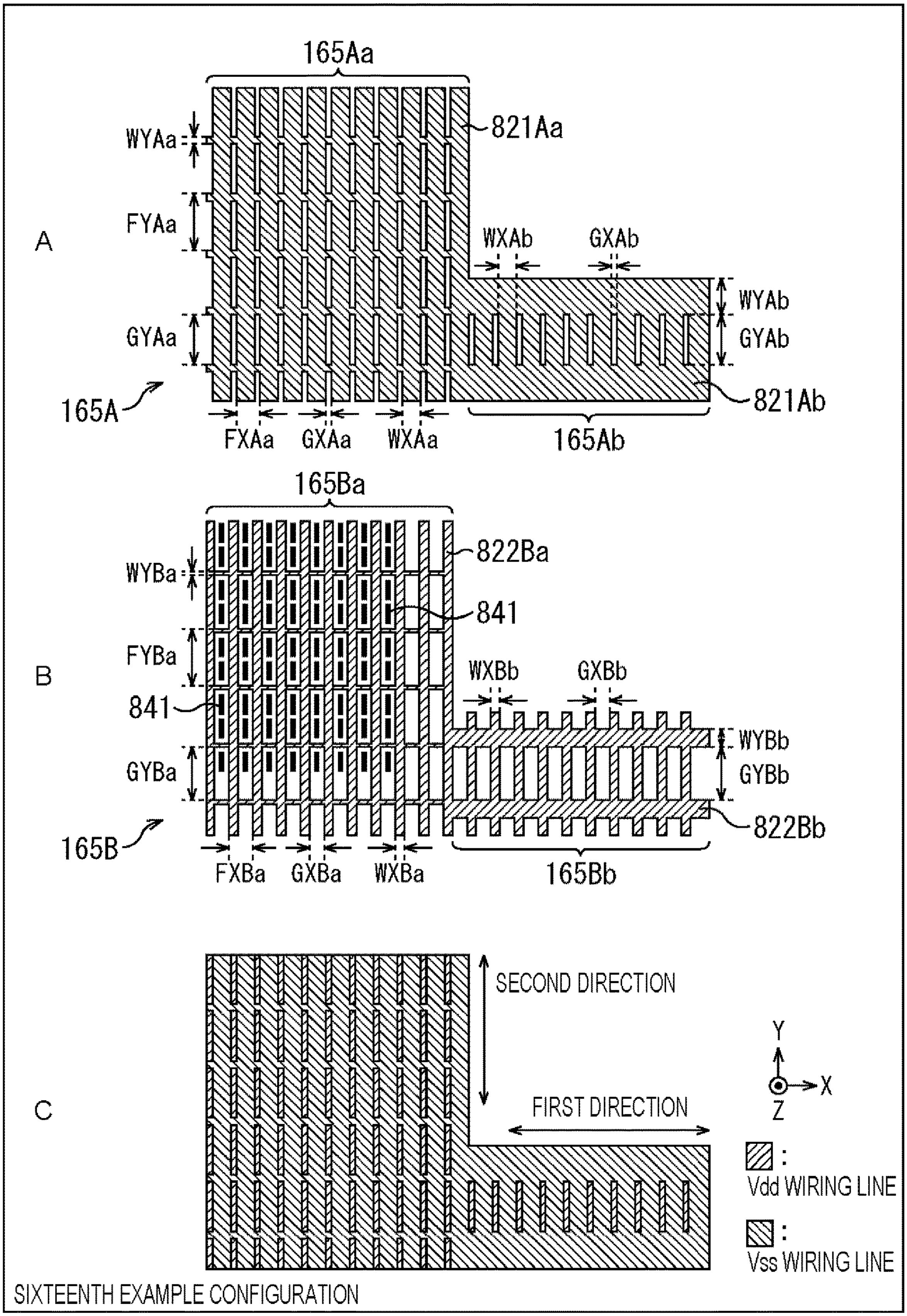
FIG. 72 is a diagram showing a sixteenth example configuration of the conductor layers A and B.

FIG. 72 shows a sixteenth example configuration of the conductor layers A and B. Note that A of FIG. 72 shows the conductor layer A, and B of FIG. 72 shows the conductor layer B. In the coordinate system in FIG. 72, the horizontal direction is the X-axis, the vertical direction is the Y-axis, and the direction perpendicular to the X-Y plane is the Z-axis.

The conductor layer A of the sixteenth example configuration shown in A of FIG. 72 is similar to the conductor layer A of the fourteenth example configuration shown in FIG. 65, and therefore, explanation thereof is not made herein.

The conductor layer B of the sixteenth example configuration shown in B of FIG. 72 has the same configuration as the conductor layer B of the fourteenth example configuration shown in FIG. 65, except that relay conductors 841 are further added. More specifically, the main conductor portion 165Ba is formed with the mesh conductor 822Ba and a plurality of relay conductors 841, and the extension conductor portion 165Bb is formed with the mesh conductor 822Bb similar to that of the fourteenth example configuration.

In the main conductor portion 165Ba, the relay conductors 841 are disposed in gap regions that are not the conductor of the mesh conductor 822Ba and are long in the Y direction, are electrically insulated from the mesh conductor 822Ba, and are connected to a Vss wiring line to which the mesh conductor 821Aa of the conductor layer A is connected, for example. One or more relay conductors 841 are disposed in each gap region of the mesh conductor 822Ba. B of FIG. 72 shows an example in which a total of two relay conductors 841 are disposed in two rows and one column in a gap region of the mesh conductor 822Ba.

In B of FIG. 72, the relay conductors 841 are disposed only in some of the gap regions of the mesh conductor 822Ba in the entire region of the main conductor portion 165Ba.

However, the relay conductors 841 may be disposed in the gap regions in the entire region of the main conductor portion 165Ba. In the conductor layer B of the sixteenth example configuration, the relay conductors 841 are not disposed in the gap regions of the mesh conductor 822Bb of the extension conductor portion 165Bb. However, the relay conductors 841 may also be disposed in the gap regions of the mesh conductor 822Bb.

<First Modification of the Sixteenth Example Configuration>

Figure 73:
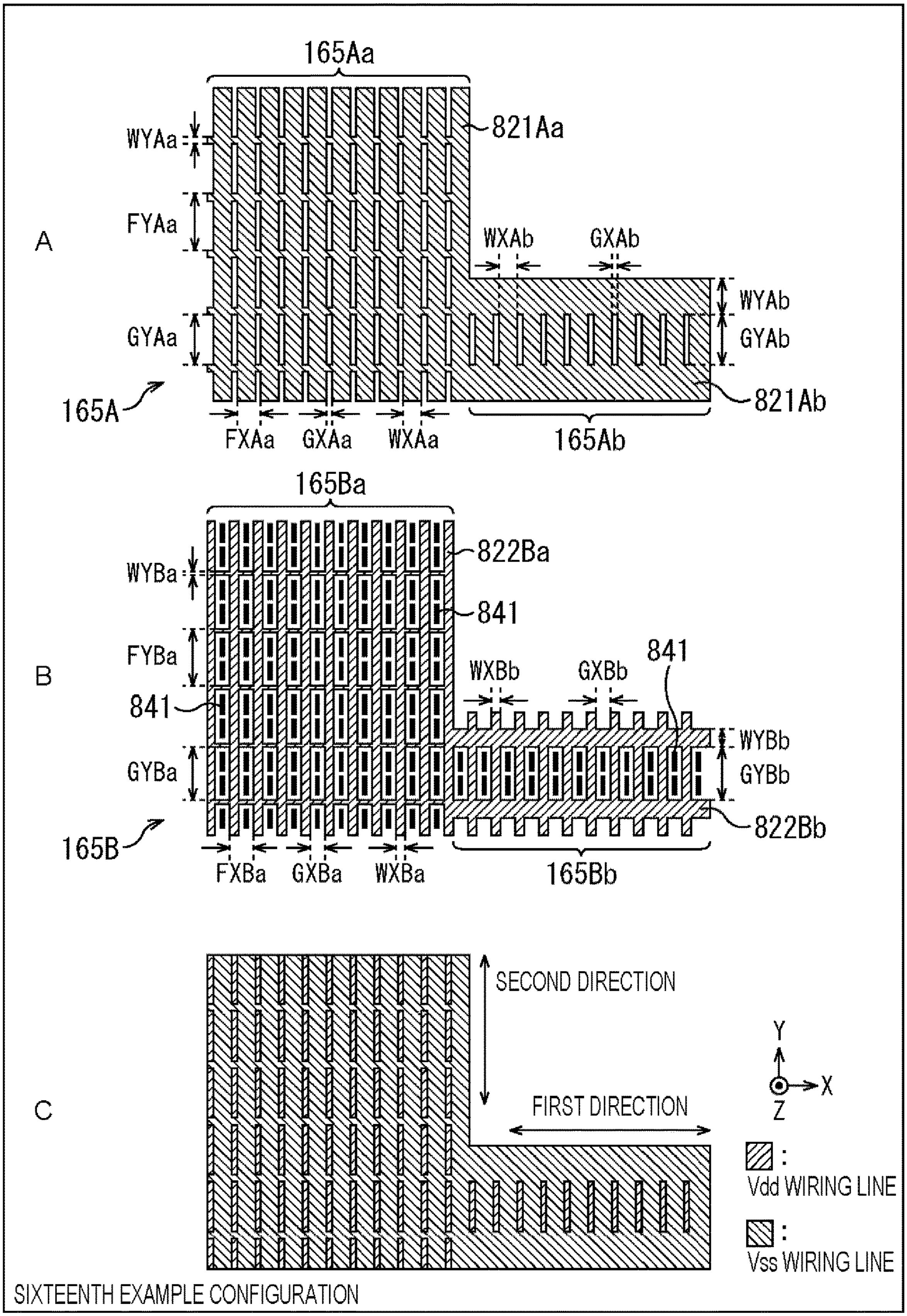
FIG. 73 is a diagram showing a first modification of the sixteenth example configuration of the conductor layers A and B.

FIG. 73 shows a first modification of the sixteenth example configuration.

In the first modification of the sixteenth example configuration shown in FIG. 73, the relay conductors 841 are disposed in the gap regions in the entire region of the main conductor portion 165Ba of the conductor layer B, and the relay conductors 841 are also disposed in the gap regions of the mesh conductor 822Bb of the extension conductor portion 165Bb. The other components of the first modification shown in FIG. 73 are similar to those of the sixteenth example configuration shown in FIG. 72.

<Second Modification of the Sixteenth Example Configuration>

Figure 74:
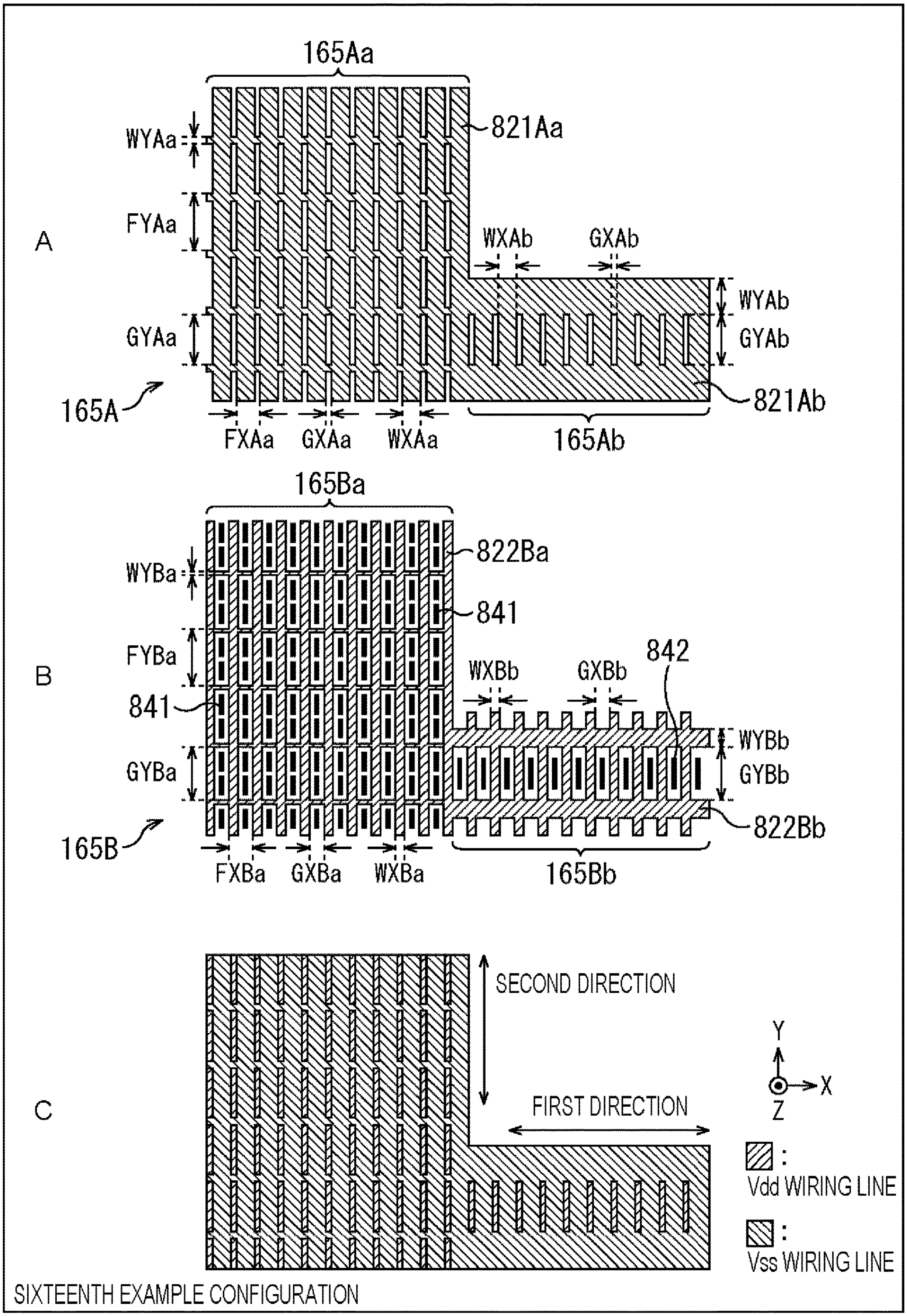
FIG. 74 is a diagram showing a second modification of the sixteenth example configuration of the conductor layers A and B.

FIG. 74 shows a second modification of the sixteenth example configuration.

The second modification of the sixteenth example configuration shown in FIG. 74 is similar to the first modification in that the relay conductors 841 are disposed in the gap regions in the entire region of the main conductor portion 165Ba of the conductor layer B. However, the second modification of the sixteenth example configuration differs from the first modification in that relay conductors 842 that are different from the relay conductors 841 are disposed in the gap regions of the mesh conductor 822Bb of the extension conductor portion 165Bb. The other components of the second modification shown in FIG. 74 are similar to those of the sixteenth example configuration shown in FIG. 72.

As in the second modification, the relay conductors 841 disposed in the gap regions of the mesh conductor 822Ba of the main conductor portion 165Ba of the conductor layer B may differ in number and shape from the relay conductors 842 disposed in the gap regions of the mesh conductor 822Bb of the extension conductor portion 165Bb.

In a case where the relay conductors 841 are not disposed in the gap regions of the mesh conductor 822Bb of the extension conductor portion. 165Bb as in the conductor layer B of the sixteenth example configuration shown in FIG. 72, the degree of freedom in wiring (the mesh conductor 822Bb) can be increased. In each conductor layer, there are normally constraints on the occupancy of the conductor region. However, as the degree of freedom in wiring is increased, the wiring resistance of the extension conductor portion 165Bb can be minimized within the constraints on the occupancy, and accordingly, the voltage drop can be further reduced.

On the other hand, in a case where the relay conductors 841, the relay conductors 842, or the like are disposed in the gap regions of the mesh conductor 822Bb of the extension conductor portion 165Bb, and active elements such as MOS transistors and diodes are disposed in the region of the extension conductor portion 165Bb or in upper and lower layers at the same plane position as the extension conductor portion 165Bb, the voltage drop can be further reduced.

Further, as the relay conductors 841 disposed in the gap regions of the mesh conductor 822Ba of the main conductor portion 165Ba of the conductor layer B differ in number and shape from the relay conductors 842 arranged in the gap regions of the mesh conductor 822Bb of the extension conductor portion 165Bb, the main conductor portion 165Ba and the extension conductor portion 165Bb can take advantage of the maximum occupancy of the conductor region of each conductor layer. Thus, the wiring resistance is lowered, so that the voltage drop can be further reduced.

Note that the shape of the relay conductors 841 is any appropriate shape, but is preferably a symmetrical circular or polygonal shape such as a rotationally symmetrical shape or a mirror-symmetrical shape. Each relay conductor 841 can be disposed at the center or any other appropriate position in a gap region in the mesh conductor 822Ba. The relay conductors 841 may be connected to a conductor layer as a Vss wiring line different from the conductor layer A. The relay conductors 841 may be connected to a conductor layer as a Vss wiring line on a side closer to the active element group 167 than the conductor layer B. The relay conductors 841 can be connected to a conductor layer different from the conductor layer A, a conductor layer closer to the active element group 167 than the conductor layer B, or the like, through conductor vias (VIA) extending in the Z direction. The same applies to the relay conductors 842.

The sixteenth example configuration shown in FIGS. 72 through 74 described above is examples in which the relay conductors 841 or 842 are disposed in the gap regions of the mesh conductors 822Ba and 822Bb of the conductor layer B. However, the same or different relay conductors may be disposed in the gap regions of the mesh conductors 821Aa and 821Ab of the conductor layer A.

Seventeenth Example Configuration

Figure 75:
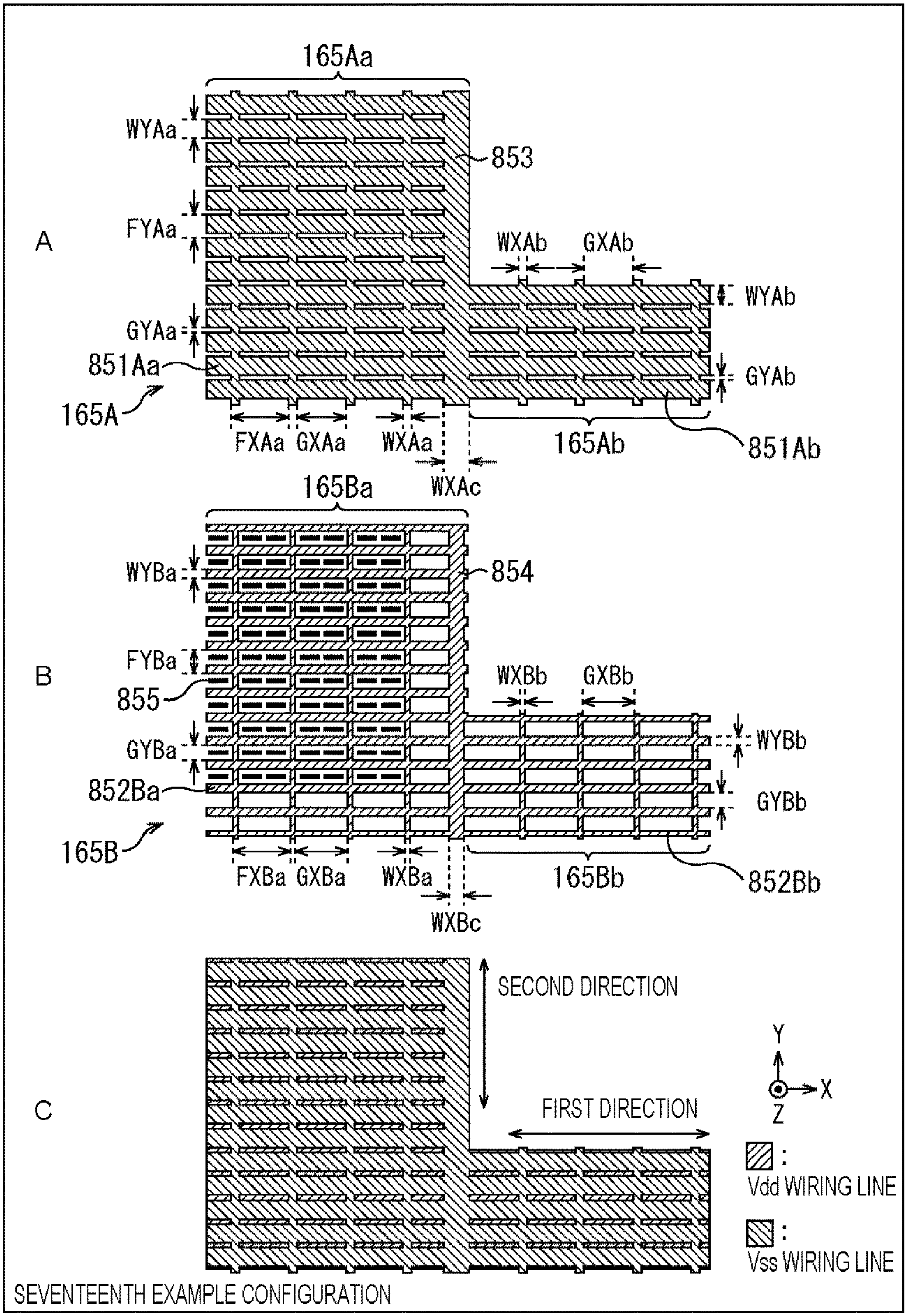
FIG. 75 is a diagram showing a seventeenth example configuration of the conductor layers A and B.

FIG. 75 shows a seventeenth example configuration of the conductor layers A and B. Note that A of FIG. 75 shows the conductor layer A, and B of FIG. 75 shows the conductor layer B. In the coordinate system in FIG. 75, the horizontal direction is the X-axis, the vertical direction is the Y-axis, and the direction perpendicular to the X-Y plane is the Z-axis.

Comparison between the conductor layer A in the seventeenth example configuration shown in A of FIG. 75 and the conductor layer A of the fourteenth example configuration shown in A of FIG. 65 shows that the shape of the mesh conductor 851Aa of the main conductor portion 165Aa is different from the shape of the mesh conductor 851Ab of the extension conductor portion 165Ab.

In other words, while the gap regions of the mesh conductor 821Aa in the fourteenth example configuration shown in A of FIG. 65 have a vertically long rectangular shape, the gap regions of the mesh conductor 851Aa in the seventeenth example configuration shown in A of FIG. 75 have a horizontally long rectangular shape. Also, while the gap regions of the mesh conductor 821Ab in A of FIG. 65 have a vertically long rectangular shape, the gap regions of the mesh conductor 851Ab in A of FIG. 75 have a horizontally long rectangular shape.

The mesh conductor 851Ab of the extension conductor portion 165Ab in A of FIG. 75 is the same as the mesh conductor 821Ab in the fourteenth example configuration shown in A of FIG. 65, in that current flows more easily in the X direction than in the Y direction (the second direction) orthogonal to the X direction (the first direction) toward the main conductor portion 165Aa.

On the other hand, while the mesh conductor 851Aa of the main conductor portion 165Aa in A of FIG. 75 has a shape in which current flows more easily in the X direction than in the Y direction, the mesh conductor 821Aa of the main conductor portion 165Aa in the fourteenth example configuration in A of FIG. 65 has a shape in which current flows easily in the Y direction.

That is, the conductor layer A in the seventeenth example configuration shown in A of FIG. 75 differs from the conductor layer A of the fourteenth example configuration in A of FIG. 65, in the direction in which the current of the main conductor portion 165Aa easily flows Further, the main conductor portion 165Aa of the conductor layer A in the seventeenth example configuration includes a reinforcement conductor 853 that is reinforced so that current flows more easily in the Y direction than in the X direction. The conductor width WXAc of the reinforcement conductor 853 is preferably designed to be greater than one or both of the conductor width WXAa in the X direction and the conductor width WYAa in the Y direction or the mesh conductor 851Aa. The conductor width WXAc of the reinforcement conductor 853 is designed to be greater than the conductor width WXAa in the X direction or the conductor width WYAa in the Y direction of the mesh conductor 851Aa, whichever smaller. Note that, in the example shown in FIG. 75, the position of the reinforcement conductor 853 in the X direction is the position closest to the extension conductor portion 165Ab in the region of the main conductor portion 165Aa. However, the position of the reinforcement conductor 853 in the X direction may be any position in the vicinity of the joint portion.

As the mesh conductor 851Aa of the main conductor portion 165Aa can be formed in a shape in which current flows easily in the X direction, a layout can be created with a minimum number of basic pattern repetitions. Accordingly, the degree of freedom in wiring layout design becomes higher. Also, the voltage drop can be further reduced, depending on the layout of active elements such as MOS transistors and diodes.

Furthermore, as the reinforcement conductor 853 reinforced so that current flows easily in the Y direction is provided, the current easily diffuses in the Y direction in the main conductor portion 165Aa. Accordingly, current concentration around the joint portion between the main conductor portion 165Aa and the extension conductor portion 165Ab can be alleviated. In a case where current concentration occurs locally, inductive noise increases due to the concentration site. However, the current concentration can be alleviated, and thus, inductive noise can be further reduced.

Comparison between the conductor layer B in the seventeenth example configuration shown in B of FIG. 75 and the conductor layer B of the fourteenth example configuration shown in B of FIG. 65 shows that the shape of the mesh conductor 852Ba of the main conductor portion 165Ba is different from the shape of the mesh conductor 852Bb of the extension conductor portion 165Bb.

In other words, while the gap regions of the mesh conductor 822Ba in the fourteenth example configuration shown in B of FIG. 65 have a vertically long rectangular shape, the gap regions of the mesh conductor 852Ba in the seventeenth example configuration shown in B of FIG. 75 have a horizontally long rectangular shape. Also, while the gap regions of the mesh conductor 822Bb in B of FIG. 65 have a vertically long rectangular shape, the gap regions of the mesh conductor 852Bb in B of FIG. 75 have a horizontally long rectangular shape.

The mesh conductor 852Bb of the extension conductor portion 165Bb in B of FIG. 75 is the same as the mesh conductor 822Bb in the fourteenth example configuration shown in B of FIG. 65, in that current flows more easily in the X direction than in the Y direction (the second direction) orthogonal to the X direction (the first direction) toward the main conductor portion 165Ba.

On the other hand, while the mesh conductor 852Ba of the main conductor portion 165Ba in B of FIG. 75 has a shape in which current flows more easily in the X direction than in the Y direction, the mesh conductor 822Ba of the main conductor portion 165Ba in the fourteenth example configuration in B of FIG. 65 has a shape in which current flows easily in the Y direction.

That is, the conductor layer B in the seventeenth example configuration shown in B of FIG. 75 differs from the conductor layer B of the fourteenth example configuration in B of FIG. 65, in the direction in which the current of the main conductor portion 165Ba easily flows Further, the main conductor portion 165Ba of the conductor layer B in the seventeenth example configuration includes a reinforcement conductor 854 that is reinforced so that current flows more easily in the Y direction than in the X direction. The conductor width WXBc of the reinforcement conductor 854 is preferably designed to be greater than one or both of the conductor width WXBa in the X direction and the conductor width WYBa in the Y direction of the mesh conductor 852Ba. The conductor width WXBc of the reinforcement conductor 854 is designed to be greater than the conductor width WXBa in the X direction or the conductor width WYBa in the Y direction of the mesh conductor 852Ba, whichever is smaller. In the example shown in FIG. 75, the position of the reinforcement conductor 854 in the X direction is the position closest to the extension conductor portion 165Bb in the region of the main conductor portion 165Ba. However, the position of the reinforcement conductor 854 in the X direction may be any position in the vicinity of the joint portion.

As shown in C of FIG. 75, the reinforcement conductor 853 of the conductor layer A and the reinforcement conductor 854 of the conductor layer B are formed at overlapping positions. Where the conductor layer A and the conductor layer B are stacked, the active element group 167 is covered with at least one of the conductor layer A and the conductor layer B, and thus, hot carrier light emission from the active element group 167 can also be blocked in the seventeenth example configuration. Note that, in a case where light blocking in the vicinity of the reinforcement conductor 853 or the reinforcement conductor 854 is not necessary, for example, the reinforcement conductor 853 and the reinforcement conductor 854 may not be formed at overlapping positions. Further, depending on the current distribution in the main conductor portion 165*a*, for example, at least one of the reinforcement conductor 853 and the reinforcement conductor 854 may not be formed.

As the mesh conductor 852Ba of the main conductor portion 165Ba can be formed in a shape in which current flows easily in the X direction, a layout can be created with a minimum number of basic pattern repetitions. Accordingly, the degree of freedom in wiring layout design becomes higher. Also, the voltage drop can be further reduced, depending on the layout of active elements such as MOS transistors and diodes.

Furthermore, as the reinforcement conductor 854 reinforced so that current flows easily in the Y direction is provided, the current easily diffuses in the second direction in the main conductor portion 165Ba. Accordingly, current concentration around the joint portion between the main conductor portion 165Ba and the extension conductor portion 165Bb can be alleviated. In a case where current concentration occurs locally, inductive noise increases due to it concentration site. However, the current concentration can be alleviated, and thus, inductive noise can be further reduced.

Further, the conductor layer B in the seventeenth example configuration shown in B of FIG. 75 differs from the conductor layer B of the fourteenth example configuration in B of FIG. 65, in that relay conductors 855 are disposed in the gap regions of at least part of the mesh conductor 852Ba of the main conductor portion 165Ba. These relay conductors 855 may be adopted, or may not be adopted.

<First Modification of the Seventeenth Example Configuration>

Figure 76:
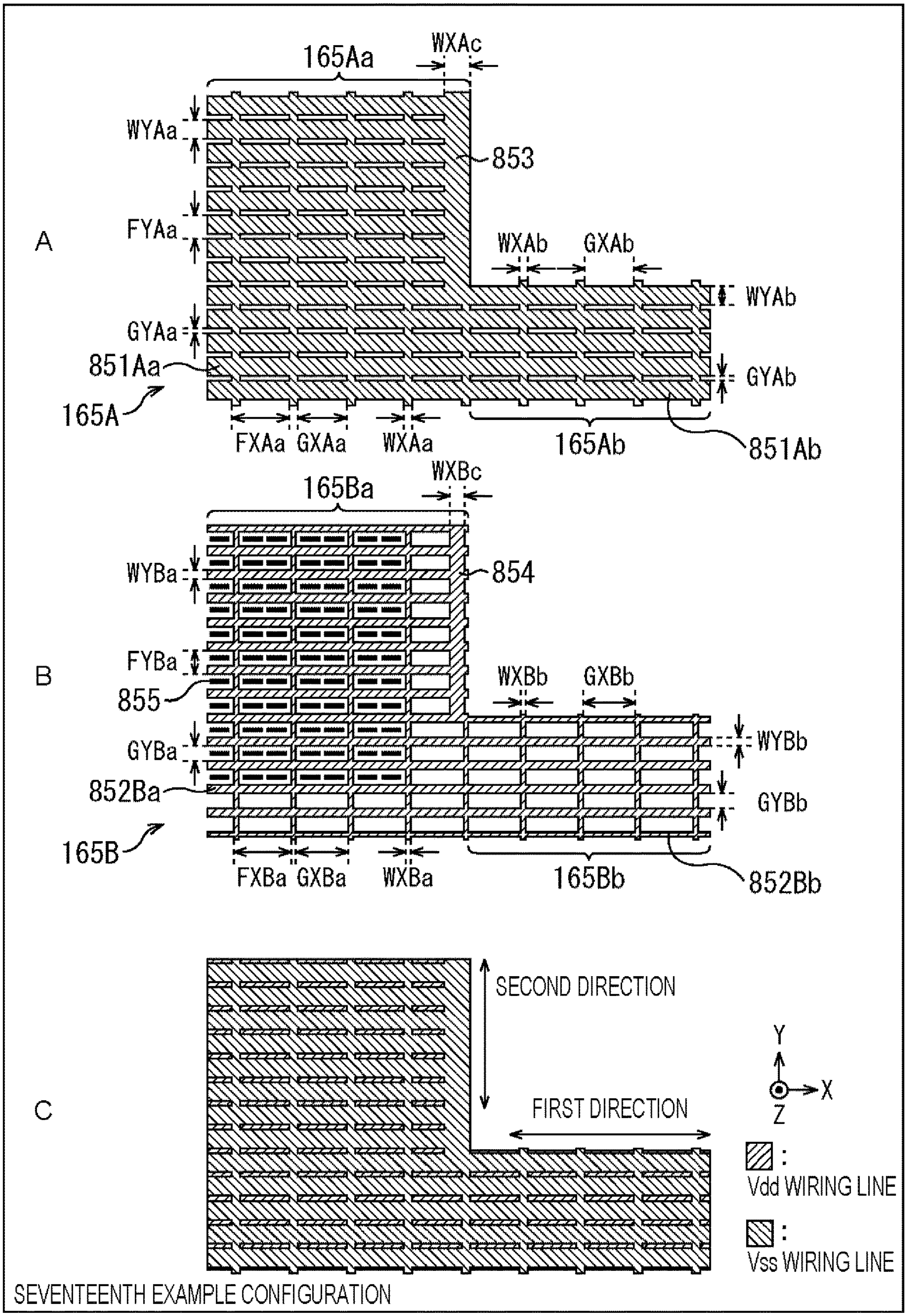
FIG. 76 is a diagram showing a first modification of the seventeenth example configuration of the conductor layers A and B.

FIG. 76 shows a first modification of the seventeenth example configuration.

The conductor layer A in the first modification of the seventeenth example configuration differs from the conductor layer A of the seventeenth example configuration shown in A of FIG. 75, in that the reinforcement conductor 853 of the conductor layer A shown in A of FIG. 76 is not formed over the entire length of the main conductor portion 165Aa in the Y direction, but is formed along part of the main conductor portion 165Aa in the Y direction. More specifically, in the first modification shown in FIG. 76, the reinforcement conductor 853 of the conductor layer A is formed at a position extending in the Y direction, excluding the position of the joint portion extending in the Y direction. The other components of the conductor layer A in the first modification are similar to those of the conductor layer A of the seventeenth example configuration shown in A of FIG. 75.

Likewise, the conductor layer B differs from the conductor layer B of the seventeenth example configuration shown in B of FIG. 75, in that the reinforcement conductor 854 of the conductor layer B shown in B of FIG. 76 is not formed over the entire length of the main conductor portion 165Ba in the Y direction, but is formed along part of the main conductor portion 165Ba in the Y direction. More specifically, in the first modification shown in FIG. 76, the reinforcement conductor 854 of the conductor layer B is formed at a position extending in the Y direction, excluding the position of the joint portion extending in the Y direction. The other components of the conductor layer B in the first modification are similar to those of the conductor layer B of the seventeenth example configuration shown in A of FIG. 75.

<Second Modification of the Seventeenth Example Configuration>

Figure 77:
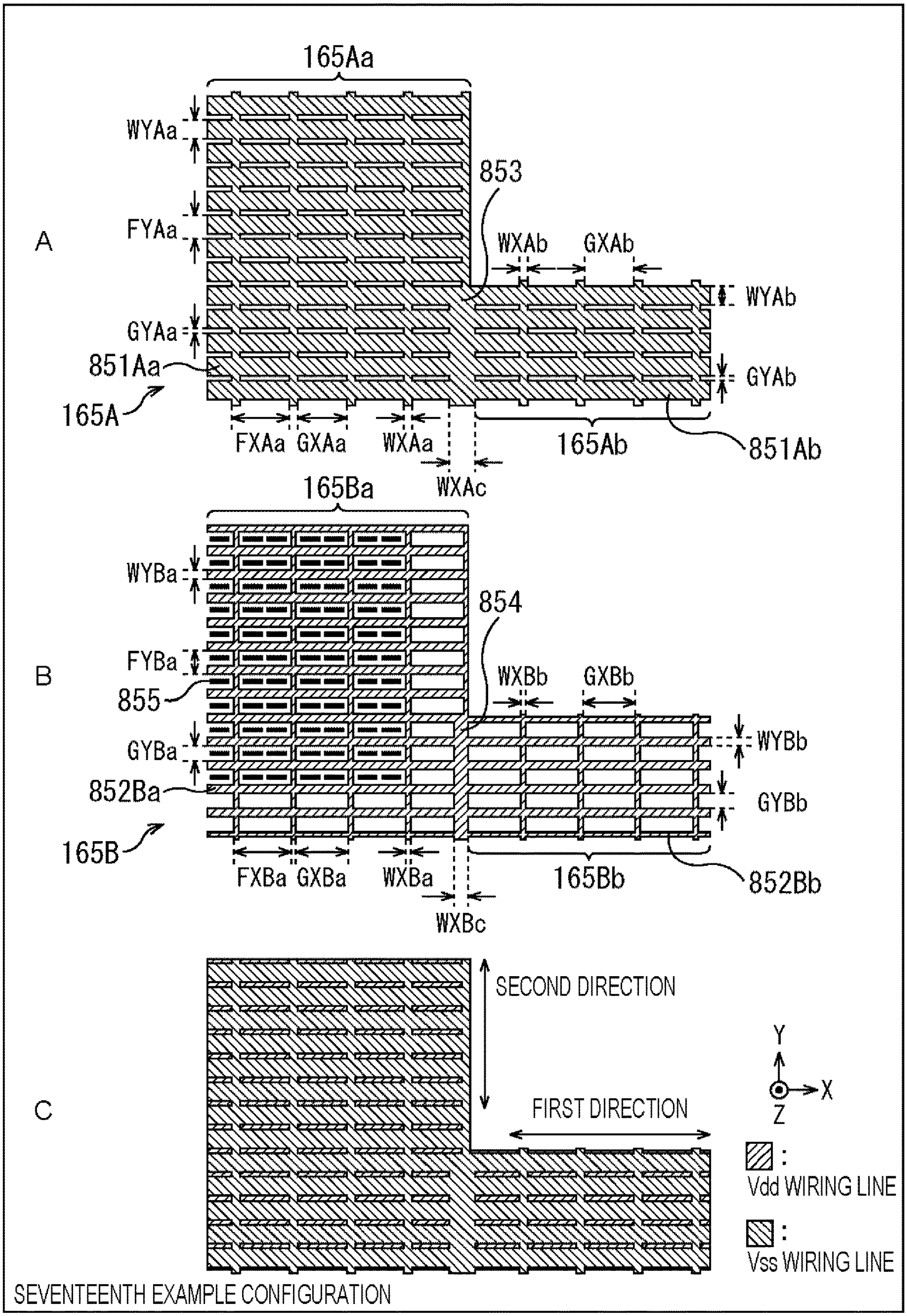
FIG. 77 is a diagram showing a second modification of the seventeenth example configuration of the conductor layers A and B.

FIG. 77 shows a second modification of the seventeenth example configuration.

The conductor layer A in the second modification of the seventeenth example configuration differs from the conductor layer A of the seventeenth example configuration shown in A of FIG. 75, in that the reinforcement conductor 853 of the conductor layer A shown in A of FIG. 77 is not formed over the entire length of the main conductor portion 165Aa in the Y direction, but is formed along part of the main conductor portion 165Aa in the Y direction. More specifically, in the second modification shown in FIG. 77, the reinforcement conductor 853 of the conductor layer A is formed only at the position of the joint portion extending in the Y direction. The other components of the conductor layer A in the second modification are similar to those of the conductor layer A of the seventeenth example configuration shown in A of FIG. 75.

Likewise, the conductor layer B differs from the conductor layer B of the seventeenth example configuration shown in B of FIG. 75, in that the reinforcement conductor 854 of the conductor layer B shown in B of FIG. 77 is not formed over the entire length of the main conductor portion 165Ba in the Y direction, but is formed along part of the main conductor portion 165Ba in the Y direction. More specifically, in the second modification shown in FIG. 77, the reinforcement conductor 854 of the conductor layer B is formed only at the position of the joint portion extending in the Y direction. The other components of the conductor layer B in the second modification are similar to those of the conductor layer B of the seventeenth example configuration shown in A of FIG. 75.

As in the first modification and the second modification of the seventeenth example configuration, the reinforcement conductor 853 of the conductor layer A and the reinforcement conductor 854 of the conductor layer B are not necessarily formed over the entire length of the main conductor portion 165Aa in the Y direction, and may be formed in a region at a predetermined portion extending in the Y direction.

Eighteenth Example Configuration

Figure 78:
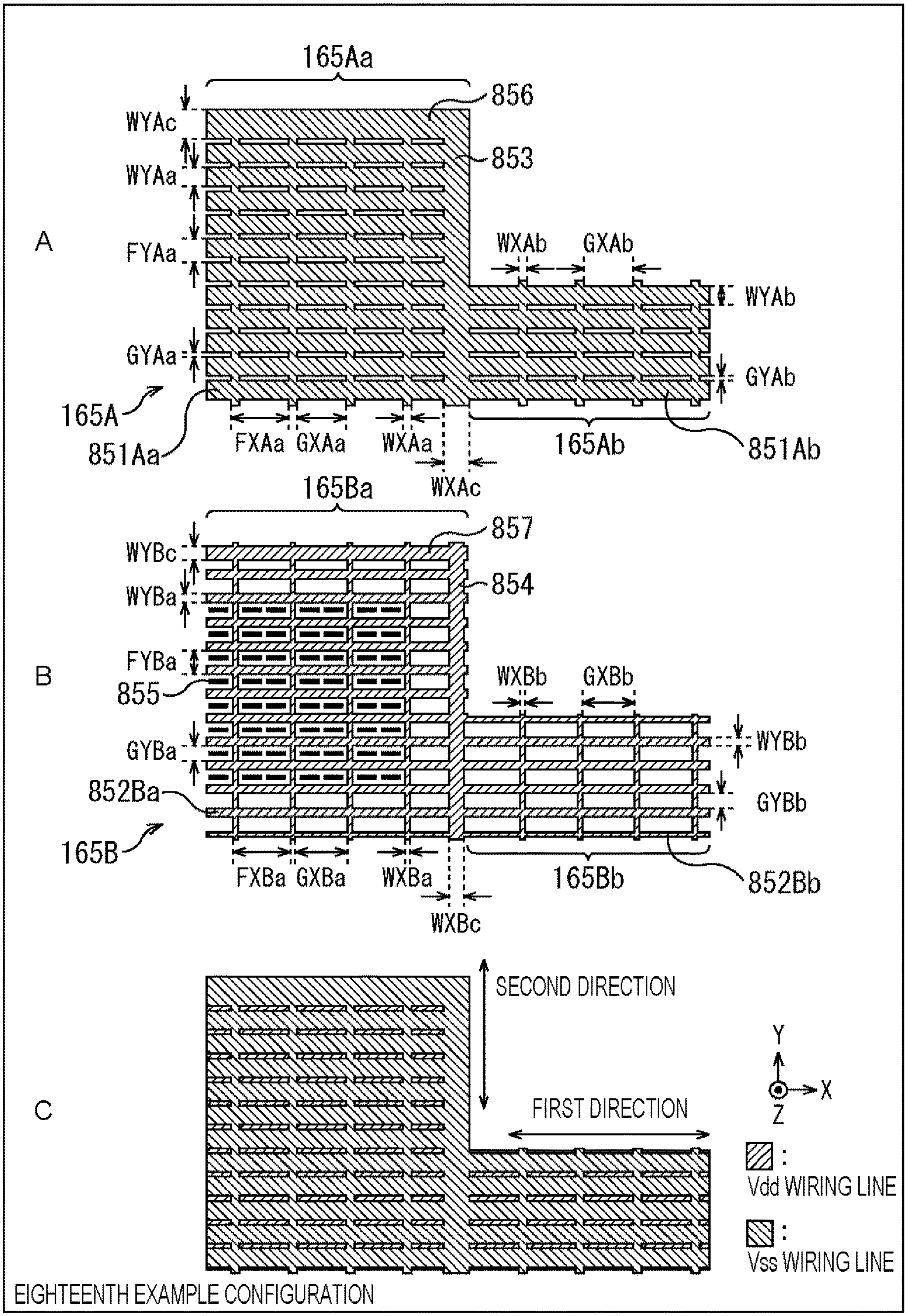
FIG. 78 is a diagram showing an eighteenth example configuration of the conductor layers A and B.

FIG. 78 shows an eighteenth example configuration of the conductor layers A and B. Note that A of FIG. 78 shows the conductor layer A, and B of FIG. 78 shows the conductor layer B. C of FIG. 78 shows a state in which the conductor layers A and B shown in A and B of FIG. 78 are viewed from the side of the conductor layer A. In the coordinate system in FIG. 78, the horizontal direction is the X-axis, the vertical direction is the Y-axis, and the direction perpendicular to the X-Y plane is the Z-axis.

The eighteenth example configuration shown in FIG. 78 has the same configuration as that of the seventeenth example configuration shown in FIG. 75, except for a modified portion. In FIG. 78, the components corresponding to those shown in FIG. 75 are denoted by the same reference numerals as those used in FIG. 75, and explanation of the components will not be repeated below.

The conductor layer A of the eighteenth example configuration shown in A of FIG. 78 includes a mesh conductor 851Aa having a shape in which current flows easily in the X direction, and a reinforcement conductor 853 reinforced so that current flows easily in the Y direction. This aspect is the same as that of the seventeenth example configuration shown in FIG. 75.

On the other hand, the conductor layer A of the eighteenth example configuration differs from that of the seventeenth example configuration shown in FIG. 75, in further including a reinforcement conductor 856 that is reinforced so that current flows more easily in the X direction than in the Y direction. The conductor width WYAc of the reinforcement conductor 856 is preferably designed to be greater than one or both of the conductor width WXAa in the X direction and the conductor width WYAa in the Y direction of the mesh conductor 851Aa. The conductor width WYAc of the reinforcement conductor 856 is designed to be greater than the conductor width WXAa in the X direction or the conductor width WYAa in the Y direction of the mesh conductor 851Aa, whichever is smaller. A plurality of reinforcement conductors 856 may be arranged in the region of the main conductor portion 165Aa at predetermined intervals in the Y direction, or one reinforcement conductor 856 may be provided at a predetermined position in the Y direction.

As the reinforcement conductor 856 reinforced so that current flows easily in the X direction is provided, current can be not only made to flow easily in the Y direction by the reinforcement conductor 853, but also made to flow easily in the X direction. Accordingly, current concentration around the joint portion between the main conductor portion 165Aa and the extension conductor portion 165Ab can be alleviated. In a case where current concentration occurs locally, inductive noise increases due to the concentration site. However, the current concentration can be alleviated, and thus, inductive noise can be further reduced.

The conductor layer B of the eighteenth example configuration shown in B of FIG. 78 includes a mesh conductor 852Ba having a shape in which current flows easily in the X direction, and a reinforcement conductor 854 reinforced so that current flows easily in the Y direction. This aspect is the same as that of the seventeenth example configuration shown in FIG. 75.

On the other hand, the conductor layer B of the eighteenth example configuration differs from that of the seventeenth example configuration shown in FIG. 75, in further including a reinforcement conductor 857 that is reinforced so that current flows more easily in the X direction than in the Y direction. The conductor width WYBc of the reinforcement conductor 857 is preferably designed to be greater than one or both of the conductor width WXBa in the X direction and the conductor width WYBa in the Y direction of the mesh conductor 852Ba. The conductor width WYBc of the reinforcement conductor 857 is designed to be greater than the conductor width WXBa in the X direction or the conductor width WYBa in the Y direction of the mesh conductor 852Ba, whichever is smaller. A plurality of reinforcement conductors 857 may be arranged in the region of the main conductor portion 165Ba at predetermined intervals in the Y direction, or one reinforcement conductor 857 may be provided at a predetermined position in the Y direction.

As shown in C of FIG. 78, the reinforcement conductor 856 of the conductor layer A and the reinforcement conductor 857 of the conductor layer B are formed at overlapping positions. Where the conductor layer A and the conductor layer B are stacked, the active element group 167 is covered with at least one of the conductor layer A and the conductor layer B, and thus, hot carrier light emission from the active element group 167 can also be blocked in the eighteenth example configuration. Note that, in a case where light blocking in the vicinity of the reinforcement conductor 856 or the reinforcement conductor 857 is not necessary, for example, the reinforcement conductor 856 and the reinforcement conductor 857 may not be formed at overlapping positions. Further, depending on the current distribution in the main conductor portion 165*a*, for example, at least one of the reinforcement conductor 856 and the reinforcement conductor 857 may not be formed.

As the reinforcement conductor 857 reinforced so that current flows easily in the X direction is provided, current can be not only made to flow easily in the Y direction by the reinforcement conductor 854, but also made to flow easily in the X direction. Accordingly, current concentration around the joint portion between the main conductor portion 165Ba and the extension conductor portion 165Bb can be alleviated. In a case where current concentration occurs locally, inductive noise increases due to the concentration site. However, the current concentration can be alleviated, and thus, inductive noise can be further reduced.

The seventeenth example configuration in FIG. 75 shows a configuration including the reinforcement conductors 853 and 854 that are reinforced so that current flows easily in the Y direction. The eighteenth example configuration in FIG. 78 shows a configuration including not only the reinforcement conductors 853 and 854, but also the reinforcement conductors 856 and 857 that are reinforced so that current flows easily in the X direction.

Although not shown in the drawings, a modification of the seventeenth example configuration or the eighteenth example configuration may be a configuration in which the conductor layer A does not include the reinforcement conductor 853 but includes the reinforcement conductor 856, and the conductor layer B does not include the reinforcement conductor 854 but includes the reinforcement conductor 857. In other words, it is possible to adopt a configuration that includes only the reinforcement conductors 856 and 857 as the reinforcement conductors.

As the reinforcement conductor 856 reinforced so that current flows easily in the X direction is provided, current can be easily made to diffuse in the Y direction depending on the relationship with the wiring resistance even in a case where the reinforcement conductor 853 is not included. Accordingly, current concentration around the joint portion between the main conductor portion 165Aa and the extension conductor portion 165Ab can be alleviated. In a case where current concentration occurs locally, inductive noise increases due to the concentration site. However, the current concentration can be alleviated, and thus, inductive noise can be further reduced.

As the reinforcement conductor 857 reinforced so that current flows easily in the X direction is provided, current can be easily made to diffuse in the Y direction depending on the relationship with the wiring resistance even in a case where the reinforcement conductor 854 is not included. Accordingly, current concentration around the joint portion between the main conductor portion 165Ba and the extension conductor portion 165Bb can be alleviated. In a case where current concentration occurs locally, inductive noise increases due to the concentration site. However, the current concentration can be alleviated, and thus, inductive noise can be further reduced.

Nineteenth Example Configuration

Figure 79:
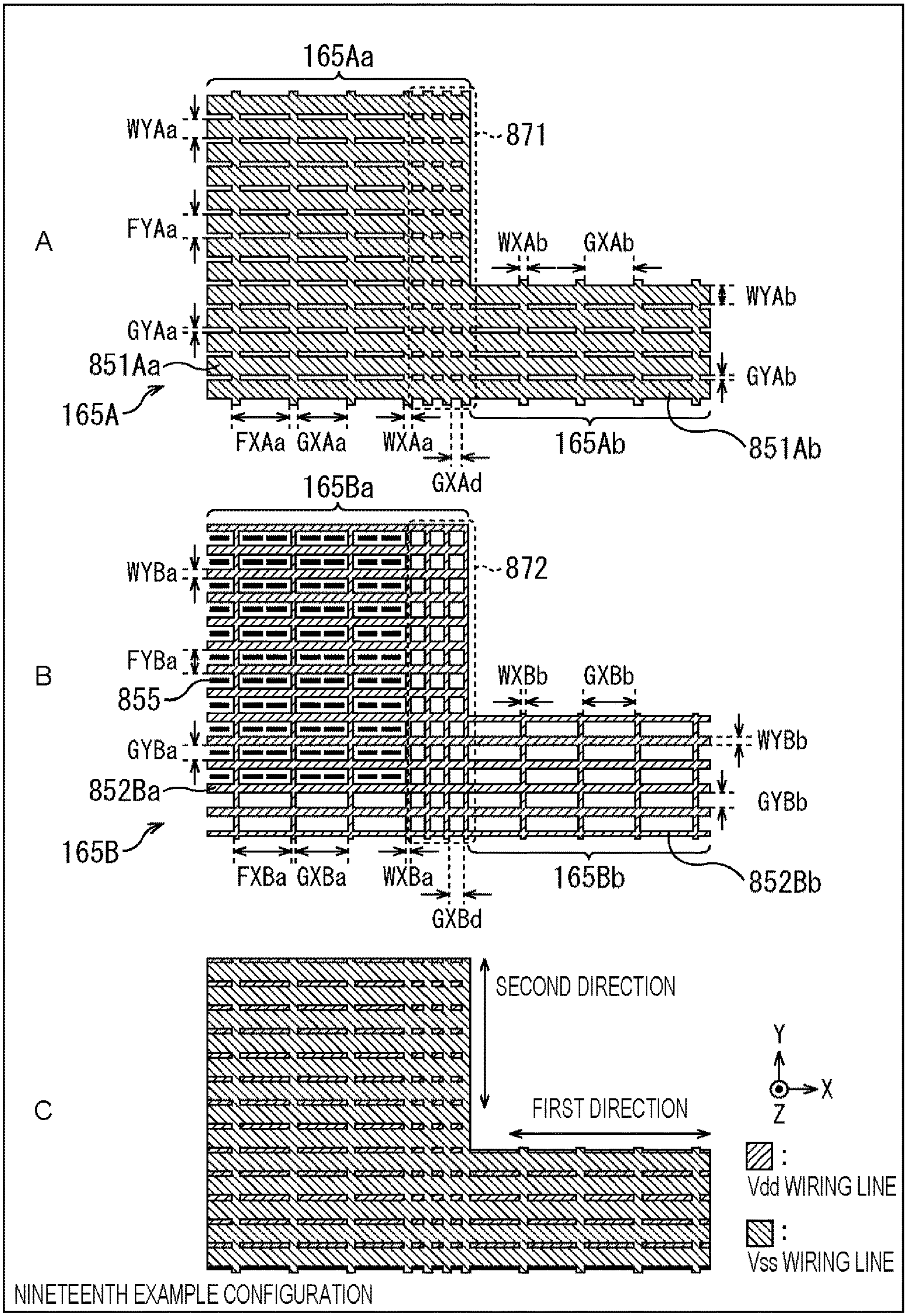
FIG. 79 is a diagram showing a nineteenth example configuration of the conductor layers A and B.

FIG. 79 shows a nineteenth example configuration of the conductor layers A and B. Note that A of FIG. 79 shows the conductor layer A, and B of FIG. 79 shows the conductor layer B. C of FIG. 79 shows a state in which the conductor layers A and B shown in A and B of FIG. 79 are viewed from the side of the conductor layer A. In the coordinate system in FIG. 79, the horizontal direction is the X-axis, the vertical direction is the Y-axis, and the direction perpendicular to the X-Y plane is the Z-axis.

The nineteenth example configuration shown in FIG. 79 has the same configuration as that of the seventeenth example configuration shown in FIG. 75, except for a modified portion. In FIG. 79, the components corresponding to those shown in FIG. 75 are denoted by the same reference numerals as those used in FIG. 75, and explanation of the components will not be repeated below.

The conductor layer A of the nineteenth example configuration shown in A of FIG. 79 differs from that of the seventeenth example configuration shown in FIG. 75 in that the reinforcement conductor 853 is replaced with a reinforcement conductor 871. The other aspects are the same. The reinforcement conductor 871 is formed with a plurality of wiring lines extending in the Y direction. The respective wiring lines that constitute the reinforcement conductor 871 are evenly spaced in the X direction with a gap width GXAd. The gap width GXAd is designed to be smaller than the gap width GXAa of the mesh conductor 851Aa of the main conductor portion 165Aa.

The conductor layer B of the nineteenth example configuration shown in B of FIG. 79 differs from that of the seventeenth example configuration shown in FIG. 75 in that the reinforcement conductor 854 is replaced with a reinforcement conductor 872. The other aspects are the same. The reinforcement conductor 872 is formed with a plurality of wiring lines extending in the Y direction.

The respective wiring lines that constitute the reinforcement conductor 872 are evenly spaced in the X direction with a gap width GXBd. The gap width GXBd is designed to be smaller than the gap width GXBa of the mesh conductor 852Ba of the main conductor portion 165Ba.

As shown in C of FIG. 79, the reinforcement conductor 871 of the conductor layer A and the reinforcement conductor 872 of the conductor layer B are formed at overlapping positions. Where the conductor layer A and the conductor layer B are stacked, the active element group 167 is covered with at least one of the conductor layer A and the conductor layer B, and thus, hot carrier light emission from the active element group 167 can also be blocked in the nineteenth example configuration. Note that, in a case where light blocking in the vicinity of the reinforcement conductor 871 or the reinforcement conductor 872 is not necessary, for example, the reinforcement conductor 871 and the reinforcement conductor 872 may not be formed at overlapping positions. Further, depending on the current distribution in the main conductor portion 165*a*, for example, at least one of the reinforcement conductor 871 and the reinforcement conductor 872 may not be formed.

<Modification of the Nineteenth Example Configuration>

Figure 80:
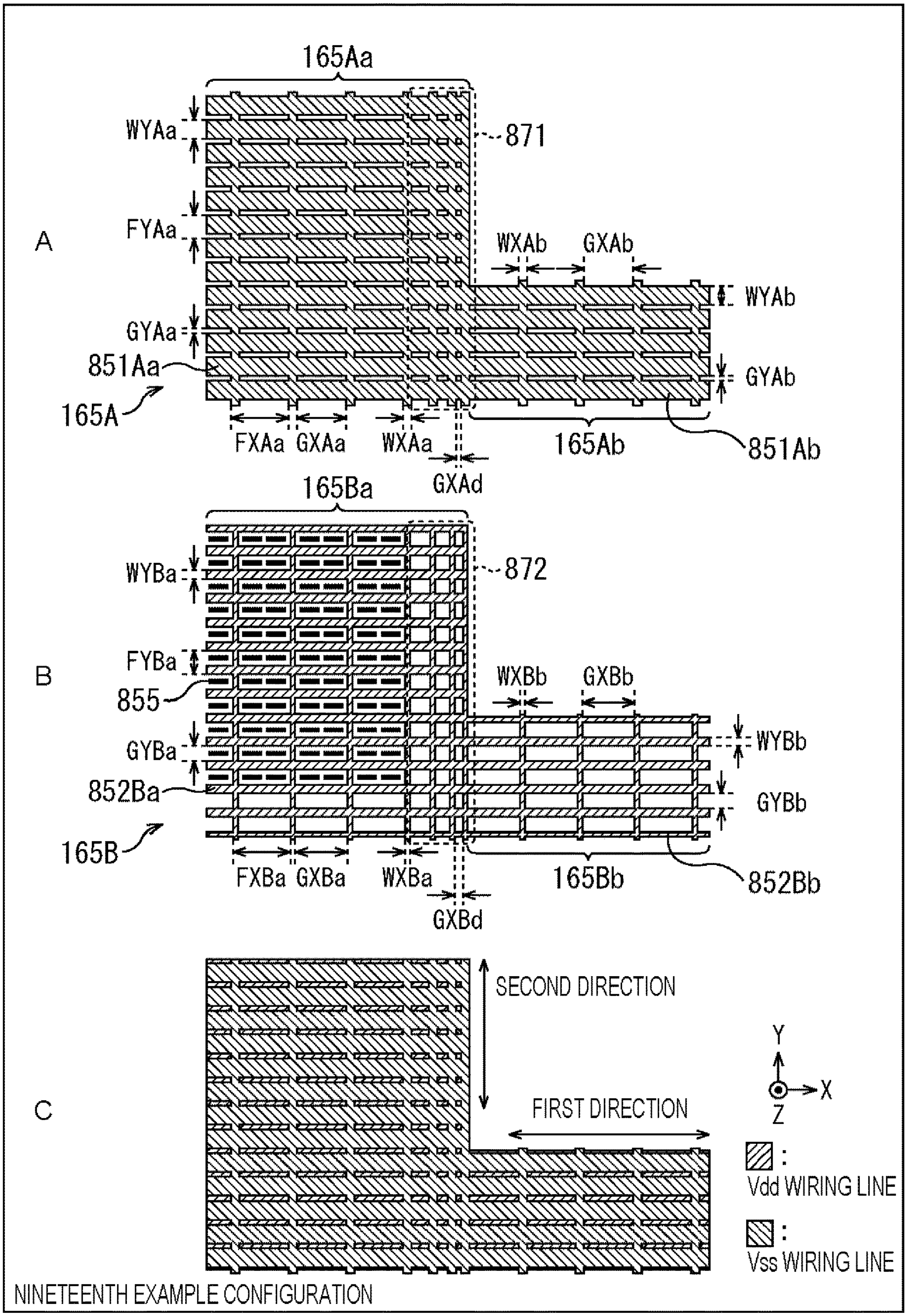
FIG. 80 is a diagram showing a modification of the nineteenth example configuration of the conductor layers A and B.

FIG. 80 shows a modification of the nineteenth example configuration.

In the nineteenth example configuration shown in FIG. 79, the plurality of wiring lines constituting the reinforcement conductor 871 of the conductor layer A is evenly spaced in the X direction with the gap width GXAd. The plurality of wiring lines constituting the reinforcement conductor 872 of the conductor layer B is also evenly spaced in the X direction with the gap width GXAd.

On the other hand, in FIG. 80, which shows a modification of the nineteenth example configuration, gap widths GXAd between adjacent wiring lines differ from one another among the plurality of wiring lines constituting the reinforcement conductor 871 of the conductor layer A. At least one of the respective gap widths GXAd is designed to be smaller than the gap width GXAa of the mesh conductor 851Aa of the main conductor portion 165Aa. Gap widths GXBd between adjacent wiring lines differ from one another among the plurality of wiring lines constituting the reinforcement conductor 872 of the conductor layer B. At least one of the respective gap widths GXBd is designed to be smaller than the gap width GXBa of the mesh conductor 852Ba of the main conductor portion 165Ba.

Although the plurality of gap widths GXAd and gap widths GXBd are designed so as to become gradually smaller from the left side in the example shown in FIG. 80, the present technology is not limited to this. The gap widths GXAd and the gap widths GXBd may be designed to become gradually smaller from the right side, or may be random widths.

As described above, the modification of the nineteenth example configuration in FIG. 80 is similar to the nineteenth example configuration shown in FIG. 79, except that the cap widths GXAd and GXBd are not uniform but are changed.

As in the nineteenth example configuration and the modification thereof shown in FIGS. 79 and 80, the reinforcement conductor 871 of the conductor layer A and the reinforcement conductor 872 of the conductor layer B can be formed with a plurality of wiring lines arranged with the predetermined gap widths GXAd or GXBd.

As the reinforcement conductors 871 and 872 that are reinforced so that current flows easily in the Y direction are provided, current easily diffuses in the Y direction, and thus, current concentration about the joint portion can be alleviated. In a case where current concentration occurs locally, inductive noise increases due to the concentration site. However, the current concentration can be alleviated, and thus, inductive noise can be further reduced. The nineteenth example configuration and the modification thereof shown in FIGS. 79 and 80 show configurations each including the reinforcement conductors 871 and 872 that are reinforced so that current flows easily in the Y direction, with the gap widths including those at least smaller than the gap width GXAa and the gap width GXBa in the X direction. However, the present technology is not limited to these examples. For example, although not shown in the drawings, it is possible to adopt a configuration that includes reinforcement conductors that are reinforced so that current flows easily in the X direction as in the eighteenth example configuration in FIG. 78, with the gap widths including those at least smaller than the gap width GYAa or the gap width GYBa in the Y direction. It is also possible to adopt a configuration including reinforcement conductors that are reinforced so that current flows easily in the X direction, a configuration including reinforcement conductors that are reinforced so that current flows easily in the Y direction, or a configuration including both a reinforcement conductor that is reinforced so that current flows easily in the X direction, and a reinforcement conductor that is reinforced so that current flows easily in the Y direction. In any of these cases, current concentration can be alleviated depending on the wiring resistance relationship, and thus, inductive noise can be further reduced.

Twentieth Example Configuration

Figure 81:
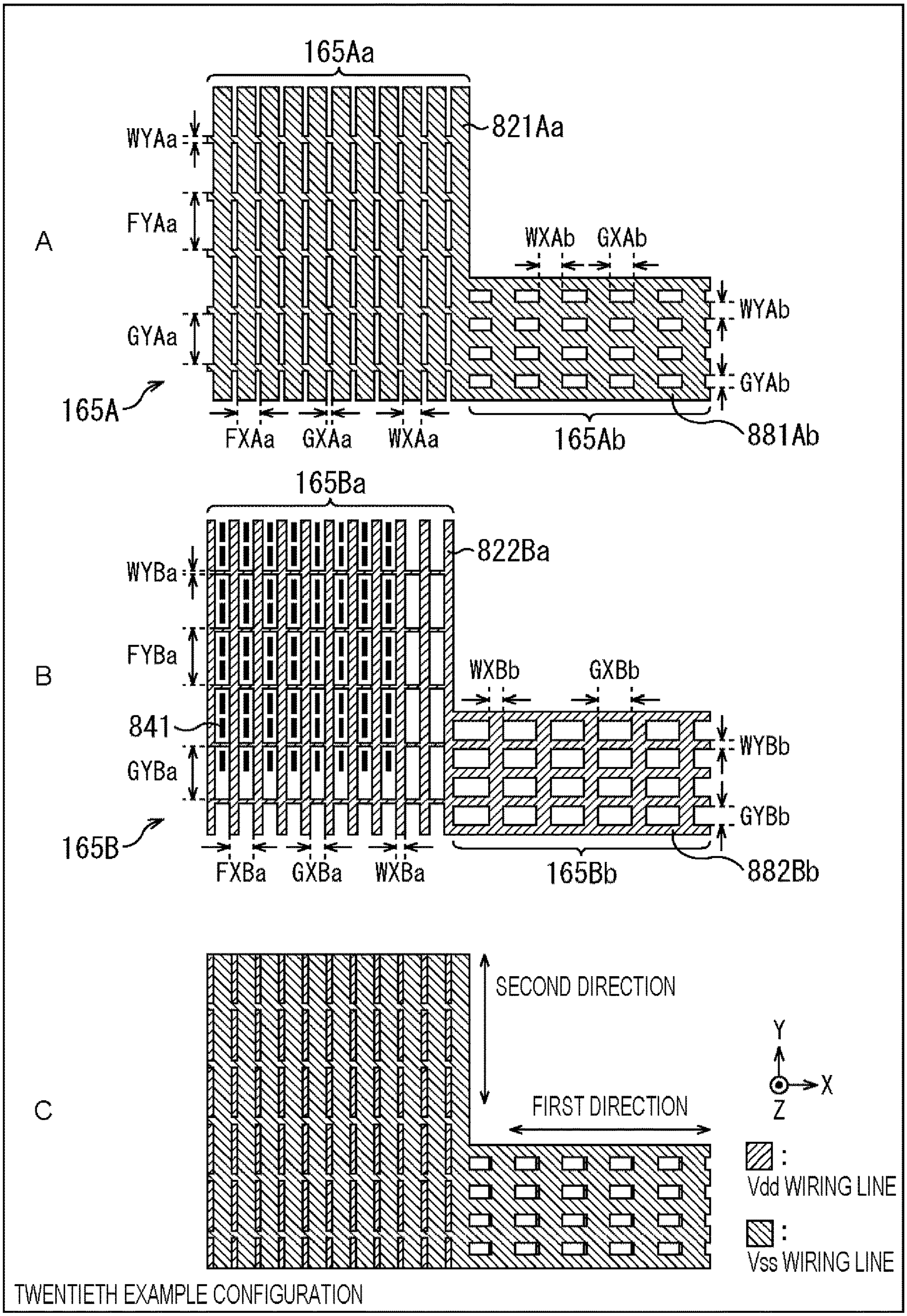
FIG. 81 is a diagram showing a twentieth example configuration of the conductor layers A and B.

FIG. 81 shows a twentieth example configuration of the conductor layers A and B. Note that A of FIG. 81 shows the conductor layer A, and B of FIG. 81 shows the conductor layer B. C of FIG. 81 shows a state in which the conductor layers A and B shown in A and B FIG. 81 are viewed from the side of the conductor layer A. In the coordinate system in FIG. 81, the horizontal direction is the X-axis, the vertical direction is the Y-axis, and the direction perpendicular to the X-Y plane is the Z-axis.

The twentieth example configuration shown in FIG. 81 has the same configuration as that of the sixteenth example configuration shown in FIG. 72, except for a modified portion. In FIG. 81, the components corresponding to those shown in FIG. 72 are denoted by the same reference numerals as those used in FIG. 72, and explanation of the components will not be repeated below.

The conductor layer A of the twentieth example configuration shown in A of FIG. 81 is the same as the conductor layer A of the sixteenth example configuration shown in FIG. 72, in that the main conductor portion 165Aa is formed with the mesh conductor 821Aa. On the other hand, the conductor layer A of the twentieth example configuration differs from the conductor layer A of the sixteenth example configuration shown in FIG. 72, in that the extension conductor portion 165Ab is formed with a mesh conductor 881Ab that is different from the mesh conductor 821Ab.

The conductor layer B of the twentieth example configuration shown in B of FIG. 81 is the same as the conductor layer B of the sixteenth example configuration shown in FIG. 72, in that the main conductor portion 165Ba includes the mesh conductor 822Ba and the relay conductors 841 disposed in gap regions. The conductor layer B of the twentieth example configuration differs from the conductor layer B of the sixteenth example configuration shown in FIG. 72, in that the extension conductor portion 165Bb is formed with a mesh conductor 882Bb that is different from the mesh conductor 822Bb.

That is, the twentieth example configuration differs from the sixteenth example configuration shown in FIG. 72, in the shape of the repetitive pattern of the extension conductor portion 165*b*.

As shown in C of FIG. 81, where the conductor layer A and the conductor layer B are stacked, some regions of the extension conductor portion 165*b* are open regions.

As described above, it is not necessary to adopt a light blocking structure in all the regions or the conductor layer A and the conductor layer B. For example, in a region where any active elements such as MOS transistors or diodes are not disposed, light blocking may not be performed.

The twentieth example configuration in FIG. 81 is a configuration in which some regions in the extension conductor portions 165*b* of the conductor layer A and the conductor layer B do not block light, but may be a configuration in which some regions in the main conductor portions 165*a* of the conductor layer A and the conductor layer B do not block light. For regions in which light blocking is not necessary, a light blocking structure is not adopted, and accordingly, the degree of freedom in wiring layout design is further increased. Thus, it is possible to adopt wiring patterns that further reduce inductive noise and also further reduce the voltage drop.

<Twenty-First Example Configuration>

In each of the examples described above in the fourteenth through twentieth example configurations, the conductor layers of the extension conductor portions 165*b* connected to the main conductor portions 165*a* are formed with mesh conductors.

However, the conductor layers of the extension conductor portions 165*b* are not necessarily mesh conductor, and may be formed with planar conductors or linear conductors, like the conductor layers of the main conductor portions 165*a*.

In the twenty-first through twenty-fourth example configurations described below, example configurations in which the conductor layers of the extension conductor portions 165*b* are formed with planar conductors or linear conductors are described.

Figure 82:
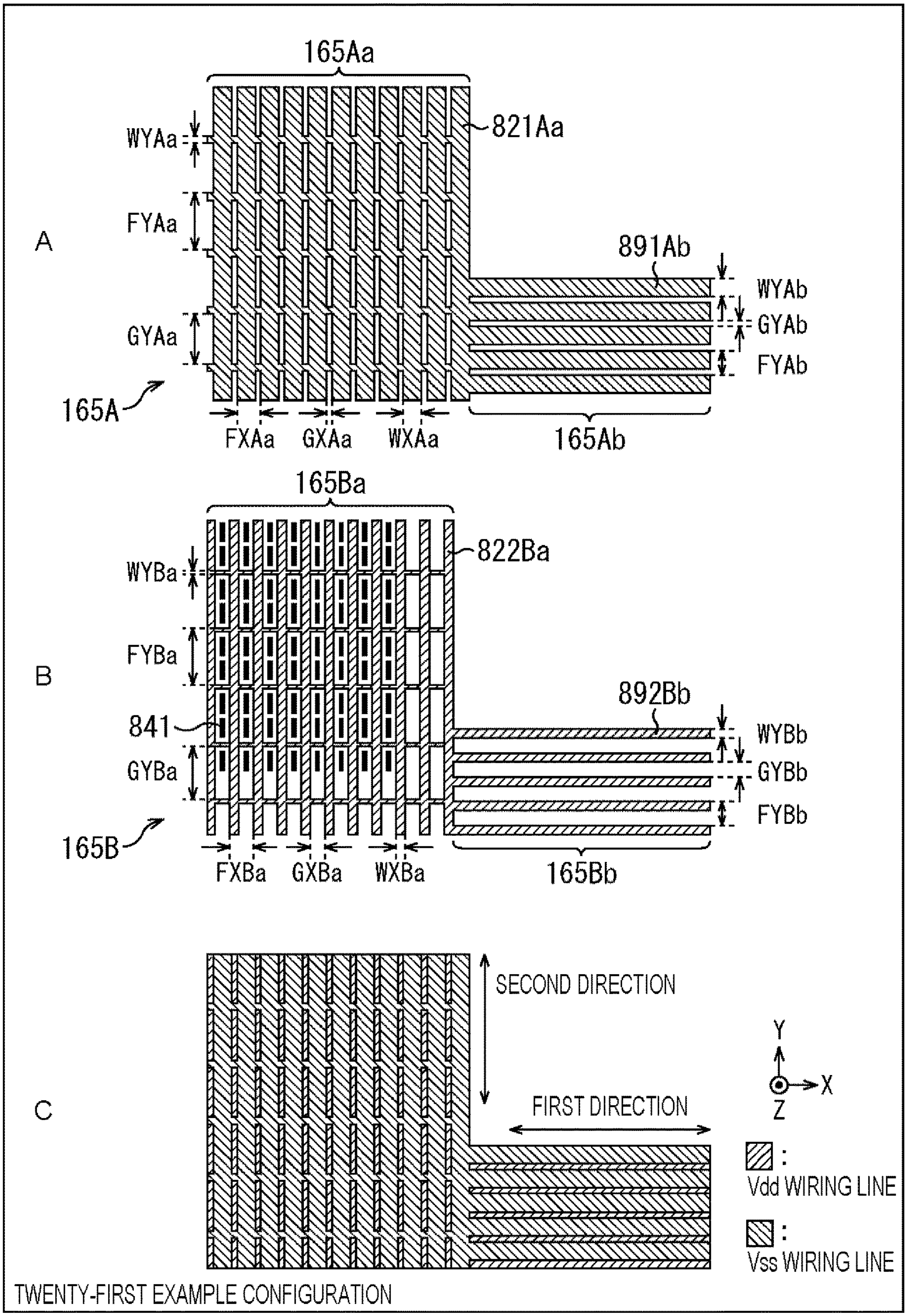
FIG. 82 is a diagram showing a twenty-first example configuration of the conductor layers A and B.

FIG. 82 shows a twenty-first example configuration of the conductor layers A and B. Note that A of FIG. 82 shows the conductor layer A, and B of FIG. 82 shows the conductor layer Be C of FIG. 82 shows a state in which the conductor layers A and B shown in A and B of FIG. 82 are viewed from the side of the conductor layer A. In the coordinate system in FIG. 82, the horizontal direction is the X-axis, the vertical direction is the Y-axis, and the direction perpendicular to the X-Y plane is the Z-axis.

The twenty-first example configuration shown in FIG. 82 is the same configuration as the sixteenth example configuration shown in FIG. 72, except for the conductor layers of the extension conductor portions 165*b*. In FIG. 82, the components corresponding to those shown in FIG. 72 are denoted by the same reference numerals as those used in FIG. 72, and explanation of the components will not be repeated below.

In the extension conductor portion 165Ab of the conductor layer A of the twenty-first example configuration shown in A of FIG. 82, linear conductors 891Ab that are long in the X direction, instead of the mesh conductor 821Ab of the sixteenth example configuration, are cyclically arranged in the Y direction with a conductor cycle FYAb. The conductor cycle FYAb is equal to the sum of the conductor width WYAb in the Y direction and the gap width GYAb in the Y direction (conductor cycle FYAb=conductor width WYAb in Y direction+gap width GYAb in Y direction).

In the extension conductor portion 165Bb of the conductor layer B of the twenty-first example configuration shown in B of FIG. 82, linear conductors 892Bb that are long in the X direction, instead of the mesh conductor 822Bb of the sixteenth example configuration, are cyclically arranged in the Y direction with a conductor cycle FYBb. The conductor cycle FYBb is equal to the sum of the conductor width WYBb in the Y direction and the gap width GYBb in the Y direction (conductor cycle FYBb=conductor width WYBb in Y direction+gap width GYBb in Y direction).

As shown in C of FIG. 82, where the conductor layer A and the conductor layer B are stacked, the active element group 167 is covered with at least one of the conductor layer A and the conductor layer B, and thus, hot carrier light emission from the active element group 167 can also be blocked in the twenty-first example configuration.

<Twenty-Second Example Configuration>

Figure 83:
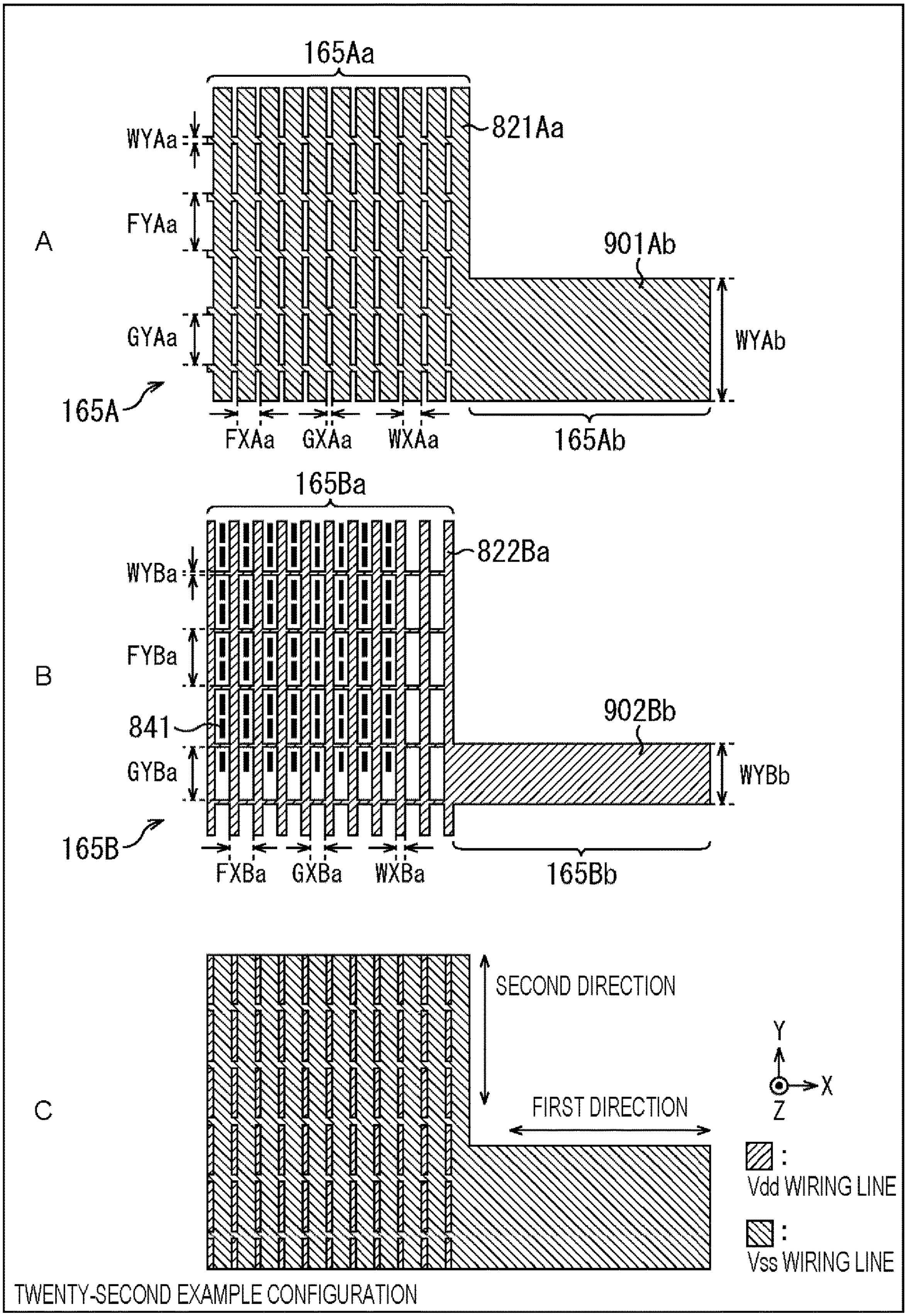
FIG. 83 is a diagram showing a twenty-second example configuration of the conductor layers A and B.

FIG. 83 shows a twenty-second example configuration of the conductor layers A and B. Note that A of FIG. 83 shows the conductor layer A, and B of FIG. 83 shows the conductor layer B. C of FIG. 83 shows a state in which the conductor layers A and B shown in A and B of FIG. 83 are viewed from the side of the conductor layer A. In the coordinate system in FIG. 83, the horizontal direction is the X-axis, the vertical direction is the Y-axis, and the direction perpendicular to the X-Y plane is the Z-axis.

The twenty-second example configuration shown in FIG. 83 is the same configuration as the sixteenth example configuration shown in FIG. 72, except for the conductor layers of the extension conductor portions 165*b*. In FIG. 83, the components corresponding to those shown in FIG. 72 are denoted by the same reference numerals as those used in FIG. 72, and explanation of the components will not be repeated below.

In the extension conductor portion 165Ab of the conductor layer A of the twenty-second example configuration shown in A of FIG. 83, a planar conductor 901Ab, instead of the mesh conductor 821Ab of the sixteenth example configuration, is disposed. The planar conductor 901Ab has a conductor width WYAb in the Y direction.

In the extension conductor portion 165Bb of the conductor layer B of the twenty-second example configuration shown in B of FIG. 83, a planar conductor 902Bb, instead of the mesh conductor 822Bb of the sixteenth example configuration, is disposed. The planar conductor 902Bb has a conductor width WYBb in the Y direction.

As shown in C of FIG. 83, where the conductor layer A and the conductor layer B are stacked, the active element group 167 is covered with at least one of the conductor layer A and the conductor layer B, and thus, hot carrier light emission from the active element group 167 can also be blocked in the twenty-second example configuration.

Figure 84:
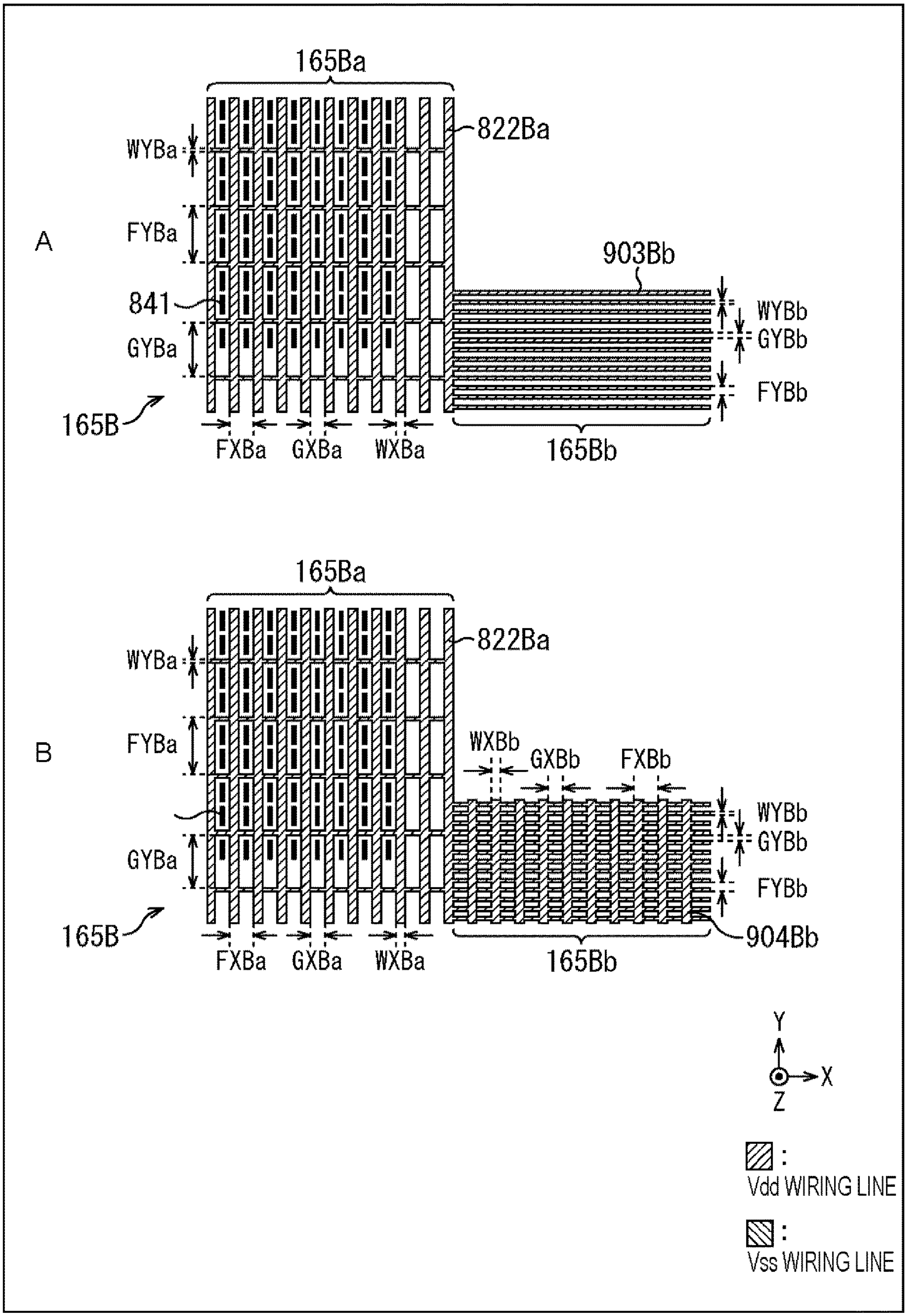
FIG. 84 is a diagram showing other example configurations of the conductor layer B in the twenty-second example configuration.

Note that, in the twenty-second example configuration, it is possible to adopt the conductor layer B shown in A or B of FIG. 84, instead of the conductor layer B shown in B of FIG. 83.

The conductor layers B shown in A and B of FIG. 84 differ from the conductor layer B shown in B of FIG. 83, only in the extension conductor portions 165*b*.

In the extension conductor portion 165Bb of the conductor layer B in A of FIG. 84, linear conductors 903Bb that are long in the X direction, instead of the planar conductor 901Ab shown in B of FIG. 83, are cyclically arranged in the Y direction with a conductor cycle FYBb. Note that conductor cycle FYBb=conductor width WYBb in Y direction+gap width GYBb in Y direction.

In the extension conductor portion 165Bb of the conductor layer B in B of FIG. 84, a mesh conductor 904Bb, instead of the planar conductor 901Ab in B of FIG. 83, is provided. The mesh conductor 904Bb is designed to have a conductor width WXBb and a gap width GXBb, and have the same pattern cyclically disposed with a conductor cycle FXBb in the X direction. The mesh conductor 904Bb is also designed to have a conductor width WYBb and a gap width GYBb, and have the same pattern cyclically disposed with a conductor cycle FYBb in the Y direction. Accordingly, the mesh conductor 904Bb has a shape including a repetitive pattern in which a predetermined basic pattern is repeatedly disposed with a conductor cycle in at least one of the X direction or the Y direction.

A plan view of the conductor layer B in A or B of FIG. 84 and the conductor layer A shown in A of FIG. 83 that are stacked is similar to C of FIG. 83.

<Twenty-Third Example Configuration>

Figure 85:
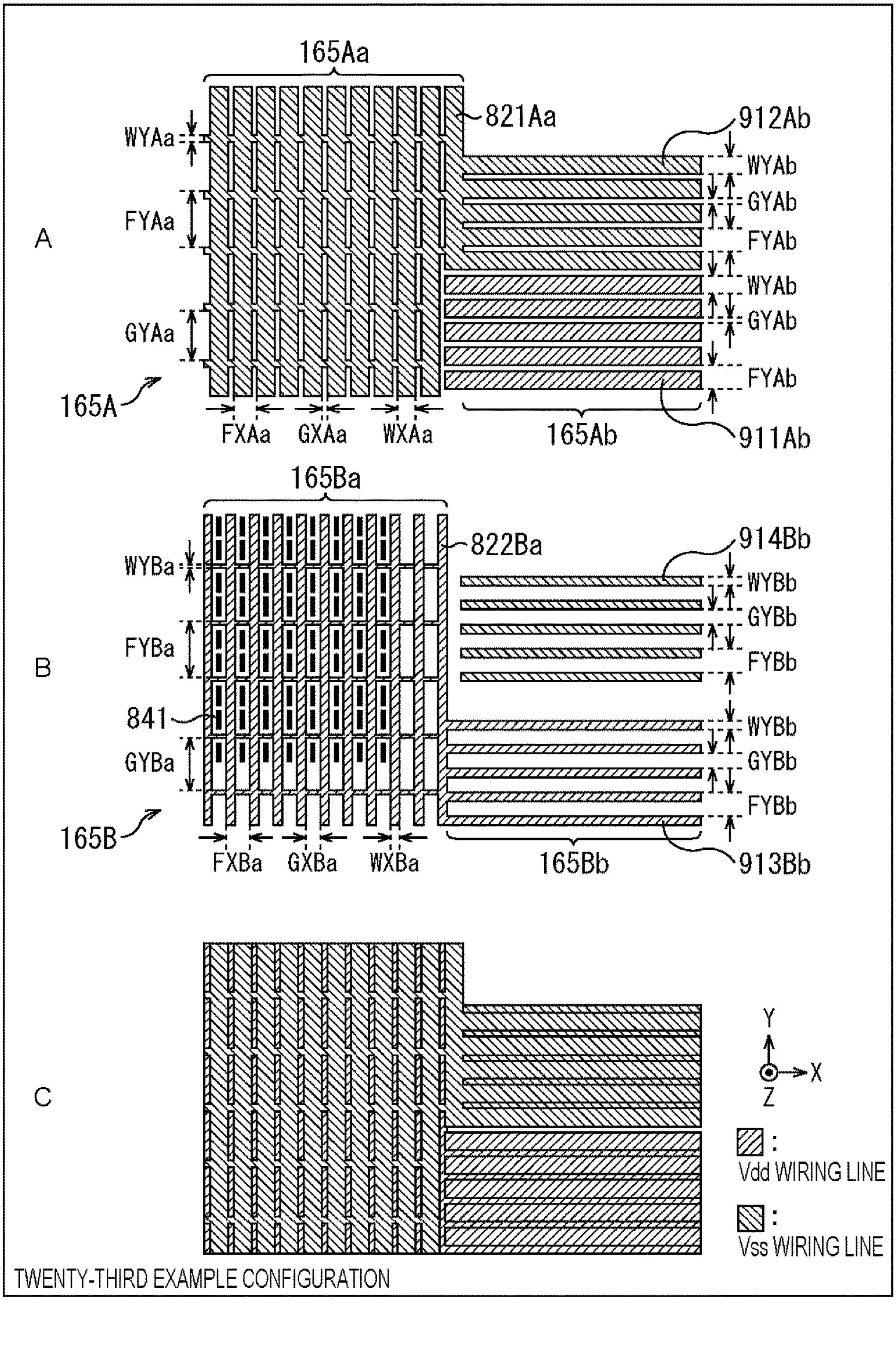
FIG. 85 is a diagram showing a twenty-third example configuration of the conductor layers A and B.

FIG. 85 shows a twenty-third example configuration of the conductor layers A and B. Note that A of FIG. 85 shows the conductor layer A, and B of FIG. 85 shows the conductor layer B. C of FIG. 85 shows a state in which the conductor layers A and B shown in A and B of FIG. 85 are viewed from the side of the conductor layer A. In the coordinate system in FIG. 85, the horizontal direction is the X-axis, the vertical direction is the Y-axis, and the direction perpendicular to the X-Y plane is the Z-axis.

The twenty-third example configuration shown in FIG. 85 is the same configuration as the sixteenth example configuration shown in FIG. 72, except for the conductor layers of the extension conductor portions 165*b*. In FIG. 85, the components corresponding to those shown in FIG. 72 are denoted by the same reference numerals as those used in FIG. 72, and explanation of the components will not be repeated below.

In the extension conductor portion 165Ab of the conductor layer A of the twenty-third example configuration shown in A of FIG. 85, linear conductors 911Ab that are long in the X direction and linear conductors 912Ab that are long in the X direction, instead of the mesh conductor 821Ab of the sixteenth example configuration, are cyclically arranged in the Y direction with a conductor cycle FYAb. The linear conductors 911Ab are wiring lines (Vdd wiring lines) connected to a positive power supply, for example. The linear conductors 912Ab are wiring lines (Vss wiring lines) connected to GND or a negative power supply, for example. The conductor cycle FYAb is equal to the sum of the conductor width WYAb in the Y direction and the gap width GYAb in the Y direction (conductor cycle FYAb=conductor width WYAb+gap width GYAb).

In the extension conductor portion 165Bb of the conductor layer B of the twenty-third example configuration shown in B of FIG. 85, linear conductors 913Bb that are long in the X direction and linear conductors 914Bb that are long in the X direction, instead of the mesh conductor 822Bb of the sixteenth example configuration, are cyclically arranged in the Y direction with a conductor cycle FYBb. The linear conductors 913Bb are wiring lines (Vdd wiring lines) connected to a positive power supply, for example. The linear conductors 914Bb are wiring lines (Vss wiring lines) connected to GND or a negative power supply, for example. The conductor cycle FYBb is equal to the sum of the conductor width WYBb in the Y direction and the gap width GYBb in the Y direction (conductor cycle FYBb=conductor width WYBb+gap width GYBb).

The linear conductors 912Ab of the extension conductor portion 165Ab of the conductor layer A are electrically connected to the mesh conductor 821Aa of the main conductor portion 165Aa, and are electrically connected to the linear conductors 914Bb of the extension conductor portion 165Bb of the conductor layer B through conductor vias (VIA) extending in the Z direction, for example.

The linear conductors 913Bb of the extension conductor portion 165Bb of the conductor layer B are electrically connected to the mesh conductor 822Ba of the main conductor portion 165Ba, and are electrically connected to the linear conductors 911Ab of the extension conductor portion 165Ab of the conductor layer A through conductor vias (VIA) extending in the Z direction or the like, for example.

As shown in C of FIG. 85, where the conductor layer A and the conductor layer B are stacked, the active element group 167 is covered with at least one of the conductor layer A and the conductor layer B, and thus, hot carrier light emission from the active element group 167 can also be blocked in the twenty-first example configuration.

In the fourteenth through twenty-second example configurations described above, in the extension conductor portions 165*b*, the Vdd wiring lines and the Vss wiring lines having different polarities are arranged so as to overlap in the same planar region. However, as in the twenty-third example configuration in FIG. 85, the Vdd wiring lines and the Vss wiring lines with different polarities may be shifted so as to be disposed in different planar regions, and GND, a negative power supply, and a positive power supply may be transmitted with both the conductor layer A and the conductor layer B.

Note that the linear conductors 911Ab of the extension conductor portion 165Ab of the conductor layer A may not be electrically connected to the linear conductors 913Bb of the extension conductor portion 165Bb of the conductor layer B, and may be dummy wiring lines. The linear conductors 914Bb of the extension conductor portion 165Bb of the conductor layer B may not be electrically connected to the linear conductors 912Ab of the extension conductor portion 165Ab of the conductor layer A, and may be dummy wiring lines.

Although an example in which a group of linear conductors 911Ab and a group of linear conductors 912Ab are adjacently arranged is shown in FIG. 85, the present technology is not limited to this. For example, a plurality of groups of linear conductors 911Ab and a plurality of groups of linear conductors 912Ab may be provided, and one group of linear conductors 911Ab and one group of linear conductors 912Ab may be alternately disposed.

Further, although an example in which the linear conductors 911Ab including a plurality of linear conductors and the linear conductors 912Ab including a plurality of linear conductors are adjacently arranged is shown in FIG. 85, the present technology is not limited to this. For example, one linear conductor 911Ab and one linear conductor 912Ab may be alternately disposed.

Further, although an example in which a group of linear conductors 913Bb and a group of linear conductors 914Bb are adjacently arranged is shown in FIG. 85, the present technology is not limited to this. For example, a plurality of groups of linear conductors 913Bb and a plurality of groups of linear conductors 914Bb may be provided, and one group of linear conductors 913Bb and one group of linear conductors 914Bb may be alternately disposed.

Further, although an example in which the linear conductors 913Bb including a plurality of linear conductors and the linear conductors 914Bb including a plurality of linear conductors are adjacently arranged is shown in FIG. 85, the present technology is not limited to this. For example, one linear conductor 913Bb and one linear conductor 914Bb may be alternately disposed.

<Twenty-Fourth Example Configuration>

Figure 86:
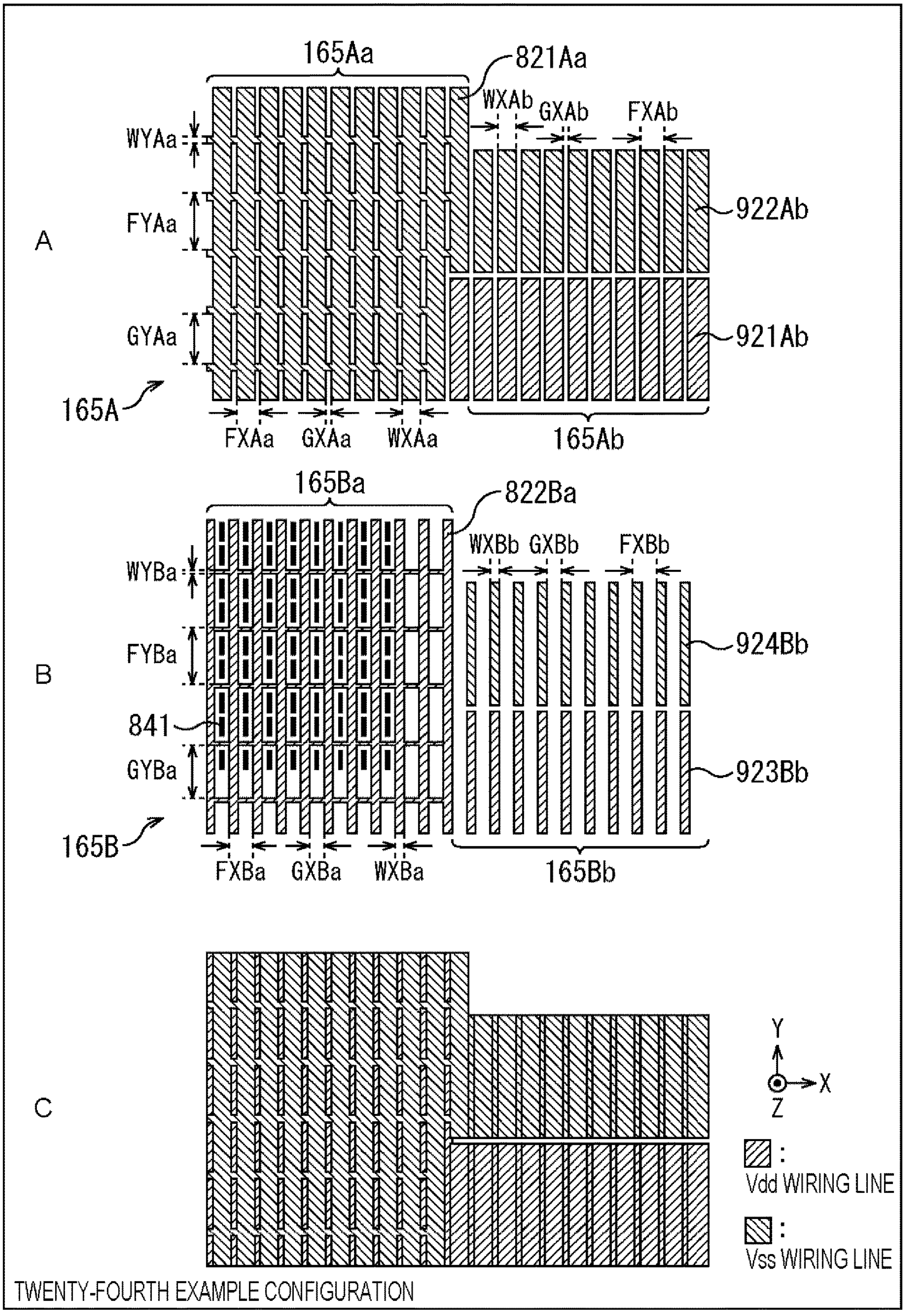
FIG. 86 is a diagram showing a twenty-fourth example configuration of the conductor layers A and B.

FIG. 86 shows a twenty-fourth example configuration of the conductor layers A and B. Note that A of FIG. 86 shows the conductor layer A, and B of FIG. 86 shows the conductor layer B. C of FIG. 86 shows a state in which the conductor layers A and B shown in A and B of FIG. 86 are viewed from the side of the conductor layer A. In the coordinate system in FIG. 86, the horizontal direction is the X-axis, the vertical direction is the Y-axis, and the direction perpendicular to the X-Y plane is the Z-axis.

The twenty-fourth example configuration shown in FIG. 86 is the same configuration as the sixteenth example configuration shown in FIG. 72, except for the conductor layers of the extension conductor portions 165*b*. In FIG. 86, the components corresponding to those shown in FIG. 72 are denoted by the same reference numerals as those used in FIG. 72, and explanation of the components will not be repeated below.

In the extension conductor portion 165Ab of the conductor layer A of the twenty-fourth example configuration shown in A of FIG. 86, linear conductors 921Ab that are long in the Y direction and linear conductors 922Ab that are long in the Y direction, instead of the mesh conductor 821Ab of the sixteenth example configuration, are cyclically arranged in the X direction with a conductor cycle FXAb. The linear conductors 921Ab are wiring lines (Vdd wiring lines) connected to a positive power supply, for example. The linear conductors 922Ab are wiring lines (Vss wiring lines) connected to GND or a negative power supply, for example. The conductor cycle FXAb is equal to the sum of the conductor width WXAb in the X direction and the gap width GXAb in the X direction (conductor cycle FXAb conductor width WXAb gap width GXAb).

In the extension conductor portion 165Bb of the conductor layer B of the twenty-fourth example configuration shown in B of FIG. 86, linear conductors 923Bb that are long in the Y direction and linear conductors 924Bb that are long in the Y direction, instead of the mesh conductor 822Bb of the sixteenth example configuration, are cyclically arranged in the X direction with a conductor cycle FXBb. The linear conductors 923Bb are wiring lines (Vdd wiring lines) connected to a positive power supply, for example. The linear conductors 924Bb are wiring lines (Vss wiring lines) connected to GND or a negative power supply, for example. The conductor cycle FXBb is equal to the sum of the conductor width WXBb in the X direction and the gap width GXBb in the X direction (conductor cycle FXBb=conductor width WXBb+gap width GXBb).

The linear conductors 922Ab of the extension conductor portion 165Ab of the conductor layer A are electrically connected to the linear conductors 924Bb of the extension conductor portion 165Bb of the conductor layer B through conductor vias (VIA) extending in the Z direction or the like, for example, and are electrically connected to the mesh conductor 821Aa of the main conductor portion 165Aa via the linear conductors 924Bb.

That is, GND or a negative power supply, for example, is transmitted in the extension conductor portions 165*b* alternately through the linear conductors 922Ab of the conductor layer A and the linear conductors 924Bb of the conductor layer B, and then reach the mesh conductor 821Aa of the main conductor portion 165Aa.

The linear conductors 923Bb of the extension conductor portion 165Bb of the conductor layer B are electrically connected to the linear conductors 921Ab of the extension conductor portion 165Ab of the conductor layer A through conductor vias (VIA) extending in the Z direction or the like, for example, and are electrically connected to the mesh conductor 822Ba of the main conductor portion 165Ba via the linear conductors 921Ab.

That is, a positive power supply, for example, is transmitted in the extension conductor portions 165*b* alternately through the linear conductors 921Ab of the conductor layer A and the linear conductors 923Bb of the conductor layer B, and then reach the mesh conductor 822Ba of the main conductor portion 165Ba.

As shown in C of FIG. 86, where the conductor layer A and the conductor layer B are stacked, the active element group 167 is covered with at least one of the conductor layer A and the conductor layer B, and thus, hot carrier light emission from the active element group 167 can also be blocked in the twenty-first example configuration.

In the fourteenth through twenty-second example configurations described above, in the extension conductor portions 165*b*, the Vdd wiring lines and the Vss wiring lines having different polarities are arranged so as to overlap in the same planar region. However, as in the twenty-fourth example configuration in FIG. 86, the Vdd wiring lines and the Vss wiring lines with different polarities may be shifted so as to be disposed in different planar regions, and GND, a negative power supply, and a positive power supply may be transmitted with both the conductor layer A and the conductor layer B.

As described above in the twenty-first through twenty-fourth example configurations shown in FIGS. 82 through 86, the conductor layers of the extension conductor portions 165*b* are not necessarily mesh conductors, but may be formed with planar conductors or linear conductors. Further, instead of only one of the conductor layers A or B, the two layers of the conductor layers A and B may be used.

With such a configuration, it is possible to achieve any one of the following effects: the effect to satisfy the wiring layout constraints, the effect to further increase the degree of freedom in wiring layout design, the effect to further reduce inductive noise, the effect to further reduce the voltage drop, and the like.

<Twenty-Fifth Example Configuration>

Figure 87:
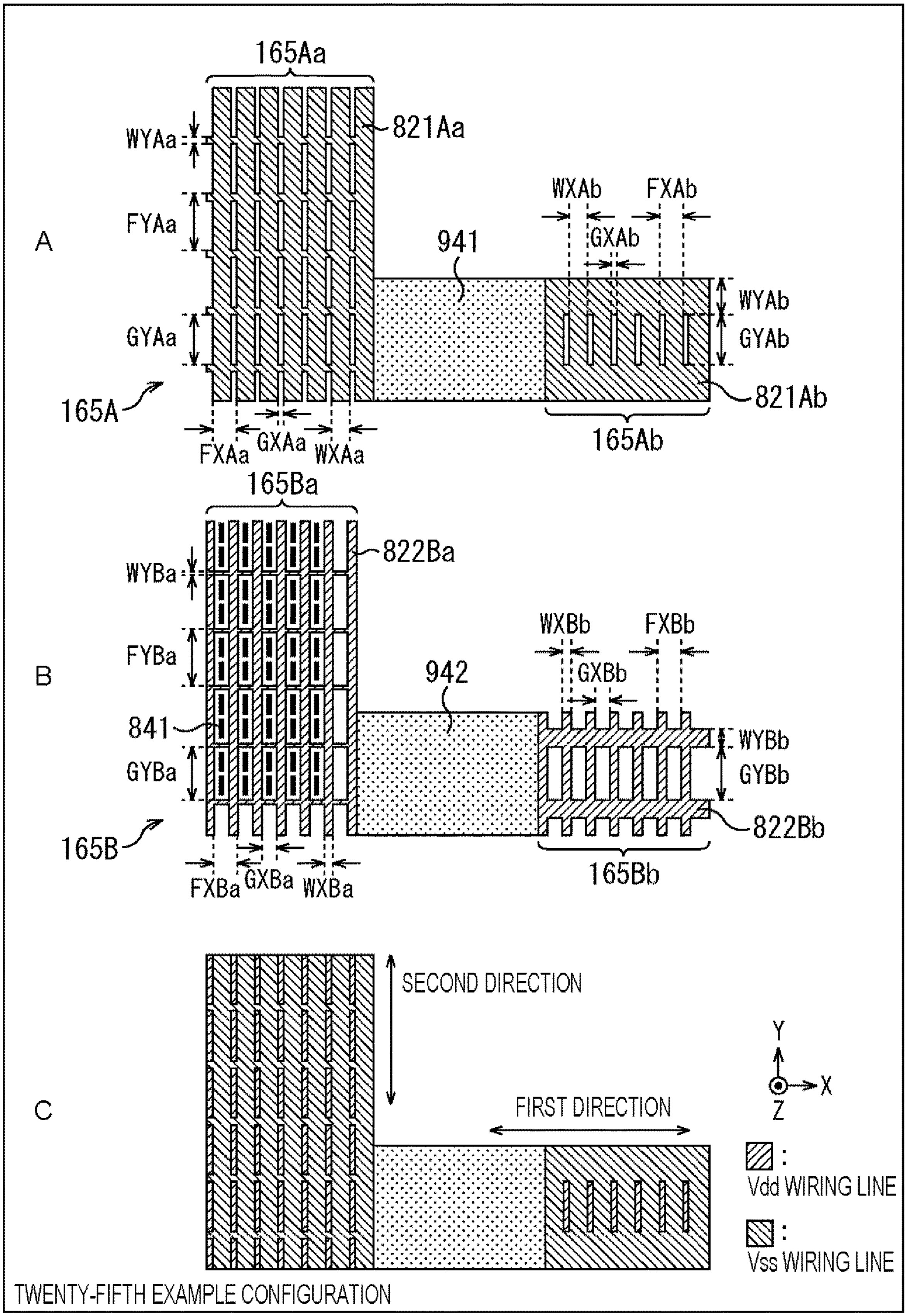
FIG. 87 is a diagram showing a twenty-fifth example configuration of the conductor layers A and B.

FIG. 87 shows a twenty-fifth example configuration of the conductor layers A and B. Note that A of FIG. 87 shows the conductor layer A, and B of FIG. 87 shows the conductor layer B. C of FIG. 87 shows a state in which the conductor layers A and B shown in A and B of FIG. 87 are viewed from the side of the conductor layer A. In the coordinate system in FIG. 87, the horizontal direction is the X-axis, the vertical direction is the Y-axis, and the direction perpendicular to the X-Y plane is the Z-axis.

The twenty-fifth example configuration shown in FIG. 87 has the same configuration as that of the sixteenth example configuration shown in FIG. 72, except for one addition. In FIG. 86, the components corresponding to those shown in FIG. 72 are denoted by the same reference numerals as those used in FIG. 72, and explanation of the components will not be repeated below.

In the conductor layer A of the twenty-fifth example configuration shown in A of FIG. 87, a conductor 941 in a shape that includes a repetitive pattern as appropriate is added between the mesh conductor 821Aa of the main conductor portion 165Aa and the mesh conductor 821Ab of the extension conductor portion 165Ab of the sixteenth example configuration shown in FIG. 72. The repetitive pattern in the conductor 941 differs from those in the mesh conductor 821Aa and the mesh conductor 821Ab. Note that the conductor 941 preferably has a shape including a repetitive pattern to efficiently design a wiring layout. However, the conductor 941 may have a shape not including any repetitive pattern. As the pattern in the conductor 941 can have any appropriate shape, the conductor 941 in A of FIG. 87 is shown as a plane, without any specific definitions. The conductor 941 is electrically connected to both the mesh conductor 821Aa and the mesh conductor 821Ab. In other words, the mesh conductor 821Aa of the main conductor portion 165Aa and the mesh conductor 821Ab of the extension conductor portion 165Ab are electrically connected to each other via the conductor 941.

In the conductor layer B of the twenty-fifth example configuration shown in B of FIG. 87, a conductor 942 in a shape that includes a repetitive pattern as appropriate is added between the mesh conductor 822Ba of the main conductor portion 165Ba and the mesh conductor 822Bb of the extension conductor portion 165Bb of the sixteenth example configuration shown in FIG. 72. The repetitive pattern in the conductor 942 differs from those in the mesh conductor 822Ba and the mesh conductor 822Bb. Note that the conductor 942 preferably has a shape including a repetitive pattern to efficiently design a wiring layout. However, the conductor 942 may have a shape not including any repetitive pattern. As the pattern in the conductor 942 can have any appropriate shape, the conductor 942 in B of FIG. 87 is shown as a plane, without any specific definitions. The conductor 942 is electrically connected to both the mesh conductor 822Ba and the mesh conductor 822Bb. In other words, the mesh conductor 822Ba of the main conductor portion 165Ba and the mesh conductor 822Bb of the extension conductor portion 165Bb are electrically connected to each other via the conductor 942.

According to the twenty-fifth example configuration, in the conductor layer A, the mesh conductor 821Aa of the main conductor portion 165Aa and the mesh conductor 821Ab of the extension conductor portion 165Ab are connected via the predetermined conductor 941. Thus, the degree of freedom in wiring layout design can be further increased, and particularly, the degree of freedom in the vicinity's of pads can be significantly increased.

In the conductor layer B, the mesh conductor 822Ba of the main conductor portion 165Ba and the mesh conductor 822Bb of the extension conductor portion 165Bb are also connected via the predetermined conductor 942. Thus, the degree of freedom in wiring layout design can be further increased, and particularly, the degree of freedom in the vicinity's of pads can be significantly increased.

<Twenty-Sixth Example Configuration>

Figure 88:
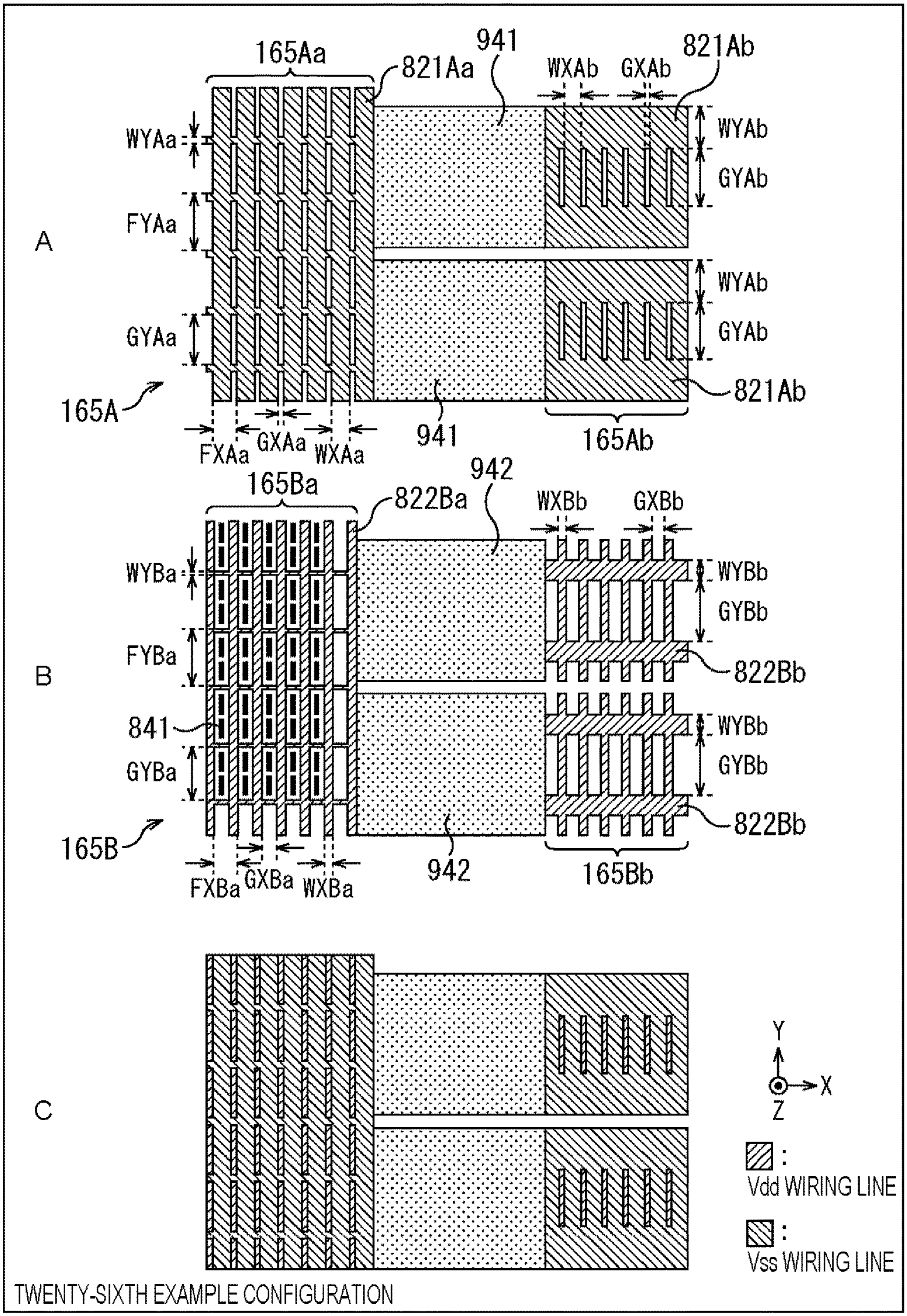
FIG. 88 is a diagram showing a twenty-sixth example configuration of the conductor layers A and B.

FIG. 88 shows a twenty-sixth example configuration of the conductor layers A and B. Note that A of FIG. 88 shows the conductor layer A, and B of FIG. 88 shows the conductor layer B. C of FIG. 88 shows a state in which the conductor layers A and B shown in A and B of FIG. 88 are viewed from the side of the conductor layer A. In the coordinate system in FIG. 88, the horizontal direction is the X-axis, the vertical direction is the Y-axis, and the direction perpendicular to the X-Y plane is the Z-axis.

The twenty-sixth example configuration shown in FIG. 88 has the same configuration as that of the twenty-fifth example configuration shown in FIG. 87, except for a modified portion. In FIG. 86, the components corresponding to those shown in FIG. 87 are denoted by the same reference numerals as those used in FIG. 87, and explanation of the components will not be repeated below.

In the conductor layer A of the twenty-sixth example configuration shown in A of FIG. 88, the main conductor portion 165Aa includes a mesh conductor 821Aa similar to that of the twenty-fifth example configuration shown in FIG. 87. Further, in the conductor layer A of the twenty-sixth example configuration, the extension conductor portion 165Ab includes a plurality of mesh conductors 821Ab and a plurality of conductors 941 that are similar to those of the twenty-fifth example configuration and are arranged at predetermined intervals in the Y direction. In other words, the conductor layer A of the twenty-sixth example configuration in A of FIG. 88 has a configuration modified so that the plurality of mesh conductors 821Ab and the plurality of conductors 941 of the extension conductor portion 165Ab of the twenty-fifth example configuration shown in FIG. 87 are arranged at predetermined intervals in the Y direction. Note that all of the plurality of conductors 941 may be the same, or may not be the same.

In the conductor layer B of the twenty-sixth example configuration shown in B of FIG. 88, the main conductor portion 165Ba includes a mesh conductor 822Ba similar to that of the twenty-fifth example configuration shown in FIG. 87. Further, in the conductor layer B of the twenty-sixth example configuration, the extension conductor portion 165Bb includes a plurality of mesh conductors 822Bb and a plurality of conductors 942 that are similar to those of the twenty-fifth example configuration and are arranged at predetermined intervals in the Y direction. In other words, the conductor layer B of the twenty-sixth example configuration in B of FIG. 88 has a configuration modified so that the plurality of mesh conductors 822Bb and the plurality of conductors 942 of the extension conductor portion 165Bb of the twenty-fifth example configuration shown in FIG. 87 are arranged at predetermined intervals in the Y direction. Note that all of the plurality of conductors 942 may be the same, or may not be the same.

With such a configuration, it is possible to achieve any one of the following effects: the effect to satisfy the wiring layout constraints, the effect to further increase the degree of freedom in wiring layout design, the effect to further reduce inductive noise, the effect to further reduce the voltage drop, and the like.

<Twenty-Seventh Example Configuration>

Figure 89:
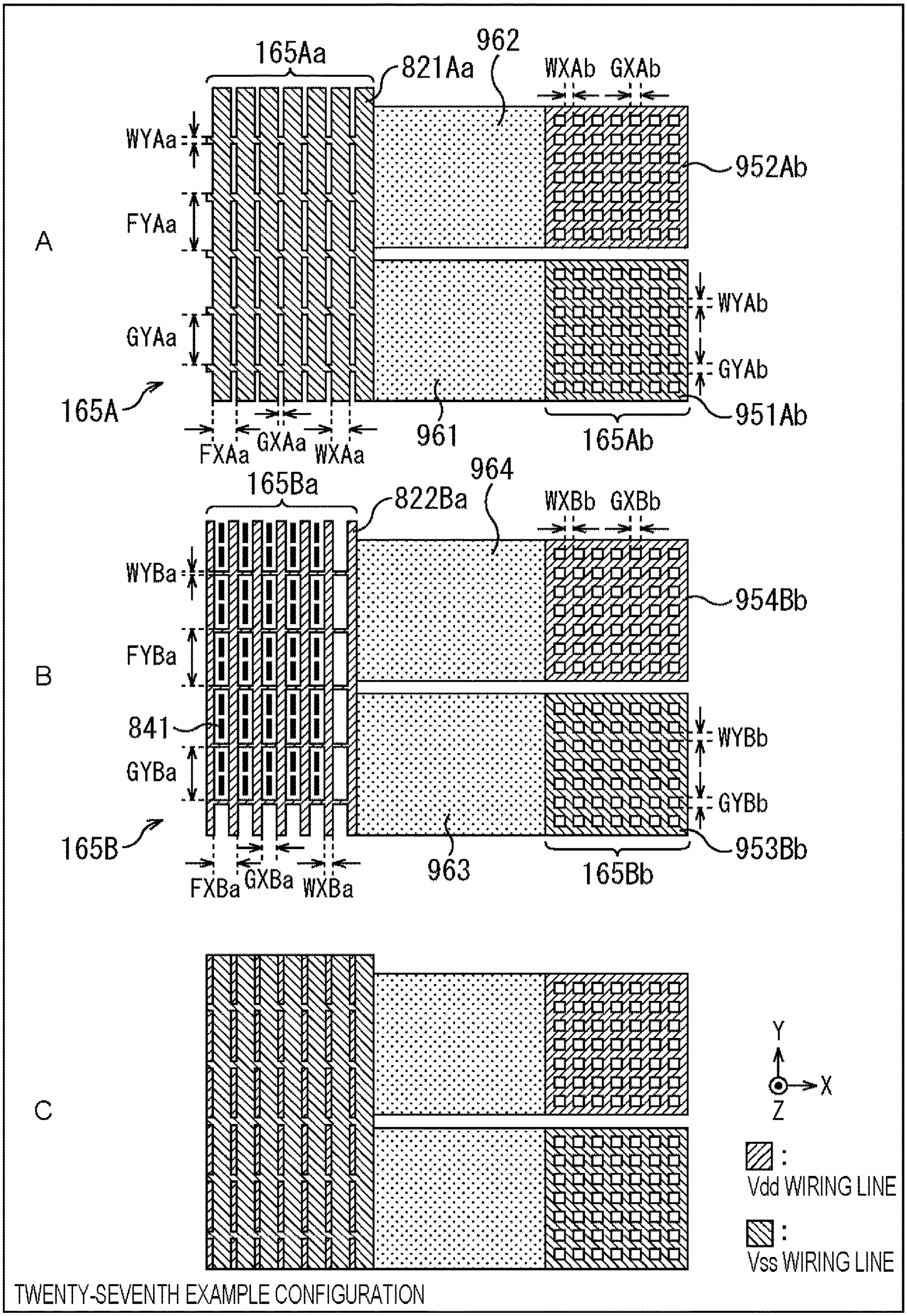
FIG. 89 is a diagram showing a twenty-seventh example configuration of the conductor layers A and B.

FIG. 89 shows a twenty-seventh example configuration of the conductor layers A and B. Note that A of FIG. 89 shows the conductor layer A, and B of FIG. 89 shows the conductor layer B. C of FIG. 89 shows a state in which the conductor layers A and B shown in A and B of FIG. 89 are viewed from the side of the conductor layer A. In the coordinate system in FIG. 89, the horizontal direction is the X-axis, the vertical direction is the Y-axis, and the direction perpendicular to the X-Y plane is the Z-axis.

The twenty-seventh example configuration shown in FIG. 89 has the same configuration as that of the twenty-sixth example configuration shown in FIG. 88, except for a modified portion. In FIG. 89, the components corresponding to those shown in FIG. 88 are denoted by the same reference numerals as those used in FIG. 88, and explanation of the components will not be repeated below.

In the conductor layer A of the twenty-seventh example configuration shown in A of FIG. 89, the main conductor portion 165Aa includes a mesh conductor 821Aa similar to that of the twenty-sixth example configuration shown in FIG. 88. The extension conductor portion 165Ab of the conductor layer A of the twenty-seventh example configuration includes a mesh conductor 951Ab and a mesh conductor 952Ab. The shapes of the mesh conductor 951Ab and the mesh conductor 952Ab each have a conductor width WXAb and a gap width GXAb in the X direction, and a conductor width WYAb and a gap width GYAb in the Y direction. However, the mesh conductor 952Ab is a wiring line (a Vdd wiring line) connected to a positive power supply, for example, and the mesh conductor 951Ab is a wiring line (a Vss wiring line) connected to GND or a negative power supply, for example.

A conductor 961 in a shape that includes a repetitive pattern as appropriate is disposed between the mesh conductor 821Aa of the main conductor portion 165Aa and the mesh conductor 951Ab of the extension conductor portion 165Ab. The repetitive pattern in the conductor 961 differs from those in the mesh conductor 821Aa and the mesh conductor 951Ab. A conductor 962 in a shape that includes a repetitive pattern as appropriate is disposed between the mesh conductor 821Aa of the main conductor portion 165Aa and the mesh conductor 952Ab of the extension conductor portion 165Ab. The repetitive pattern in the conductor 962 differs from those in the mesh conductor 821Aa and the mesh conductor 952Ab. Note that the conductor 961 or 962 preferably has a shape including a repetitive pattern to efficiently design a wiring layout. However, the conductor 961 or 962 may have a shape not including any repetitive pattern. As the patterns in the conductors 961 and 962 can have any appropriate shape, the conductors 961 and 962 in A of FIG. 89 are shown as planes, without any specific definitions.

The main conductor portion 165Ba of the conductor layer B of the twenty-seventh example configuration shown in B of FIG. 89 includes a mesh conductor 822Ba similar to that of the twenty-sixth example configuration shown in FIG. 88. The extension conductor portion 165Bb of the conductor layer B of the twenty-seventh example configuration includes a mesh conductor 953Bb and a mesh conductor 954Bb. The shapes of the mesh conductor 953Bb and the mesh conductor 954Bb each have a conductor width WXBb and a gap width GXBb in the X direction, and a conductor width WYBb and a gap width GYBb in the Y direction. However, the mesh conductor 954Bb is a wiring line (a Vdd wiring line) connected to a positive power supply, for example, and the mesh conductor 953Bb is a wiring line (a Vss wiring line) connected to GND or a negative power supply, for example.

A conductor 963 in a shape that includes a repetitive pattern as appropriate is disposed between the mesh conductor 822Ba of the main conductor portion 165Ba and the mesh conductor 953Bb of the extension conductor portion 165Bb. The repetitive pattern in the conductor 963 differs from those in the mesh conductor 822Ba and the mesh conductor 953Bb. A conductor 964 in a shape that includes a repetitive pattern as appropriate is disposed between the mesh conductor 822Ba of the main conductor portion 165Ba and the mesh conductor 954Bb of the extension conductor portion 165Bb. The repetitive pattern in the conductor 964 differs from those in the mesh conductor 822Ba and the mesh conductor 954Bb. Note that the conductor 963 or 964 preferably has a shape including a repetitive pattern to efficiently design a wiring layout. However, the conductor 963 or 964 may have a shape not including any repetitive pattern. As the patterns in the conductors 963 and 964 can have any appropriate shape, the conductors 963 and 964 in B of FIG. 89 are shown as planes, without any specific definitions.

The conductor 961 of the conductor layer A is electrically connected to the mesh conductor 821Aa of the main conductor portion 165Aa and at least one of the mesh conductor 951Ab or 953Bb of the extension conductor portions 165*b*, directly or indirectly via a conductor that is at least part of the conductor 963, for example. In other words, the mesh conductor 821Aa of the main conductor portion 165Aa and at least one of the mesh conductor 951Ab or 953Bb of the extension conductor portions 165*b* are electrically connected to each other via the conductor 961. Further, the mesh conductor 951Ab of the extension conductor portion 165Ab is electrically connected to the mesh conductor 953Bb of the extension conductor portion 165Bb of the conductor layer B through a conductor via (VIA) extending in the Z direction or the like, for example. The conductor 961 and the conductor 963 may also be electrically connected to each other through a conductor via (VIA) extending in the Z direction or the like, for example.

The conductor 964 of the conductor layer B is electrically connected to the mesh conductor 822Ba of the main conductor portion 165Ba and at least one of the mesh conductor 952Ab or 954Bb of the extension conductor portions 165*b*, directly or indirectly via a conductor that is at least part of the conductor 962, for example. In other words, the mesh conductor 822Ba of the main conductor portion 165Ba and at least one of the mesh conductor 952Ab or 954Bb of the extension conductor portions 165*b* are electrically connected to each other via the conductor 964. Further, the mesh conductor 952Ab of the extension conductor portion 165Ab is electrically connected to the mesh conductor 954Bb of the extension conductor portion 165Bb of the conductor layer B through a conductor via (VIA) extending in the Z direction or the like, for example. The conductor 962 and the conductor 964 may also be electrically connected to each other through a conductor via (VIA) extending in the Z direction or the like, for example.

For example, as for the polarities of the respective main conductor portions 165*a* and the respective extension conductor portions 165*b* in the conductor layer A and the conductor layer B at the same plane position in the twenty-sixth example configuration in FIG. 88 described above, the main conductor portion 165Aa of the conductor layer A and the main conductor portion 165Ba of the conductor layer B have different polarities between the Vss wiring line and the Vdd wiring line, and the extension conductor portion 165Ab of the conductor layer A and the extension conductor portion 165Bb of the conductor layer B also have different polarities.

On the other hand, as for the polarities of the respective main conductor portions 165*a* and the respective extension conductor portions 165*b* in the conductor layer A and the conductor layer B at the same plane position in the twenty-seventh example configuration in FIG. 89, the main conductor portion 165Aa of the conductor layer A and the main conductor portion 165Ba of the conductor layer B have different polarities between the Vss wiring line and the Vdd wiring line, but the extension conductor portion 165Ab of the conductor layer A and the extension conductor portion 165Bb of the conductor layer B have the same polarity. In a case where the upper and lower conductor layers A and B are designed with such a polar arrangement, the extension conductor portions 165*b* at which the upper and lower conductor layers A and B are electrically connected can be used as pads (electrodes).

According to the twenty-seventh example configuration, it is possible to achieve any one of the following effects: the effect to satisfy the wiring layout constraints, the effect to further increase the degree of freedom in wiring layout design, the effect to further reduce inductive noise, the effect to further reduce the voltage drop, and the like.

<Twenty-Eighth Example Configuration>

Figure 90:
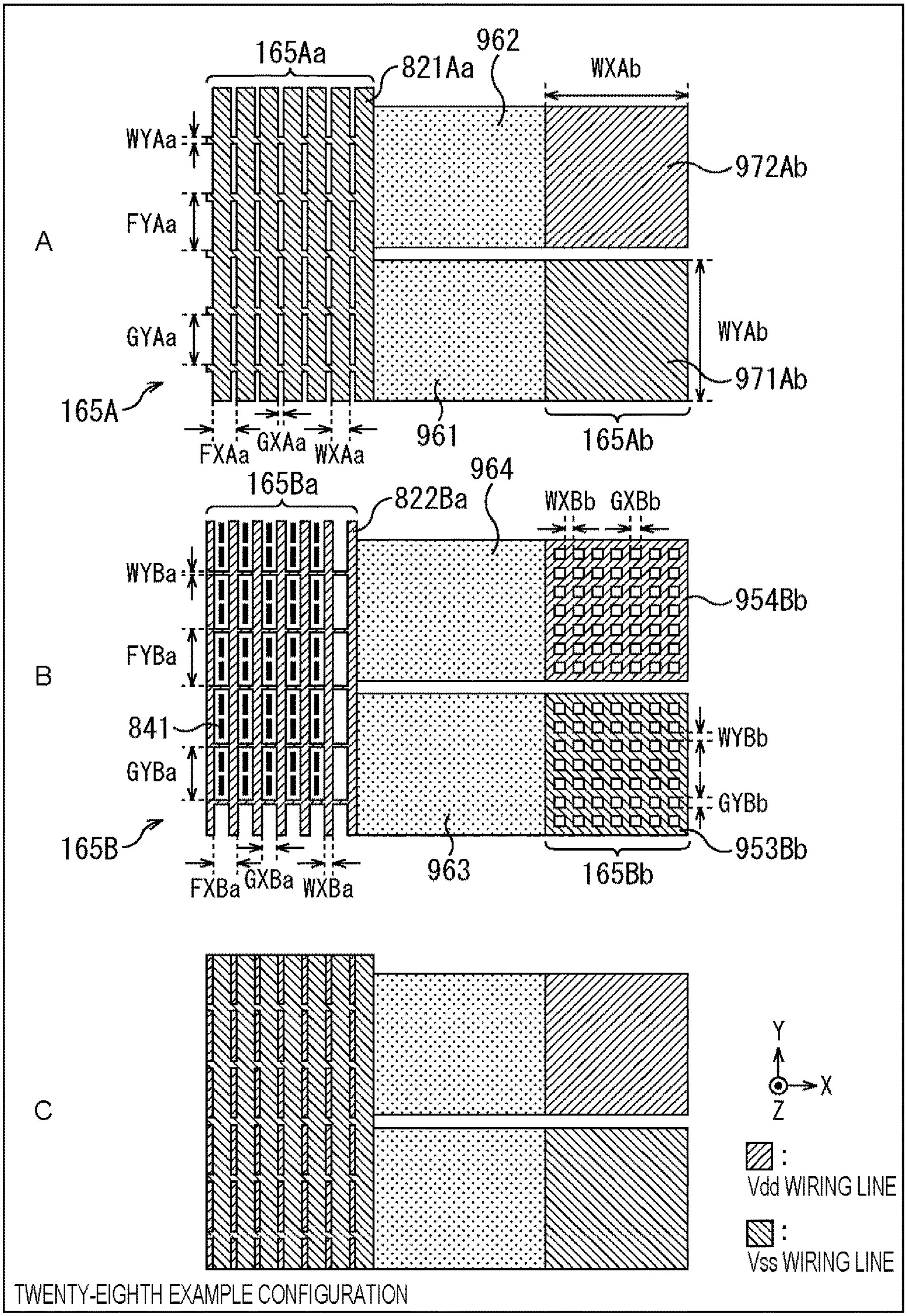
FIG. 90 is a diagram showing a twenty-eighth example configuration of the conductor layers A and B.

FIG. 90 shows a twenty-eighth example configuration of the conductor layers A and B. Note that A of FIG. 90 shows the conductor layer A, and B of FIG. 90 shows the conductor layer B. C of FIG. 90 shows a state in which the conductor layers A and B shown in A and B of FIG. 90 are viewed from the side of the conductor layer A. In the coordinate system in FIG. 90, the horizontal direction is the X-axis, the vertical direction is the Y-axis, and the direction perpendicular to the X-Y plane is the Z-axis.

The twenty-eighth example configuration shown in FIG. 90 has the same configuration as that of the twenty-seventh example configuration shown in FIG. 89, except for a modified portion. In FIG. 90, the components corresponding to those shown in FIG. 89 are denoted by the same reference numerals as those used in FIG. 89, and explanation of the components will not be repeated below.

The twenty-eighth example configuration shown in FIG. 90 differs from the twenty-seventh example configuration in FIG. 89 only in the shape of the extension conductor portion 165Ab of the conductor layer A, and is the same as the twenty-seventh example configuration in FIG. 89 in the other aspects.

Specifically, in the extension conductor portion 165Ab of the conductor layer A in the twenty-seventh example configuration in FIG. 89, the mesh conductor 951Ab and the mesh conductor 952Ab each having a shape that has the conductor width WXAb and the gap width GXAb in the X direction and the conductor width WYAb and the gap width GYAb in the Y direction are formed.

On the other hand, in the extension conductor portion 165Ab of the conductor layer A in the twenty-eighth example configuration in FIG. 90, a planar conductor 971Ab and a planar conductor 972Ab each having a shape that has a conductor width WXAb in the X direction and a conductor width WYAb in the Y direction are formed.

In other words, in the extension conductor portion 165Ab of the conductor layer A of the twenty-eighth example configuration in FIG. 90, the planar conductor 971Ab is provided in place of the mesh conductor 951Ab of the twenty-seventh example configuration in FIG. 89, and the planar conductor 972Ab is provided in place of the mesh conductor 952Ab.

The twenty-seventh example configuration shown in FIG. 89 is an example in which the extension conductor portions 165*b* of the upper and lower conductor layers A and B have the same shape. However, the extension conductor portions 165*b* may have different shapes, as in the twenty-eighth example configuration in FIG. 90.

Furthermore, in the twenty-eighth example configuration in FIG. 90, the extension conductor portion 165Ab of the conductor layer A has a flat shape. However, a mesh conductor 973Ab and a mesh conductor 974Ab of the extension conductor portion 165Ab of the conductor layer A shown in A of FIG. 91 have the same mesh-like form. The mesh conductor 973Ab of the conductor layer A in A of FIG. 91 and the mesh conductor 953Bb of the conductor layer B in B of FIG. 90 may constitute a light blocking structure, and the mesh conductor 974Ab of the conductor layer A in A of FIG. 91 and the mesh conductor 954Bb of the conductor layer B in B of FIG. 90 may constitute a light blocking structure. Further, the conductor width WXAb or the gap width GXAb in the X direction, and the conductor width WYAb or the gap widths GYAb in the Y direction may be designed to be substantially the same as those of the mesh conductor 953Bb or the mesh conductor 954Bb of the extension conductor portion 165Bb of the conductor layer B.

Figure 91:
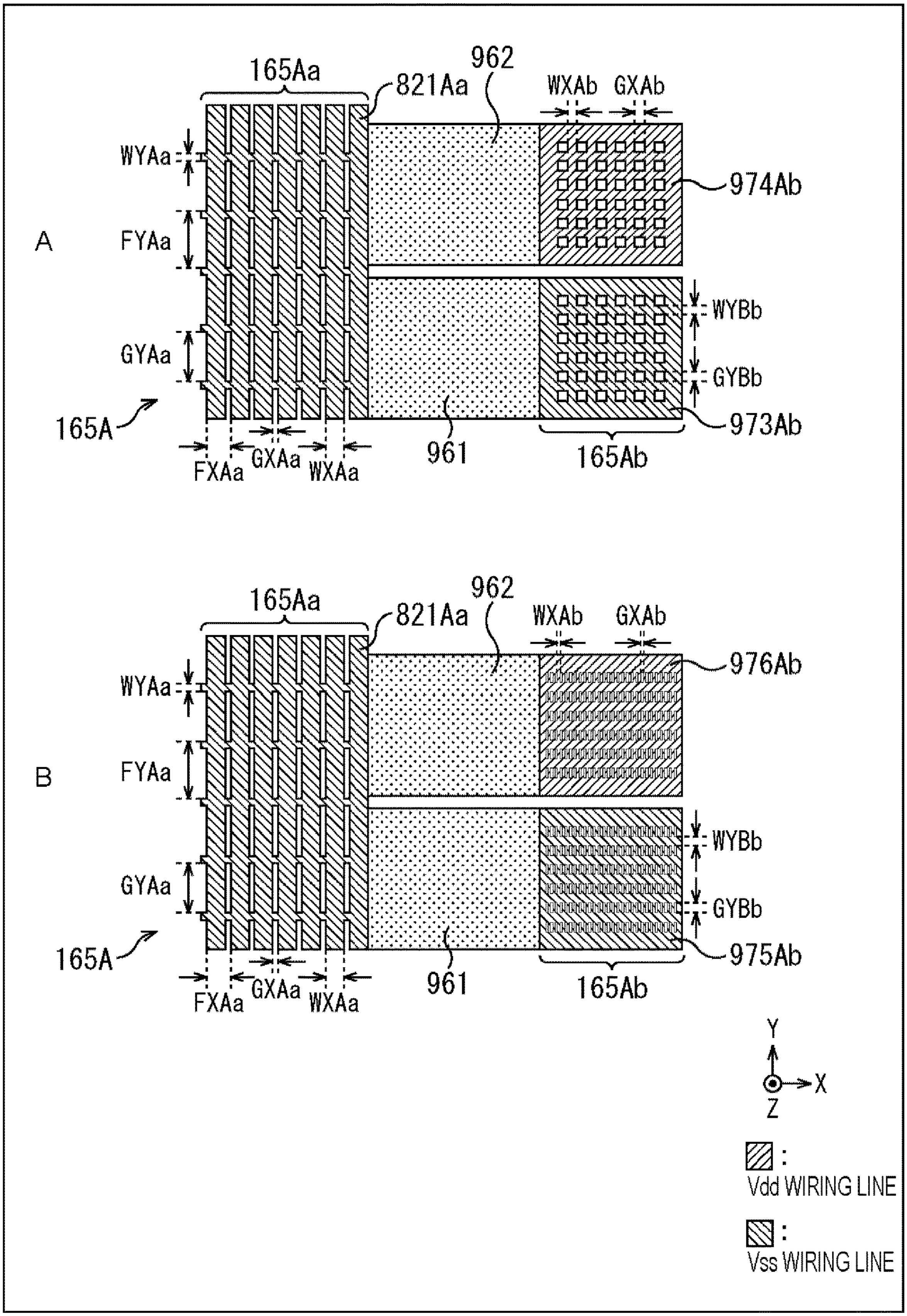
FIG. 91 is a diagram showing other example configurations of the conductor layer A in the twenty-eighth example configuration.

Alternatively, as in a mesh conductor 975Ab and a mesh conductor 976Ab of the extension conductor portion 165Ab of the conductor layer A shown in B of FIG. 91, the conductor width WXAb or the gap width GXAb in the X direction may be designed to be smaller than that of the mesh conductor 953Bb or the mesh conductor 954Bb of the extension conductor portion 165Bb of the conductor layer B in B of FIG. 90. Further, the mesh conductor 975Ab of the conductor layer A in B of FIG. 91 and the mesh conductor 953Bb of the conductor layer B in B of FIG. 90 may constitute a light blocking structure, and the mesh conductor 976Ab of the conductor layer A in B of FIG. 91 and the mesh conductor 954Bb of the conductor layer B in B of FIG. 90 may constitute a light blocking structure. Although not shown in the drawings, in addition to the above, the conductor width WYAb or the gap width GYAb in the Y direction of the extension conductor portion 165Ab of the conductor layer A may be designed to be smaller than that of the mesh conductor 953Bb or the mesh conductor 954Bb of the extension conductor portion 165Bb of the conductor layer B. The conductor width WXAb or the gap width GXAb in the X direction and the conductor width WYAb or the gap width GYAb in the Y direction of the extension conductor portion 165Ab of the conductor layer A may be designed to be greater than those of the mesh conductor 953Bb or the mesh conductor 954Bb of the extension conductor portion 165Bb of the conductor layer B.

A and B of FIG. 91 show other example configurations of the conductor layer A of the twenty-eighth example configuration in FIG. 90.

<Summary of the Fourteenth Through Twenty-Eighth Example Configurations>

In the fourteenth through twenty-eighth example configurations shown in FIGS. 65 through 90, the repetitive patterns in the main conductor portions 165*a* and the extension conductor portions 165*b* of both the conductor layer A and the conductor layer B are formed with different patterns (shapes).

The conductor layer A (a first conductor layer) includes: the main conductor portion 165Aa (a first conductor portion) including a conductor of a shape in which a planar, linear, or mesh repetitive pattern (a first basic pattern) is repeatedly disposed in the same plane in the X direction or the Y direction; and the extension conductor portion 165Ab (a fourth conductor portion) including a conductor of a shape in which a planar, linear, or mesh repetitive pattern (a fourth basic pattern) is repeatedly disposed in the same plane in the X direction or the Y direction. Here, the repetitive pattern in the conductor of the main conductor portion 165Aa and the repetitive pattern in the conductor of the extension conductor portion 165Ab have different shapes, and a conductor having a different pattern from those patterns may exist between the conductor of the main conductor portion 165Aa and the conductor of the extension conductor portion 165Ab.

The conductor layer B (a second conductor layer) includes: the main conductor portion 165Ba (a second conductor portion) including a conductor of a shape in which a planar, liner, or mesh repetitive pattern (a second basic pattern) is repeatedly disposed in the same plane in the X direction or the Y direction; and the extension conductor portion 165Bb (a third conductor portion) including a conductor of a shape in which a planar, linear, or mesh repetitive pattern (a third basic pattern) is repeatedly disposed in the same plane in the X direction or the Y direction. Here, the repetitive pattern in the conductor of the main conductor portion 165Ba and the repetitive pattern in the conductor of the extension conductor portion 165Bb have different shapes, and a conductor having a different pattern from those patterns may exist between the conductor of the main conductor portion 165Ba and the conductor of the extension conductor portion 165Bb.

In the respective example configurations described above, the conductors described as wiring lines (Vss wiring lines) connected to GND or a negative power supply may be wiring lines (Vdd wiring lines) connected to a positive power supply, for example, and the conductors described as wiring lines (Vdd wiring lines) connected to a positive power supply may be wiring lines (Vss wiring lines) connected to GND or a negative power supply, for example.

In each of the example configurations described above, the total length LAa in the Y direction of the conductor of the main conductor portion 165Aa is designed to be greater than the total length LAb in the Y direction of the conductor of the extension conductor portion 165Ab. However, the total length LAa and the total length LAb may be designed to be the same or substantially the same, or the total length LAa may be designed to be smaller than the total length LAb.

Likewise, the total length LBa in the Y direction of the main conductor portion 165Ba is designed to be greater than the total length LBb in the Y direction of the extension conductor portion 165Bb. However, the total length LBa and the total length LBb may be designed to be the same or substantially the same, or the total length LBa may be designed to be smaller than the total length LBb.

In the example configurations using a repetitive pattern in which current flows more easily in the Y direction than in the X direction as an example repetitive pattern in the main conductor portion 165Aa and the main conductor portion 165Ba among the respective example configurations described above, the repetitive pattern may be replaced with an example repetitive pattern in which current flows easily in the X direction. To the contrary, in an example configuration using a repetitive pattern in which current flows more easily in the X direction than in the Y direction, the repetitive pattern may be replaced with an example repetitive pattern in which current flows easily in the Y direction. Alternatively, the example repetitive pattern may be a pattern in which current flows easily to the same extent in the X direction and the Y direction.

In each of the example configurations described above, the patterns in the conductors of the main conductor portion 165Aa of the conductor layer A (the wiring layer 165) and the main conductor portion 165Ba of the conductor layer B (the wiring layer 165B) may have the configuration of any of the patterns described in the first through thirteenth example configurations. Although an example in which all the conductor cycles, all the conductor widths, and all the gap widths are uniform has been described in some of the example configurations described above, the present technology is not limited to this. For example, the conductor cycles, the conductor widths, and the gap widths may be non-uniform, or the conductor cycles, the conductor widths, and the gap widths may vary depending on the positions in some configurations. Further, in some of the example configurations described above, an example in which the conductor cycles, the conductor widths, the gap widths, the wiring shapes, the wiring positions, the numbers of wiring lines, or the like are substantially the same between the Vdd wiring lines and the Vss wiring lines has been described. However, the present technology is not limited to this. For example, between the Vdd wiring lines and the Vss wiring lines, the conductor cycles may vary, the conductor widths may vary, the gap widths may vary, the wiring shapes may vary, the wiring positions may vary, the wiring positions may have shifts or deviations, or the numbers of wiring lines may vary.

<10. Example Configurations of Connections with Pads>

Next, the relationship between the conductor layers A and B and the pads is described, with reference to FIGS. 92 through 108.

Figure 92:
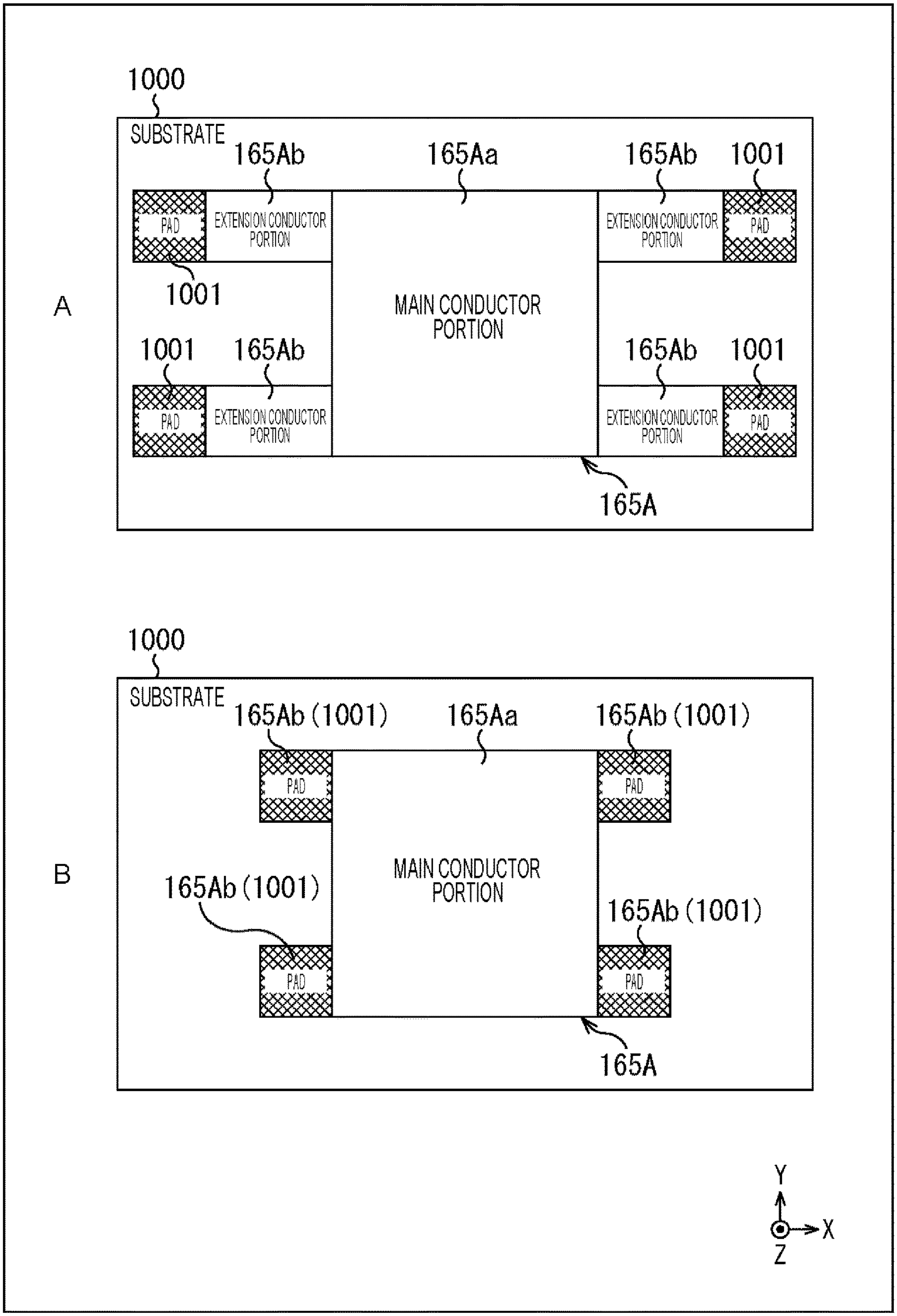
FIG. 92 is plan views showing the entire conductor layer A formed on a substrate.

FIG. 92 is a plan view showing the entire conductor layer A formed on a substrate.

As described above, the conductor layer A (the wiring layer 165A) includes the main conductor portion 165Aa and the extension conductor portions 165Ab.

In a case where pads are provided separately from the conductor layer A, the extension conductor portions 165Ab are disposed at positions near pads 1001, and connects the main conductor portion 165Aa and the pads 1001, as shown in A of FIG. 92. On the other hand, as shown in B of FIG. 92, the extension conductor portions 165Ab may form the pads 1001.

The main conductor portion 165Aa having a larger area than the extension conductor portions 165Ab is formed in a principal region of a substrate 1000, such as a central region of a substrate, for example, and blocks light from entering active elements such as MOMS transistors and diodes formed in the region of the main conductor portion 165Aa or on another layer in the Z direction perpendicular to the surface of the region of the main conductor portion 165Aa.

Note that FIG. 92 shows an example of the layout and the shape of the conductor layer A, and the layout and the shape of the conductor layer A are not limited to this example. Accordingly, the positions and the areas of the main conductor portion 165Aa, the extension conductor portions 165Ab, and the pads 1001 formed in the substrate 1000 may be determined as appropriate, and active elements may not be formed in the regions of the main conductor portion 165Aa and the extension conductor portions 165Ab or in another layer in the Z direction perpendicular to the surfaces of these regions. The extension conductor portions 165Ab are not necessarily disposed near the pads 1001. Further, the positions of the extension conductor portions 165Ab and the pads 1001 relative to the main conductor portion 165Aa may be on the Y-direction sides, or on both the X-direction sides and the Y-direction sides, instead of the X-direction sides of the four sides of the main conductor portion 165Aa as shown in FIG. 92. Further, the number of pads 1001 may be one, or three or more, instead of two on each side as shown in FIG. 92.

FIG. 92 shows an example of the conductor layer A (the wiring layer 165A), but the same applies to the conductor layer B (the wiring layer 165B).

With such a configuration, it is possible to achieve any one of the following effects: the effect to satisfy the wiring layout constraints, the effect to further increase the degree of freedom in wiring layout design, the effect to further reduce inductive noise, the effect to further reduce the voltage drop, and the like.

In FIG. 92, the pads 1001 are not specifically distinguished as electrodes (Vdd electrodes) connected to a positive power supply, or as electrodes (Vss electrodes) connected to GND or a negative power supply, for example. In the description below, however, the layouts of the pads 1001 in cases where the pads 1001 are distinguished will be explained.

<Fourth Example Layout of Pads>

Figure 93:
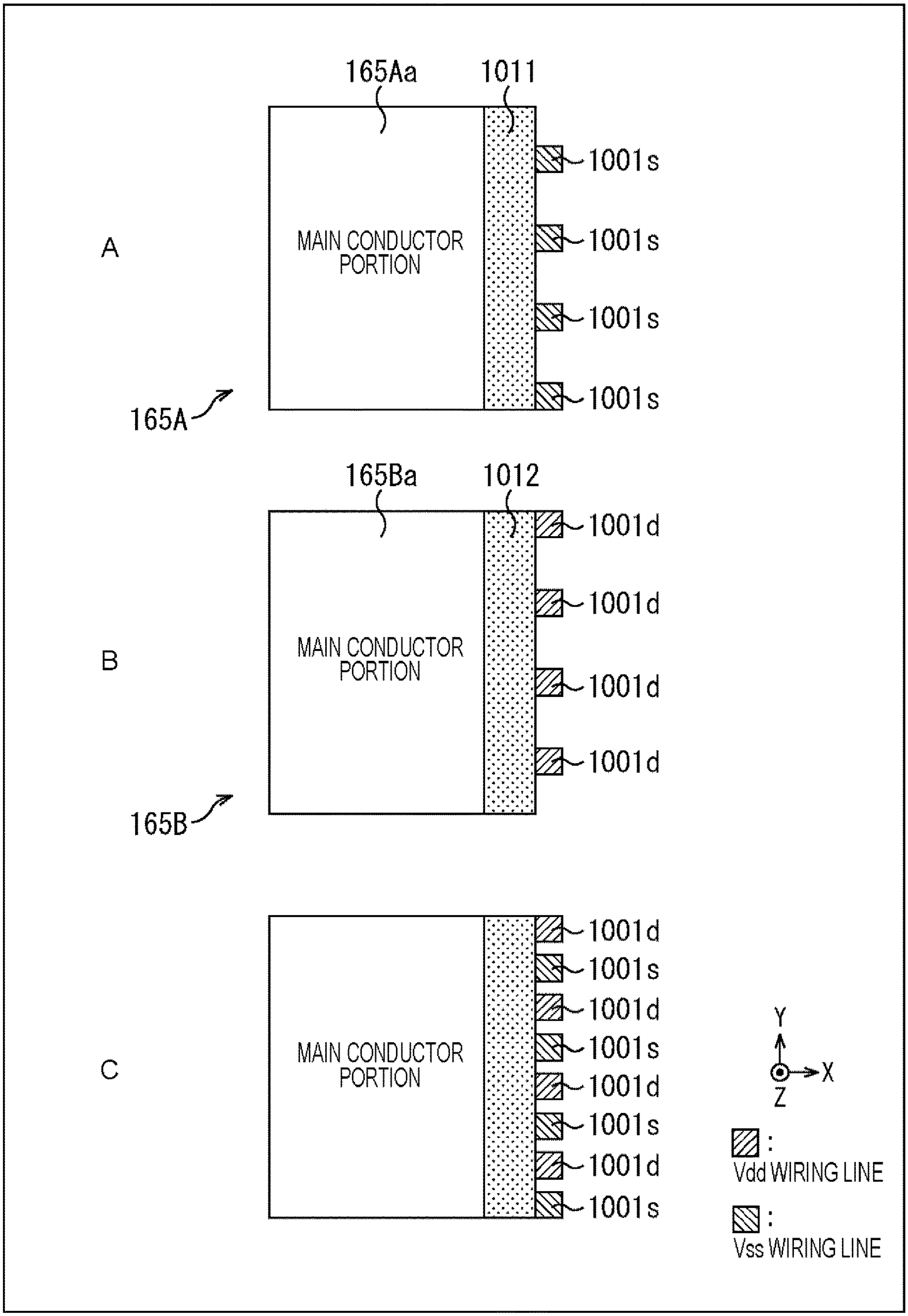
FIG. 93 is plan views showing a fourth example layout of pads.

FIG. 93 shows a fourth example layout of pads.

A of FIG. 93 is a plan view showing the conductor layer A (the wiring layer 165A), and an example layout of pads 1001_s_ connected to the conductor layer A.

B of FIG. 93 is a plan view showing the conductor layer B (the wiring layer 165B), and an example layout of pads 1001_d_ connected to the conductor layer B.

C of FIG. 93 is a plan view showing a state in which the conductor layers A and B shown in A and B of FIG. 93, and the pads 1001_s_ and the pads 1001_d_ are stacked.

In FIG. 93, the pads 1001_s_ represent pads 1001 to which GND or a negative power supply (Vss) is supplied, for example, and the pads 1001_d_ represent pads 1001 to which a positive power supply (Vdd) is supplied, for example.

As shown in A of FIG. 93, the plurality of pads 1001_s_ is connected, at predetermined intervals, to a predetermined side of the rectangular main conductor portion 165Aa, via a conductor 1011 of a shape that includes a predetermined repetitive pattern as appropriate. Each of the pads 1001_s_ may be formed with an extension conductor portion 165Ab as in the twenty-seventh example configuration shown in FIG. 89, or the conductor 1011 may be formed with an extension conductor portion 165Ab, for example. Further, in a case where the pads 1001_s_ are extension conductor portions 165Ab, the conductor 1011 may not be included or may be included.

As shown in B of FIG. 93, the plurality of pads 1001_d_ is connected, at predetermined intervals, to a predetermined side of the rectangular main conductor portion 165Ba, via a conductor 1012 of a shape that includes a predetermined repetitive pattern as appropriate. The predetermined side is the same side as the side on which the pads 1001_s_ are disposed in the conductor layer A. Each of the pads 1001_d_ may be formed with an extension conductor portion 165Bb as in the twenty-seventh example configuration shown in FIG. 89, or the conductor 1012 may be formed with an extension conductor portion 165Bb, for example. Further, in a case where the pads 1001_d_ are extension conductor portions 165Bb, the conductor 1012 may not be included or may be included.

As shown in C of FIG. 93, where the conductor layers A and B are stacked, the layout of the pads 1001_s_ and the pads 1001_d_ is an alternate arrangement in which the pads 1001_s_ and the pads 1001_d_ are alternately arranged in the Y direction. In this case, as described above with reference to FIGS. 42 through 44, the magnetic fields generated from the respective conductor layers A and B and the induced electromotive force based on the magnetic fields can be effectively canceled out, and thus, inductive noise can be further reduced. However, this layout is not symmetrical about the Y direction. Therefore, in a case where the pads 1001 are disposed over a wide range, or where the main conductor portion 165Aa or 165Ba, the extension conductor portions 165Ab or 165Bb, or the conductor 1011 or 1012 is long in the array direction of the pads 1001 (or longer in the Y direction than in the X direction in FIG. 93), some magnetic fields cannot be completely canceled out. As a result, the induced electromotive force accumulates and increases as the victim conductor loop becomes larger, and inductive noise might increase in some cases.

<Fifth Example Layout of Pads>

Figure 94:
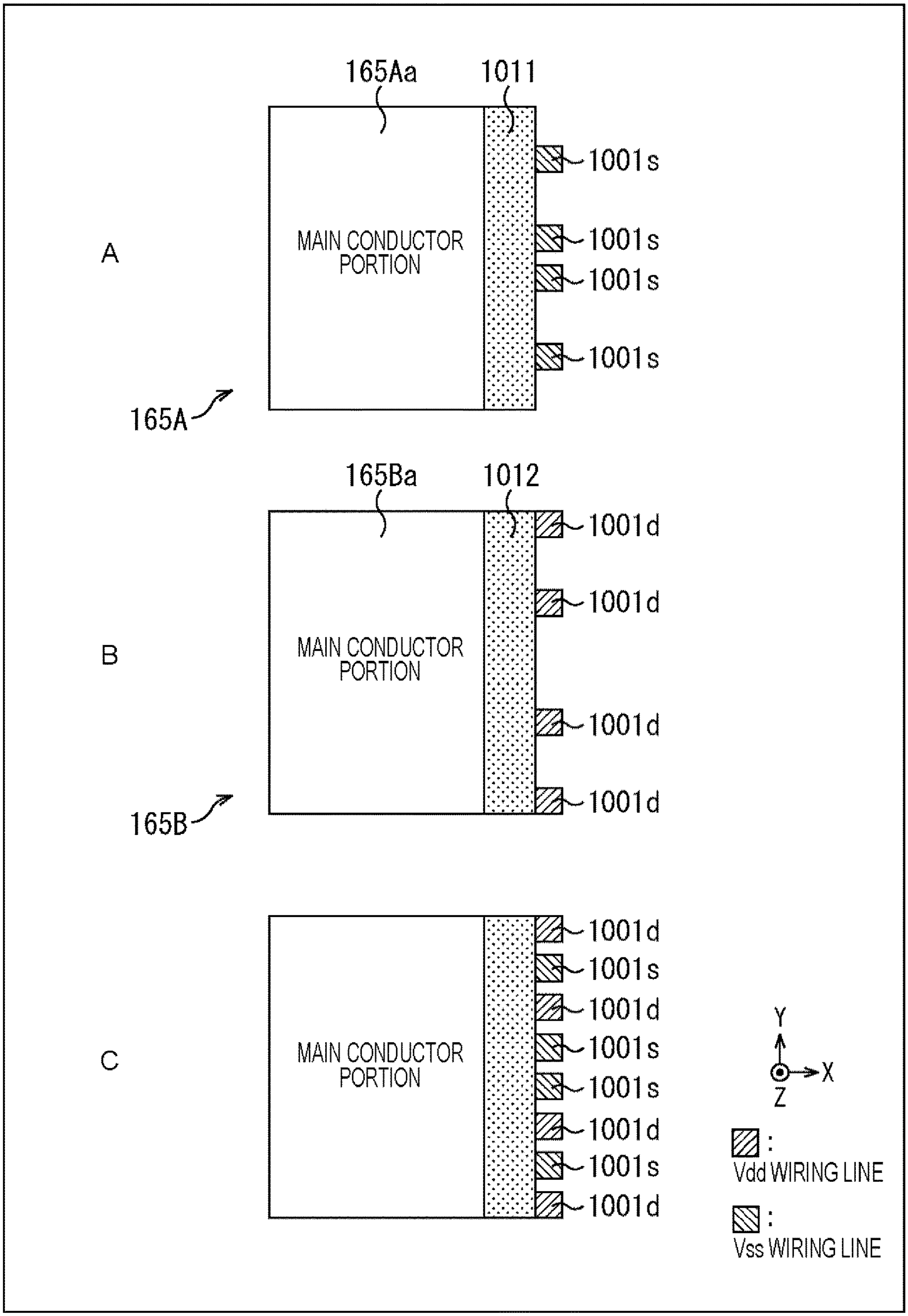
FIG. 94 is plan views showing a fifth example layout of pads.

FIG. 94 shows a fifth example layout of pads.

A of FIG. 94 is a plan view showing the conductor layer A (the wiring layer 165A), and an example layout of pads 1001_s_ connected to the conductor layer A.

B of FIG. 94 is a plan view showing the conductor layer B (the wiring layer 165B), and an example layout of pads 1001_d_ connected to the conductor layer B.

C of FIG. 94 is a plan view showing a state in which the conductor layers A and B shown in A and B of FIG. 94, and the pads 1001_s_ and the pads 1001_d_ are stacked.

In FIG. 94, the pads 1001_s_ represent pads 1001 to which GND or a negative power supply is supplied, for example, and the pads 1001_d_ represent pads 1001 to which a positive power supply is supplied, for example.

As shown in A of FIG. 94, the plurality of pads 1001_s_ is connected, at predetermined intervals, to a predetermined side of the rectangular main conductor portion 165Aa, via a conductor 1011 of a shape that includes a predetermined repetitive pattern as appropriate. Each of the pads 1001_s_ may be formed with an extension conductor portion 165Ab, or the conductor 1011 may be formed with an extension conductor portion 165Ab. Further, in a case where the pads 1001_s_ are extension conductor portions 165Ab, the conductor 1011 may not be included or may be included.

As shown in B of FIG. 94, the plurality of pads 1001_d_ is connected, at predetermined intervals, to a predetermined side of the rectangular main conductor portion 165Ba, via a conductor 1012 of a shape that includes a predetermined repetitive pattern as appropriate. The predetermined side is the same side as the side on which the pads 1001_s_ are disposed in the conductor layer A. Each of the pads 1001_d_ may be formed with an extension conductor portion 165Bb, or the conductor 1012 may be formed with an extension conductor portion 165Bb. Further, in a case where the pads 1001_d_ are extension conductor portions 165Bb, the conductor 1012 may not be included or may be included.

As shown in C of FIG. 94, where the conductor layers A and B are stacked, the layout of the pads 1001_s_ and the pads 1001_d_ is a mirror-symmetry arrangement in which each four consecutive pads 1001 consisting of pads 1001_s_ and pads 1001_d_ aligned in the Y direction form one set, and the respective sets of pads 1001 are sequentially arranged in the Y direction in a mirror-symmetrical manner. In this case, the magnetic fields generated from the respective conductor layers A and B and the induced electromotive force based on the magnetic fields can be more effectively canceled out than is the alternate arrangement shown in FIG. 93, and thus, inductive noise can be further reduced depending on the layout of the components other than the pads.

<Sixth Example Layout of Pads>

Figure 95:
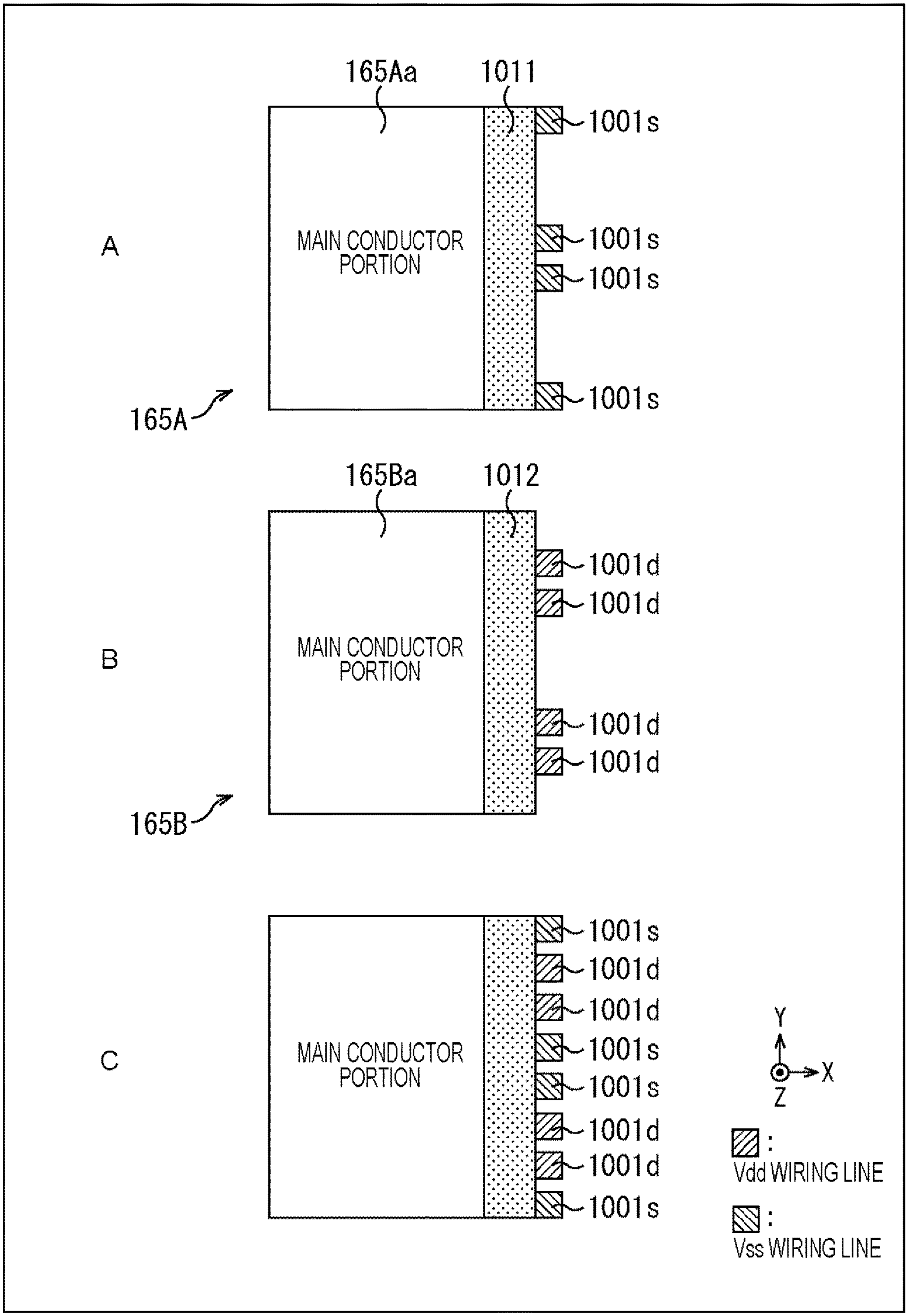
FIG. 95 is plan views showing a sixth example layout of pads.

FIG. 95 shows a sixth example layout of pads.

A of FIG. 95 is a plan view showing the conductor layer A (the wiring layer 165A), and an example layout of pads 1001_s_ connected to the conductor layer A.

B of FIG. 95 is a plan view showing the conductor layer B (the wiring layer 165B), and an example layout of pads 1001_d_ connected to the conductor layer B.

C of FIG. 95 is a plan view showing a state in which the conductor layers A and B shown in A and B of FIG. 95, and the pads 1001_s_ and the pads 1001_d_ are stacked.

In FIG. 95, the pads 1001_s_ represent pads 1001 to which GND or a negative power supply is supplied, for example, and the pads 1001_d_ represent pads 1001 to which a positive power supply is supplied, for example.

As shown in A of FIG. 95, the plurality of pads 1001_s_ is connected, at predetermined intervals, to a predetermined side of the rectangular main conductor portion 165Aa, via a conductor 1011 of a shape that includes a predetermined repetitive pattern as appropriate. Each of the pads 1001_s_ may be formed with an extension conductor portion 165Ab, or the conductor 1011 may be formed with an extension conductor portion 165Ab. Further, in a case where the pads 1001_s_ are extension conductor portions 165Ab, the conductor 1011 may not be included or may be included.

As shown in B of FIG. 95, the plurality of pads 1001_d_ is connected, at predetermined intervals, to a predetermined side of the rectangular main conductor portion 165Ba, via a conductor 1012 of a shape that includes a predetermined repetitive pattern as appropriate. The predetermined side is the same side as the side on which the pads 1001_s_ are disposed in the conductor layer A. Each of the pads 1001_d_ may be formed with an extension conductor portion 165Bb, or the conductor 1012 may be formed with an extension conductor portion 165Bb. Further, in a case where the pads 1001_d_ are extension conductor portions 165Bb, the conductor 1012 may not be included or may be included.

As shown in C of FIG. 95, where the conductor layers A and B are stacked, the layout of the pads 1001_s_ and the pads 1001_d_ is a mirror-symmetry arrangement in which each four consecutive pads 1001 consisting of pads 1001_s_ and pads 1001_d_ aligned in the Y direction form one set, and the respective sets of pads 1001 are sequentially arranged in the Y direction in a mirror-symmetrical manner. Further, the four pads 1001 consisting of pads 1001_s_ and pads 1001_d_ in each one set are in a mirror-symmetry arrangement in which sets of two pads 1001 are arranged in a mirror-symmetrical manner about the center line in the Y direction. In the case of such a two-stage mirror arrangement, the range in which the remaining magnetic fields accumulate is narrower than that in the one-stage mirror arrangement shown in FIG. 94. Thus, the induced electromotive force can be more effectively canceled out, and inductive noise can be further reduced depending on the layout of the components other than the pads.

<Seventh Example Layout of Pads>

Figure 96:
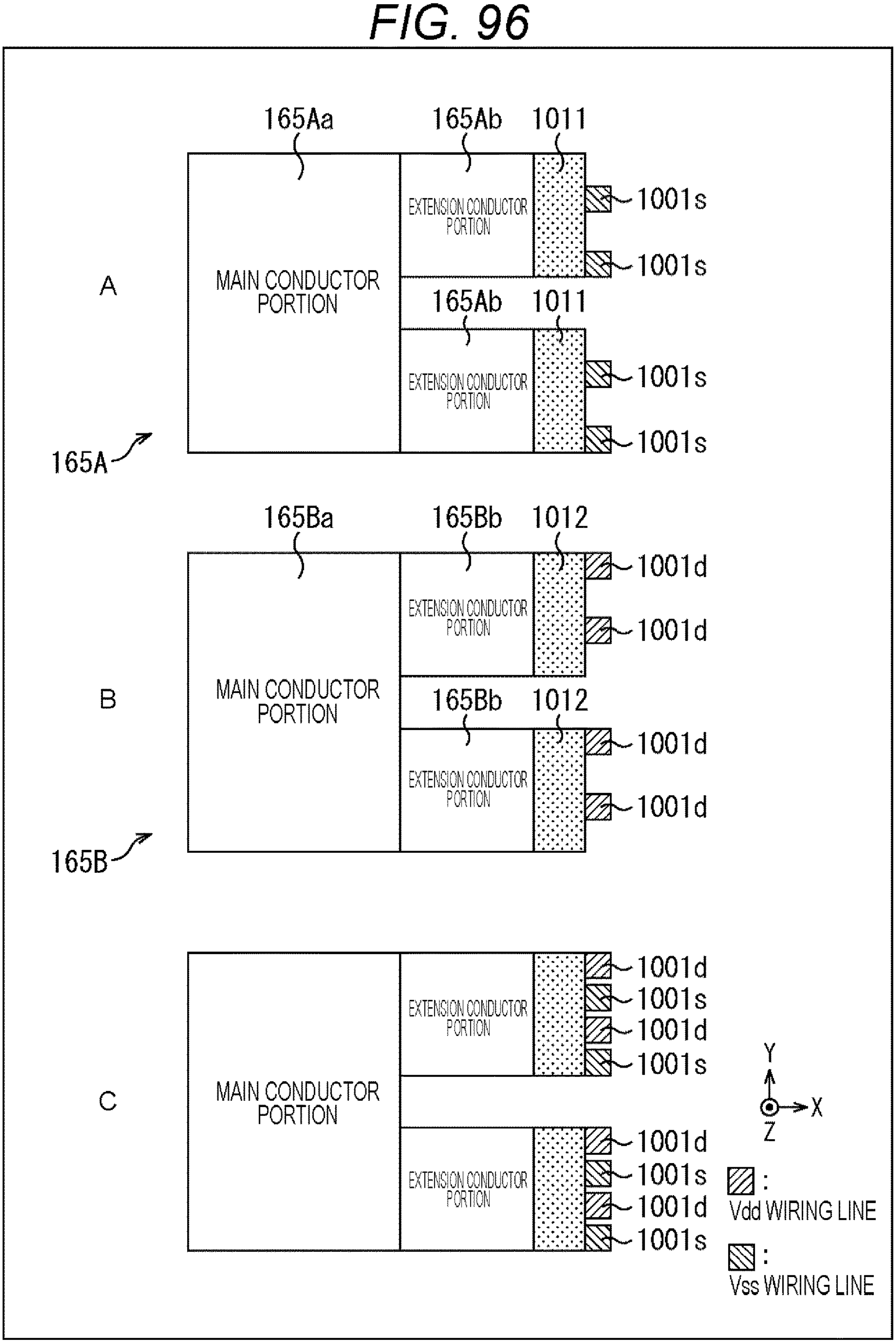
FIG. 96 is plan views showing a seventh example layout of pads.

FIG. 96 shows a seventh example layout of pads.

A of FIG. 96 is a plan view showing the conductor layer A (the wiring layer 165A), and an example layout of pads 1001_s_ connected to the conductor layer A.

B of FIG. 96 is a plan view showing the conductor layer B (the wiring layer 165B), and an example layout of pads 1001*d* connected to the conductor layer B.

C of FIG. 96 is a plan view showing a state in which the conductor layers A and B shown in A and B of FIG. 96, and the pads 1001*s* and the pads 1001*d* are stacked.

In FIG. 96, the pads 1001*s* represent pads 1001 to which GND or a negative power supply is supplied, for example, and the pads 1001*d* represent pads 1001 to which a positive power supply is supplied, for example.

As shown in A of FIG. 96, a plurality of extension conductor portions 165Ab is connected to a predetermined side of the rectangular main conductor portion 165Aa, and the plurality of pads 1001*s* is connected, at predetermined intervals, to outer peripheral portions of the respective extension conductor portions 165Ab, via conductors 1011 of a shape that includes a predetermined repetitive pattern as appropriate. The conductors 1011 may not be included, or may be included. Also, the conductors 1011 may be disposed between the main conductor portion 165Aa and the extension conductor portions 165Ab.

As shown in B of FIG. 96, a plurality of extension conductor portions 165Bb is connected to a predetermined side of the rectangular main conductor portion 165Ba, and the plurality of pads 1001*d* is connected, at predetermined intervals, to outer peripheral portions of the respective extension conductor portions 165Bb, via conductors 1012 of a shape that includes a predetermined repetitive pattern as appropriate. The conductors 1012 may not be included, or may be included. Also, the conductors 1012 may be disposed between the main conductor portion 165Ba and the extension conductor portions 165Bb.

As shown in C of FIG. 96, where the conductor layers A and B are stacked, the layout of the pads 1001*s* and the pads 1001*d* is an alternate arrangement in which the pads 1001*s* and the pads 1001*d* are alternately arranged in the Y direction. In this case, the magnetic fields generated from the respective conductor layers A and B and the induced electromotive force based on the magnetic fields can be effectively canceled out, and thus, inductive noise can be further reduced. However, this layout is not symmetrical about the Y direction. Therefore, in a case where the pads 1001 are disposed over a wide range, or where the main conductor portion 165Aa or 165Ba, the extension conductor portions 165Ab or 165Bb, or the conductors 1011 or 1012 are long in the array direction of the pads 1001 (or longer in the Y direction than in the X direction in FIG. 96), some magnetic fields cannot be completely canceled out. As a result, the induced electromotive force accumulates and increases as the victim conductor loop becomes larger, and inductive noise might increase in some cases.

<Eighth Example Layout of Pads>

Figure 97:
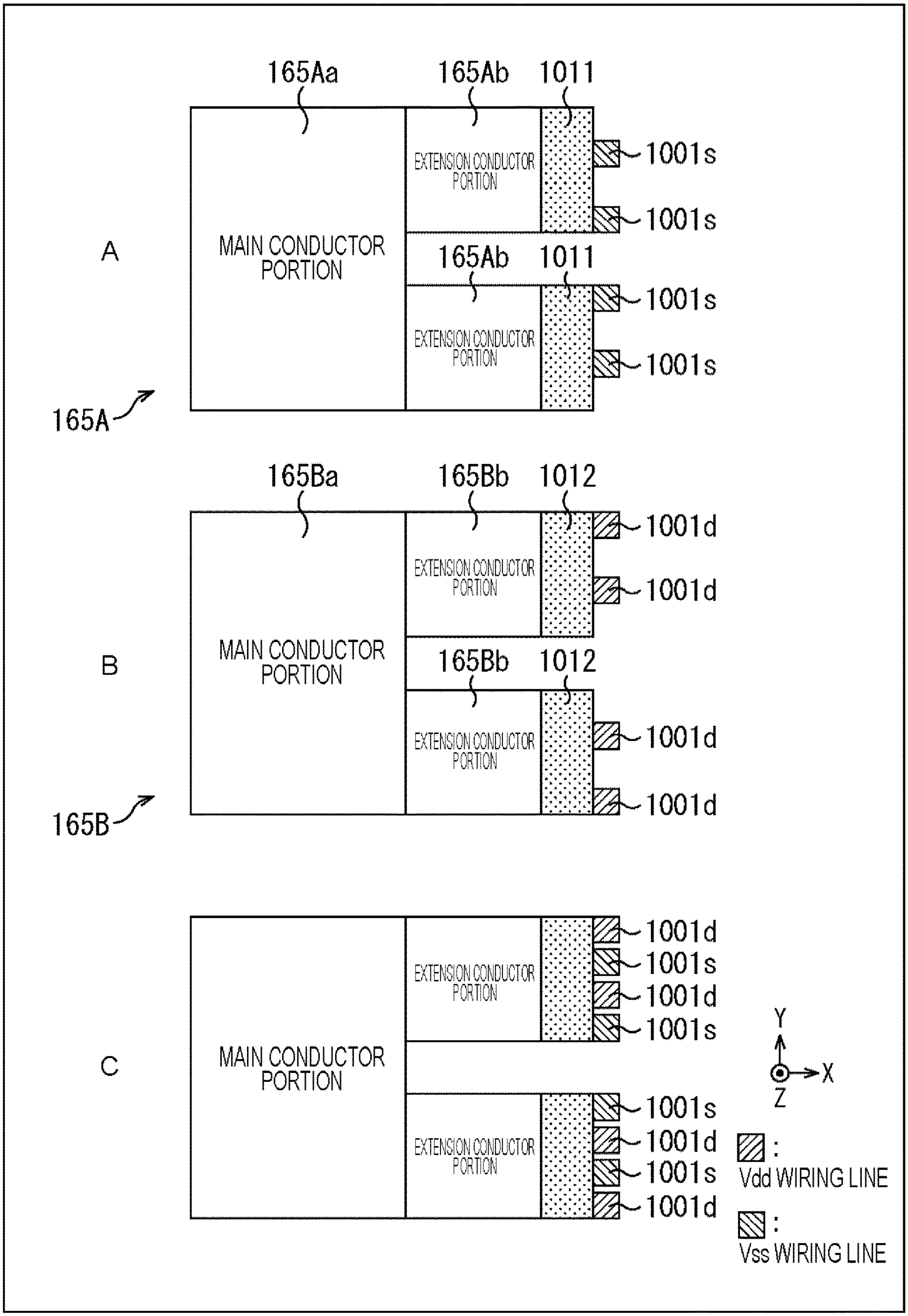
FIG. 97 is plan views showing an eighth example layout of pads.

FIG. 97 shows an eighth example layout of pads.

A of FIG. 97 is a plan view showing the conductor layer A (the wiring layer 165A), and an example layout of pads 1001*s* connected to the conductor layer A.

B of FIG. 97 is a plan view showing the conductor layer B (the wiring layer 165B), and an example layout of pads 1001*d* connected to the conductor layer B.

C of FIG. 97 is a plan view showing a state in which the conductor layers A and B shown in A and B of FIG. 97, and the pads 1001*s* and the pads 1001*d* are stacked.

In FIG. 97, the pads 1001*s* represent pads 1001 to which GND or a negative power supply is supplied, for example, and the pads 1001*d* represent pads 1001 to which a positive power supply is supplied, for example.

As shown in A of FIG. 97, a plurality of extension conductor portions 165Ab is connected to a predetermined side of the rectangular main conductor portion 165Aa, and the plurality of pads 1001*s* is connected, at predetermined intervals, to outer peripheral portions of the respective extension conductor portions 165Ab, via conductors 1011 of a shape that includes a predetermined repetitive pattern as appropriate. The conductors 1011 may not be included, or may be included. Also, the conductors 1011 may be disposed between the main conductor portion 165Aa and the extension conductor portions 165Ab.

As shown in B of FIG. 97, a plurality of extension conductor portions 165Bb is connected to a predetermined side of the rectangular main conductor portion 165Ba, and the plurality of pads 1001*d* is connected, at predetermined intervals, to outer peripheral portions of the respective extension conductor portions 165Bb, via conductors 1012 of a shape that includes a predetermined repetitive pattern as appropriate. The conductors 1012 may not be included, or may be included. Also, the conductors 1012 may be disposed between the main conductor portion 165Ba and the extension conductor portions 165Bb.

As shown in C of FIG. 97, where the conductor layers A and B are stacked, the layout of the pads 1001*s* and the pads 1001*d* is a mirror-symmetry arrangement in which each four consecutive pads 1001 consisting of pads 1001*s* and pads 1001*d* aligned in the Y direction form one set, and the respective sets of pads 1001 are sequentially arranged in the Y direction in a mirror-symmetrical manner. In this case, the magnetic fields generated from the respective conductor layers A and B and the induced electromotive force based on the magnetic fields can be more effectively canceled out than in the alternate arrangement shown in FIG. 96, and thus, inductive noise can be further reduced depending on the layout of the components other than the pads.

<Ninth Example Layout of Pads>

Figure 98:
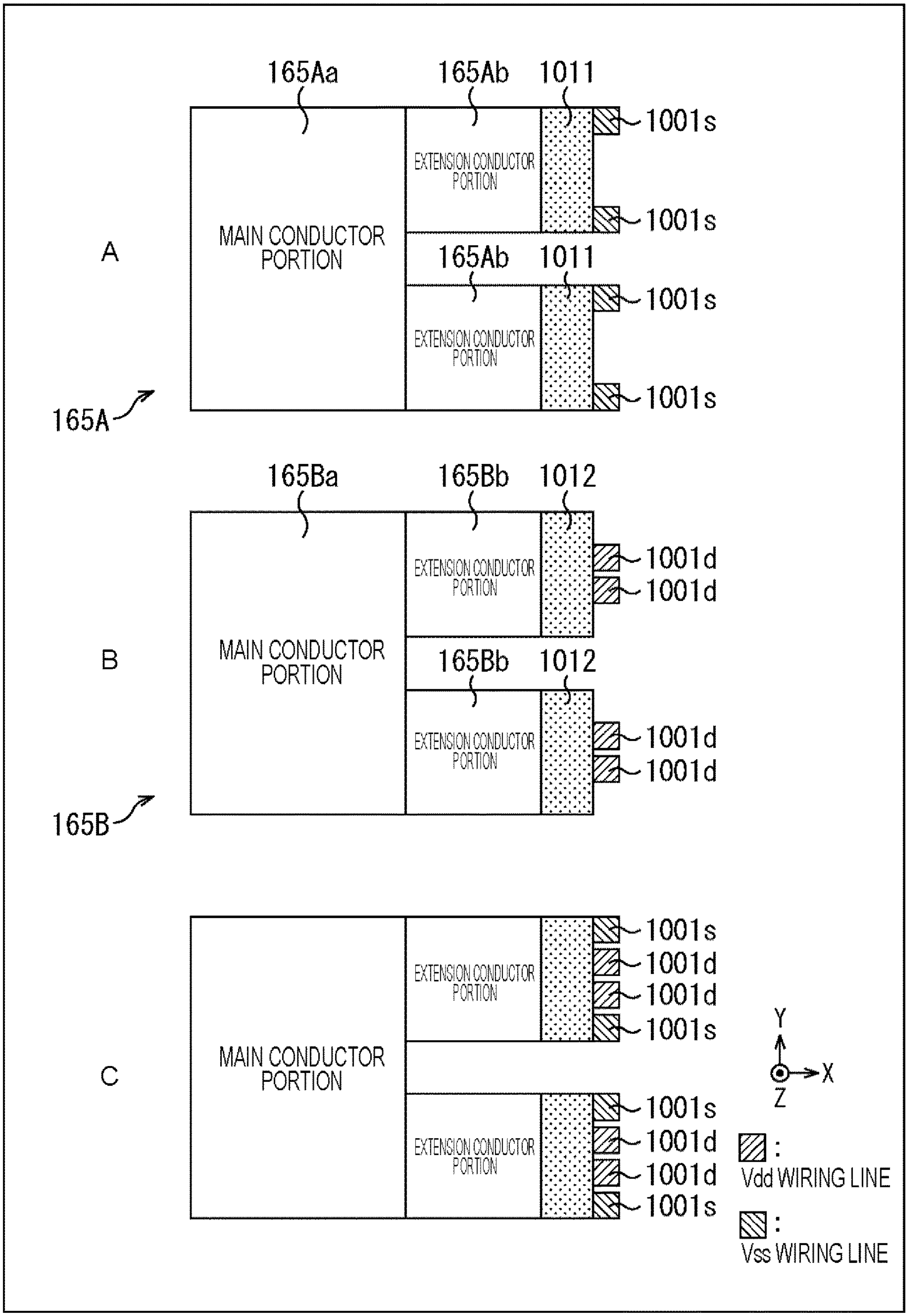
FIG. 98 is plan views showing a ninth example layout of pads.

FIG. 98 shows a ninth example layout of pads.

A of FIG. 98 is a plan view showing the conductor layer A (the wiring layer 165A), and an example layout of pads 1001*s* connected to the conductor layer A.

B of FIG. 98 is a plan view showing the conductor layer B (the wiring layer 165B), and an example layout of pads 1001*d* connected to the conductor layer B.

C of FIG. 98 is a plan view showing a state in which the conductor layers A and B shown in A and B of FIG. 98, and the pads 1001*s* and the pads 1001*d* are stacked.

In FIG. 98, the pads 1001*s* represent pads 1001 to which GND or a negative power supply is supplied, for example, and the pads 1001*d* represent pads 1001 to which a positive power supply is supplied, for example.

As shown in A of FIG. 98, a plurality of extension conductor portions 165Ab is connected to a predetermined side of the rectangular main conductor portion 165Aa, and the plurality of pads 1001*s* is connected, at predetermined intervals, to outer peripheral portions of the respective extension conductor portions 165Ab, via conductors 1011 of a shape that includes a predetermined repetitive pattern as appropriate. The conductors 1011 may not be included, or may be included. Also, the conductors 1011 may be disposed between the main conductor portion 165Aa and the extension conductor portions 165Ab.

As shown in B of FIG. 98, a plurality of extension conductor portions 165Bb is connected to a predetermined side of the rectangular main conductor portion 165Ba, and the plurality of pads 1001*d* is connected, at predetermined intervals, to outer peripheral portions of the respective extension conductor portions 165Bb, via conductors 1012 of a shape that includes a predetermined repetitive pattern as appropriate. The conductors 1012 may not be included, or may be included. Also, the conductors 1012 may be disposed between the main conductor portion 165Ba and the extension conductor portions 165Bb.

As shown in C of FIG. 98, where the conductor layers A and B are stacked, the layout of the pads 1001*s* and the pads 1001*d* is a mirror-symmetry arrangement in which each four consecutive pads 1001 consisting of pads 1001*s* and pads 1001*d* aligned in the Y direction form one set, and the respective sets of pads 1001 are sequentially arranged in the Y direction in a mirror-symmetrical manner. Further, the four pads 1001 consisting of pads 1001*s* and pads 1001*d* in each one set are in a mirror-symmetry arrangement in which sets of two pads 1001 are arranged in a mirror-symmetrical manner about the center line in the Y direction. In the case of such a two-stage mirror arrangement, the range in which the remaining magnetic fields accumulate is narrower than that in the one-stage mirror arrangement shown in FIG. 97. Thus, the induced electromotive force can be more effectively canceled out, and inductive noise can be further reduced depending on the layout of the components other than the pads.

<Tenth Example Layout of Pads>

Figure 99:
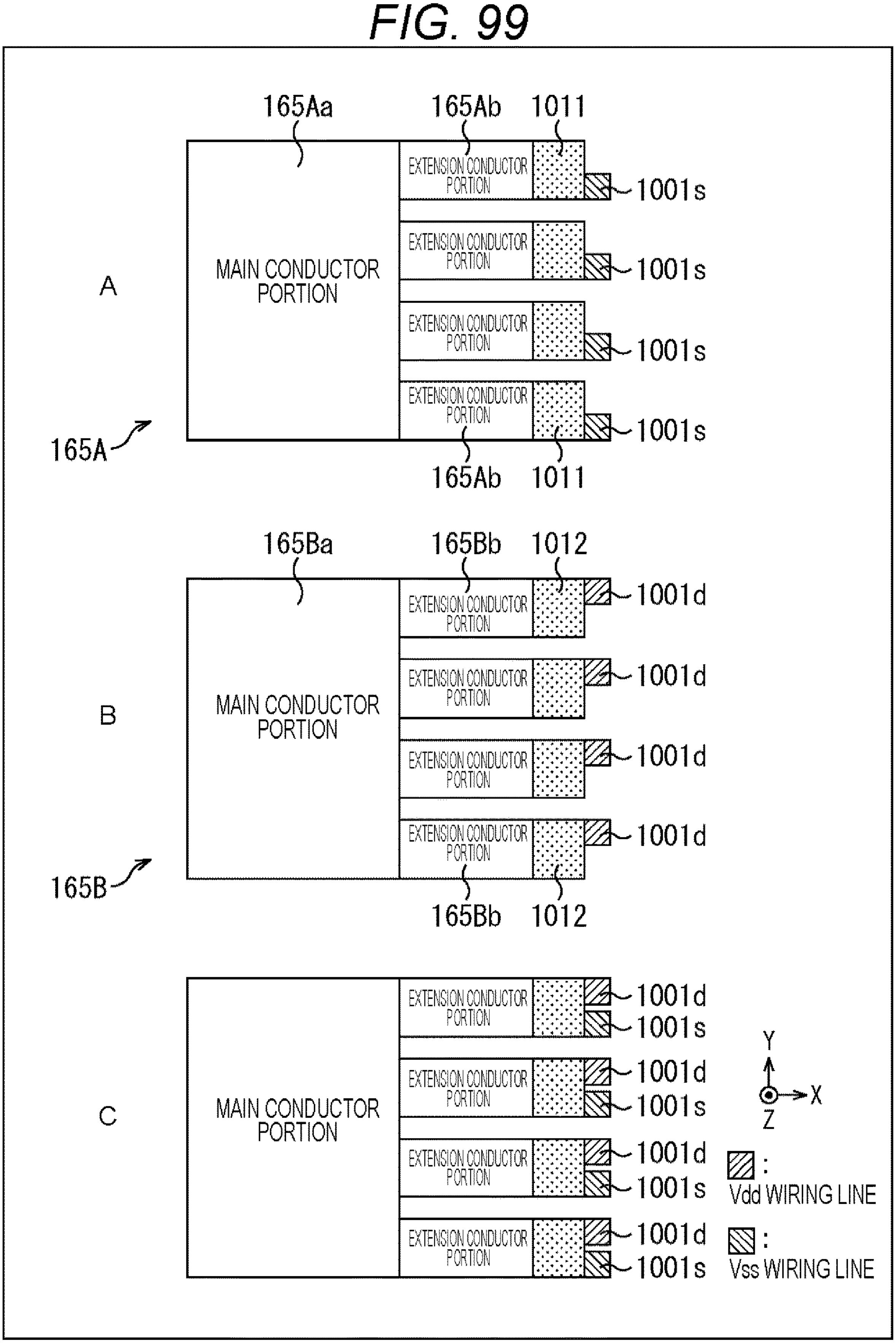
FIG. 99 is plan views showing a tenth example layout of pads.

FIG. 99 shows a tenth example layout of pads.

A of FIG. 99 is a plan view showing the conductor layer A (the wiring layer 165A), and an example layout of pads 1001*s* connected to the conductor layer A.

B of FIG. 99 is a plan view showing the conductor layer B (the wiring layer 165B), and an example layout of pads 1001*d* connected to the conductor layer B.

C of FIG. 99 is a plan view showing a state in which the conductor layers A and B shown in A and B of FIG. 99, and the pads 1001*s* and the pads 1001*d* are stacked.

In FIG. 99, the pads 1001*s* represent pads 1001 to which GND or a negative power supply is supplied, for example, and the pads 1001*d* represent pads 1001 to which a positive power supply is supplied, for example.

As shown in A of FIG. 99, a plurality of extension conductor portions 165Ab is connected to a predetermined side of the rectangular main conductor portion 165Aa, and one pad 1001*s* is connected to an outer peripheral portion of each extension conductor portion 165Ab, via a conductor 1011 of a shape that includes a predetermined repetitive pattern as appropriate. The conductors 1011 may not be included, or may be included. Also, the conductors 1011 may be disposed between the main conductor portion 165Aa and the extension conductor portions 165Ab.

As shown in B of FIG. 99, a plurality of extension conductor portions 165Bb is connected to a predetermined side of the rectangular main conductor portion 165Ba, and one pad 1001*d* is connected to as outer peripheral portion of each extension conductor portion 165Bb, via a conductor 1012 of a shape that includes a predetermined repetitive pattern as appropriate. The conductors 1012 may not be included, or may be included. Also, the conductors 1012 may be disposed between the main conductor portion 165Ba and the extension conductor portions 165Bb.

As shown in C of FIG. 99, where the conductor layers A and B are stacked, the layout of the pads 1001*s* and the pads 1001*d* is an alternate arrangement in which the pads 1001*s* and the pads 1001*d* are alternately arranged in the Y direction. In this case, the magnetic fields generated from the respective conductor layers A and B and the induced electromotive force based on the magnetic fields can be effectively canceled out, and thus, inductive noise can be further reduced. However, this layout is not symmetrical about the Y direction. Therefore, in a case where the pads 1001 are disposed over a wide range, or where the main conductor portion 165Aa or 165Ba, the extension conductor portions 165Ab or 165Bb, or the conductors 1011 or 1012 are long in the array direction of the pads 1001 (or longer in the Y direction than in the X direction in FIG. 99), some magnetic fields cannot be completely canceled out. As a result, the induced electromotive force accumulates and increases as the victim conductor loop becomes larger, and inductive noise might increase in some cases.

<Eleventh Example Layout of Pads>

Figure 100:
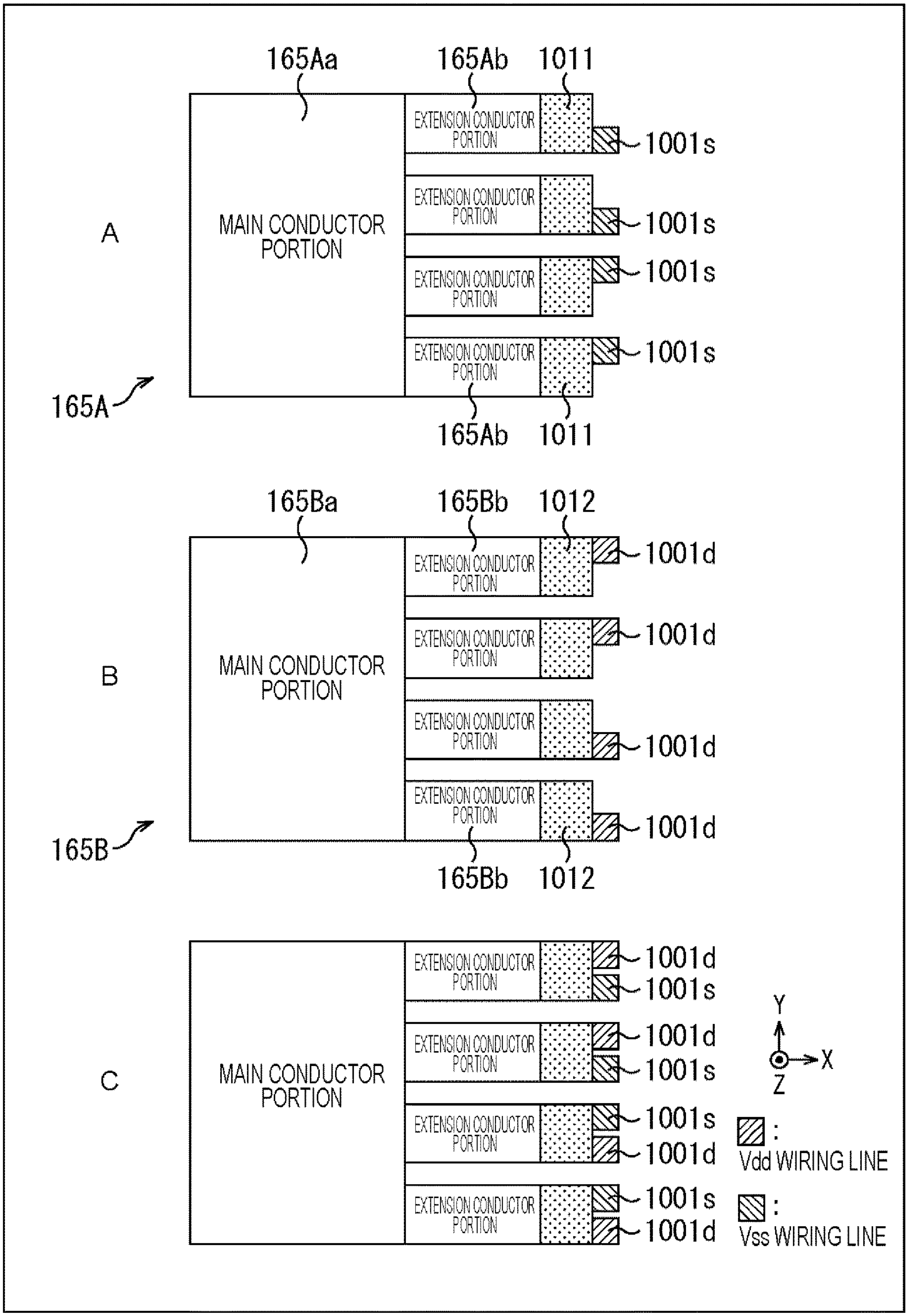
FIG. 100 is plan views showing an eleventh example layout of pads.

FIG. 100 shows an eleventh example layout of pads.

A of FIG. 100 is a plan view showing the conductor layer A (the wiring layer 165A), and an example layout of pads 1001*s* connected to the conductor layer A.

B of FIG. 100 is a plan view showing the conductor layer B (the wiring layer 165B), and an example layout of pads 1001*d* connected to the conductor layer B.

C of FIG. 100 is a plan view showing a state in which the conductor layers A and B shown in A and B of FIG. 100, and the pads 1001*s* and the pads 1001*d* are stacked.

In FIG. 100, the pads 1001*s* represent pads 1001 to which GND or a negative power supply is supplied, for example, and the pads 1001*d* represent pads 1001 to which a positive power supply is supplied, for example.

As shown in A of FIG. 100, a plurality of extension conductor portions 165Ab is connected to a predetermined side of the rectangular main conductor portion 165Aa, and one pad 1001*s* is connected to an outer peripheral portion of each extension conductor portion 165Ab, via a conductor 1011 of a shape that includes a predetermined repetitive pattern as appropriate. The conductors 1011 may not be included, or may be included. Also, the conductors 1011 may be disposed between the main conductor portion 165Aa and the extension conductor portions 165Ab.

As shown in B of FIG. 100, a plurality of extension conductor portions 165Bb is connected to a predetermined side of the rectangular main conductor portion 165Ba, and one pad 1001*d* is connected to an outer peripheral portion of each extension conductor portion 165Bb, via a conductor 1012 of a shape that includes a predetermined repetitive pattern as appropriate. The conductors 1012 may not be included, or may be included. Also, the conductors 1012 may be disposed between the main conductor portion 165Ba and the extension conductor portions 165Bb.

As shown in C of FIG. 100, where the conductor layers A and B are stacked, the layout of the pads 1001*s* and the pads 1001*d* is a mirror-symmetry arrangement in which each four consecutive pads 1001 consisting of pads 1001*s* and pads 1001*d* aligned in the Y direction form one set, and the respective sets of pads 1001 are sequentially arranged in the Y direction in a mirror-symmetrical manner. In this case, the magnetic fields generated from the respective conductor layers A and B and the induced electromotive force based on the magnetic fields can be more effectively canceled out than in the alternate arrangement shown in FIG. 99, and thus, inductive noise can be further reduced depending on the layout of the components other than the pads.

<Twelfth Example Layout of Pads>

Figure 101:
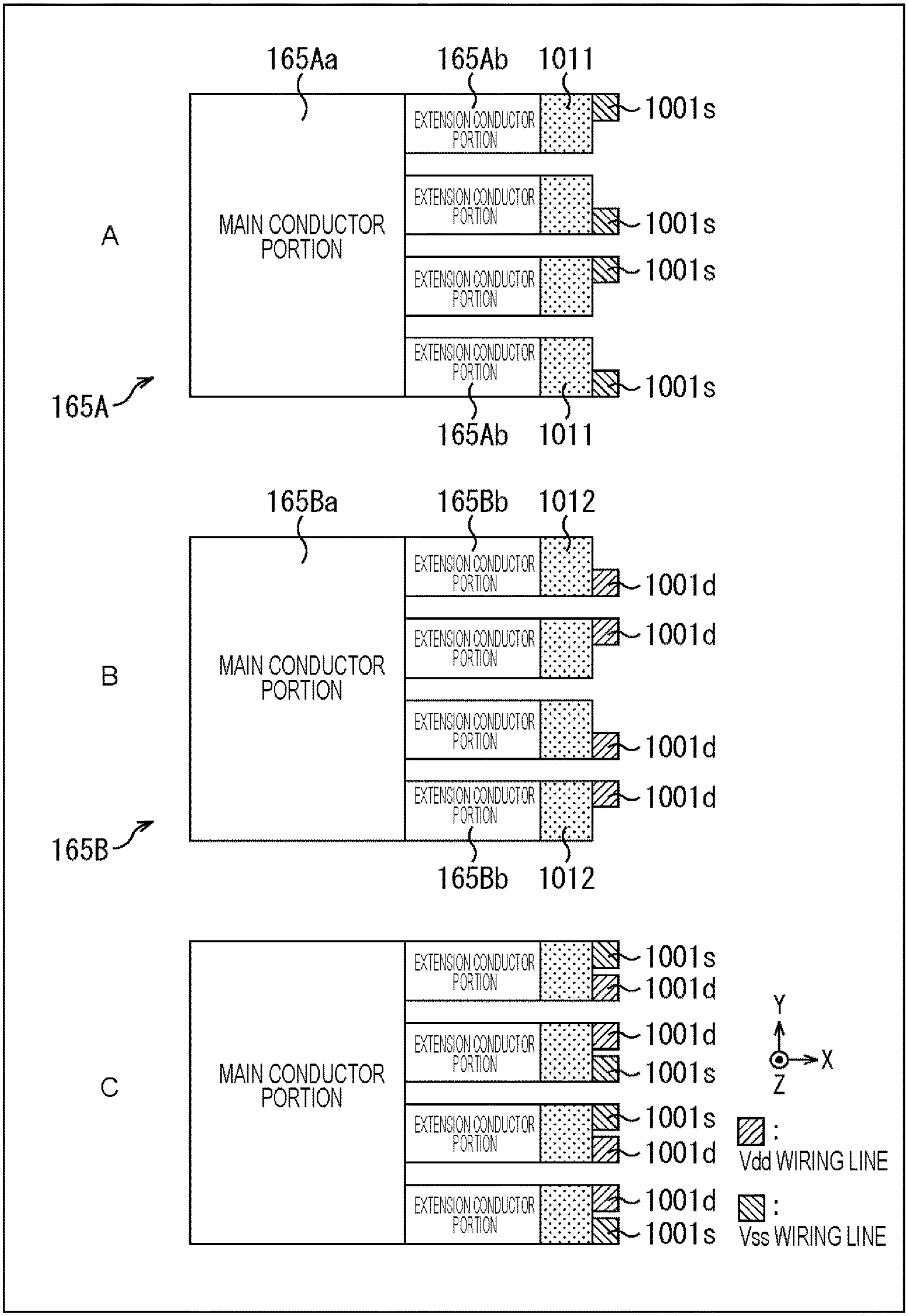
FIG. 101 is plan views showing a twelfth example layout of pads.

FIG. 101 shows a twelfth example layout of pads.

A of FIG. 101 is a plan view showing the conductor layer A (the wiring layer 165A), and an example layout of pads 1001*s* connected to the conductor layer A.

B of FIG. 101 is a plan view showing the conductor layer B (the wiring layer 165B), and an example layout of pads 1001*d* connected to the conductor layer B.

C of FIG. 101 is a plan view showing a state in which the conductor layers A and B shown in A and B of FIG. 101, and the pads 1001*s* and the pads 1001*d* are stacked.

In FIG. 101, the pads 1001*s* represent pads 1001 to which GND or a negative power supply is supplied, for example, and the pads 1001*d* represent pads 1001 to which a positive power supply is supplied, for example.

As shown in A of FIG. 101, a plurality of extension conductor portions 165Ab is connected to a predetermined side of the rectangular main conductor portion 165Aa, and one pad 1001*s* is connected to an outer peripheral portion of each extension conductor portion 165Ab, via a conductor 1011 of a shape that includes a predetermined repetitive pattern as appropriate. The conductors 1011 may not be included, or may be included. Also, the conductors 1011 may be disposed between the main conductor portion 165Aa and the extension conductor portions 165Ab.

As shown in B of FIG. 101, a plurality of extension conductor portions 165Bb is connected to a predetermined side of the rectangular main conductor portion 165Ba, and one pad 1001*d* is connected to an outer peripheral portion of each extension conductor portion 165Bb, via a conductor 1012 of a shape that includes a predetermined repetitive pattern as appropriate. The conductors 1012 may not be included, or may be included. Also, the conductors 1012 may be disposed between the main conductor portion 165Ba and the extension conductor portions 165Bb.

As shown in C of FIG. 101, where the conductor layers A and B are stacked, the layout of the pads 1001*s* and the pads 1001*d* is a mirror-symmetry arrangement in which each four consecutive pads 1001 consisting of pads 1001*s* and pads 1001*d* aligned in the Y direction form one set, and the respective sets of pads 1001 are sequentially arranged in the Y direction in a mirror-symmetrical manner. Further, the four pads 1001 consisting of pads 1001*s* and pads 1001*d* in each one set are in a mirror-symmetry arrangement in which sets of two pads 1001 are arranged in a mirror-symmetrical manner about the center line in the Y direction. In the case of such a two-stage mirror arrangement, the range in which the remaining magnetic fields accumulate is narrower than that in the one-stage mirror arrangement shown in FIG. 100. Thus, the induced electromotive force can be more effectively canceled out, and inductive noise can be further reduced depending on the layout of the components other than the pads.

<Thirteenth Example Layout of Pads>

Figure 102:
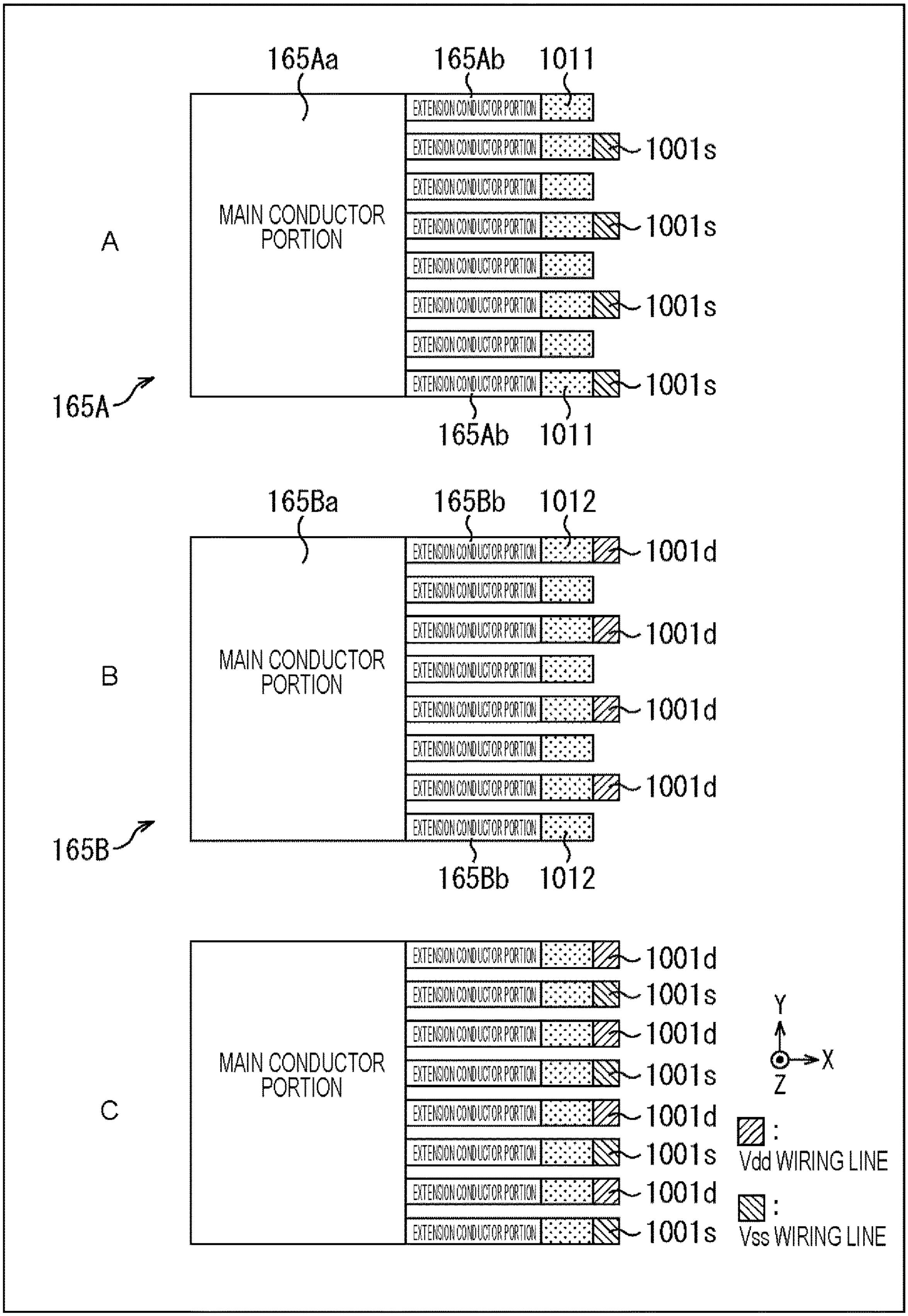
FIG. 102 is plan views showing a thirteenth example layout of pads.

FIG. 102 shows a thirteenth example layout of pads.

A of FIG. 102 is a plan view showing the conductor layer A (the wiring layer 165A), and an example layout of pads 1001*s* connected to the conductor layer A.

B of FIG. 102 is a plan view showing the conductor layer B (the wiring layer 165B), and an example layout of pads 1001*d* connected to the conductor layer B.

C of FIG. 102 is a plan view showing a state in which the conductor layers A and B shown in A and B of FIG. 102, and the pads 1001*s* and the pads 1001*d* are stacked.

In FIG. 102, the pads 1001*s* represent pads 1001 to which GND or a negative power supply is supplied, for example, and the pads 1001*d* represent pads 1001 to which a positive power supply is supplied, for example.

As shown in A of FIG. 102, a plurality of extension conductor portions 165Ab is connected to a predetermined side of the rectangular main conductor portion 165Aa, and conductors 1011 of a shape that includes a predetermined repetitive pattern as appropriate are connected to outer peripheral portions of the respective extension conductor portions 165Ab. Further, one of the plurality of pad 1001*s* is connected to some of the extension conductor portions 165Ab via the conductors 1011. The conductors 1011 may not be included, or may be included. Also, the conductors 1011 may be disposed between the main conductor portion 165Aa and the extension conductor portions 165Ab.

As shown in B of FIG. 102, a plurality of extension conductor portions 165Bb is connected to a predetermined side of the rectangular main conductor portion 165Ba, and conductors 1012 of a shape that includes a predetermined repetitive pattern as appropriate are connected to outer peripheral portions of the respective extension conductor portions 165Bb. Further, one of the plurality of pad 1001*d* is connected to some of the extension conductor portions 165Bb via the conductors 1012. The conductors 1012 may not be included, or may be included. Also, the conductors 1012 may be disposed between the main conductor portion 165Ba and the extension conductor portions 165Bb.

As shown in C of FIG. 102, where the conductor layers A and B are stacked, the layout of the pacts 1001*s* and the pads 1001*d* is an alternate arrangement in which the pads 1001*s* and the pads 1001*d* are alternately arranged in the Y direction. In this case, the magnetic fields generated from the respective conductor layers A and B and the induced electromotive force based on the magnetic fields can be effectively canceled out, and thus, inductive noise can be further reduced. However, this layout is not symmetrical about the Y direction. Therefore, in a case where the pads 1001 are disposed over a wide range, or where the main conductor portion 165Aa or 165Ba, the extension conductor portions 165Ab or 165Bb, or the conductors 1011 or 1012 are long in the array direction of the pads 1001 (or longer in the Y direction than in the X direction in FIG. 102), some magnetic fields cannot be completely canceled out. As a result, the induced electromotive force accumulates and increases as the victim conductor loop becomes larger, and inductive noise might increase in some cases.

<Fourteenth Example Layout of Pads>

Figure 103:
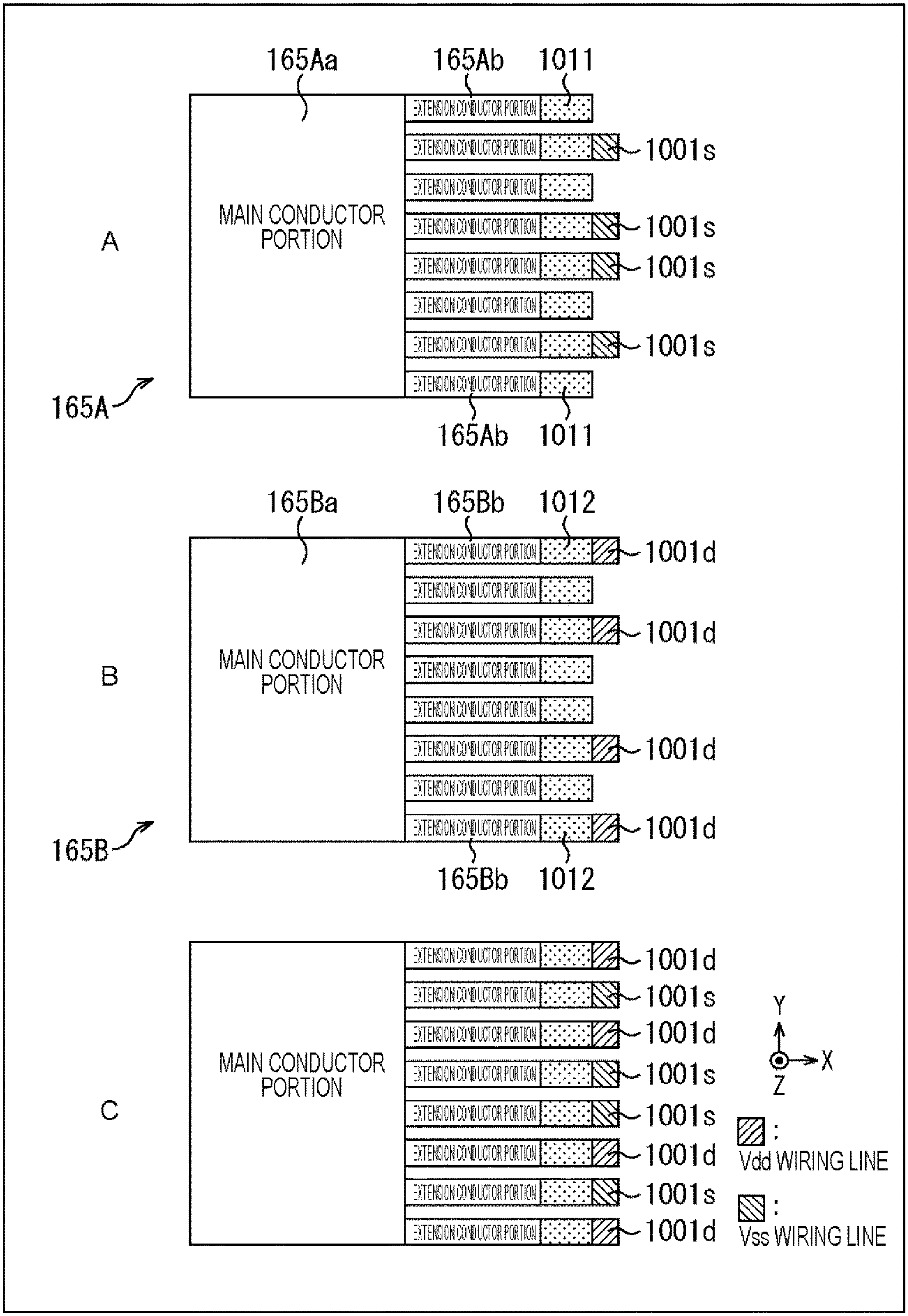
FIG. 103 is plan views showing a fourteenth example layout of pads.

FIG. 103 shows a fourteenth example layout of pads.

A of FIG. 103 is a plan view showing the conductor layer A (the wiring layer 165A), and an example layout of pads 1001*s* connected to the conductor layer A.

B of FIG. 103 is a plan view showing the conductor layer B (the wiring layer 165B), and an example layout of pads 1001*d* connected to the conductor layer B.

C of FIG. 103 is a plan view showing a state in which the conductor layers A and B shown in A and B of FIG. 103, and the pads 1001*s* and the pads 1001*d* are stacked.

In FIG. 103, the pads 1001*s* represent pads 1001 to which GND or a negative power supply is supplied, for example, and the pads 1001*d* represent pads 1001 to which a positive power supply is supplied, for example.

As shown in A of FIG. 103, a plurality of extension conductor portions 165Ab is connected to a predetermined side of the rectangular main conductor portion 165Aa, and conductors 1011 of a shape that includes a predetermined repetitive pattern as appropriate are connected to outer peripheral portions of the respective extension conductor portions 165Ab. Further, one of the plurality of pad 1001*s* is connected to some of the extension conductor portions 165Ab via the conductors 1011. The conductors 1011 may not be included, or may be included. Also, the conductors 1011 may be disposed between the main conductor portion 165Aa and the extension conductor portions 165Ab.

As shown in B of FIG. 103, a plurality of extension conductor portions 165Bb is connected to a predetermined side of the rectangular main conductor portion 165Ba, and conductors 1012 of a shape that includes a predetermined repetitive pattern as appropriate are connected to outer peripheral portions of the respective extension conductor portions 165Bb. Further, one of the plurality of pad 1001*d* is connected to some of the extension conductor portions 165Bb via the conductors 1012. The conductors 1012 may not be included, or may be included. Also, the conductors 1012 may be disposed between the main conductor portion 165Ba and the extension conductor portions 165Bb.

As shown in C of FIG. 103, where the conductor layers A and B are stacked, the layout of the pads 1001*s* and the pads 1001*d* is a mirror-symmetry arrangement in which each four consecutive pads 1001 consisting of pads 1001*s* and pads 1001*d* aligned in the Y direction form one set, and the respective sets of pads 1001 are sequentially arranged in the Y direction in a mirror-symmetrical manner. In this case, the magnetic fields generated from the respective conductor layers A and B and the induced electromotive force based on the magnetic fields can be more effectively canceled out than in the alternate arrangement shown in FIG. 102, and thus, inductive noise can be further reduced depending on the layout of the components other than the pads.

<Fifteenth Example Layout of Pads>

Figure 104:
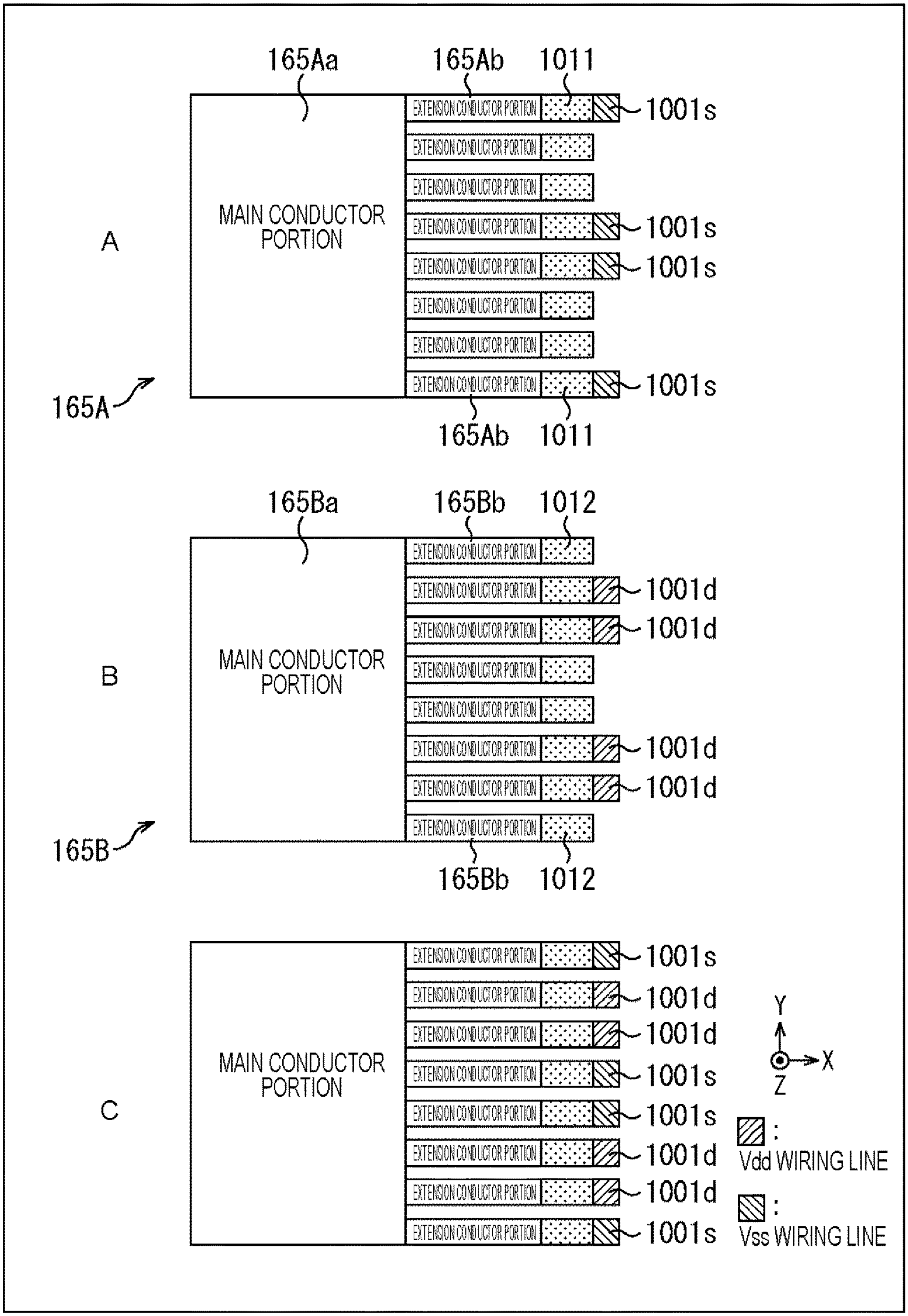
FIG. 104 is plan views showing a fifteenth example layout of pads.

FIG. 104 shows a fifteenth example layout of pads.

A of FIG. 104 is a plan view showing the conductor layer A (the wiring layer 165A), and an example layout of pads 1001*s* connected to the conductor layer A.

B of FIG. 104 is a plan view showing the conductor layer B (the wiring layer 165B), and an example layout of pads 1001*d* connected to the conductor layer B.

C of FIG. 104 is a plan view showing a state in which the conductor layers A and B shown in A and B of FIG. 104, and the pads 1001*s* and the pads 1001*d* are stacked.

In FIG. 104, the pads 1001*s* represent pads 1001 to which GND or a negative power supply is supplied, for example, and the pads 1001*d* represent pads 1001 to which a positive power supply is supplied, for example.

As shown in A of FIG. 104, a plurality of extension conductor portions 165Ab is connected to a predetermined side of the rectangular main conductor portion 165Aa, and conductors 1011 of a shape that includes a predetermined repetitive pattern as appropriate are connected to outer peripheral portions of the respective extension conductor portions 165Ab. Further, one of the plurality of pad 1001*s* is connected to some of the extension conductor portions 165Ab via the conductors 1011. The conductors 1011 may not be included, or may be included. Also, the conductors 1011 may be disposed between the main conductor portion 165Aa and the extension conductor portions 165Ab.

As shown in B of FIG. 104, a plurality of extension conductor portions 165Bb is connected to a predetermined side of the rectangular main conductor portion 165Ba, and conductors 1012 of a shape that includes a predetermined repetitive pattern as appropriate are connected to outer peripheral portions of the respective extension conductor portions 165Bb. Further, one of the plurality of pad 1001*d* is connected to some of the extension conductor portions 165Bb via the conductors 1012. The conductors 1012 may not be included, or may be included. Also, the conductors 1012 may be disposed between the main conductor portion 165Ba and the extension conductor portions 165Bb.

As shown in C of FIG. 104, where the conductor layers A and B are stacked, the layout of the pads 1001*s* and the pads 1001*d* is a mirror-symmetry arrangement in which each four consecutive pads 1001 consisting of pads 1001*s* and pads 1001*d* aligned in the Y direction form one set, and the respective sets of pads 1001 are sequentially arranged in the Y direction in a mirror-symmetrical manner. Further, the four pads 1001 consisting of pads 1001*s* and pads 1001*d* in each one set are in a mirror-symmetry arrangement in which sets of two pads 1001 are arranged in a mirror-symmetrical manner about the center line in the Y direction. In the case of such a two-stage mirror arrangement, the range in which the remaining magnetic fields accumulate is narrower than that in the one-stage mirror arrangement shown in FIG. 103. Thus, the induced electromotive force can be more effectively canceled out, and inductive noise can be further reduced depending on the layout of the components other than the pads.

In the example layouts of pads described above with reference to FIGS. 93 through 104, the total number of pads connected to a predetermined side of the main conductor portions 165*a* of the conductor layers A and B is eight, and the layout of the eight pads 1001 aligned in the Y direction is an alternate arrangement, a one-stage mirror arrangement, or a two-stage mirror arrangement. However, the total number of pads may be other than eight, and the layout of such pads may be an alternate arrangement, a one-stage mirror arrangement, or a two-stage mirror arrangement. The number of pads in one set in an alternate arrangement or a mirror arrangement is not necessarily two or four, but may be any appropriate number.

Also, the number of pads connected to one extension conductor portion 165*b* is not necessarily one or two as in the examples shown in FIGS. 93 through 104, but may be three or larger.

Further, in the examples shown in FIGS. 93 through 104, a plurality of pads 1001 is connected to only one predetermined side of the main conductor portions 165*a* of the rectangular conductor layers A and B, for simplification. However, the pads 1001 may be connected to any one side other than the side shown in FIGS. 93 through 104, or may be any two, three, or four sides.

Although the total number of pads is eight in the example cases described above, the total number of pads is not necessarily eight. The number of pads may be increased, or the number of pads may be decreased.

Part or all of each component shown in the example layouts of pads may be omitted, part or all of each component may be changed, part or all of each component may be modified, part or all of each component may be replaced with some other component, or some other component may be added to part or all of each component. Further, part or all of each component shown in the example layouts of pads may be divided into a plurality of portions, part or all of each component may be separated into a plurality of portions, at least one of the divided or separated portions may have a different function or different characteristics from the other portions. Further, at least some of the respective components shown in the example layouts of pads may be combined, to form a different pad layout. Further, at least one of the respective components shown in the example layouts of pads may be moved, to form a different pad layout. Further, a coupling element or a relay element may be added to at least one of the combinations of the respective components shown in the example layout of pads, to have form a different pad layout. Further, a switching element or a switching function may be added to at least one of the combinations of the respective components shown in the example layout of pads, to have form a different pad layout.

<Sixteenth Example Layout of Pad>

Referring now to FIGS. 105 through 108, examples of an orthogonal pad layouts in cases where a plurality of pads

1001 is disposed on two adjacent sides of the rectangular main conductor portions 165*a* of the conductor layers A and B are described.

Figure 105:
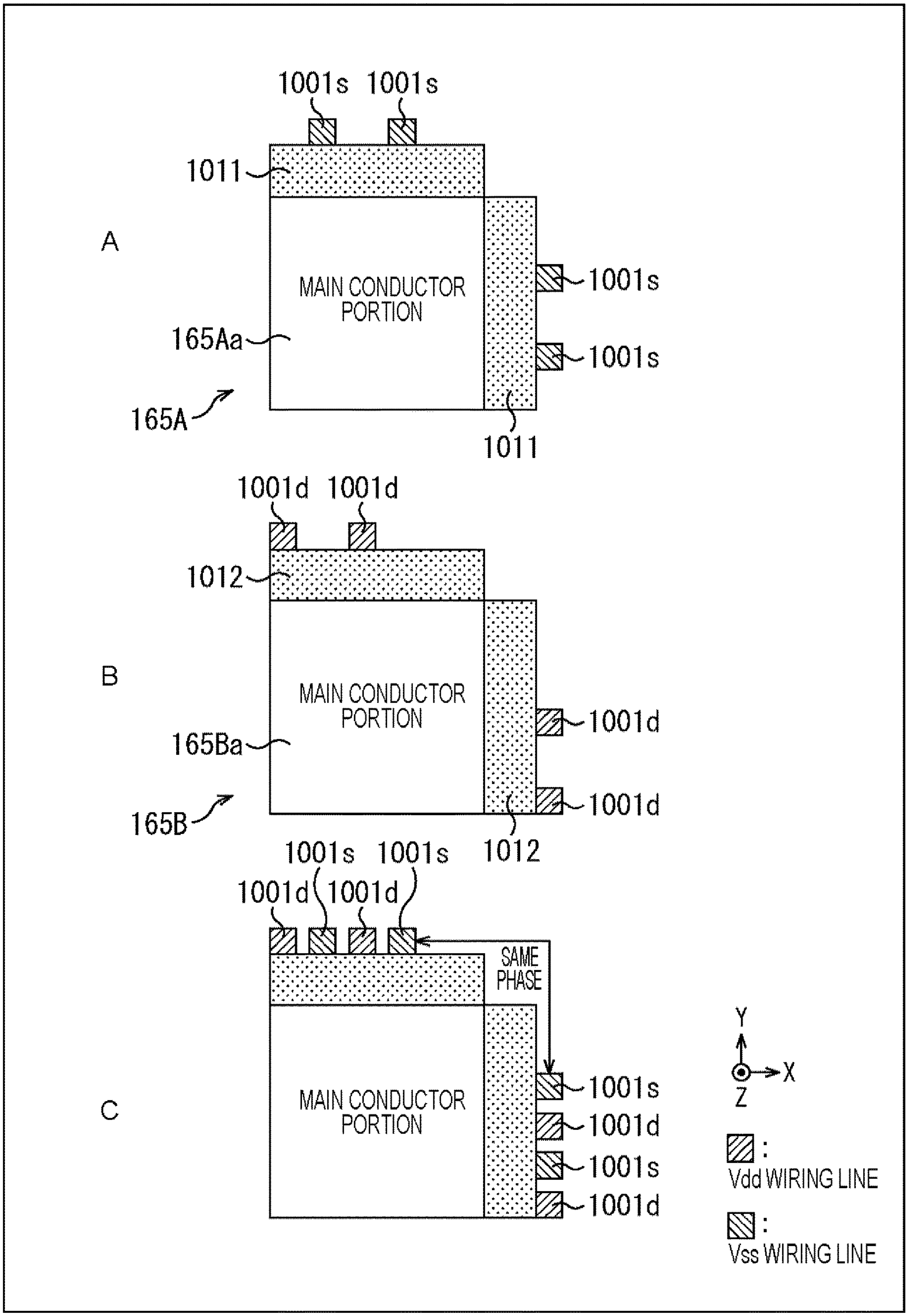
FIG. 105 is plan views showing a sixteenth example layout of pads.

FIG. 105 shows a sixteenth example layout of pads.

A of FIG. 105 is a plan view showing the conductor layer A (the wiring layer 165A), and an example layout of pads 1001*s* connected to the conductor layer A.

B of FIG. 105 is a plan view showing the conductor layer B (the wiring layer 165B), and an example layout of pads 1001*d* connected to the conductor layer B.

C of FIG. 105 is a plan view showing a state in which the conductor layers A and B shown in A and B of FIG. 105, and the pads 1001*s* and the pads 1001*d* are stacked.

In FIG. 105, the pads 1001*s* represent pads 1001 to which GND or a negative power supply is supplied, for example, and the pads 1001*d* represent pads 1001 to which a positive power supply is supplied, for example.

As shown in A of FIG. 105, the plurality of pads 1001*s* is connected, at predetermined intervals, to two adjacent sides of the rectangular main conductor portion 165Aa, via conductors 1011 of a shape that includes a predetermined repetitive pattern as appropriate. Each of the pads 1001*s* may be formed with an extension conductor portion 165Ab, or the conductors 1011 may be formed with extension conductor portions 165Ab. Further, in a case where the pads 1001*s* are extension conductor portions 165Ab, the conductors 1011 may not be included or may be included.

As shown in B of FIG. 105, the plurality of pads 1001*d* is connected, at predetermined intervals, to two adjacent sides of the rectangular main conductor portion 165Ba, via conductors 1012 of a shape that includes a predetermined repetitive pattern as appropriate. Each of the pads 1001*d* may be formed with an extension conductor portion 165Bb, or the conductors 1012 may be formed with extension conductor portions 165Bb. Further, in a case where the pads 1001*d* are extension conductor portions 165Bb, the conductors 1012 may not be included or may be included.

As shown in C of FIG. 105, where the conductor layers A and B are stacked, the layout of the pads 1001*s* and the pads 1001*d* an alternate arrangement in which the pads 1001*s* and the pads 1001*d* are alternately arranged on two adjacent sides of the rectangular main conductor portions 165*a*. Further, among the pads 1001*s* and the pads 1001*d* that are alternately arranged on the two sides, the polarity of the pad 1001 at the end of each side is of a pad 1001*s* connected to GND or a negative power supply. In this manner, among the plurality of pads 1001 on the two sides on which the pads 1001*s* and the pads 1001*d* are alternately arranged, the pads 1001 at the ends closest to the corner of the substrate 1000 are in phase with each other, and are pads 1001*s* of the polarity with the higher electrostatic discharge (ESD) resistance. Thus, a higher ESD resistance can be achieved.

Note that, with the ESD resistance being taken into consideration, the polarity of the pads 1001 at the ends of the two sides on which the pads 1001*s* and the pads 1001*d* are alternately arranged is preferably of pads 1001*s* connected to GND or a negative power supply, for example, but may be of pads 1001*d* connected to a positive power supply, for example.

<Seventeenth Example Layout of Pads>

Figure 106:
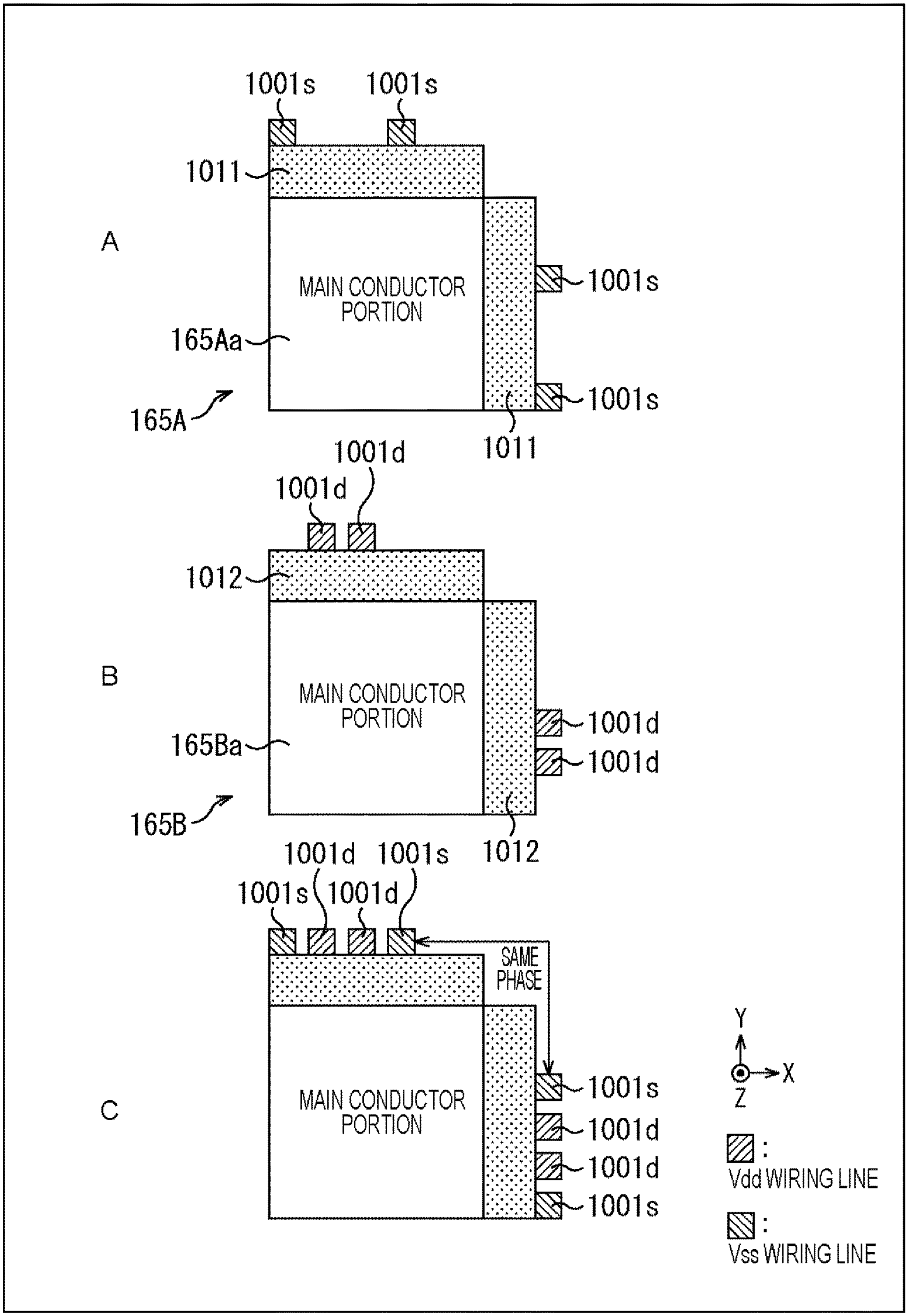
FIG. 106 is plan views showing a seventeenth example layout of pads.

FIG. 106 shows a seventeenth example layout of pads.

A of FIG. 106 is a plan view showing the conductor layer A (the wiring layer 165A), and an example layout of pads 1001*s* connected to the conductor layer A.

B of FIG. 106 is a plan view showing the conductor layer B (the wiring layer 165B), and an example layout of pads 1001*d* connected to the conductor layer B.

C of FIG. 106 is a plan view showing a state in which the conductor layers A and B shown in A and B of FIG. 106, and the pads 1001*s* and the pads 1001*d* are stacked.

In FIG. 106, the pads 1001*s* represent pads 1001 to which GND or a negative power supply is supplied, for example, and the pads 1001*d* represent pads 1001 to which a positive power supply is supplied, for example.

As shown in A of FIG. 106, the plurality of pads 1001*s* is connected, at predetermined intervals, to two adjacent sides of the rectangular main conductor portion 165Aa, via conductors 1011 of a shape that includes a predetermined repetitive pattern as appropriate. Each of the pads 1001*s* may be formed with an extension conductor portion 165Ab, or the conductors 1011 may be formed with extension conductor portions 165Ab. Further, in a case where the pads 1001*s* are extension conductor portions 165Ab, the conductors 1011 may not be included or may be included.

As shown in B of FIG. 106, the plurality of pads 1001*d* is connected, at predetermined intervals, to two adjacent sides of the rectangular main conductor portion 165Ba, via conductors 1012 of a shape that includes a predetermined repetitive pattern as appropriate. Each of the pads 1001*d* may be formed with an extension conductor portion 165Bb, or the conductors 1012 may be formed with extension conductor portions 165Bb. Further, in a case where the pads 1001*d* are extension conductor portions 165Bb, the conductors 1012 may not be included or may be included.

As shown in C of FIG. 106, where the conductor layers A and B are stacked, the layout is a mirror-symmetry arrangement in which each four consecutive pads 1001 consisting of pads 1001*s* and pads 1001*d* form one set, and the respective sets of pads 1001 are sequentially arranged in the Y direction in a mirror-symmetrical manner, as in the example layout of pads shown in C of FIG. 95. Further, among the pads 1001*s* and the pads 1001*d* that are arranged on the two sides in a mirror-symmetrical manner, the polarity of the pad 1001 at the end of each side is of a pad 1001*s* connected to GND or a negative power supply. In this manner, among the plurality of pads 1001 on the two sides on which the pads 1001*s* and the pads 1001*d* are arranged in a mirror-symmetrical manner, the pads 1001 at the ends closest to the corner of the substrate 1000 are in phase with each other, and are pads 1001*s* of the polarity with the higher ESD resistance. Thus, a higher ESD resistance can be achieved. Further, as the pads are arranged in a mirror-symmetrical manner, the impedance difference between the Vss wiring lines and the Vdd wiring lines become smaller, and the current difference also becomes smaller. Accordingly, inductive noise can be made even smaller than that in the sixteenth example layout shown in FIG. 105.

Note that, with the ESD resistance being taken into consideration, the polarity of the pads 1001 at the ends of the two sides on which the pads 1001*s* and the pads 1001*d* are arranged in a mirror-symmetrical manner is preferably of pads 1001*s* connected to GND or a negative power supply, for example, but may be of pads 1001*d* connected to a positive power supply, for example.

<Eighteenth Example Layout of Pads>

Figure 107:
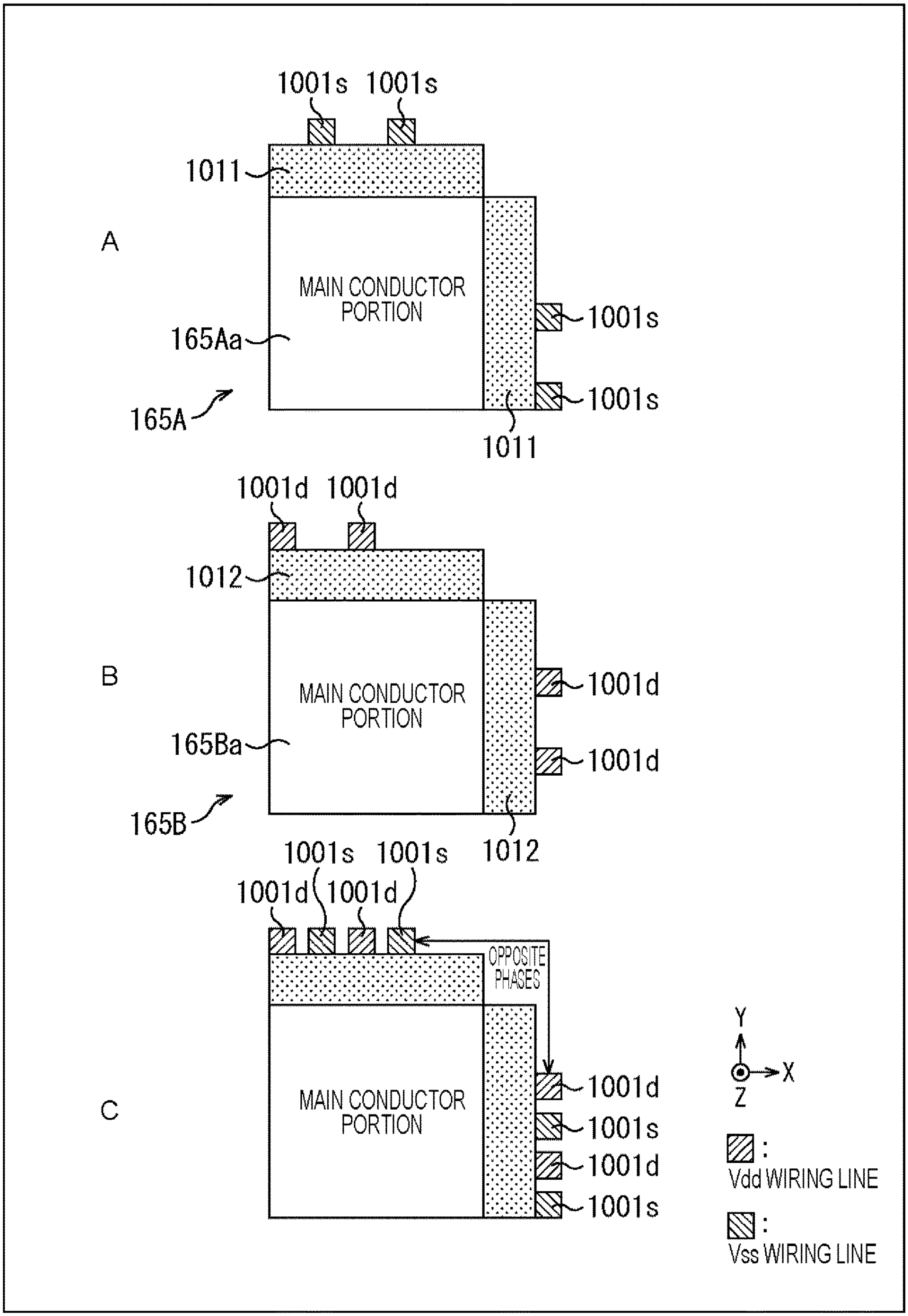
FIG. 107 is plan views showing an eighteenth example layout of pads.

FIG. 107 shows an eighteenth example layout of pads.

A of FIG. 107 is a plan view showing the conductor layer A (the wiring layer 165A), and an example layout of pads 1001*s* connected to the conductor layer A.

B of FIG. 107 is a plan view showing the conductor layer B (the wiring layer 165B), and an example layout of pads 1001*d* connected to the conductor layer B.

C of FIG. 107 is a plan view showing a state in which the conductor layers A and B shown in A and B of FIG. 107, and the pads 1001*s* and the pads 1001*d* are stacked.

In FIG. 107, the pads 1001*s* represent pads 1001 to which GND or a negative power supply is supplied, for example, and the pads 1001*d* represent pads 1001 to which a positive power supply is supplied, for example.

As shown in A of FIG. 107, the plurality of pads 1001*s* are connected, at predetermined intervals, to two adjacent sides of the rectangular main conductor portion 165Aa, via conductors 1011 of a shape that includes a predetermined repetitive pattern as appropriate. Each of the pads 1001*s* may be formed with an extension conductor portion 165Ab, or the conductors 1011 may be formed with extension conductor portions 165Ab. Further, in a case where the pads 1001*s* are extension conductor portions 165Ab, the conductors 1011 may not be included or may be included.

As shown in B of FIG. 107, the plurality of pads 1001*d* is connected, at predetermined intervals, to two adjacent sides of the rectangular main conductor portion 165Ba, via conductors 1012 of a shape that includes a predetermined repetitive pattern as appropriate. Each of the pads 1001*d* may be formed with an extension conductor portion 165Bb, or the conductors 1012 may be formed with extension conductor portions 165Bb. Further, in a case where the pads 1001*d* are extension conductor portions 165Bb, the conductors 1012 may not be included or may be included.

As shown in C of FIG. 107, where the conductor layers A and B are stacked, the layout of the pads 1001*s* and the pads 1001*d* an alternate arrangement in which the pads 1001*s* and the pads 1001*d* are alternately arranged, as the example layout of pads shown in FIG. 105. However, this layout differs from the example layout of pads shown in FIG. 105, in that the polarities of the pads 1001 at the ends of the respective sides are the opposite phases of a pad 1001*s* and a pad 1001*d*, among the pads 1001*s* and the pads 1001*d* arranged on the two sides. In this manner, the polarities of the pads 1001 at the end portions closest to the corner of the substrate 1000 are made to have phases opposite of each other among the plurality of pads 1001 on the two sides on which the pads 1001*s* and the pads 1001*d* are alternately arranged. Accordingly, the impedance difference between the Vss wiring lines and the Vdd wiring lines can be made even smaller, and the current difference becomes even smaller. Thus, inductive noise can be made smaller than that in the seventeenth example layout shown in FIG. 106.

<Nineteenth Example Layout of Pads>

Figure 108:
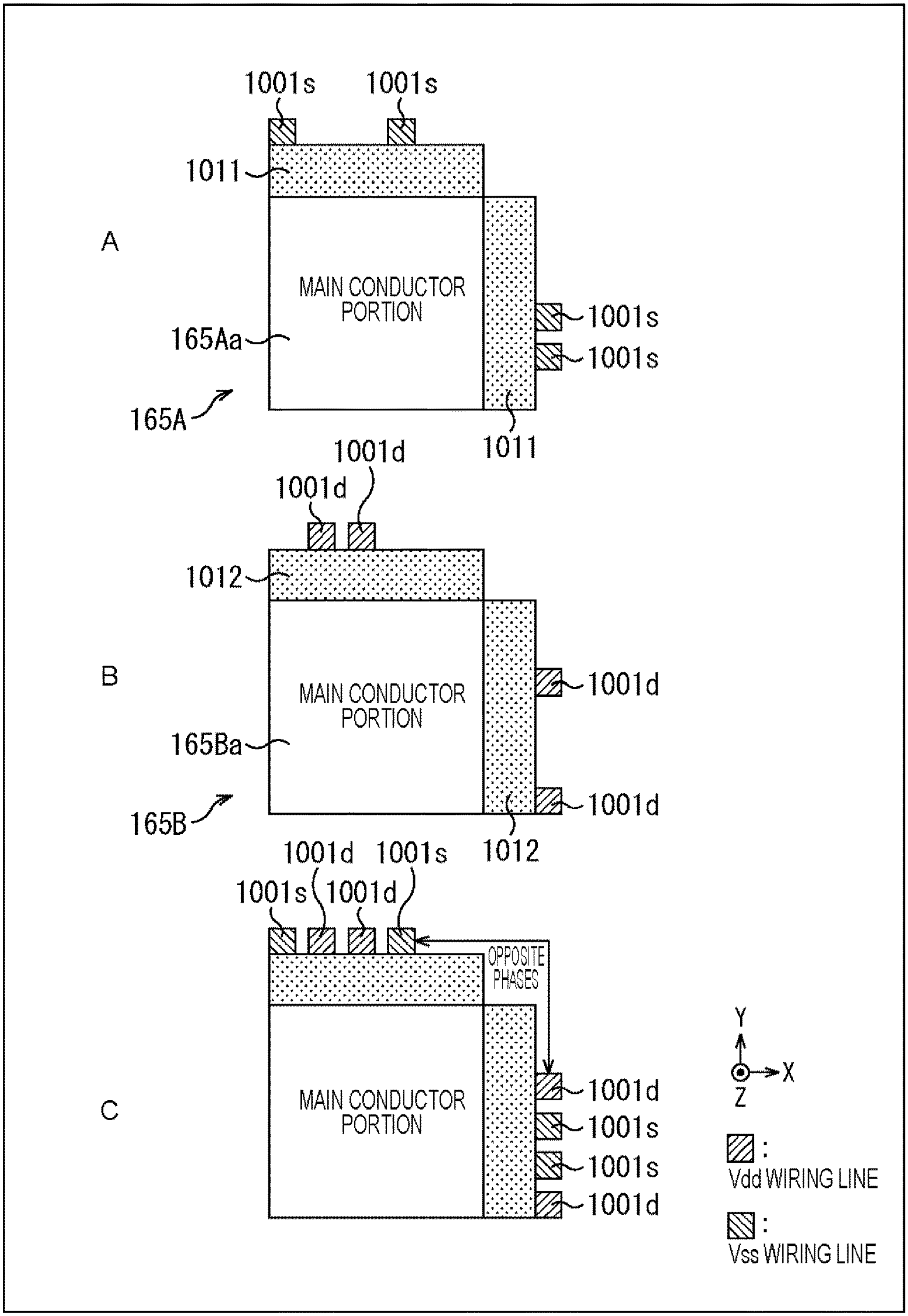
FIG. 108 plan views showing a nineteenth example layout of pads.

FIG. 108 shows a nineteenth example layout of pads.

A of FIG. 108 is a plan view showing the conductor layer A (the wiring layer 165A), and an example layout of pads 1001*s* connected to the conductor layer A.

B of FIG. 108 is a plan view showing the conductor layer B (the wiring layer 165B), and an example layout of pads 1001*d* connected to the conductor layer B.

C of FIG. 108 is a plan view showing a state in which the conductor layers A and B shown in A and B of FIG. 108, and the pads 1001*s* and the pads 1001*d* are stacked.

In FIG. 108, the pads 1001*s* represent pads 1001 to which GND or a negative power supply is supplied, for example, and the pads 1001*d* represent pads 1001 to which a positive power supply is supplied, for example.

As shown in A of FIG. 108, the plurality of pads 1001*s* is connected, at predetermined intervals, to two adjacent sides of the rectangular main conductor portion 165Aa, via conductors 1011 of a shape that includes a predetermined repetitive pattern as appropriate. Each of the pads 1001*s* may be formed with an extension conductor portion 165Ab, or the conductors 1011 may be formed with extension conductor portions 165Ab. Further, in a case where the pads 1001*s* are extension conductor portions 165Ab, the conductors 1011 may not be included or may be included.

As shown in B of FIG. 108, the plurality of pads 1001*d* is connected, at predetermined intervals, to two adjacent sides of the rectangular main conductor portion 165Ba, via conductors 1012 of a shape that includes a predetermined repetitive pattern as appropriate. Each of the pads 1001*d* may be formed with an extension conductor portion 165Bb, or the conductors 1012 may be formed with extension conductor portions 165Bb. Further, in a case where the pads 1001*d* are extension conductor portions 165Bb, the conductors 1012 may not be included or may be included.

As shown in C of FIG. 108, where the conductor layers A and B are stacked, the layout of the pads 1001*s* and the pads 1001*d* is a mirror-symmetry arrangement in which the pads 1001*s* and the pads 1001*d* are arranged in a mirror-symmetrical manner, as in the example layout of pads shown in FIG. 106. However, this layout differs from the example layout of pads shown in FIG. 106, in that the polarities of the pads 1001 at the ends of the respective sides are the opposite phases of a pad 1001*s* and a pad 1001*d*, among the pads 1001*s* and the pads 1001*d* arranged on the two sides. In this manner, the polarities of the pads 1001 at the end portions closest to the corner of the substrate 1000 are made to have phases opposite of each other among the plurality of pads 1001 on the two sides on which the pads 1001*s* and the pads 1001*d* are arranged in a mirror-symmetrical manner. Accordingly, the impedance difference between the Vss wiring lines and the Vdd wiring lines can be made even smaller, and the current difference becomes even smaller. Thus, inductive noise can be made smaller than that in the seventeenth example layout shown in FIG. 106.

In the sixteenth through nineteenth example layouts of pads described above with reference to FIGS. 105 through 108, the plurality of pads 1001 is arranged, at predetermined intervals, on two adjacent sides of each rectangular main conductor portion 165*a* via the conductors 1011 or 1012. However, the pads 1001 are not necessarily arranged on two sides, but may be arranged on three or four sides.

Also, in the sixteenth through nineteenth example layouts of pads described above with reference to FIGS. 105 through 108, the layouts of the pads 1001 arranged on one side are the alternate arrangement shown in FIG. 93 or the two-stage mirror arrangement shown in FIG. 95. However, the one-stage mirror arrangement shown in FIG. 94 may be adopted, and the polarities of the pads 1001 at the end portions closest to the corner may be of the same phase or of the opposite phases.

Further, in the sixteenth through nineteenth example layouts of pads described above with reference to FIGS. 105 through 108, the extension conductor portions 165*b* are not included. However, in a configuration including extension conductor portions 165*b* on a side of the rectangular main conductor portion 165Aa as in FIGS. 96 through 104, the alternate arrangement shown in FIG. 93, the one-stage mirror arrangement shown in FIG. 94, or the two-stage mirror arrangement shown in FIG. 95 may be adopted, and the polarities of the pads 1001 at the end portions closest to the corner may be of the same phase or of the opposite phases.

Note that the extension conductor portions 165Ab and 165Bb, and the conductors 1011 and 1012 are preferably designed so that GND or a negative power supply is supplied from the pads 1001*s* to the main conductor portion 165Aa, and a positive power supply of the opposite polarity is supplied from the pads 1001*d* to the main conductor portion 165Ba, for example. However, the present technology is not limited to that. In other words, the extension conductor portions 165Ab and 165Bb, and the conductors 1011 and 1012 are preferably designed so that GND or a negative power supply and a positive power supply of the opposite polarity supplied from the pads 1001 will not be completely short-circuited, for example. However, the present technology is not limited to that. Note that at least some of FIGS. 92 through 108 show an example in which a plurality of pads 1001*s* is provided, an example in which a plurality of pads 1001*d* is provided, an example in which a plurality of conductors 1011 is provided, an example in which a plurality of conductors 1012 is provided, an example in which a plurality of extension conductor portions 165Ab is provided, an example in which a plurality of extension conductor portions 165Bb is provided, and the like. However, in each of the drawings, all the pads 1001*s* may be the same, or all the pads 1001*s* may not be the same, all the pads 1001*d* may be the same, all the pads 1001*d* may not be the same, all the conductors 1011 may be the same, all the conductors 1011 may not be the same, all the conductors 1012 may be the same, all the conductors 1012 may not be the same, all the extension conductor portions 165Ab may be the same, ail the extension conductor portions 165Ab may not be the same, all the extension conductor portions 165Bb may be the same, or all the extension conductor portions 165Bb may not be the same. Note that at least one of the following conditions preferably satisfied: the total number of pads 1001*s* and the total number of pads 1001*d* directly or indirectly connected to a main conductor portion 165*a* in the substrate 1000 are the same or substantially the same, the total number of pads 1001*s* and the total number of pads 1001*d* directly or indirectly connected to a main conductor portion 165*a* on predetermined two adjacent sides of the substrate 1000 are the same or substantially the same, the total number of pads 1001*s* and the total number of pads 1001*d* directly or indirectly connected to a main conductor portion 165*a* on predetermined two facing sides of the substrate 1000 are the same or substantially the same, the total number of pads 1001*s* and the total number of pads 1001*d* directly or indirectly connected to a main conductor portion 165*a* on a predetermined side of the substrate 1000 are the same or substantially the same, the total number of pads 1001*s* and the total number of pads 1001*d* directly or indirectly connected to at least two extension conductor portions 165*b* on predetermined two adjacent sides of the substrate 1000 are the same or substantially the same, the total number of pads 1001*s* and the total number of pads 1001*d* directly or indirectly connected to at least two extension conductor portions 165*b* on predetermined two facing sides of the substrate 1000 are the same or substantially the same, the total number of pads 1001*s* and the total number of pads 1001*d* directly or indirectly connected to at least one extension conductor portion 165*b* on a predetermined side of the substrate 1000 are the same or substantially the same, the total number of pads 1001*s* and the total number of pads 1001*d* directly or indirectly connected to at least two sets of conductors 1011 and 1012 on predetermined two adjacent sides of the substrate 1000 are the same or substantially the same, the total number of pads 1001*s* and the total number of pads 1001*d* directly or indirectly connected to at least two sets of conductors 1011 and 1012 on predetermined two facing sides of the substrate 1000 are the same or substantially the same, the total number of pads 1001*s* and the total number of pads 1001*d* directly or indirectly connected to at least one set of conductors 1011 and 1012 on a predetermined side of the substrate 1000 are the same or substantially the same. However, the present technology is not limited to that. For example, the total number of pads 1001*s* and the total number of pads 1001*d* described above are not necessarily the same, and the total number of pads 1001*s* and the total number of pads 1001*d* described above are not necessarily substantially the same.

<Example Layouts of Substrates of a Victim Conductor Loop and Aggressor Conductor Loops>

Figure 109:
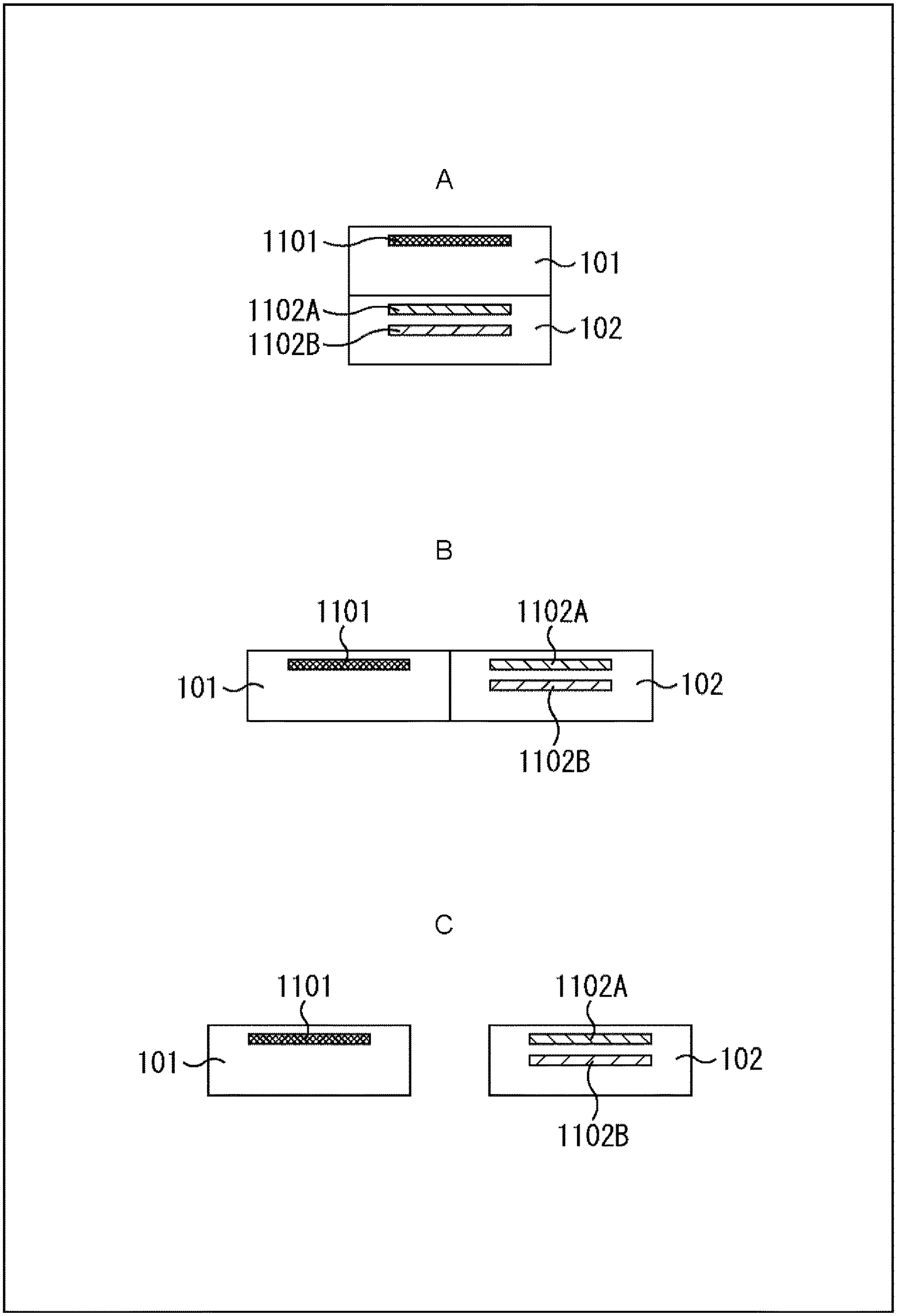
FIG. 109 is cross-sectional views showing example layouts of substrates of a victim conductor loop and aggressor conductor loops.

FIG. 109 shows example layouts of substrates of a victim conductor loop and aggressor conductor loops.

A of FIG. 109 is a cross-sectional view schematically showing an example layout of substrates of a victim conductor loop and aggressor conductor loops that have been described.

In the structure of each of the example configurations described above, a victim conductor loop 1101 is included in the first semiconductor substrate 101, aggressor conductor loops 1102A and 1102B are included is the second semiconductor substrate 102, and the first semiconductor substrate 101 and the second semiconductor substrate 102 are stacked, as shown in A of FIG. 109.

However, the first semiconductor substrate 101 and the second semiconductor substrate 102 may not be stacked, and it is possible to adopt a structure in which the first semiconductor substrate 101 and the second semiconductor substrate 102 are arranged adjacent to each other as shown in B of FIG. 109, or the first semiconductor substrate 101 and the second semiconductor substrate 102 are disposed in the same plane at a predetermined distance from each other as shown in C of FIG. 109.

Figure 110:
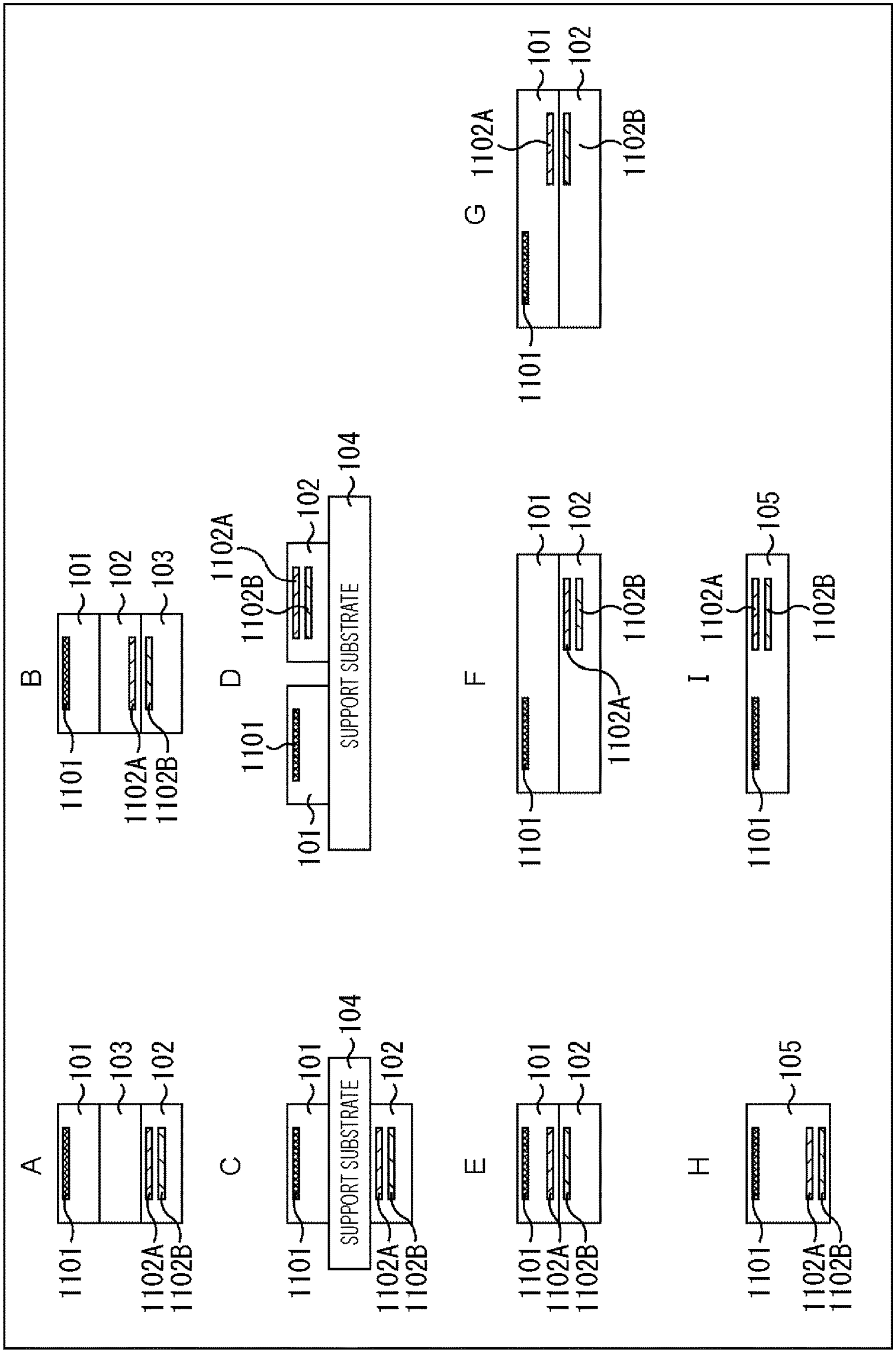
FIG. 110 is cross-sectional views showing example layouts of substrates of a victim conductor loop and aggressor conductor loops.

Further, the substrate layout of the victim conductor loop and the aggressor conductor loops may be any of the various component layouts shown in A through I of FIG. 110.

A of FIG. 110 shows a structure in which the victim conductor loop 1101 is included in the first semiconductor substrate 101, the aggressor conductor loops 1102A and 1102B are included in the second semiconductor substrate 102, a third semiconductor substrate 103 is inserted between the first semiconductor substrate 101 and the second semiconductor substrate 102, and the first through third semiconductor substrates 101 through 103 are stacked.

B of FIG. 110 shows a structure in which the victim conductor loop 1101 is included in the first semiconductor substrate 101, the aggressor conductor loop 1102A is included in the second semiconductor substrate 102, the aggressor conductor loop 1102B is included in the third semiconductor substrate 103, and the first through third semiconductor substrates 101 through 103 are stacked in that order.

C of FIG. 110 shows a structure in which the victim conductor loop 1101 is included in the first semiconductor substrate 101, the aggressor conductor loops 1102A and 1102B are included in the second semiconductor substrate 102, a support substrate 104 is inserted between the first semiconductor substrate 101 and the second semiconductor substrate 102, and the first semiconductor substrate 101, the support substrate 104, and the second semiconductor substrate 102 are stacked in that order. The support substrate 104 may not be included, and the first semiconductor substrate 101 and the second semiconductor substrate 102 may be disposed at a predetermined distance from each other.

D of FIG. 110 shows a structure in which the victim conductor loop 1101 is included in the first semiconductor substrate 101, the aggressor conductor loops 1102A and 1102B are included in the second semiconductor substrate 102, and the first semiconductor substrate 101 and the second semiconductor substrate 102 are placed on the support substrate 104 and are disposed in the same plane at a predetermined distance from each other. The support substrate 104 may not be included, and the first semiconductor substrate 101 and the second semiconductor substrate 102 may be supported at a different site so as to be located in the same plane.

E of FIG. 110 shows a structure in which the victim conductor loop 1101 and the aggressor conductor loop 1102A are included in the first semiconductor substrate 101, the aggressor conductor loop 1102B is included in the second semiconductor substrate 102, and the first semiconductor substrate 101 and the second semiconductor substrate 102 are stacked. Here, the region in the X-Y plane in which the victim conductor loop 1101 is formed in the first semiconductor substrate 101 at least partially overlaps the region in the X-Y plane in which the aggressor conductor loops 1102A and 1102B are formed in the second semiconductor substrate 102.

F of FIG. 110 shows a structure in which the victim conductor loop 1101 is included in the first semiconductor substrate 101, the aggressor conductor loops 1102A and 1102B are included in the second semiconductor substrate 102, and the first semiconductor substrate 101 and the second semiconductor substrate 102 are stacked. Here, the region in the X-Y plane in which the victim conductor loop 1101 is formed in the first semiconductor substrate 101 may be completely different from or partially overlap the region in the X-Y plane in which the aggressor conductor loops 1102A and 1102B are formed in the second semiconductor substrate 102.

G of FIG. 110 shows a structure in which the victim conductor loop 1101 and the aggressor conductor loop 1102A are included in the first semiconductor substrate 101, the aggressor conductor loop 1102B is included in the second semiconductor substrate 102, and the first semiconductor substrate 101 and the second semiconductor substrate 102 are stacked. Here, the region in the X-Y plane in which the victim conductor loop 1101 is formed in the first semiconductor substrate 101 is a different region from the region in the X-Y plane in which the aggressor conductor loops 1102A and 1102B are formed.

H of FIG. 110 shows a structure in which the victim conductor loop 1101 and the aggressor conductor loops 1102A and 1102B are included in one semiconductor substrate 105. However, in the single semiconductor substrate 105, the region in the X-Y plane in which the victim conductor loop 1101 is formed at least partially overlaps the region in the X-Y plane in which the aggressor conductor loops 1102A and 1102B are formed.

I of FIG. 110 shows a structure in which the victim conductor loop 1101 and the aggressor conductor loops 1102A and 1102B are included in the single semiconductor substrate 105. However, in the single semiconductor substrate 105, the region in the X-Y plane in which the victim conductor loop 1101 is formed a different region from the region in the X-Y plane in which the aggressor conductor loops 1102A and 1102B are formed.

The stacking order of the respective substrates shown in A through I of FIG. 110 may be reversed so that the positions of the victim conductor loop 1101 and the aggressor conductor loops 1102A and 1102B are turned upside down.

As described above, the number and the layout of the semiconductor substrates including the victim conductor loop 1101 and the aggressor conductor loops 1102A and 1102B, and the presence/absence of the support substrate may vary in many ways.

The aggressor conductor loops that generate the magnetic fluxes to pass through the loop plane of the victim conductor loop may or may not overlap the victim conductor loop. Further, the aggressor conductor loops may be formed in a plurality of semiconductor substrates stacked on the semiconductor substrate in which the victim conductor loop is formed, or may be formed in the same semiconductor substrate as the victim conductor loop.

Further, the aggressor conductor loops may not be included in a semiconductor substrate, but may be included in any substrate such as a printed board, a flexible printed board, an interposer substrate, a package substrate, an inorganic substrate, or an organic substrate, for example, as long as a conductor is included or a conductor can be formed in the substrate. The aggressor conductor loops may exist in a circuit that is not a semiconductor substrate but is like a package or the like in which a semiconductor substrate is sealed. Normally, the distance of each aggressor conductor loop to the victim conductor loop becomes shorter in the following order; the distance in a case where the aggressor conductor loops are formed in a semiconductor substrate, the distance in a case where the aggressor conductor loops are formed in a package, and the distance in a case where the aggressor conductor loops are formed in a printed board. The inductive noise or the capacitive noise that might be generated in the victim conductor loop easily increases in a case where the distance of each aggressor conductor loop to the victim conductor loop is shorter. Accordingly, the present technology is more effective in a case where the distance of each aggressor conductor loop to the victim conductor loop is shorter. Further, the present technology can be applied not only to substrates, but also to the conductors that are typically conductor wires and conductor plates, such as bonding wires, lead wires, antenna wires, power lines, GND lines, coaxial wires, dummy wires, a sheet metals.

Figure 111:
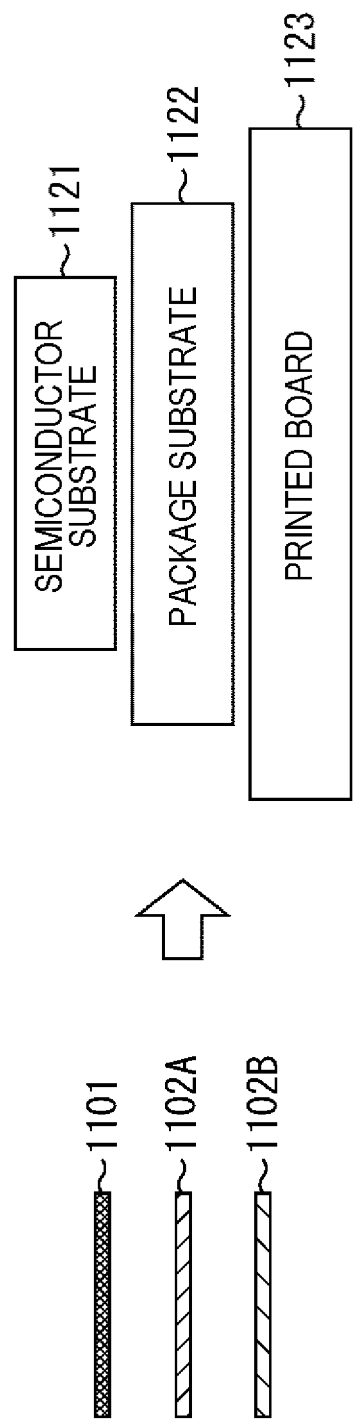
FIG. 111 is a diagram for explaining example layouts of a victim conductor loop and aggressor conductor loops in a structure in which three kinds of substrates are stacked.

Next, as shown in FIG. 111, in a structure in which the three kinds of substrate, which are a semiconductor substrate 1121, a package substrate 1122, and a printed board 1123, are stacked, a conductor 1101 that is at least part of the victim conductor loop (hereinafter referred to as the victim conductor loop 1101), and conductors 1102A and 1102B that are at least part of the aggressor conductor loops (hereinafter, referred to as Aggressor conductor loops 1102A and 1102B) are arranged. This example layout will be described below. Although not shown in the drawing, the victim conductor loop or the aggressor conductor loops described above might include at least conductors disposed in two or more substrates among the semiconductor substrate 1121, the package substrate 1122, and the printed board 1123. The semiconductor substrate 1121 can be replaced with any of the following substrates: a package substrate, an interposer substrate, a printed board, a flexible printed board, an inorganic substrate, an organic substrate, a substrate including a conductor, or a substrate in which a conductor can be formed. Also, the package substrate 1122 can be replaced with any of the following substrates: a semiconductor substrate, an interposer substrate, a printed board, a flexible printed board, an inorganic substrate, an organic substrate, a substrate including a conductor, or a substrate in which a conductor can be formed. Further, the printed board 1123 can be replaced with any of the following substrates: a semiconductor substrate, a package substrate, an interposer substrate, a flexible printed board, an inorganic substrate, an organic substrate, a substrate including a conductor, or a substrate in which a conductor can be formed.

Figure 112:
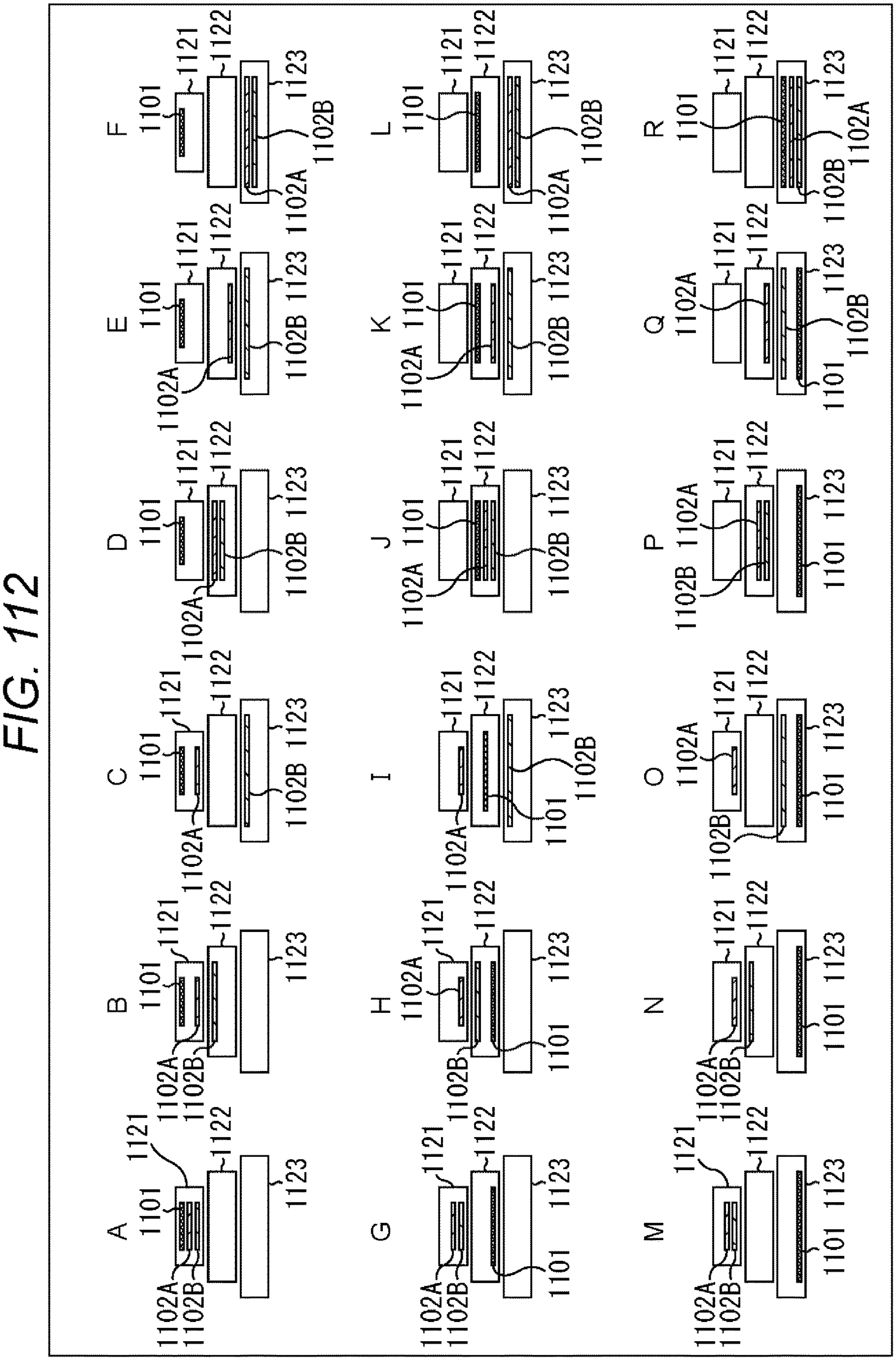
FIG. 112 is a diagram for explaining example layouts of a victim conductor loop and aggressor conductor loops in a structure in which three kinds of substrates are stacked.

A through R of FIG. 112 show example layouts of a victim conductor loops and aggressor conductor loops in a stack structure in which the three kinds of substrates shown in FIG. 111 are stacked.

A of FIG. 112 shows a schematic view of a stack structure in which the victim conductor loop 1101 and the aggressor conductor loops 1102A and 1102B are all included in the semiconductor substrate 1121. The package substrate 1122 and the printed board 1123 in which neither the victim conductor loop 1101 nor the aggressor conductor loops 1102A and 1102B are formed may be omitted.

B of FIG. 112 shows a schematic view of a stack structure in which the victim conductor loop 1101 and the aggressor conductor loop 1102A are included in the semiconductor substrate 1121, and the aggressor conductor loop 1102B is included in the package substrate 1122. The printed board 1123 in which neither the victim conductor loop 1101 nor the aggressor conductor loops 1102A and 11021B are formed may be omitted.

C of FIG. 112 shows a schematic view of a stack structure in which the victim conductor loop 1101 and the aggressor conductor loop 1102A are included in the semiconductor substrate 1121, and the aggressor conductor loop 1102B is included in the printed board 1123. The package substrate 1122 in which neither the victim conductor loop 1101 nor the aggressor conductor loops 1102A and 1102B are formed may be omitted.

D of FIG. 112 shows a schematic view of a stack structure in which the victim conductor loop 1101 is included in the semiconductor substrate 1121, and the aggressor conductor loops 1102A and 1102B are included in the package substrate 1122. The printed board 1123 in which neither the victim conductor loop 1101 nor the aggressor conductor loops 1102A and 1102B are formed may be omitted.

E of FIG. 112 shows a schematic view of a stack structure in which the victim conductor loop 1101 is included in the semiconductor substrate 1121, the aggressor conductor loop 1102A is included in the package substrate 1122, and the aggressor conductor loop 1102B is included in the printed board 1123.

F of FIG. 112 shows a schematic view of a stack structure in which the victim conductor loop 1101 is included in the semiconductor substrate 1121, and the aggressor conductor loops 1102A and 1102B are included in the printed board 1123. The package substrate 1122 in which neither the victim conductor loop 1101 nor the aggressor conductor loops 1102A and 1102B are formed may be omitted.

G of FIG. 112 shows a schematic view of a stack structure in which the aggressor conductor loops 1102A and 1102B are included in the semiconductor substrate 1121, and the victim conductor loop 1101 is included in the package substrate 1122. The printed board 1123 in which neither the victim conductor loop 1101 nor the aggressor conductor loops 1102A and 1102B are formed may be omitted.

H of FIG. 112 shows a schematic view of a stack structure in which the aggressor conductor loop 1102A is included in the semiconductor substrate 1121, and the aggressor conductor loop 11023 and the victim conductor loop 1101 are included in the package substrate 1122. The printed board 1123 in which neither the victim conductor loop 1101 nor the aggressor conductor loops 1102A and 1102B are formed may be omitted.

I of FIG. 112 shows a schematic diagram of a stack structure in which the aggressor conductor loop 1102A is included in the semiconductor substrate 1121, the victim conductor loop 1101 is included in the package substrate 1122, and the aggressor conductor loop 1102B is included in the printed board 1123.

J of FIG. 112 shows a schematic view of a stack structure in which the victim conductor loop 1101 and the aggressor conductor loops 1102A and 1102B are all included in the package substrate 1122. The semiconductor substrate 1121 and the printed board 1123 in which neither the victim conductor loop 1101 nor the aggressor conductor loops 1102A and 1102B are formed may be omitted.

K of FIG. 112 shows a schematic view of a stack structure in which the victim conductor loop 1101 and the aggressor conductor loop 1102A are included in the package substrate 1122, and the aggressor conductor loop 1102B is included in the printed board 1123. The semiconductor substrate 1121 in which neither the victim conductor loop 1101 nor the aggressor conductor loops 1102A and 1102B are formed may be omitted.

I of FIG. 112 shows a schematic view of a stack structure in which the victim conductor loop 1101 is included in the package substrate 1122, and the aggressor conductor loops 1102A and 1102B are included in the printed board 1123. The semiconductor substrate 1121 in which neither the victim conductor loop 1101 nor the aggressor conductor loops 1102A and 1102B are formed may be omitted.

M of FIG. 112 shows a schematic view of a stack structure in which the aggressor conductor loops 1102A and 1102B are included in the semiconductor substrate 1121, and the victim conductor loop 1101 is included in the printed board 1123. The package substrate 1122 in which neither the victim conductor loop 1101 nor the aggressor conductor loops 1102A and 1102B are formed may be omitted.

N of FIG. 112 shows a schematic diagram of a stack structure in which the aggressor conductor loop 1102A is included in the semiconductor substrate 1121, the aggressor conductor loop 1102B is included in the package substrate 1122, and the victim conductor loop 1101 is included in the printed board 1123.

O of FIG. 112 shows a schematic view of a stack structure in which the aggressor conductor loop 1102A is included in the semiconductor substrate 1121, and the aggressor conductor loop 1102B and the victim conductor loop 1101 are included in the printed board 1123. The package substrate 1122 in which neither the victim conductor loop 1101 nor the aggressor conductor loops 1102A and 11021B are formed may be omitted.

P of FIG. 112 shows a schematic view of a stack structure in which the aggressor conductor loops 1102A and 1102B are included in the package substrate 1122, and the victim conductor loop 1101 is included in the printed board 1123. The semiconductor substrate 1121 in which neither the victim conductor loop 1101 nor the aggressor conductor loops 1102A and 1102B are formed may be omitted.

Q of FIG. 112 shows a schematic view of a stack structure in which the aggressor conductor loop 1102A is included in the package substrate 1122, and the aggressor conductor loop 1102B and the victim conductor loop 1101 are included in the printed board 1123. The semiconductor substrate 1121 in which neither the victim conductor loop 1101 nor the aggressor conductor loops 1102A and 1102B are formed may be omitted.

R of FIG. 112 shows a schematic view of a stack structure in which the victim conductor loop 1101 and the aggressor conductor loops 1102A and 1102B are all included in the printed board 1123. The semiconductor substrate 1121 and the package substrate 1122 in which neither the victim conductor loop 1101 nor the aggressor conductor loops 1102A and 1102B are formed may be omitted.

The stacking order of the respective substrates shown in A through R of FIG. 112 may be reversed so that the positions of the victim conductor loop 1101 and the aggressor conductor loop 1102A or the aggressor conductor loop 1102B are turned upside down.

As described above, the victim conductor loop 1101 and the aggressor conductor loops 1102A and 1102B can be formed in any regions in the semiconductor substrate 1121, the package substrate 1122, and the printed board 1123.

<Examples of Package Stacking of the First Semiconductor Substrate 101 and the Second Semiconductor Substrate 102 Constituting the Solid-State Imaging Device 100>

Figure 113:
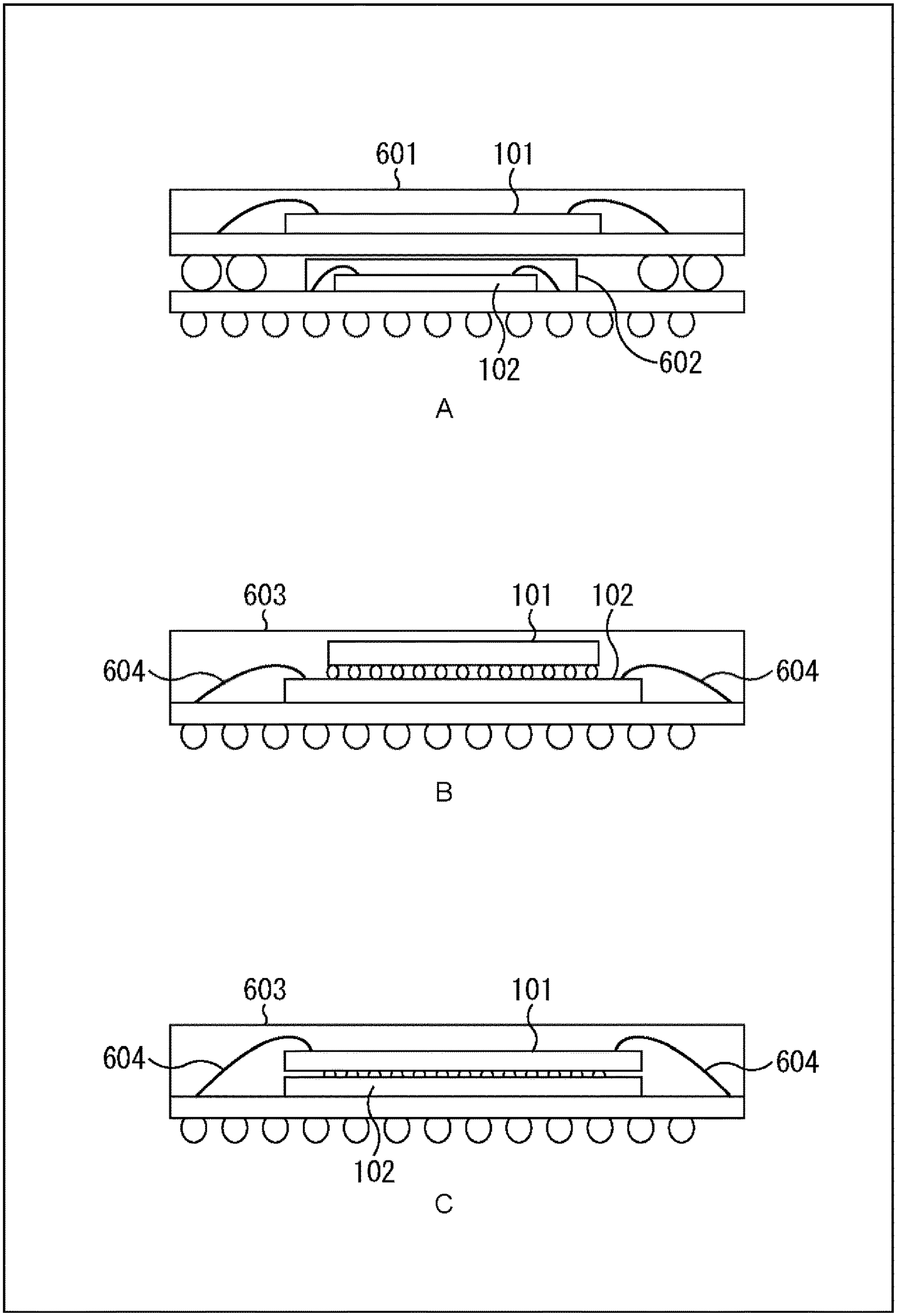
FIG. 113 is a diagram showing examples of package stacking of the first semiconductor substrate and the second semiconductor substrate that constitute a solid-state imaging device.

FIG. 113 is a diagram showing examples of package stacking of the first semiconductor substrate 101 and the second semiconductor substrate 102 that constitute the solid-state imaging device 100.

The first semiconductor substrate 101 and the second semiconductor substrate 102 may be stacked as packages on each other in any appropriate manner.

For example, as shown in A of FIG. 113, the first semiconductor substrate 101 and the second semiconductor substrate 102 may be sealed with a sealing material independently of each other, and the resultant package 601 and package 602 may be stacked.

Alternatively, as shown in B or C of FIG. 113, the first semiconductor substrate 101 and the second semiconductor substrate 102 in a stacked state may be sealed with a sealing material, to form a package 603. In this case, bonding wires 604 may be connected to the second semiconductor substrate 102 as shown in B of FIG. 113, or may be connected to the first semiconductor substrate 101 as shown in C of FIG. 113.

Further, each package may be in any form. For example, a chip size package (CSP) or a wafer level chip size package (WL-CSP) may be used, or an interposer substrate or a rewiring layer may be used in a package. Further, any form without a package may be adopted too. For example, a semiconductor substrate may be mounted as a chip on board (COB). For example, it is possible to adopt any of the following forms: a ball grid array (BOA), a chip on board (COB), a chip on tape (COT), a chip size package/chip scale package (CSP), a dual in-line memory module (DIMM), a dual in-line package (DIP), a fine-pitch ball grid array (FBGA), a fine-pitch land grid array (FLGA), a fine-pitch quad flat package (FQFP), a single in-line package with heatsink (HSIP), a leadless chip carrier (LCC), a low profile fine pitch land grid array (LFLGA), a land grid array (LGA), a low-profile quad flat package (LQFP), a multi-chip fine-pitch ball grid array (MC-FBGA), a multi-chip module (MCM), a multi-chip package (MCP), a molded chip size package (M-CSP), a mini flat package (MFP), a metric quad flat package (MQFP), a metal quad (MQUAD), a micro small outline package (MSOP), a pin grid array (PGA), a plastic leaded chip carrier (PLCC), a plastic leadless chip carrier (PLCC), a quad flat i-leaded package (QFI), a quad flat j-leaded package (QFJ), quad flat non-leaded package (QFN), a quad flat package (QFP), a quad tape carrier package (QTCP), a quad in-line package (QUIP), a shrink dual in-line package (SDIP), a single in-line memory module (SIMM), a single in-line package (SIP), a stacked multi chip package (S-MCP), a small outline non-leaded board (SNB), a small outline i-leaded package (SOI), a small outline j-leaded package (SOJ), a small outline non-leaded package (SON), a small outline package (SOP), a shrink single in-line package (SSIP), a shrink small outline package (SSOP), a shrink zigzag in-line package (SZIP), tape-automated bonding (TAB), a tape carrier package (TCP), a thin quad flat package (TQFP), a thin small outline package (TSOP), a thin shrink small outline package (TSSOP), an ultra chip scale package (UCSP), an ultra thin small outline package (UTSOP), a very short pitch small outline package (VSO), a very small outline package (VSOP), a wafer level chip size package (WL-CSP), a zigzag in-line package (ZIP), or a micro multi-chip package (μMCP).

The present technology is applied to any sensor such as a charge-coupled device (CCD) image sensor, a CCD sensor, a CMOS sensor, a MOS sensor, an infrared (IR) sensor, an ultraviolet (UV) sensor, a time of flight (ToF) sensor, or a ranging sensor, a circuit board, a device, or an electronic apparatus, for example.

Further, the present technology is suitable for a sensor, a circuit board, an apparatus, or an electronic apparatus in which some devices such as transistors, diodes, or antennas are arranged in an array, and are particularly suitable for a sensor, a circuit board, an apparatus, or an electronic apparatus in which some devices are arranged in substantially the same plane. However, the present technology is not limited to those examples.

The present technology can also be applied to: various kinds of memory sensors to which memory devices are related, a memory circuit board, a memory unit, or an electronic apparatus including a memory; various kinds of CCD sensors to which CCDs are related, a CCD circuit board, a CCD apparatus, or an electronic apparatus including a CCD; various kinds of CMOS sensors to which CMOSs are related, a CMOS circuit board, a CMOS apparatus, or an electronic apparatus including a CMOS; various kinds of MOS sensors to which MOSs are related, a MOS circuit board, a MOS apparatus, an electronic apparatus including a MOS; various kinds of display sensors to which light emitting devices are related, a display circuit board, a display device, or an electronic apparatus including a display; various kinds of laser sensors to which light emitting devices are related, a laser circuit board, a laser device, or an electronic apparatus including a laser; various kinds of antenna sensors to which antenna devices are related, an antenna circuit board, an antenna unit, or an electronic apparatus including an antenna, or the like, for example. Of these examples, the following are preferable: a sensor, a circuit board, a device, or an electronic apparatus including a victim conductor loop with a variable loop path; a sensor, a circuit board, a device, or an electronic apparatus including a control line or a signal line; a sensor, a circuit board, a device, or an electronic apparatus that include a horizontal control line or a vertical signal line, or the like. However, the preferable examples are not limited to these examples.

<11. Example Positions of Conductive Shields>

In the example configurations described above, the conductor layer A (the wiring layer 165A) and the conductor layer B (the wiring layer 165B) are designed so that inductive noise can be reduced. In the description below, on the other hand, configurations for further reducing inductive noise by adding one or more conductive shields will be described.

Figure 114:
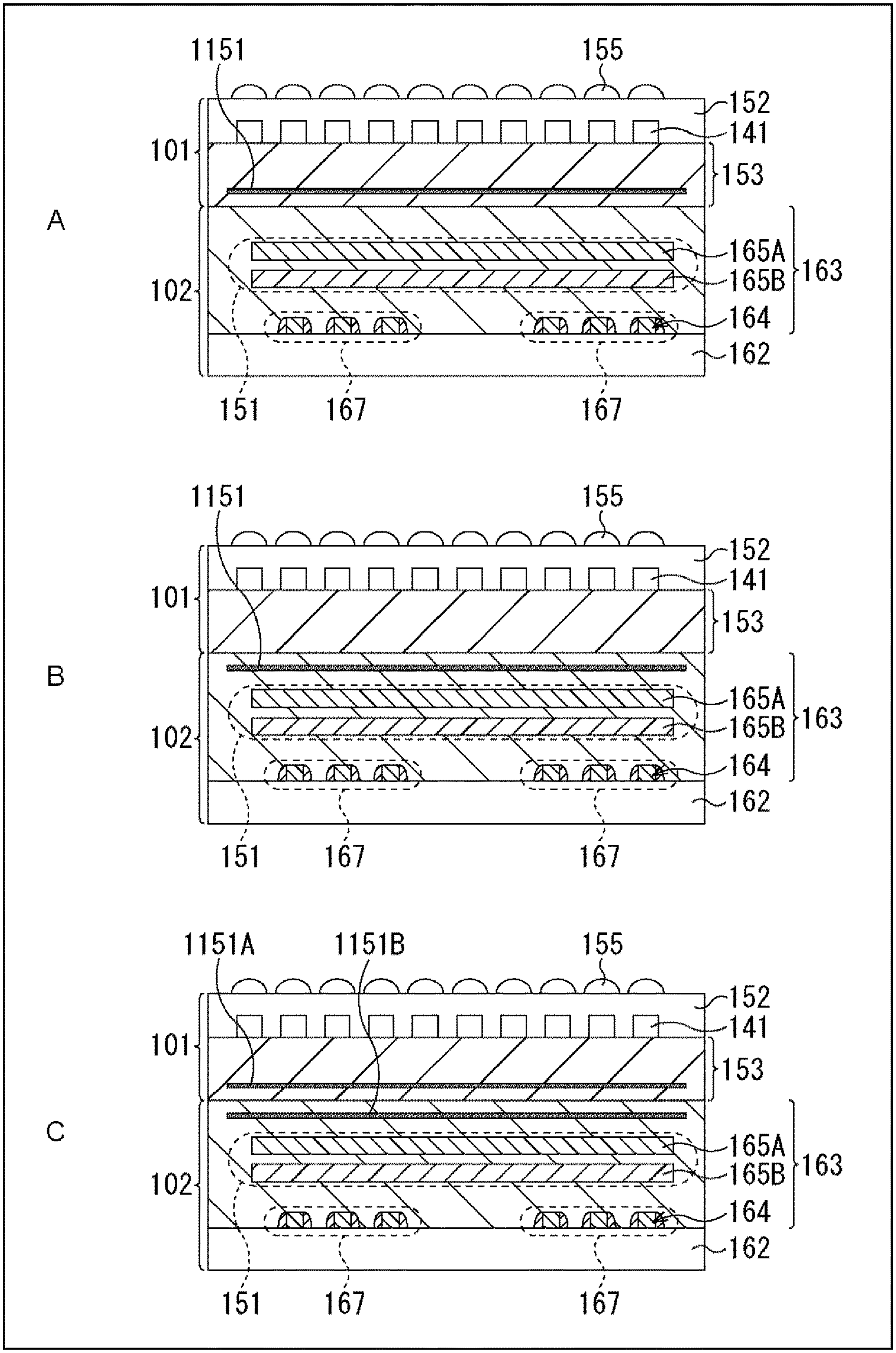
FIG. 114 is cross-sectional views showing example configurations in which a conductive shield is provided.
Figure 115:
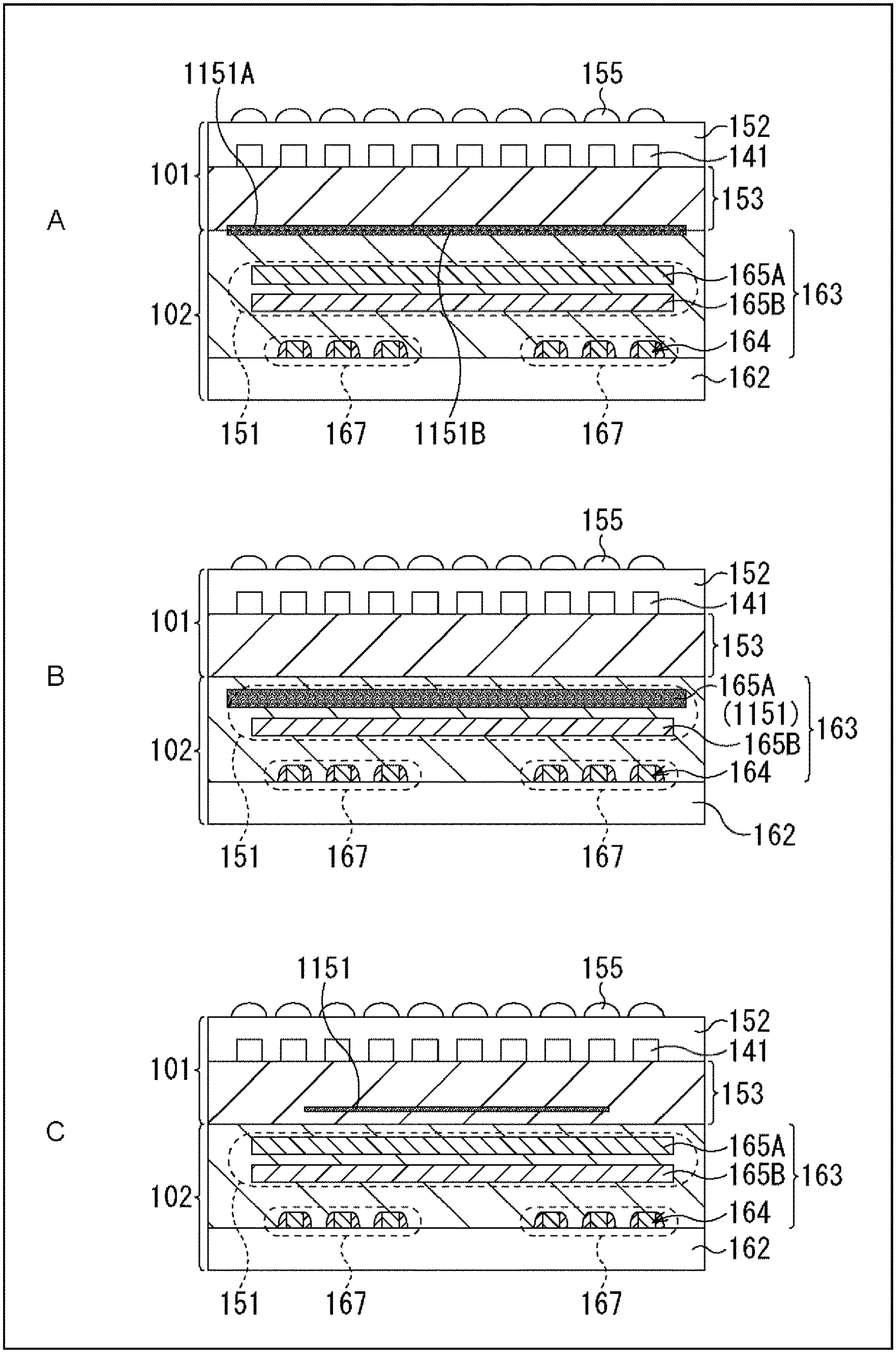
FIG. 115 is cross-sectional views showing example configurations in which a conductive shield is provided.

FIGS. 114 and 115 are cross-sectional views showing example configurations in which one or more conductive shields are provided for the solid-state imaging device 100 in which the first semiconductor substrate 101 and the second semiconductor substrate 102 shown in FIG. 6 are stacked.

Note that, in FIGS. 114 and 115, the components other than the conductive shield(s) are similar to those of the structure shown in FIG. 6, and therefore, explanation of them will not be repeated.

A of FIG. 114 is a cross-sectional view showing a first example configuration in which a conductive shield is provided for the solid-state imaging device 100 shown in FIG. 6.

In A of FIG. 114, a conductive shield 1151 is formed in the multilayer wiring layer 153 of the first semiconductor substrate 101.

B of FIG. 114 is a cross-sectional view showing a second example configuration in which a conductive shield is provided for the solid-state imaging device 100 shown in FIG. 6.

In B of FIG. 114, a conductive shield 1151 is formed in the multilayer wiring layer 163 of the second semiconductor substrate 102.

C of FIG. 114 is a cross-sectional view showing a third example configuration in which conductive shields are provided for the solid-state imaging device 100 shown in FIG. 6.

In C of FIG. 114, a conductive shield 1151 is formed in each of the multilayer wiring layers of first semiconductor substrate 101 and the second semiconductor substrate 102. More specifically, a conductive shield 1151A is formed in the multilayer wiring layer 153 of the first semiconductor substrate 101, and a conductive shield. 1151B is formed in the multilayer wiring layer 163 of the second semiconductor substrate 102.

A of FIG. 115 is a cross-sectional view showing a fourth example configuration in which conductive shields are provided for the solid-state imaging device 100 shown in FIG. 6.

In A of FIG. 115, a conductive shield 1151 is formed in each of the multilayer wiring layers of first semiconductor substrate 101 and the second semiconductor substrate 102, and these conductive shields are joined. More specifically, a conductive shield 1151A is formed on the joining surface with the multilayer wiring layer 163 of the second semiconductor substrate 102 in the multilayer wiring layer 153 of the first semiconductor substrate 101, and a conductive shield 1151B is formed on the joining surface with the multilayer wiring layer 153 of the first semiconductor substrate 101 in the multilayer wiring layer 163 of the second semiconductor substrate 102. The conductive shields 1151A and 1151B are joined by homogenous metal bonding such as Cu—Cu bonding, Au—Au bonding, or Al—Al bonding, or by dissimilar metal bonding such as Cu—Au bonding, Cu—Al bonding, or Au—Al bonding, for example.

Note that C of FIG. 114 and A of FIG. 115 are examples in which the planar regions of the conductive shields 1151A and 1151B are the same, but these planar regions are only required to at least partially overlap each other and be joined to each other.

B of FIG. 115 is a cross-sectional view showing a fifth example configuration in which a conductive shield is provided for the solid-state imaging device 100 shown in FIG. 6.

In B of FIG. 115, the wiring layer 165A, which is the conductor layer A, also functions as a conductive shield 1151. Part of the wiring layer 165A may be the conductive shield 1151.

C of FIG. 115 is a cross-sectional view showing a sixth example configuration in which conductive shields are provided for the solid-state imaging device 100 shown in FIG. 6.

In the sixth example configuration in C of FIG. 115, the conductive shield 1151 is formed in the multilayer wiring layer 153, as in the first example configuration shown in A of FIG. 114. However, the planar region in which the conductive shield 1151 is formed is designed to be smaller than the planar regions of the wiring layer 165A as the conductor layer A and the wiring layer 165B as the conductor layer B.

As in the first example configuration in A of FIG. 114, the area of the planar region in which the conductive shield 1151 is formed is preferably equal to or larger than the area of the planar region of the wiring layer 165A as the conductor layer A, and the area of the planar region of the wiring layer 165B as the conductor layer B. However, the area of the planar region in which the conductive shield 1151 is formed may be designed to be smaller, as in B of FIG. 115.

As the conductive shield(s) 1151 is (are) provided as in the first through sixth example configurations in FIGS. 114 and 115, inductive noise can be further reduced.

The first through sixth example configurations in FIGS. 114 and 115 are examples in which the conductive shield 1151 shields the two layers of the wiring layers 165A and 165B, but may shield only one wiring layer.

In the first through sixth example configurations in FIGS. 114 and 115, a magnetic shield may be used instead of the conductive shield 1151. This magnetic shield may be conductive or non-conductive. In a case where the magnetic shield is conductive, inductive noise and capacitive noise can be further reduced.

Referring now to FIGS. 116 through 119, the position and the planar shape of the conductive shield 1151 relative to signal lines 132 formed in the first semiconductor substrate 101 are described.

FIGS. 116 through 119 show first through fourth example configurations of the position and the planar shape of the conductive shield 1151 relative to the signal lines 132. The first through fourth example configurations in FIGS. 116 through 119 are the same, except for the planar shape of the conductive shield 1151.

Figure 116:
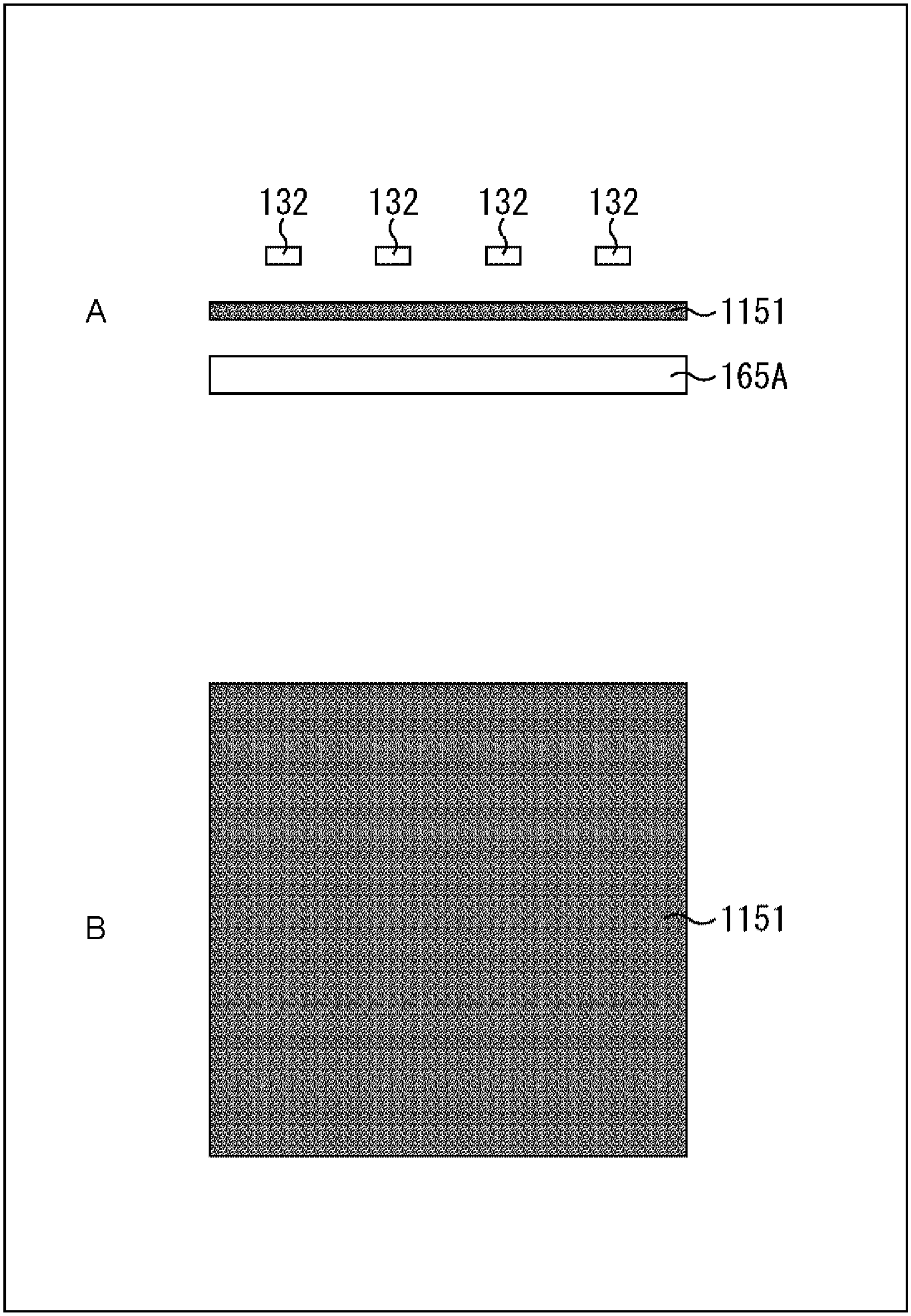
FIG. 116 is a diagram showing a first example configuration of the position and the planar shape of a conductive shield relative to signal lines.

A of FIG. 116 is a cross-sectional view showing the positional relationship in the Z direction among the signal lines 132 for transmitting analog pixel signals, the conductive shield 1151, and the wiring layer 165A in the first semiconductor substrate 101. B of FIG. 116 is a plan view showing the planar shape of the conductive shield 1151.

As shown in A of FIG. 116, the conductive shield 1151 is disposed between the signal lines 132 and the wiring layer 165A. As shown in B of FIG. 116, the planar shape of the conductive shield 1151 can be designed to be a flat face.

Figure 117:
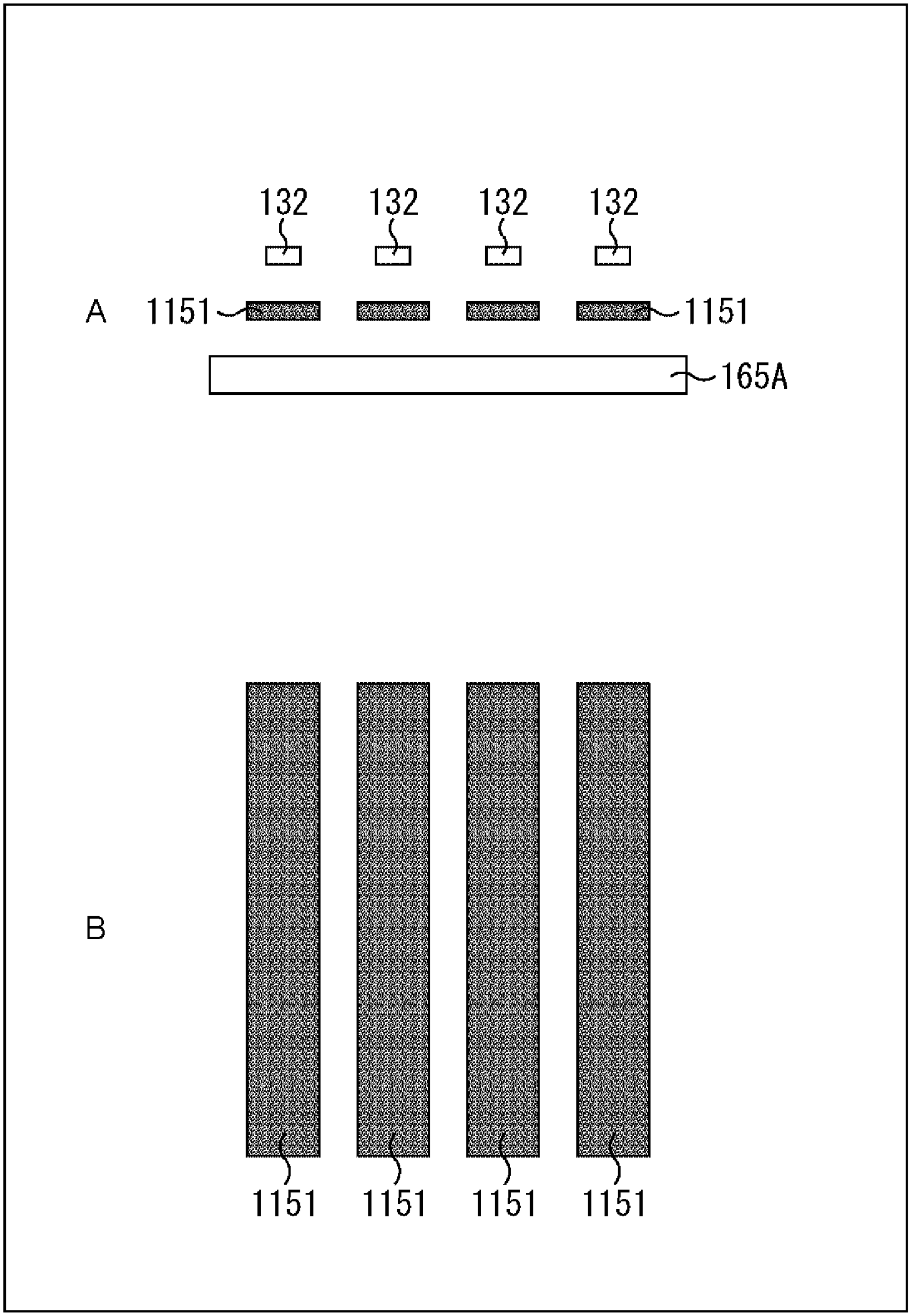
FIG. 117 is a diagram showing a second example configuration of the position and the planar shape of a conductive shield relative to signal lines.

Alternatively, as in the second example configuration in A and B of FIG. 117, the planar shape of the conductive shield 1151 may be formed in a linear shape, and the respective linear regions can be formed to overlap the signal lines 132 in one-to-one correspondence.

Figure 118:
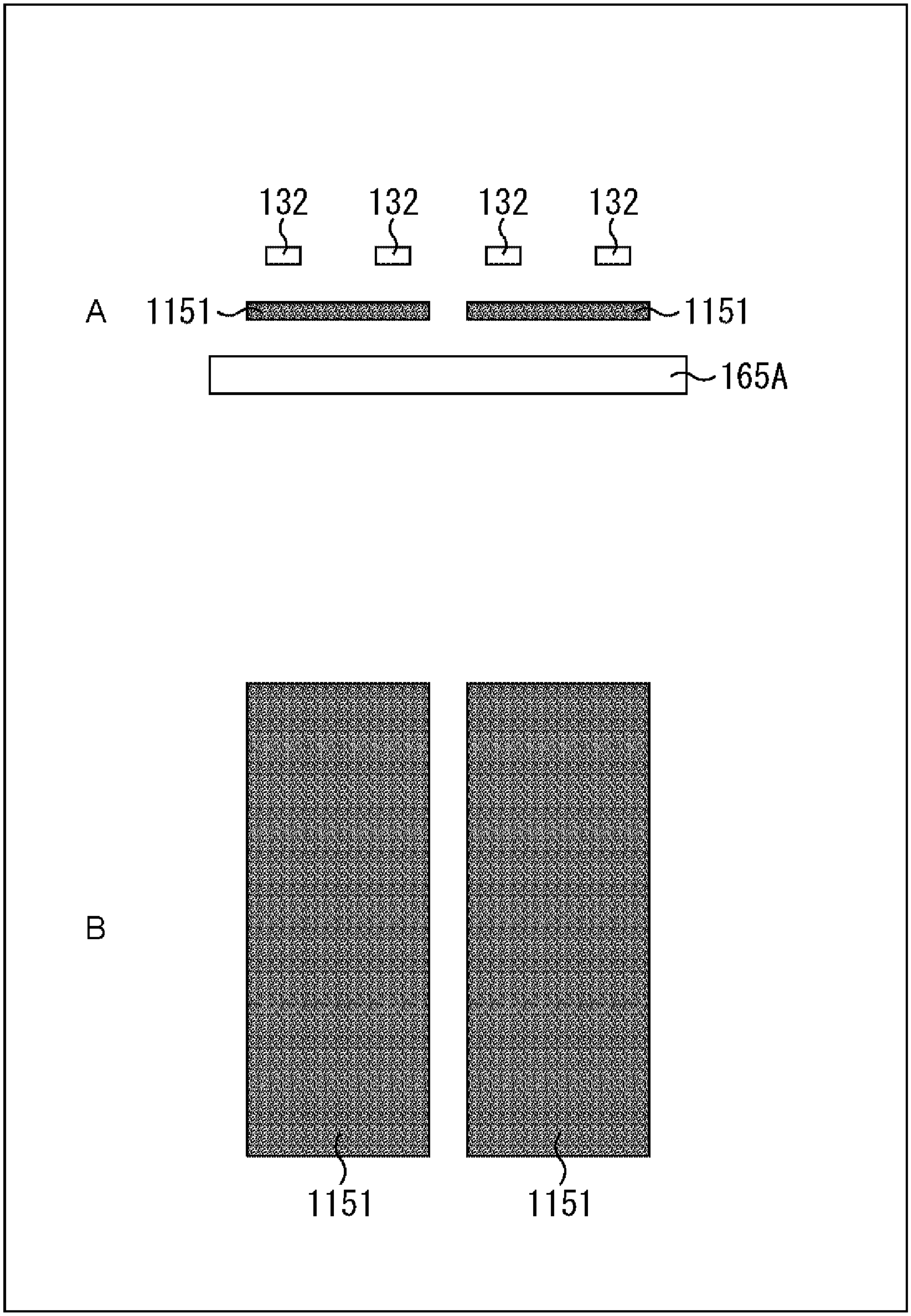
FIG. 118 is a diagram showing a third example configuration of the position and the planar shape of a conductive shield relative to signal lines.

Alternatively, the respective linear regions of the conductive shield 1151 do not necessarily correspond to the signal lines 132 one by one as in the second example configuration in A and B of FIG. 117, but one linear region may be formed to overlap a plurality of signal lines 132 as in a third example configuration in A and B of FIG. 118, for example. Although one linear region of the conductive shield 1151 corresponds to two signal lines 132 in the planar shape shown in FIG. 118, one linear shape may correspond to three or more signal lines 132.

Figure 119:
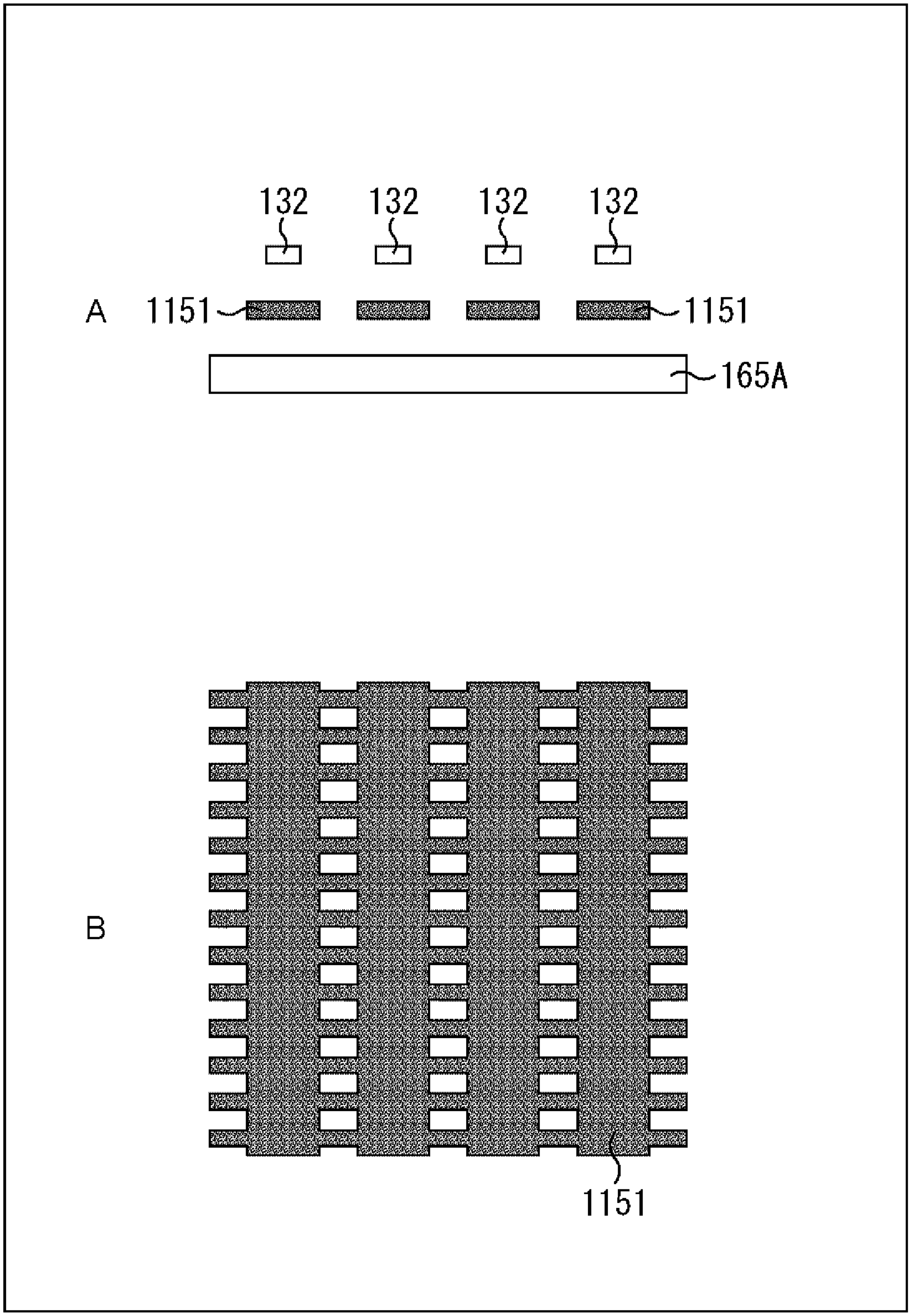
FIG. 119 is a diagram showing a fourth example configuration of the position and the planar shape of a conductive shield relative to signal lines.

Alternatively, the planar shape of the conductive shield 1151 may not be formed in a linear shape, but may be designed as a mesh-like form as in the fourth example configuration in A and B of FIG. 119. The conductor widths, the gap widths, and the conductor cycles of vertical conductors extending in the vertical direction (Y direction) of the mesh-like conductive shield 1151 may differ from or may be the same as the conductor widths, the gap widths, and the conductor cycles of horizontal conductors extending in the horizontal direction (X direction).

In the first through fourth example configurations in FIGS. 116 through 119, the conductive shield 1151 is formed as one layer, but may be formed as two layers as shown in C of FIG. 114 and A of FIG. 115. Further, the same applies in cases where the wiring layer 165A shown in FIGS. 116 through 119 is replaced with the wiring layer 165B.

Although the conductive shield 1151 is formed at a position overlapping the entire regions of the signal lines 132, the conductive shield 1151 may be formed at a position overlapping some of the regions, or may be formed at a position not overlapping any of the regions of the signal lines 132. However, since noise often propagates through signal lines, the conductive shield 1151 is preferably located at a position overlapping the signal lines 132.

Although the formation position of the conductive shield 1151 relative to the signal lines 132 for transmitting analog pixel signals in the first semiconductor substrate 101 has been described, the signal lines 132 may not be signal lines for pixel signal transmission, but may be signal lines for transmitting other signals, or may be control lines, wiring lines, conductors, or GND. To efficiently release noise, the conductive shield 1151 is preferably connected to GND or a negative power supply. However, the conductive shield 1151 may be connected to other control lines, other signal lines, other conductors, or other wiring lines. Alternatively, the conductive shield 1151 may not be connected to other control lines, other signal lines, other conductors, other wiring lines, or the like.

As the conductive shield 1151 is provided, inductive noise and capacitive noise can be further reduced.

<12. Example Applications>

The technology according to the present disclosure is not limited to the description of the respective embodiments described above and the modifications or example applications thereof, and various modifications can be made. Part of each component in the above respective embodiments and the modifications or example applications thereof may be omitted, part or all of each component may be changed, part or all of each component may be modified, part or all of each component may be replaced with some other component, or some other component may be added to part or all of each component. Further, part or all of each component in the above respective embodiments and the modifications or example applications thereof may be divided into a plurality of portions, part or all of each component may be separated into a plurality of portions, at least one of the divided or separated portions may have a different, function or different characteristics from the other portions. Further, at least some of the respective components in the above respective embodiments and the modifications or example applications thereof may be combined, to form a different embodiment. Furthermore, at least part of each component in the respective embodiments described above and the modifications or example applications thereof may be moved, to form a different embodiment. Further, coupling elements or relay elements may be added to a combination of at least some of the respective components in the above respective embodiments and the modifications or example applications thereof, to form a different embodiment. Furthermore, a switching element or a switching function may be added to a combination of at least some of the respective components in the above respective embodiments and the modifications or example applications thereof, to form a different embodiment.

In the solid-state imaging device 100 according to this embodiment, the conductors forming the respective conductor layers A and B, which can be aggressor conductor loops, are Vdd wiring lines or Vss wiring lines. That is, currents flows in the opposite directions in at least partial regions in the conductor layers A and B. When a current flows in the conductor layer A from the top side toward the bottom side in the drawing at a certain time, a current flows in the conductor layer B from the bottom side toward the top side in the drawing. Note that the magnitudes of the currents are preferably the same. Although the conductors forming the conductor layers A and B are formed in the second semiconductor substrate in the examples described above, the present technology is not limited to this. For example, those conductors may be formed in the first semiconductor substrate, or part or all of conductors may be formed outside the second semiconductor substrate.

The signals flowing in the conductor layers A and B may be any signals other than Vdd and Vss, as long as the signals are differential signals with which the direction of current changes in the time direction. That is, signals with which a current I changes with time t (dI being the minute current change over a very short time dt) are only required to flow in the conductor layers A and B. Note that, even if a DC current normally flows in the conductor layers A and B, the current I changes with time t in a case where there is a current rise, a temporal transition of the current, a current fall, or the like.

For example, the magnitude of the current flowing in the conductor layer A and the magnitude of the current flowing in the conductor layer B are not necessarily the same. To the contrary, the magnitude of the current flowing in the conductor layer A and the magnitude of the current flowing in the conductor layer B may be the same (currents that change with time are made to flow in the conductor layers A and B at substantially the same timing). In general, the magnitude of the induced electromotive force to be generated in the victim conductor loop can be reduced more greatly in a case where currents that change with time flow in the conductor layers A and B at substantially the same timing, than in a case where the magnitude of the current flowing in the conductor layer A and the magnitude of the current flowing in the conductor layer B are not the same. Meanwhile, the signals flowing in the conductor layers A and B do not have to be differential signals. For example, both may be Vdd wiring lines, both may be Vss wiring lines, both may be GND wiring lines, the two may be signal lines of the same kind, the two may be signal lines of different kinds, or the like. Further, the conductors forming the conductor layers A and B may be conductors that are not connected to a power supply or a signal source. In these cases, the effect to reduce inductive noise becomes smaller, but the other effects of the invention can be achieved.

Further, frequency signals having a predetermined frequency, such as clock signals, may flow in the conductor layers A and B, for example. Alternatively, AC power supply currents may flow in the conductor layers A and B, for example. Further, the same frequency signal may flow in the conductor layers A and B, for example. Alternatively, signals containing a plurality of frequency components may flow in the conductor layers A and B. On the other hand, DC signals with which the current I does not change with time t at all may flow. In this case, the effect to reduce inductive noise is not achieved, but the other effects of the invention can be achieved. On the other hand, no signals may be made to flow. In this case, the effects to reduce inductive noise, capacitive noise, and the voltage drop (IR-Drop) are not achieved, but the other effects of the invention can be achieved.

<13. Example Configuration of an Imaging Apparatus>

The solid-state imaging device 100 described above can be applied to a camera system such as a digital camera or a video camera, a portable telephone having an imaging function, some other device having an imaging function, or an electronic apparatus including a semiconductor device having high-sensitivity analog elements such as flash memories, for example.

Figure 120:
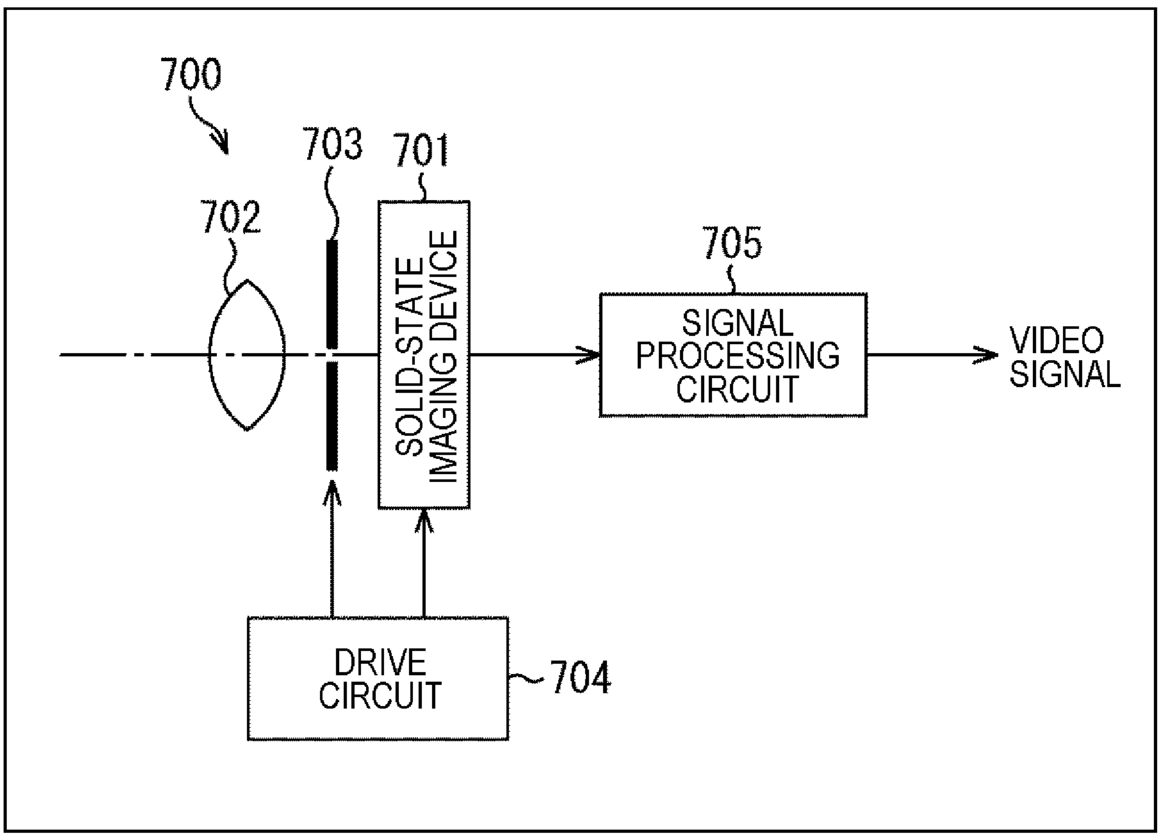

FIG. 120 is a block diagram showing an example configuration of an imaging apparatus 700 as an example of an electronic apparatus.

The imaging apparatus 700 includes a solid-state imaging element 701, an optical system 702 that guides incident light to the solid-state imaging element 701, a shutter mechanism 703 disposed between the solid-state imaging element 701 and the optical system 702, and a drive circuit 704 that drives the solid-state imaging element 701. The imaging apparatus 700 further includes a signal processing circuit 705 that processes an output signal of the solid-state imaging element 701.

The solid-state imaging element 701 corresponds to the solid-state imaging device 100 described above. The optical system 702 includes an optical lens group and the like, and causes image light (incident light) from an object to enter the solid-state imaging element 701. As a result, signal charges are stored in the solid-state imaging element 701 for a certain period of time. The shutter mechanism 703 controls the light exposure period and the light blocking period for the solid-state imaging element 701.

The drive circuit 704 supplies a drive signal to the solid-state imaging element 701 and the shutter mechanism 703. The drive circuit 704 then controls an operation to be performed by the solid-state imaging element 701 to output a signal to the signal processing circuit 705, and a shutter operation of the shutter mechanism 703, using the supplied drive signal. That is, in this example, in accordance with the drive signal (timing signal) supplied from the drive circuit 704, an operation to transfer a signal from the solid-state imaging element 701 to the signal processing circuit 705 is performed.

The signal processing circuit 705 performs various kinds of signal processing on the signal transferred from the solid-state imaging element 701. The signal (video signal) subjected to the various kinds of signal processing is then stored into a storage medium (not shown) such as a memory, or is output to a monitor (not shown).

With an electronic apparatus such as the imaging apparatus 700 described above, in the solid-state imaging element 701, it is possible to reduce generation of noise due to leakage of light such as hot carrier light emission from active elements such as MOS transistors and diodes at a time of operation in a peripheral circuit portion into a light receiving element. Thus, a high-quality electronic apparatus with improved image quality can be provided.

<14. Example Application to an In-Vivo Information Acquisition System>

The technology (the present technology) according to the present disclosure can be applied to various products. For example, the technology according to the present disclosure may be applied to a patient's in-vivo information acquisition system using a capsule endoscope.

Figure 121:
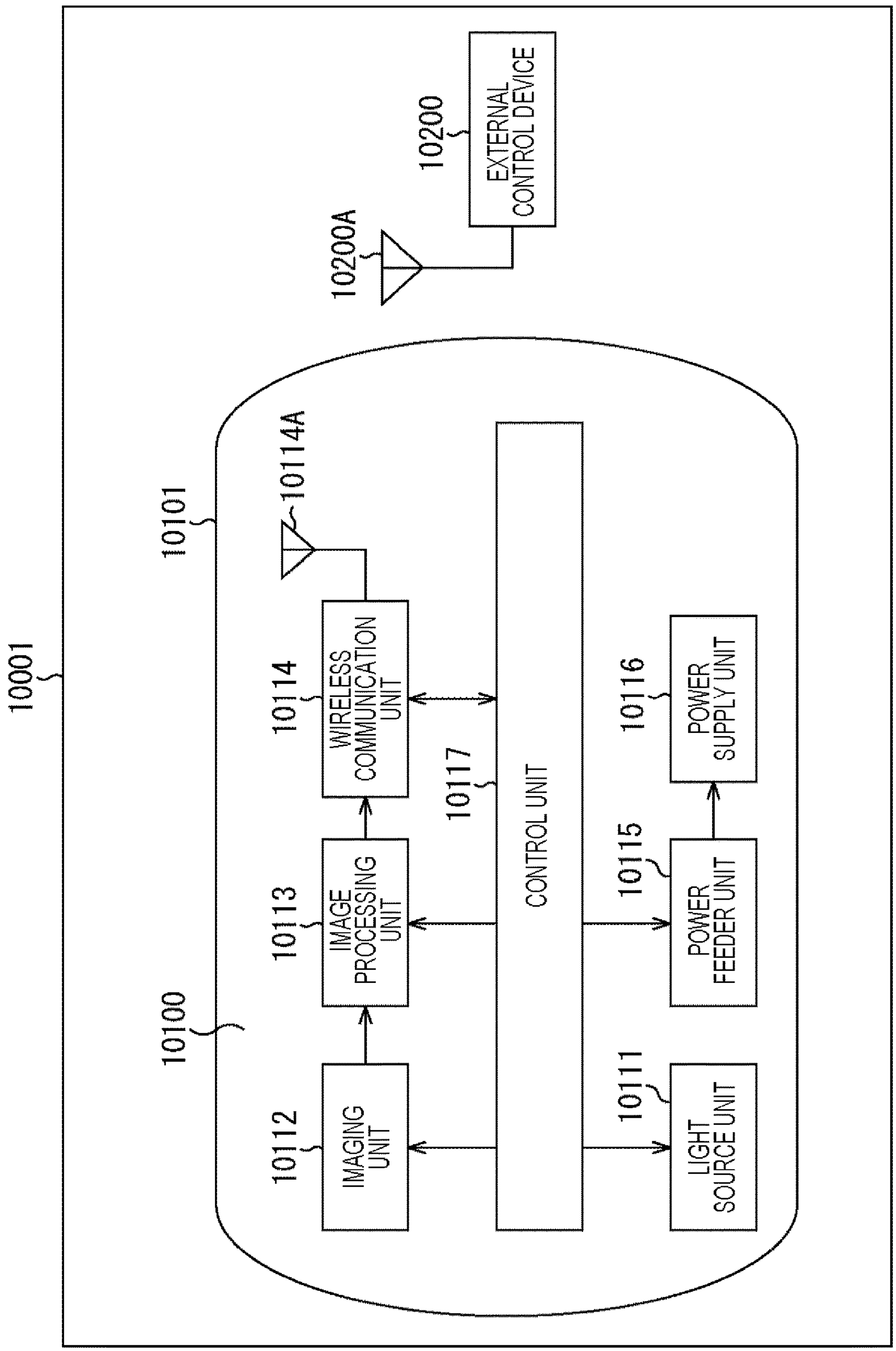

FIG. 121 is a block diagram schematically showing an example configuration of a patient's in-vivo information acquisition system using a capsule endoscope to which the technology (the present technology) according to the present disclosure may be applied.

An in-vivo information acquisition system 10001 includes a capsule endoscope 10100 and an external control device 10200.

The capsule endoscope 10100 is swallowed by the patient at the time of examination. The capsule endoscope 10100 has an imaging function and a wireless communication function. Before naturally discharged from the patient, the capsule endoscope 10100 moves inside the internal organs such as the stomach and the intestines by peristaltic motion or the like, sequentially captures images of the inside of the internal organs (these images will be hereinafter also referred to as in-vivo images) at predetermined intervals, and sequentially transmits information about the in-vivo images to the external control device 10200 outside the body in a wireless manner.

The external control device 10200 controls the overall operation of the in-vivo information acquisition system 10001. The external control device 10200 also receives the information about the in-vivo images transmitted from the capsule endoscope 10100, and, on the basis of the received in-vivo image information, generates image data for displaying the in-vivo images on a display device (not shown).

In this manner, the in-vivo information acquisition system 10001 can acquire in-vivo images showing the states of the inside of the body of the patient at any appropriate time until the swallowed capsule endoscope 10100 is discharged.

The configurations and the functions of the capsule endoscope 10100 and the external control device 10200 are now described in greater detail.

The capsule endoscope 10100 has a capsule-like housing 10101, and the housing 10101 houses a light source unit 10111, an imaging unit 10112, an image processing unit 10113, a wireless communication unit 10114, a power feeder unit 10115, a power supply unit 10116, and a control unit 10117.

The light source unit 10111 is formed with a light source such as a light emitting diode (LED), for example, and emits light onto the imaging field of view of the imaging unit 10112.

The imaging unit 10112 is formed with an imaging device and an optical system including a plurality of lenses provided in front of the imaging device. Reflected light of light emitted to body tissue as the current observation target (this reflected light will be hereinafter referred to as the observation light) is collected by the optical system, and enters the imaging device. In the imaging unit 10112, the observation light incident on the imaging device is photoelectrically converted, and an image signal corresponding to the observation light is generated. The image signal generated by the imaging unit 10112 is supplied to the image processing unit 10113.

The image processing unit 10113 is formed with a processor such as a central processing unit (CPU) or a graphics processing unit (GPU), and performs various kinds of signal processing on the image signal generated by the imaging unit 10112. The image processing unit 10113 supplies the image signal subjected to the signal processing as RAW data to the wireless communication unit 10114.

The wireless communication unit 10114 performs predetermined processing such as modulation processing on the image signal subjected to the signal processing by the image processing unit 10113, and transmits the image signal to the external control device 10200 via an antenna 10114A. The wireless communication unit 10114 also receives a control signal related to control of driving of the capsule endoscope 10100 from the external control device 10200 via the antenna 10114A. The wireless communication unit 10114 supplies the control signal received from the external control device 10200 to the control unit 10117.

The power feeder unit 10115 includes an antenna coil for power reception, a power regeneration circuit that regenerates electric power from the current generated in the antenna coil, a booster circuit, and the like. In the power feeder unit 10115, electric power is generated according to a so-called non-contact charging principle.

The power supply unit 10116 is formed with a secondary battery, and stores the electric power generated by the power feeder unit 10115. In FIG. 121, to avoid complication of the drawing, an arrow or the like indicating the destination of power supply from the power supply unit 10116 is not shown. However, the electric power stored in the power supply unit 10116 is supplied to the light source unit 10111, the imaging unit 10112, the image processing unit 10113, the wireless communication unit 10114, and the control unit 10117, and can be used for driving these components.

The control unit 10117 is formed with a processor such as a CPU, and drives the light source unit 10111, the imaging unit 10112, the image processing unit 10113, the wireless communication unit 10114, and the power feeder unit 10115 unit as appropriate in accordance with a control signal transmitted from the external control device 10200.

The external control device 10200 is formed with a processor such as a CPU or a GPU, or a microcomputer, a control board, or the like on which a processor and a storage element such as a memory are mounted together. The external control device 10200 controls operation of the capsule endoscope 10100 by transmitting a control signal to the control unit 10117 of the capsule endoscope 10100 via an antenna 10200A. In the capsule endoscope 10100, the conditions for emitting light to the current observation target in the light source unit 10111 can be changed in accordance with the control signal from the external control device 10200, for example. Further, the imaging conditions (such as the frame rate and the exposure value in the imaging unit 10112, for example) can also be changed in accordance with the control signal from the external control device 10200. The contents of the processing in the image processing unit 10113 and the conditions (such as the transmission intervals and the number of images to be transmitted, for example) for the wireless communication unit 10114 to transmit image signals may also be changed in accordance with the control signal from the external control device 10200.

Further, the external control device 10200 also performs various kinds of image processing on the image signal transmitted from the capsule endoscope 10100, and generates image data for displaying a captured in-vivo image on the display device. Examples of the image processing include various kinds of signal processing, such as a development process (a demosaicing process), an image quality enhancement process (a band emphasizing process, a super-resolution process, a noise reduction (NR) process, a camera shake correction process, and/or the like), and/or an enlargement process (an electronic zooming process), for example. The external control device 10200 controls driving of the display device, to cause the display device to display an in-vivo image captured on the basis of the generated image data. Alternatively, the external control device 10200 may cause a recording device (not shown) to record the generated image data, or cause a printing device (not shown) to print out the generated image data.

An example of an in-vivo information acquisition system to which the technology according to the present disclosure can be applied has been described above. The technology according to the present disclosure may be applied to the imaging unit 10112 among the components described above. Specifically, the solid-state imaging device 100 described above can be used as the imaging unit 10112. As the technique according to the present disclosure is applied to the imaging unit 10112, as the technique according to the present disclosure is applied to the imaging unit 10112, the occurrence of noise reduced, and a clearer surgical site image can be obtained. Thus, accuracy of examination is increased.

<15. Example Application to an Endoscopic Surgery System>

The technology (the present technology) according to the present disclosure can be applied to various products. For example, the technology according to the present disclosure may be applied to an endoscopic surgery system.

Figure 122:
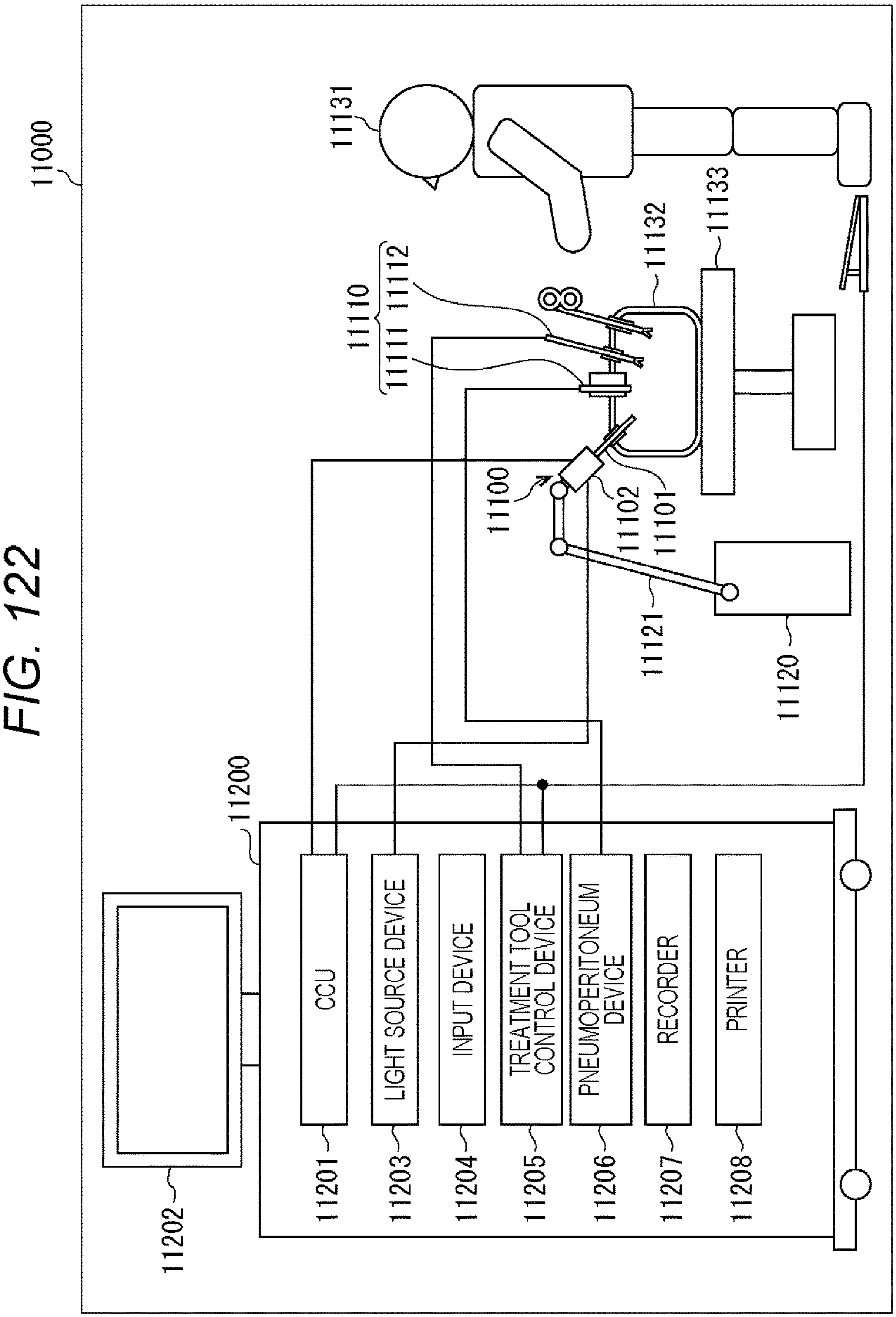

FIG. 122 is a diagram schematically showing an example configuration of an endoscopic surgery system to which the technology (the present technology) according to the present disclosure may be applied.

FIG. 122 shows a situation where a surgeon (a physician) 11131 is performing surgery on a patient 11132 on a patient bed 11133, using an endoscopic surgery system 11000. As shown in the drawing, the endoscopic surgery system 11000 includes an endoscope 11100, other surgical tools 11110 such as a pneumoperitoneum tube 11111 and an energy treatment tool 11112, a support arm device 11120 that supports the endoscope 11100, and a cart 11200 on which various kinds of devices for endoscopic surgery are mounted.

The endoscope 11100 includes a lens barrel 11101 that has a region of a predetermined length from the top end to be inserted into a body cavity of the patient 11132, and a camera head 11102 connected to the base end of the lens barrel 11101. In the example shown in the drawing, the endoscope 11100 is designed as a so-called rigid scope having a rigid lens barrel 11101. However, the endoscope 11100 may be designed as a so-called flexible scope having a flexible lens barrel.

At the top end of the lens barrel 11101, an opening into which an objective lens is inserted is provided. A light source device 11203 is connected to the endoscope 11100, and the light generated by the light source device 11203 is guided to the top end of the lens barrel by a light guide extending inside the lens barrel 11101, and is emitted toward the current observation target in the body cavity of the patient 11132 via the objective lens. Note that the endoscope 11100 may be a forward-viewing endoscope, an oblique-viewing endoscope, or a side-viewing endoscope.

An optical system and an imaging device are provided inside the camera head 11102, and reflected light (observation light) from the current observation target is converged on the imaging device by the optical system. The observation light is photoelectrically converted by the imaging device, and an electrical signal corresponding to the observation light, which is an image signal corresponding to the observation image, is generated. The image signal is transmitted as RAW data to a camera control unit (CCU) 11201.

The CCU 11201 is formed with a central processing unit (CPU), a graphics processing unit (GPU), or the like, and collectively controls operations of the endoscope 11100 and a display device 11202. Further, the CCU 11201 receives an image signal from the camera head 11102, and subjects the image signal to various kinds of image processing, such as a development process (demosaicing process), for example, to display an image based on the image signal.

Under the control of the CCU 11201, the display device 11202 displays an image based on the image signal subjected to the image processing by the CCU 11201.

The light source device 11203 is formed with a light source such as a light emitting diode (LED), for example, and supplies the endoscope 11100 with illuminating light for imaging the surgical site or the like.

An input device 11204 is as input interface to the endoscopic surgery system 11000. The user can input various kinds of information and instructions to the endoscopic surgery system 11000 via the input device 11204. For example, the user inputs an instruction or the like to change imaging conditions (such as the type of illuminating light, the magnification, and the focal length) for the endoscope 11100.

A treatment tool control device 11205 controls driving of the energy treatment tool 11112 for tissue cauterization, incision, blood vessel sealing, or the like. A pneumoperitoneum device 11206 injects a gas into a body cavity of the patient 11132 via the pneumoperitoneum tube 11111 to inflate the body cavity, for the purpose of securing the field of view of the endoscope 11100 and the working space of the surgeon. A recorder 11207 is a device capable of recording various kinds of information about the surgery. A printer 11208 is a device capable of printing various kinds of information relating to the surgery in various formats such as text, images, graphics, and the like.

Note that the light source device 11203 that supplies the endoscope 11100 with the illuminating light for imaging the surgical site can be formed with an LED, a laser light source, or a white light source that is a combination of an LED and a laser light source, for example. In a case where a white light source is formed with a combination of RGB laser light sources, the output intensity and the output timing of each color (each wavelength) can be controlled with high precision. Accordingly, the white balance of an image captured by the light source device 11203 can be adjusted. Alternatively, in this case, laser light from each of the RGB laser light sources may be emitted onto the current observation target in a time-division manner, and driving of the imaging device of the camera head 11102 may be controlled in synchronization with the timing of the light emission. Thus, images corresponding to the respective RGB colors can be captured in a time-division manner. According to the method, a color image can be obtained without any color filter provided in the imaging device.

Further, the driving of the light source device 11203 may also be controlled so that the intensity of light to be output is changed at predetermined time intervals. The driving of the imaging device of the camera head 11102 is controlled in synchronism with the timing of the change in the intensity of the light, and images are acquired in a time-division manner and are then combined. Thus, a high dynamic range image with no black portions and no white spots can be generated.

Further, the light source device 11203 may also be designed to be capable of supplying light of a predetermined wavelength band compatible with special light observation. In special light observation, light of a narrower band than the illuminating light (or white light) at the time of normal observation is emitted, with the wavelength dependence of light absorption in body tissue being taken advantage of, for example. As a result, so-called narrow band imaging is performed to image predetermined tissue such as a blood vessel in a mucosal surface layer or the like with high contrast. Alternatively, in the special light observation, fluorescence observation for obtaining an image with fluorescence generated through emission of excitation light may be performed. In fluorescence observation, excitation light is emitted to body tissue so that the fluorescence from the body tissue can be observed (autofluorescence observation). Alternatively, a reagent such as indocyanine green (ICG) is locally injected into body tissue, and excitation light corresponding to the fluorescence wavelength of the reagent is emitted to the body tissue so that a fluorescent image can be obtained, for example. The light source device 11203 can be designed to be capable of supplying narrow band light and/or excitation light compatible with such special light observation.

Figure 123:
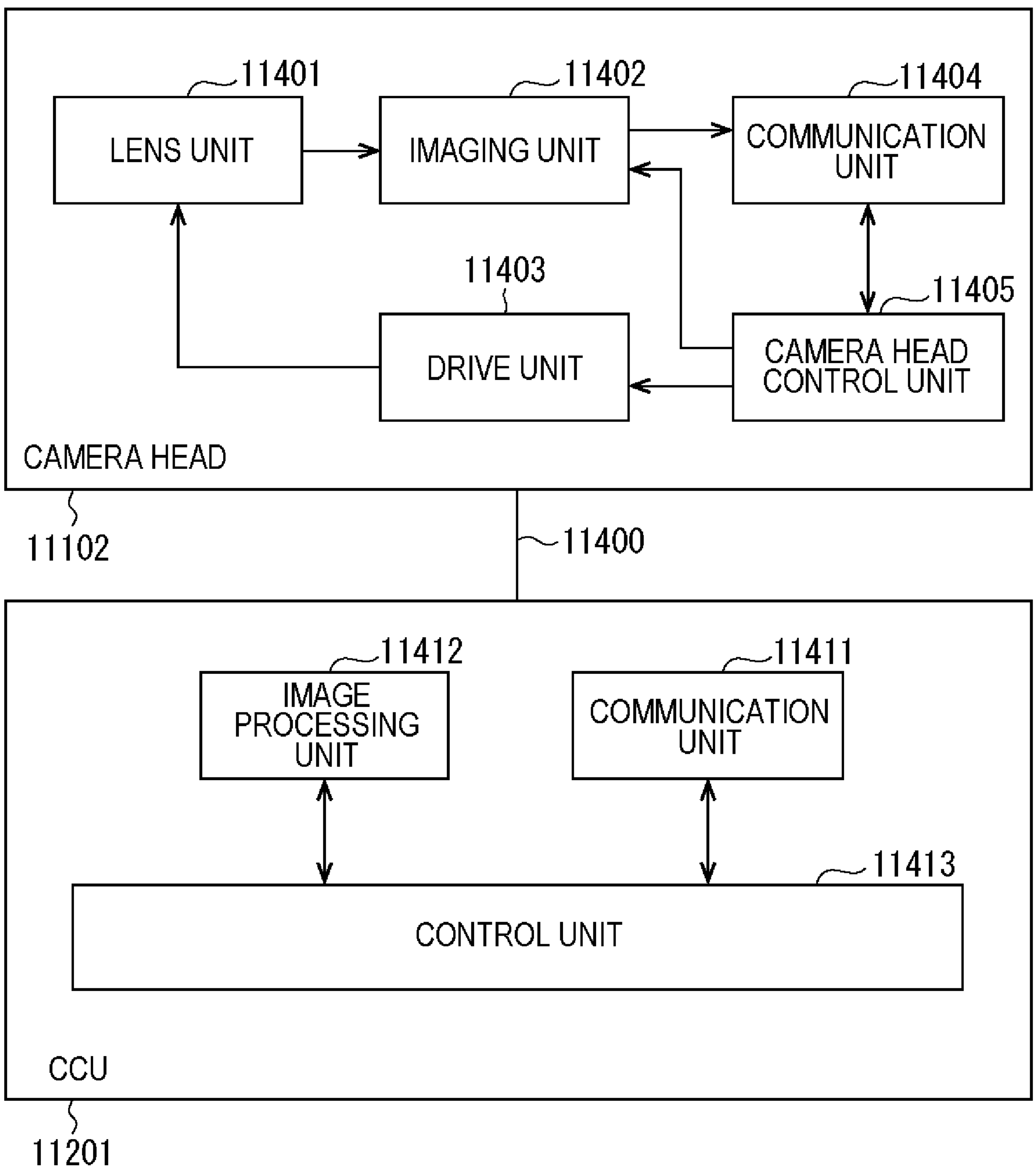

FIG. 123 is a block diagram showing an example of the functional configurations of the camera head 11102 and the CCU 11201 shown in FIG. 122.

The camera head 11102 includes a lens unit 11401, an imaging unit 11402, a drive unit 11403, a communication unit 11404, and a camera head control unit 11405. The CCU 11201 includes a communication unit 11411, an image processing unit 11412, and a control unit 11413. The camera head 11102 and the CCU 11201 are communicably connected to each other by a transmission cable 11400.

The lens unit 11401 is an optical system provided at the connecting portion with the lens barrel 11101. Observation light captured from the top end of the lens barrel 11101 is guided to the camera head 11102, and enters the lens unit 11401. The lens unit 11401 is formed with a combination of a plurality of lenses including a zoom lens and a focus lens.

The imaging unit 11402 is formed with an imaging device. The imaging unit 11402 may be formed with one imaging device (a so-called single-date type), or may be formed with a plurality of imaging devices (a so-called multiple-plate type). In a case where the imaging unit 11402 is of a multiple-plate type, for example, image signals corresponding to the respective RGB colors may be generated by the respective imaging devices, and be then combined to obtain a color image. Alternatively, the imaging unit 11402 may be designed to include a pair of imaging devices for acquiring right-eye and left-eye image signals compatible with three-dimensional (3D) display. As the 3D display is conducted, the surgeon 11131 can grasp more accurately the depth of the body tissue at the surgical site. Note that, in a case where the imaging unit 11402 is of a multiple-plate type, a plurality of lens units 11401 are provided for the respective imaging devices.

Further, the imaging unit 11402 is not necessarily provided in the camera head 11102. For example, the imaging unit 11402 may be provided immediately behind the objective lens in the lens barrel 11101.

The drive unit 11403 is formed with an actuator, and, under the control of the camera head control unit 11405, moves the zoom lens and the focus lens of the lens unit 11401 by a predetermined distance along the optical axis. With this arrangement, the magnification and the focal point of the image captured by the imaging unit 11402 can be appropriately adjusted.

The communication unit 11404 is formed with a communication device for transmitting and receiving various kinds of information to and from the CCU 11201. The communication unit 11404 transmits the image signal obtained as RAW data from the imaging unit 11402 to the CCU 11201 via the transmission cable 11400.

Further, the communication unit 11404 also receives a control signal for controlling the driving of the camera head 11102 from the CCU 11201, and supplies the control signal to the camera head control unit 11405. The control signal includes information about imaging conditions, such as information for specifying the frame rate of captured images, information for specifying the exposure value at the time of imaging, and/or information for specifying the magnification and the focal point of captured images, for example.

Note that the above imaging conditions such as the frame rate, the exposure value, the magnification, and the focal point may be appropriately specified by the user, or may be automatically set by the control unit 11413 of the CCU 11201 on the basis of an acquired image signal. In the latter case, the endoscope 11100 has a so-called auto-exposure (AE) function, an auto-focus (AF) function, and an auto-white-balance (AWB) function.

The camera head control unit 11405 controls the driving of the camera head 11102, on the basis of a control signal received from the CCU 11201 via the communication unit 11404.

The communication unit 11411 is formed with a communication device for transmitting and receiving various kinds of information to and from the camera head 11102. The communication unit 11411 receives an image signal transmitted from the camera head 11102 via the transmission cable 11400.

Further, the communication unit 11411 also transmits a control signal for controlling the driving of the camera head 11102, to the camera head 11102. The image signal and the control signal can be transmitted through electrical communication, optical communication, or the like.

The image processing unit 11412 performs various kinds of image processing on an image signal that is RAW data transmitted from the camera head 11102.

The control unit 11413 performs various kinds of control relating to display of an image of the surgical site or the like captured by the endoscope 11100, and a captured image obtained through imaging of the surgical site or the like. For example, the control unit 11413 generates a control signal for controlling the driving of the camera head 11102.

Further, the control unit 11413 also causes the display device 11202 to display a captured image showing the surgical site or the like, on the basis of the image signal subjected to the image processing by the image processing unit 11412. In doing so, the control unit 11413 may recognize the respective objects shown in the captured image, using various image recognition techniques. For example, the control unit 11413 can detect the shape, the color, and the like of the edges of an object shown in the captured image, to recognize the surgical tool such as forceps, a specific body site, bleeding, the mist at the time of use of the energy treatment tool 11112, and the like. When causing the display device 11202 to display the captured image, the control unit 11413 may cause the display device 11202 to superimpose various kinds of surgery aid information on the image of the surgical site on the display, using the recognition result. As the surgery aid information is superimposed and displayed, and thus, is presented to the surgeon 11131, it becomes possible to reduce the burden on the surgeon 11131, and enable the surgeon 11131 to proceed with the surgery in a reliable manner.

The transmission cable 11400 connecting the camera head 11102 and the CCU 11201 is an electrical signal cable compatible with electric signal communication, an optical fiber compatible with optical communication, or a composite cable thereof.

Here, in the example shown in the drawing, communication is performed in a wired manner using the transmission cable 11400. However, communication between the camera head 11102 and the CCU 11201 may be performed in a wireless manner.

An example of an endoscopic surgery system to which the technique according to the present disclosure can be applied has been described above. The technology according to the present disclosure may be applied to the imaging unit 11402 of the camera head 11102 among the components described above, for example. Specifically, the solid-state imaging device 100 described above can be used as the imaging unit 11402. As the technology according to the present disclosure is applied to the imaging unit 11402, the generation of noise is reduced, and a clearer surgical site image can be obtained. Thus, the surgeon can check the surgical site without fail.

Note that the endoscopic surgery system has been described as an example herein, but the technology according to the present disclosure may be applied to a microscopic surgery system or the like, for example.

<16. Example Applications to Mobile Structures>

The technology according to the present disclosure may be further embodied as a device mounted on any type of mobile structure, such as an automobile, an electrical vehicle, a hybrid electrical vehicle, a motorcycle, a bicycle, a personal mobility device, an airplane, a drone, a vessel, or a robot, for example.

Figure 124:
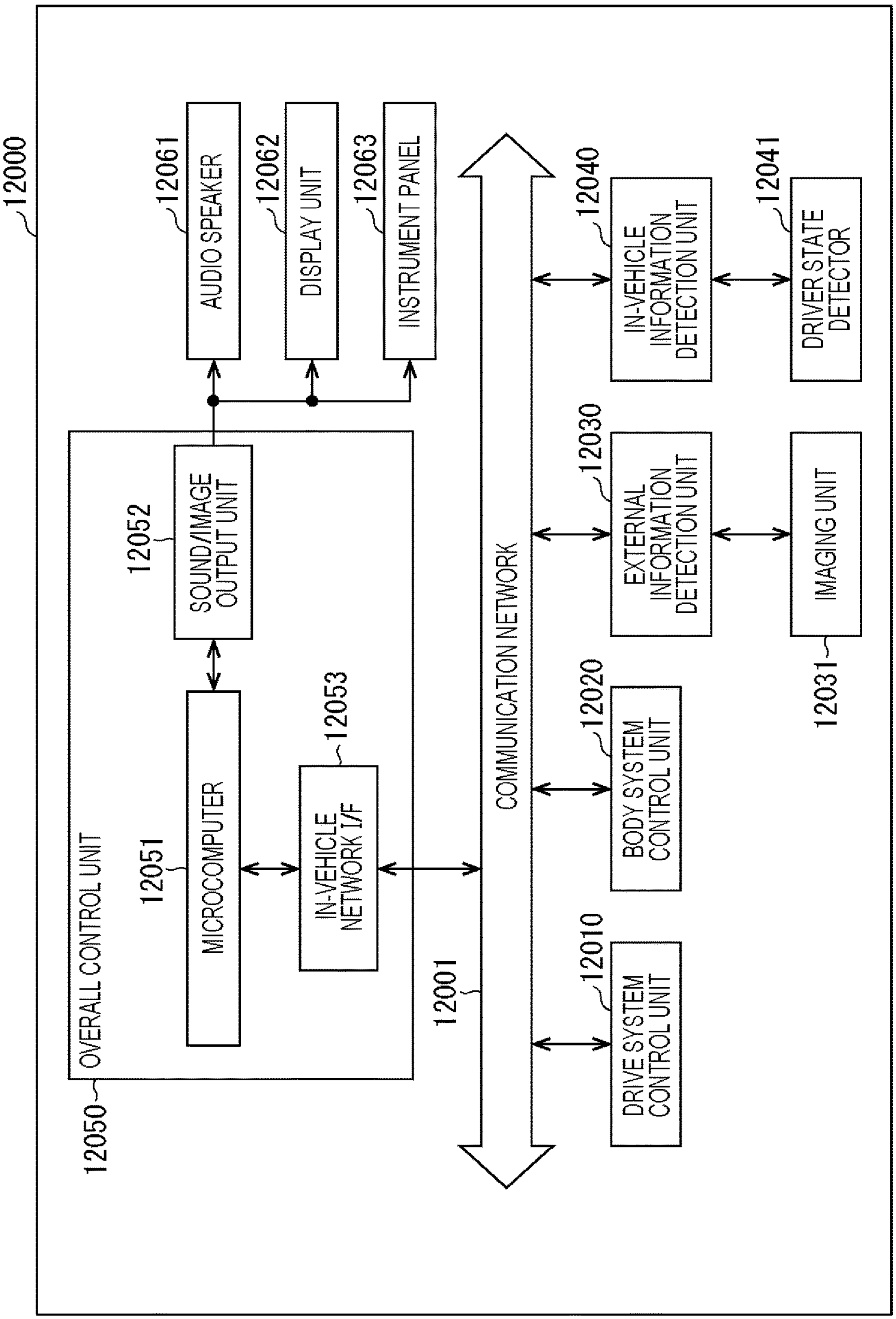

FIG. 124 is a block diagram schematically showing an example configuration of a vehicle control system that is an example of a mobile structure control system to which the technology according to the present disclosure may be applied.

A vehicle control system 12000 includes a plurality of electronic control units connected via a communication network 12001. In the example shown in FIG. 124, the vehicle control system 12000 includes a drive system control unit 12010, a body system control unit 12020, an external information detection unit 12030, an in-vehicle information detection unit 12040, and an overall control unit 12050. Further, a microcomputer 12051, a sound/image output unit 12052, and an in-vehicle network interface (I/F) 12053 are also shown as the functional components of the overall control unit 12050.

The drive system control unit 12010 controls operations of the devices related to the drive system of the vehicle according to various programs. For example, the drive system control unit 12010 functions as control devices such as a driving force generation device for generating a driving force of the vehicle such as an internal combustion engine or a driving motor, a driving force transmission mechanism for transmitting the driving force to the wheels, a steering mechanism for adjusting the steering angle of the vehicle, and a braking device for generating a braking force of the vehicle.

The body system control unit 12020 controls operations of the various devices mounted on the vehicle body according to various programs. For example, the body system control unit 12020 functions as a keyless entry system, a smart key system, a power window device, or a control device for various lamps such as a headlamp, a backup lamp, a brake lamp, a turn signal lamp, a fog lamp, or the like. In this case, the body system control unit 12020 can receive radio waves transmitted from a portable device that substitutes for a key, or signals from various switches. The body system control unit 12020 receives inputs of these radio waves or signals, and controls the door lock device, the power window device, the lamps, and the like of the vehicle.

The external information detection unit 12030 detects information outside the vehicle equipped with the vehicle control system 12000. For example, an imaging unit 12031 is connected to the external information detection unit 12030. The external information detection unit 12030 causes the imaging unit 12031 to capture an image of the outside of the vehicle, and receives the captured image. On the basis of the received image, the external information detection unit 12030 may perform an object detection process for detecting a person, a vehicle, an obstacle, a sign, characters on the road surface, or the like, or perform a distance detection process.

The imaging unit 12031 is an optical sensor that receives light, and outputs an electrical signal corresponding to the amount of received light. The imaging unit 12031 can output an electrical signal as an image, or output an electrical signal as distance measurement information. Further, the light to be received by the imaging unit 12031 may be visible light, or may be invisible light such as infrared rays.

The in-vehicle information detection unit 12040 detects information about the inside of the vehicle. For example, a driver state detector 12041 that detects the state of the driver is connected to the in-vehicle information detection unit 12040. The driver state detector 12041 includes a camera that captures an image of the driver, for example, and, on the basis of detected information input from the driver state detector 12041, the in-vehicle information detection unit 12040 may calculate the degree of fatigue or the degree of concentration of the driver, or determine whether the driver is dozing off or not.

On the basis of the external/internal information acquired by the external information detection unit 12030 or the in-vehicle information detection unit 12040, the microcomputer 12051 can calculate the control target value of the driving force generation device, the steering mechanism, or the braking device, and output a control command to the drive system control unit 12010. For example, the microcomputer 12051 can perform cooperative control to achieve the functions of an advanced driver assistance system (ADAS), including vehicle collision avoidance or impact mitigation, follow-up running based on the distance between vehicles, vehicle velocity maintenance running, vehicle collision warning, vehicle lane deviation warning, or the like.

Further, the microcomputer 12051 can also perform cooperative control to conduct automatic driving or the like for autonomously running not depending on the operation of the driver, by controlling the driving force generation device, the steering mechanism, the braking device, or the like on the basis of information about the surroundings of the vehicle, the information having being acquired by the external information detection unit 12030 or the in-vehicle information detection unit 12040.

Further, the microcomputer 12051 can also output a control command to the body system control unit 12020, on the basis of the external information acquired by the external information detection unit 12030. For example, the microcomputer 12051 controls the headlamp in accordance with the position of the leading vehicle or the oncoming vehicle detected by the external information detection unit 12030, and performs cooperative control to achieve an anti-glare effect by switching from a high beam to a low beam, or the like.

The sound/image output unit 12052 transmits an audio output signal and/or an image output signal to an output device that is capable of visually or audibly notifying the passenger(s) of the vehicle or the outside of the vehicle of information. In the example shown in FIG. 124, an audio speaker 12061, a display unit 12062, and an instrument panel 12063 are shown as output devices. The display unit 12062 may include an on-board display and/or a head-up display, for example.

Figure 125:
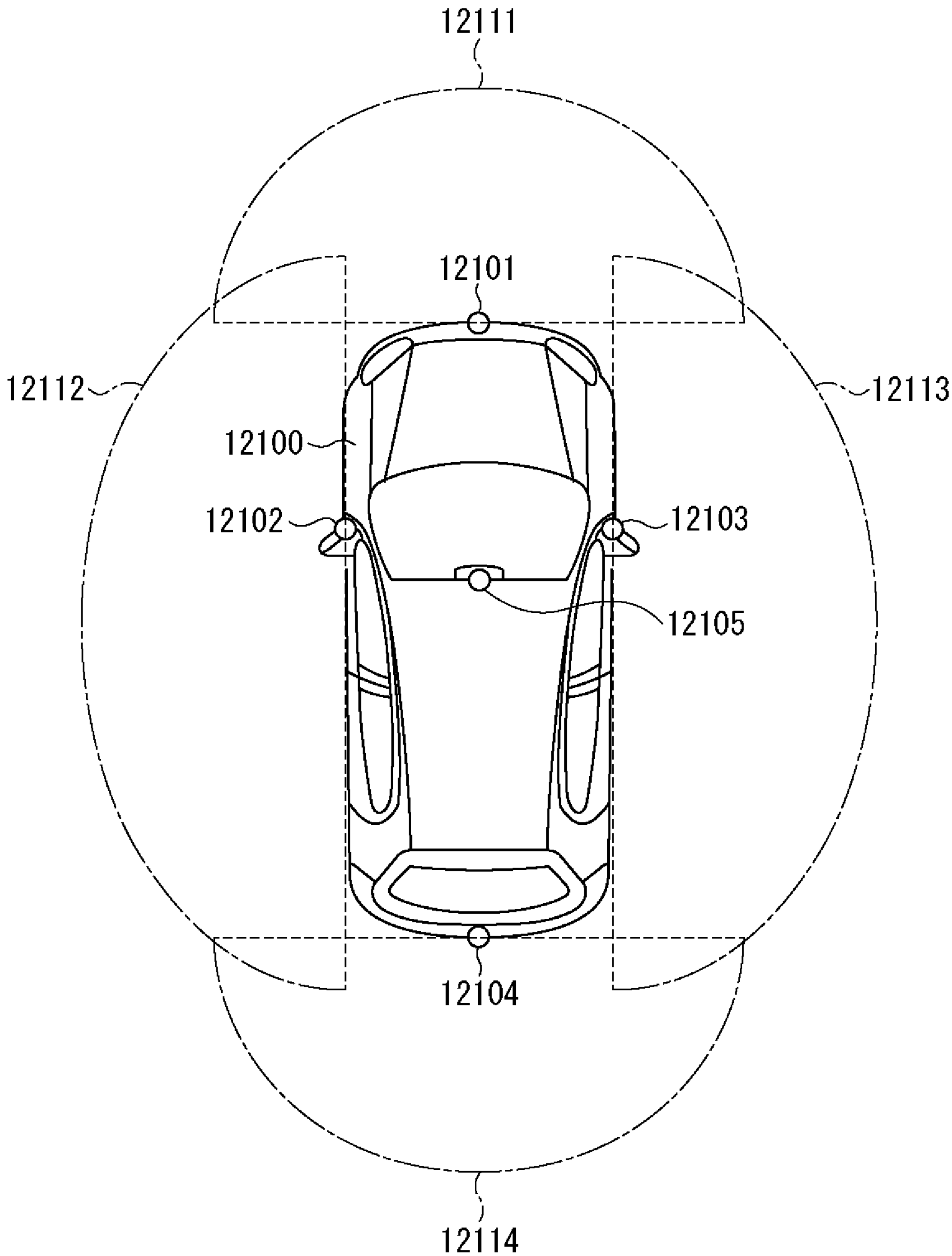

FIG. 125 is a diagram showing an example of installation positions of imaging units 12031.

In FIG. 125, a vehicle 12100 includes imaging units 12101, 12102, 12103, 12104, and 12105 as the imaging units 12031.

Imaging units 12101, 12102, 12103, 12104, and 12105 are provided at the following positions: the front end edge of a vehicle 12100, a side mirror, the rear bumper, a rear door, an upper portion of the front windshield inside the vehicle, and the like, for example. The imaging unit 12101 provided on the front end edge and the imaging unit 12105 provided on the upper portion of the front windshield inside the vehicle mainly capture images ahead of the vehicle 12100. The imaging units 12102 and 12103 provided on the side mirrors mainly capture images on the sides of the vehicle 12100. The imaging unit 12104 provided on the rear bumper or a rear door mainly captures images behind the vehicle 12100. The front images acquired by the imaging units 12101 and 12105 are mainly used for detection of a vehicle running in front of the vehicle 12100, a pedestrian, an obstacle, a traffic signal, a traffic sign, a lane, or the like.

Note that FIG. 125 shows an example of the imaging ranges of the imaging units 12101 through 12104. An imaging range 12111 indicates the imaging range of the imaging unit 12101 provided on the front end edge, imaging ranges 12112 and 12113 indicate the imaging ranges of the imaging units 12102 and 12103 provided on the respective side mirrors, and an imaging range 12114 indicates the imaging range of the imaging unit 12104 provided on the rear bumper or a rear door. For example, image data captured by the imaging units 12101 through 12104 are superimposed on one another, so that an overhead image of the vehicle 12100 viewed from above is obtained.

At least one of the imaging units 12101 through 12104 may have a function of acquiring distance information. For example, at least one of the imaging units 12101 through 12104 may be a stereo camera including a plurality of imaging devices, or may be an imaging device having pixels for phase difference detection.

For example, on the basis of distance information obtained from the imaging units 12101 through 12104, the microcomputer 12051 calculates the distances to the respective three-dimensional objects within the imaging ranges 12111 through 12114, and temporal changes in the distances (the velocities relative to the vehicle 12100). In this manner, the three-dimensional object that is the closest three-dimensional object on the traveling path of the vehicle 12100 and is traveling at a predetermined velocity (0 km/h or higher, for example) in substantially the same direction as the vehicle 12100 can be extracted as the vehicle running in front of the vehicle 12100. Further, the microcomputer 12051 can set beforehand an inter-vehicle distance to be maintained in front of the vehicle running in front of the vehicle 12100, and can perform automatic brake control (including follow-up stop control), automatic acceleration control (including follow-up start control), and the like. In this manner, it is possible to perform cooperative control to conduct automatic driving or the like to autonomously travel not depending on the operation of the driver.

For example, on the basis of the distance information obtained from the imaging units 12101 through 12104, the microcomputer 12051 can extract three-dimensional object data concerning three-dimensional objects under the categories of two-wheeled vehicles, regular vehicles, large vehicles, pedestrians, utility poles, and the like, and use the three-dimensional object data in automatically avoiding obstacles. For example, the microcomputer 12051 classifies the obstacles in the vicinity of the vehicle 12100 into obstacles visible to the driver of the vehicle 12100 and obstacles difficult to visually recognize. The microcomputer 12051 then determines collision risks indicating the risks of collision with the respective obstacles. If a collision risk is equal to or higher than a set value, and there is a possibility of collision, the microcomputer 12051 can output a warning to the driver via the audio speaker 12061 and the display unit 12062, or can perform driving support for avoiding collision by performing forced deceleration or avoiding steering via the drive system control unit 12010.

At least one of the imaging units 12101 through 12104 may be an infrared camera that detects infrared rays. For example, the microcomputer 12051 can recognize a pedestrian by determining whether or not a pedestrian exists in images captured by the imaging units 12101 through 12104. Such pedestrian recognition is carried out through a process of extracting feature points from the images captured by the imaging units 12101 through 12104 serving as infrared cameras, and a process of performing a pattern matching on the series of feature points indicating the outlines of objects and determining whether or not there is a pedestrian, for example. If the microcomputer 12051 determines that a pedestrian exists in the images captured by the imaging units 12101 through 12104, and recognizes a pedestrian, the sound/image output unit 12052 controls the display unit 12062 to display a rectangular contour line for emphasizing the recognized pedestrian in a superimposed manner. Further, the sound/image output unit 12052 may also control the display unit 12062 to display an icon or the like indicating the pedestrian at a desired position.

An example of a vehicle control system to which the technology according to the present disclosure may be applied has been described above. The technology according to the present disclosure may be applied to the imaging unit 12031 among the components described above, for example. Specifically, the solid-state imaging device 100 described above can be used as the imaging unit 12031. As the technology according to the present disclosure is applied to the imaging unit 12031, the generation of noise is reduced, and an easier-to-view surgical site image can be obtained. Thus, driving by the driver can be appropriately aided.

Embodiments of the present technology are not limited to the embodiments described above, and various modifications may be made to them without departing from the scope of the present technology.

Note that the advantageous effects described in this specification are merely examples, and the advantageous effects of the present technology are not limited to them and may include effects other than those described in this specification.

Note that the present technology may also be embodied in the configurations described below.

(1)

A circuit board including:

a first conductor layer that has at least a first conductor portion including a conductor of a shape in which a planar or mesh-like first basic pattern is repeatedly disposed in the same plane; and a second conductor layer that has at least a second conductor portion including a conductor of a shape in which a planar or mesh-like second basic pattern is repeatedly disposed in the same plane, and a third conductor portion including a conductor of a shape in which a planar, linear, or mesh-shaped third basic pattern is repeatedly disposed is the same plane, in which the repeating cycle of the first basic pattern and the repeating cycle of the second basic pattern are substantially the same cycles, and the third basic pattern has a different shape from the second basic pattern.

(2)

The circuit board according to (1), in which the third basic pattern has a shape in which current flows at least is a first direction, the first direction being a direction toward the second conductor portion, and a conductor width of the third basic pattern in a second direction orthogonal to the first direction is greater than a conductor width of the second basic pattern in the second direction.

(3)

The circuit board according to (1) or (2), in which the third basic pattern has a shape in which current flows at least in a first direction, the first direction being a direction toward the second conductor portion, and a total length of the second conductor portion is a second direction orthogonal to the first direction is greater than a total length of the third conductor portion in the second direction.

(4)

The circuit board according to any one of (1) to (3), in which the third basic pattern has a shape in which current flows at least in a first direction, the first direction being a direction toward the second conductor portion, and at least part of the second conductor portion has a shape in which current flows more easily in a second direction orthogonal to the first direction, than is the first direction.

(5)

The circuit board according to any one of (1) to (4), in which the third basic pattern has a shape in which current flows at least in a first direction, the first direction being a direction toward the second conductor portion, and a gap width of the third basic pattern in a second direction orthogonal to the first direction is smaller than a gap width of the second basic pattern in the second direction.

(6)

The circuit board according to any one of (1) to (3) or (5), in which the third basic pattern has a shape in which current flows at least in a first direction, the first direction being a direction toward the second conductor portion, and at least part of the second conductor portion has a shape in which current flows more easily in the first direction than in a second direction orthogonal to the first direction.

(7)

The circuit board according to any one of (1) to (6), in which the third basic pattern has a shape in which current flows at least in a first direction, the first direction being a direction toward the second conductor portion, and the second conductor portion includes a reinforcement conductor in which current flows more easily in a second direction orthogonal to the first direction, than in the first direction.

(8)

The circuit board according to any one of (1) to (7), in which the third basic pattern has a shape in which current flows at least in a first direction, the first direction being a direction toward the second conductor portion, and the second conductor portion includes a reinforcement conductor in which current flows more easily in the first direction than in a second direction orthogonal to the first direction.

(9)

The circuit board according to (7) or (8), in which a conductor width of the reinforcement conductor is greater than a conductor width of the second basic pattern.

(10)

The circuit board according to any one of (7) to (9), in which the reinforcement conductor has a mesh-like form, and a gap width of a mesh of the reinforcement conductor is smaller than a gap width of the second basic pattern.

(11)

The circuit board according to any one of (7) to (10), in which the reinforcement conductor has a mesh-like form in which gap widths of a mesh are varied, and at least one of the gap widths of the mesh of the reinforcement conductor is smaller than a gap width of the second basic pattern.

(12)

The circuit board according to any one of (1) to (11), in which the second basic pattern has a mesh-like shape, and one or a plurality of first relay conductors is disposed in gaps in a mesh.

(13)

The circuit board according to (12), in which the third basic pattern has a mesh-like shape, and does not have a conductor disposed in a gap in a mesh.

(14)

The circuit board according to (12), in which the third basic pattern has a mesh-like shape, and has a conductor disposed in a gap in a mesh.

(15)

The circuit board according to any one of (1) to (14), in which the second conductor portion and the third conductor portion are electrically connected.

(16)

The circuit board according to any one of (1) to (15), in which the second conductor portion and the third conductor portion are electrically connected via a conductor of a shape different from the second basic pattern and the third basic pattern.

(17)

The circuit board according to any one of (1) to (16), in which the first basic pattern and the second basic pattern constitute a light blocking structure in at least a region.

(18)

The circuit board according to any one of (1) to (17), in which the first conductor layer has a fourth conductor portion including a conductor of a shape in which a planar, linear, or mesh-like fourth basic pattern is repeatedly disposed in the same plane, and the fourth basic pattern has a different shape from the first basic pattern.

(19)

A semiconductor device including a circuit board, the circuit board including:

a first conductor layer that has at least a first conductor portion including a conductor of a shape in which a planar or mesh-like first basic pattern is repeatedly disposed in the same plane; and a second conductor layer that has at least a second conductor portion including a conductor of a shape in which a planar or mesh-like second basic pattern is repeatedly disposed in the same plane, and a third conductor portion including a conductor of a shape in which a planar, linear, or mesh-shaped third basic pattern is repeatedly disposed in the same plane, in which the repeating cycle of the first basic pattern and the repeating cycle of the second basic pattern are substantially the same cycles, and the third basic pattern has a different shape from the second basic pattern.

(20)

An electronic apparatus including a semiconductor device including a circuit board, the circuit board including:

a first conductor layer that has at least a first conductor portion including a conductor of a shape in which a planar or mesh-like first basic pattern is repeatedly disposed in the same plane; and a second conductor layer that has at least a second conductor portion including a conductor of a shape in which a planar or mesh-like second basic pattern is repeatedly disposed in the same plane, and a third conductor portion including a conductor of a shape in which a planar, linear, or mesh-shaped third basic pattern is repeatedly disposed in the same plane, in which the repeating cycle of the first basic pattern and the repeating cycle of the second basic pattern are substantially the same cycles, and the third basic pattern has a different shape from the second basic pattern.

REFERENCE SIGNS LIST

| | |
|---|---|
| 10 | Pixel substrate |
| 11 | Victim conductor loop |
| 20 | Logic substrate |
| 21 | Power-supply wiring line |
| 100 | Solid-state imaging device |
| 101 | First semiconductor substrate |
| 102 | Second semiconductor substrate |
| 111 | Pixel/analog processing unit |
| 112 | Digital processing unit |
| 121 | Pixel array |
| 122 | A/D conversion unit |
| 123 | Vertical scanning unit |

-continued

| | |
|---|---|
| 131 | Pixel |
| 132 | Signal line |
| 133 | Control line |
| 141 | Photodiode |
| 142 | Transfer transistor |
| 143 | Reset transistor |
| 144 | Amplification transistor |
| 145 | Select transistor |
| 151 | Light blocking structure |
| 152 | Semiconductor base |
| 153 | Multilayer wiring layer |
| 155 | Optical member |
| 162 | Semiconductor base |
| 163 | Multilayer wiring layer |
| 164 | MOS transistor |
| 165 | Wiring layer |
| 165a (165Aa, 165Ba) | Main conductor portion |
| 165b (165Ab, 165Bb) | Extension conductor portion |
| 167 | Active element group |
| 191 | Buffer region |
| 192 | Interlayer distance |
| 193 | Buffer region width |
| 194 | Light-blocking target region |
| 202 through 204 | Circuit block |
| 205 through 208 | Light-blocking target region |
| 209 | Non-light-blocking target region |
| 211, 212 | Linear conductor |
| 213, 214 | Planar conductor |
| 216, 217 | Mesh conductor |
| 221 | Planar conductor |
| 222 | Mesh conductor |
| 231, 232 | Mesh conductor |
| 241, 242 | Mesh conductor |
| 251, 252 | Mesh conductor |
| 261 | Planar conductor |
| 262 | Mesh conductor |
| 271, 272 | Mesh conductor |
| 281, 282 | Mesh conductor |
| 291, 292 | Mesh conductor |
| 301 through 306 | Relay conductor |
| 311, 312 | Mesh conductor |
| 321, 322 | Mesh conductor |
| 331, 332 | Mesh conductor |
| 400 | Wiring region |
| 401, 402 | Pad |
| 501, 502 | Wiring line |
| 601 through 603 | Package |
| 604 | Bonding wire |
| 700 | Imaging apparatus |
| 701 | Solid-state imaging element |
| 702 | Optical system |
| 703 | Shutter mechanism |
| 704 | Drive circuit |
| 705 | Signal processing circuit |
| 811, 812 | Mesh conductor |
| 821Aa, 821Ab | Mesh conductor |
| 822Ab, 822Ba, 822Bb | Mesh conductor |
| 831Aa, 831Ab | Mesh conductor |
| 832Ba, 832Bb | Mesh conductor |
| 841, 842 | Relay conductor |
| 851Aa, 851Ab | Mesh conductor |
| 852Ba, 852Bb | Mesh conductor |
| 853, 854 | Reinforcement conductor |
| 855 | Relay conductor |
| 856, 857 | Reinforcement conductor |
| 871, 872 | Reinforcement conductor |
| 1000 | Substrate |
| 1001 (1001d, 1001s) | Pad |
| 1101 | Victim conductor loop |
| 1102A, 1102B | Aggressor conductor loop |
| 1121 | Semiconductor substrate |
| 1122 | Package substrate |
| 1123 | Printed board |
| 1151 (1151A, 1151B) | Conductive shield |

What is claimed is:

1. A circuit board, comprising:

a first conductor layer that has at least a first conductor portion including a conductor of a shape in which a planar or mesh-like first basic pattern is repeatedly disposed in a first plane; and a second conductor layer that has at least a second conductor portion including a conductor of a shape in which a planar or mesh-like second basic pattern is repeatedly disposed in a second plane, and a third conductor portion including a conductor of a shape in which a planar, linear, or mesh-shaped third basic pattern is repeatedly disposed in the second plane, wherein a repeating cycle of the first basic pattern and a repeating cycle of the second basic pattern are the same, and the third basic pattern has a different shape from the second basic pattern.

2. The circuit board according to claim 1, wherein the third basic pattern has a shape in which current flows at least in a first direction, the first direction being a direction toward the second conductor portion, and a conductor width of the third basic pattern in a second direction orthogonal to the first direction is greater than a conductor width of the second basic pattern in the second direction.

3. The circuit board according to claim 1, wherein the third basic pattern has a shape in which current flows at least in a first direction, the first direction being a direction toward the second conductor portion, and a total length of the second conductor portion in a second direction orthogonal to the first direction is greater than a total length of the third conductor portion in the second direction.

4. The circuit board according to claim 1, wherein the third basic pattern has a shape in which current flows at least in a first direction, the first direction being a direction toward the second conductor portion, and at least part of the second conductor portion has a shape in which current flows more easily in a second direction orthogonal to the first direction, than in the first direction.

5. The circuit board according to claim 1, wherein the third basic pattern has a shape in which current flows at least in a first direction, the first direction being a direction toward the second conductor portion, and a gap width of the third basic pattern in a second direction orthogonal to the first direction is smaller than a gap width of the second basic pattern in the second direction.

6. The circuit board according to claim 1, wherein the third basic pattern has a shape in which current flows at least in a first direction, the first direction being a direction toward the second conductor portion, and at least part of the second conductor portion has a shape in which current flows more easily in the first direction than in a second direction orthogonal to the first direction.

7. The circuit board according to claim 1, wherein
the third basic pattern has a shape in which current flows at least in a first direction, the first direction being a direction toward the second conductor portion, and
the second conductor portion includes a reinforcement conductor in which current flows more easily in a second direction orthogonal to the first direction, than in the first direction.

8. The circuit board according to claim 1, wherein
the third basic pattern has a shape in which current flows at least in a first direction, the first direction being a direction toward the second conductor portion, and
the second conductor portion includes a reinforcement conductor in which current flows more easily in the first direction than in a second direction orthogonal to the first direction.

9. The circuit board according to claim 7, wherein
a conductor width of the reinforcement conductor is greater than a conductor width of the second basic pattern.

10. The circuit board according to claim 7, wherein
the reinforcement conductor has a mesh-like form, and
a gap width of a mesh of the reinforcement conductor is smaller than a gap width of the second basic pattern.

11. The circuit board according to claim 7, wherein
the reinforcement conductor has a mesh-like form in which gap widths of a mesh are varied, and
at least one of the gap widths of the mesh of the reinforcement conductor is smaller than a gap width of the second basic pattern.

12. The circuit board according to claim 1, wherein
the second basic pattern has a mesh-like shape, and one or a plurality of first relay conductors is disposed in gaps in a mesh.

13. The circuit board according to claim 12, wherein
the third basic pattern has a mesh-like shape, and does not have a conductor disposed in a gap in a mesh.

14. The circuit board according to claim 12, wherein
the third basic pattern has a mesh-like shape, and has a conductor disposed in a gap in a mesh.

15. The circuit board according to claim 1, wherein
the second conductor portion and the third conductor portion are electrically connected.

16. The circuit board according to claim 1, wherein
the second conductor portion and the third conductor portion are electrically connected via a conductor of a shape different from the second basic pattern and the third basic pattern.

17. The circuit board according to claim 1, wherein
the first basic pattern and the second basic pattern constitute a light blocking structure in at least a region.

18. The circuit board according to claim 1, wherein
the first conductor layer has a fourth conductor portion including a conductor of a shape in which a planar, linear, or mesh-like fourth basic pattern is repeatedly disposed in the same plane, and
the fourth basic pattern has a different shape from the first basic pattern.

19. A semiconductor device, comprising:
a circuit board,
the circuit board including:
a first conductor layer that has at least a first conductor portion including a conductor of a shape in which a planar or mesh-like first basic pattern is repeatedly disposed in a first plane; and
a second conductor layer that has at least a second conductor portion including a conductor of a shape in which a planar or mesh-like second basic pattern is repeatedly disposed in a second plane, and a third conductor portion including a conductor of a shape in which a planar, linear, or mesh-shaped third basic pattern is repeatedly disposed in the second plane,
wherein
the repeating cycle of the first basic pattern and the repeating cycle of the second basic pattern are the same, and
the third basic pattern has a different shape from the second basic pattern.

20. An electronic apparatus, comprising:
a semiconductor device including a circuit board,
the circuit board including:
a first conductor layer that has at least a first conductor portion including a conductor of a shape in which a planar or mesh-like first basic pattern is repeatedly disposed in a first plane; and
a second conductor layer that has at least a second conductor portion including a conductor of a shape in which a planar or mesh-like second basic pattern is repeatedly disposed in a second plane, and a third conductor portion including a conductor of a shape in which a planar, linear, or mesh-shaped third basic pattern is repeatedly disposed in the second plane,
wherein
the repeating cycle of the first basic pattern and the repeating cycle of the second basic pattern are the same, and
the third basic pattern has a different shape from the second basic pattern.

* * * * *